(12) United States Patent
Bertin

(10) Patent No.: US 10,002,908 B2
(45) Date of Patent: Jun. 19, 2018

(54) LOGIC ELEMENTS COMPRISING CARBON NANOTUBE FIELD EFFECT TRANSISTOR (CNTFET) DEVICES AND METHODS OF MAKING SAME

(71) Applicant: Nantero, Inc., Woburn, MA (US)

(72) Inventor: Claude L. Bertin, Venice, FL (US)

(73) Assignee: Nantero, Inc., Woburn, MA (US)

( * ) Notice: Subject to any disclaimer, the term of this patent is extended or adjusted under 35 U.S.C. 154(b) by 141 days.

(21) Appl. No.: 15/160,301

(22) Filed: May 20, 2016

(65) Prior Publication Data
US 2017/0005140 A1     Jan. 5, 2017

Related U.S. Application Data

(63) Continuation of application No. 13/579,828, filed as application No. PCT/US2011/025694 on Feb. 22, 2011, now Pat. No. 9,362,390.
(Continued)

(51) Int. Cl.
*H01L 27/28*     (2006.01)
*B82Y 10/00*     (2011.01)
(Continued)

(52) U.S. Cl.
CPC .......... *H01L 27/283* (2013.01); *B82Y 10/00* (2013.01); *G06F 17/5045* (2013.01);
(Continued)

(58) Field of Classification Search
CPC .......... H01L 51/0048; H01L 51/5206; H01L 51/5234; H01L 51/0053; H01L 51/0068;
(Continued)

(56) References Cited

U.S. PATENT DOCUMENTS

| 6,128,214 A | 10/2000 | Kuekes et al. |
| 6,256,767 B1 | 7/2001 | Kuekes et al. |

(Continued)

FOREIGN PATENT DOCUMENTS

| GB | 2364933 A | 2/2002 |
| WO | WO 2000/48195 A1 | 8/2000 |
| WO | WO 2001/03208 A1 | 1/2001 |

OTHER PUBLICATIONS

Amblard, G., "Development and characterization of carbon nanotube processes for NRAM technology," Proc. of SPIE 2011, vol. 7970, pp. 797017-1-797017-7.
(Continued)

*Primary Examiner* — Amar Movva
(74) *Attorney, Agent, or Firm* — Jones Day

(57) ABSTRACT

Inverter circuits and NAND circuits comprising nanotube based FETs and methods of making the same are described. Such circuits can be fabricating using field effect transistors comprising a source, a drain, a channel region, and a gate, wherein the first channel region includes a fabric of semi-conducting nanotubes of a given conductivity type. Such FETs can be arranged to provide inverter circuits in either two-dimension or three-dimensional (stacked) layouts. Design equations based upon consideration of the electrical characteristics of the nanotubes are described which permit optimization of circuit design layout based upon constants that are indicative of the current carrying capacity of the nanotube fabrics of different FETs.

32 Claims, 98 Drawing Sheets

Related U.S. Application Data

(60) Provisional application No. 61/306,735, filed on Feb. 22, 2010.

(51) Int. Cl.

| | | |
|---|---|---|
| *H01L 51/00* | (2006.01) | |
| *H03K 19/20* | (2006.01) | |
| *H01L 21/02* | (2006.01) | |
| *H01L 29/16* | (2006.01) | |
| *H01L 29/78* | (2006.01) | |
| *G06F 17/50* | (2006.01) | |
| *H01L 51/10* | (2006.01) | |
| *H01L 51/05* | (2006.01) | |
| *B82Y 40/00* | (2011.01) | |

(52) U.S. Cl.
CPC ........ *H01L 21/02376* (2013.01); *H01L 29/16* (2013.01); *H01L 29/78* (2013.01); *H01L 51/0048* (2013.01); *H01L 51/105* (2013.01); *H03K 19/20* (2013.01); *B82Y 40/00* (2013.01); *H01L 51/0558* (2013.01); *H01L 51/0566* (2013.01); *Y10S 977/742* (2013.01)

(58) Field of Classification Search
CPC ............. H01L 51/0072; H01L 51/4253; H01L 27/283; H01L 21/02376
USPC .......................................................... 257/29
See application file for complete search history.

(56) References Cited

U.S. PATENT DOCUMENTS

| | | |
|---|---|---|
| 6,314,019 B1 | 11/2001 | Kuekes et al. |
| 6,445,006 B1 | 9/2002 | Brandes et al. |
| 6,548,841 B2 | 4/2003 | Frazier et al. |
| 6,707,098 B2 | 3/2004 | Hofmann et al. |
| 6,759,693 B2 | 7/2004 | Vogeli et al. |
| 6,803,840 B2 | 10/2004 | Hunt et al. |
| 6,809,465 B2 | 10/2004 | Jin |
| 6,835,591 B2 | 12/2004 | Rueckes et al. |
| 6,918,284 B2 | 7/2005 | Snow et al. |
| 6,919,592 B2 | 7/2005 | Segal et al. |
| 6,919,740 B2 | 7/2005 | Snider |
| 6,924,538 B2 | 8/2005 | Jaiprakash et al. |
| 6,990,009 B2 | 1/2006 | Bertin et al. |
| 7,015,500 B2 | 3/2006 | Choi et al. |
| 7,115,901 B2 | 10/2006 | Bertin et al. |
| 7,115,960 B2 | 10/2006 | Bertin et al. |
| 7,160,169 B2 | 1/2007 | Park |
| 7,161,403 B2 | 1/2007 | Bertin |
| 7,259,410 B2 | 8/2007 | Jaiprakash et al. |
| 7,335,395 B2 | 2/2008 | Ward et al. |
| 7,375,369 B2 | 5/2008 | Sen et al. |
| 7,567,414 B2 | 7/2009 | Bertin et al. |
| 7,598,544 B2 | 10/2009 | Bertin et al. |
| 7,635,856 B2 | 12/2009 | Appenzeller et al. |
| 7,839,615 B2 | 11/2010 | Bertin et al. |
| 9,362,390 B2 | 6/2016 | Bertin |
| 2001/0023986 A1 | 9/2001 | Mancevski |
| 2002/0175390 A1 | 11/2002 | Goldstein et al. |
| 2003/0200521 A1 | 10/2003 | DeHon et al. |
| 2003/0236000 A1 | 12/2003 | Vogeli et al. |
| 2004/0192072 A1* | 9/2004 | Snow ..................... B82Y 10/00 438/800 |
| 2004/0238887 A1 | 12/2004 | Nihey et al. |
| 2005/0056877 A1 | 3/2005 | Rueckes et al. |
| 2005/0058797 A1 | 3/2005 | Sen et al. |
| 2005/0079659 A1 | 4/2005 | Duan et al. |
| 2006/0183278 A1 | 8/2006 | Bertin et al. |
| 2006/0237537 A1 | 10/2006 | Empedocles et al. |
| 2006/0237857 A1* | 10/2006 | Bertin .................... B82Y 10/00 257/427 |
| 2008/0012047 A1 | 1/2008 | Bertin et al. |
| 2008/0157126 A1 | 7/2008 | Bertin et al. |
| 2008/0159042 A1 | 7/2008 | Bertin et al. |
| 2008/0170429 A1 | 7/2008 | Bertin et al. |
| 2008/0210370 A1 | 9/2008 | Smalley et al. |
| 2008/0237599 A1 | 10/2008 | Herner et al. |
| 2008/0251723 A1 | 10/2008 | Ward et al. |
| 2008/0299307 A1 | 12/2008 | Ward et al. |
| 2009/0184389 A1 | 7/2009 | Bertin et al. |
| 2010/0001267 A1 | 1/2010 | Manning et al. |
| 2010/0039138 A1 | 2/2010 | Bertin et al. |
| 2010/0134141 A1 | 6/2010 | Bertin et al. |
| 2011/0244121 A1 | 10/2011 | Roberts et al. |
| 2012/0056149 A1 | 3/2012 | Cleavelin et al. |

OTHER PUBLICATIONS

Avouris, P., "Carbon Nanotube Electronics," Chemical Physics, 2002, vol. 281, pp. 429-445.

Bachtold, et al., "Logic Circuits Based on Carbon Nanotubes," Physica E 16, 2003, pp. 42-46.

Baker, et al., "CMOS: Circuit Design, Layout, and Simulation," IEEE Press, 1998 Chapter 9, 22 pgs.

Brock, et al., "Carbon Nanotube Memories and Fabrics in a Radiation Hard Semiconductor Foundry," 2005 IEEE Conference, 9 pgs.

Chen, et al., "Novel Method of Converting Metallic-Type Carbon Nanotubes to Semiconducting-Type Carbon Nanotubes Field-Effect Transistors," JP Jrl. of App. Phys., 2006, vol. 45, No. 4B, pp. 3680-3685.

Chen, et al., "Self-Aligned Carbon Nanotube Transistors with Charge Transfer Doping," Appl. Phys. Ltrs., 2005, No. 36, pp. 123108-1-123108-3.

Chen, et al., "Self-Aligned Carbon Nanotube Transistors with Novel Chemical Doping," IEDM 04, 2004, pp. 695-698.

Cui, et al., "Carbon Nanotube Memory Devices of High Charge Storage Stability," Appl. Phys. Ltrs., 2002, vol. 81, No. 17, pp. 3260-3262.

Derycke, et al., "Carbon Nanotube Inter- and Intramolecular Logic Gates," Nano Letters, 2001, vol. 1, No. 9, pp. 453-456.

Derycke, et al., "Controlling Doping and Carrier Injection in Carbon Nanotube Transistors," Appl. Phys. Ltrs., 2002, vol. 80, No. 15, pp. 2773-2775.

Ding, et al., "Y-Contacted High-Performance n-Type Single-Walled Carbon Nanotube Field-Effect Transistors: Scaling and Comparison with Sc-Contacted Devices," Nano Letters, 2009, vol. 9, No. 12, pp. 4209-4214.

Duan, et al., "Nonvolatile Memory and Programmable Logic from Molecule-Gated Nanowires," Nano Letters, 2002, XXXX, vol. 0, No., 0, A-D, 4 pgs.

Fuhrer, et al., "High-Mobility Nanotube Transistor Memory," Nano Letters, 2002, vol. 2, No. 7, pp. 755-759.

Heinze, et al., "Carbon Nanotubes as Schottky Barrier Transistors," Phys. Rev. Ltrs., 2002, vol. 89, No. 10, pp. 106801-1-106801-4.

Huang, et al., "Logic Gates and Computation from Assembled Nanowire Building Blocks," Science, 2001, vol. 294, pp. 1313-1317.

Javey, et al., "Ballistic carbon nanotube field-effect transistors," Nature, Aug. 2003, vol. 424, pp. 654-657.

Javey, et al., "Carbon Nanotube Transistor Arrays for Multistage Complementary Logic and Ring Oscillators," Nano Letters, 2002, XXXX, vol. 0, No. 0, A-D, 4 pgs.

Javey, et al., "High-k Dielectrics for Advanced Carbon-Nanotube Transistors and Logic Gates," Nature Materials, 2002, vol. 1, pp. 241-246.

Javey, et al., "Carbon Nanotube Field-Effect Transistors with Integrated Ohmic Contacts and High-k Dielectrics," Nano Letters, 2004, vol. 4, No. 3, pp. 447-450.

Kianian, et al., "A 3D Stackable Carbon Nanotube-based Nonvolatile Memory (NRAM)," ESSDERC, Nantero, Inc., Jun. 14, 2010, 4 pgs.

Krupke, et al., "Separation of Metallic from Semiconducting Single-Walled Carbon Nanotubes," Science, 2003, vol. 301, pp. 344-347.

(56) References Cited

OTHER PUBLICATIONS

Lin, et al., "Novel Carbon Nanotube FET Design with Tunable Polarity," IEDM 04-687, 2004, pp. 29.2.1-29.2.4.
Martel, et al., "Carbon Nanotube Field-Effect Transistors and Logic Circuits," DAC 2002, New Orleans, Louisiana, 5 pgs.
Na, et al., "A Field Effect Transistor Fabricated with Metallic Single-Walled Carbon Nanotubes," Fullerenes, Nanotubes, and Carbon Nanostructures, 2006, vol. 14, pp. 141-149.
Novak, et al., "Nerve Agent Detection Using Networks of Single-Walled Carbon Nanotubes," Appl. Phys. Ltrs., 2003, vol. 83, No. 19, pp. 4026-4028.
Peigney, et al., "A Study of the Formation of Single- and Double-Walled Carbon Nanotubes by a CVD Method," J. Phys. Chem. B, 2001, vol. 105, pp. 9699-9710.
Radosavijevic, et al., "Nonvolatile Molecular Memory Elements Based on Ambipolar Nanotube Field Effect Transistors," Nano Letters, 2003, vol. 2, No. 7, pp. 761-764.
Rosendale, et al., "A 4 Megabit Carbon Nanotube-based Nonvolatile Memory (NRAM)," ESSCIRC 2010 Proceedings, pp. 478-481.
Rueckes, et al., "Carbon Nanotube-Based Nonvolatile Random Access Memory for Molecular Computing," Science, 2000, vol. 289, pp. 94-97.
Sahoo, et al., "Simulations of Carbon Nanotube Field Effect Transistors," International Jrl. of Electronic Engineering Research, 2009, ISSN0975-6450, vol. 1, No. 2, pp. 117-125.
Snow, et al., "Random Networks of Carbon Nanotubes as an Electronic Material," Appl. Phys. Ltrs., 2003, vol. 82, No. 13, pp. 2145-2147.
Star, et al., "Nanoelectronic Carbon Dioxide Sensors," Adv. Mater., 2004, vol. 16, No. 22, pp. 2049-2052.
Star, et al., "Nanotube Optoelectronic Memory Devices," Nano Letters, 2004, vol. 4, No. 9, pp. 1587-1591.
Ward, et al., "A Non-Volatile Nanoelectromechanical Memory Element Utilizing a Fabric of Carbon Nanotubes," Nonvolatile Memory Technology Symposium, 2004, Orlando, Florida, USA, pp. 34-38.
Wind, et al., "Fabrication and Electrical Characterization of Top Gate Single-Wall Carbon Nanotube Field-Effect Transistors," IBM T.J. Watson Research Ctr., 6A1:1-9 plus figures 1-5, May 2002.
Wind, et al., "Vertical Scaling of Carbon Nanotube Field-Effect Transistors Using Top Gate Electrodes," Appl. Phys. Ltrs., 2002, vol. 80, No. 20, pp. 3817-3819.
Zhou, et al., "p-Channel, n-Channel, Thin Film Transistors and p-n Diodes Based on Single Wall Carbon Nanotube Networks," Nano Letters, 2004, vol. 4, No. 10, pp. 2031-2035.
International Search Report for PCT/US2011/025694, dated Jul. 27, 2011, 4 pages.
Written Opinion for PCT/US2011/025694, dated Jul. 27, 2011, 5 pages.

* cited by examiner

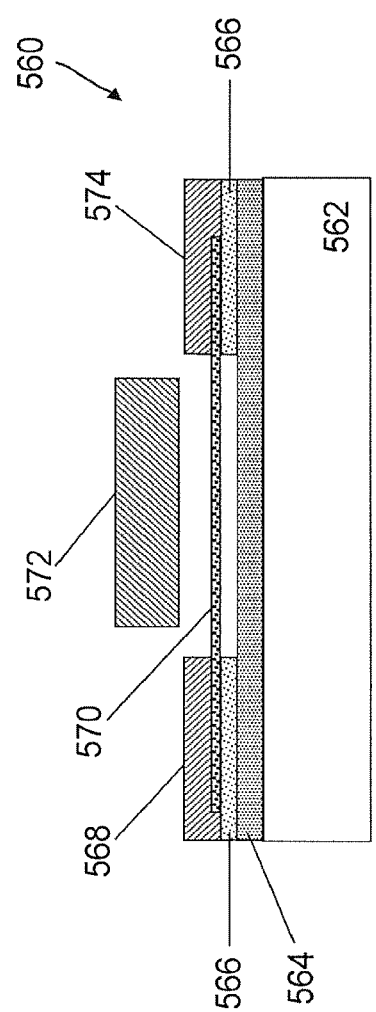

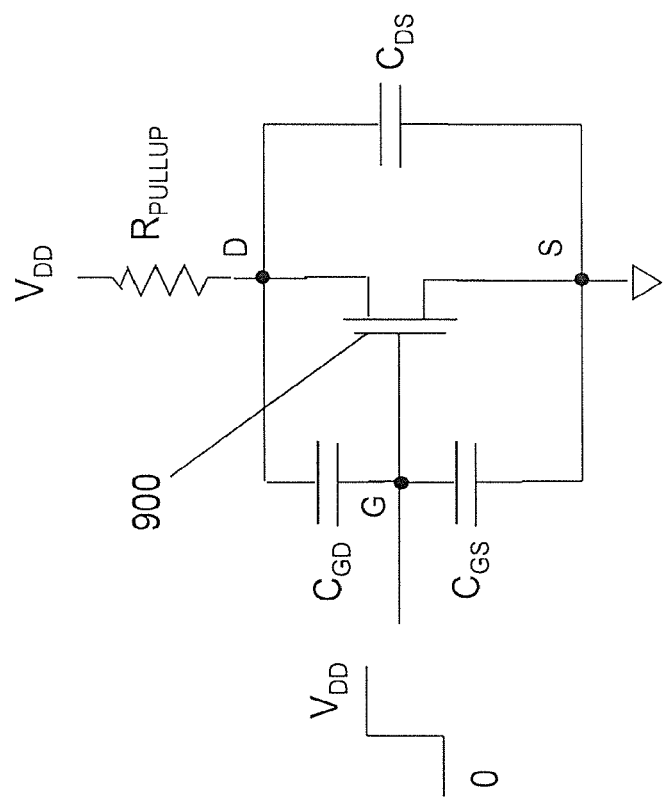

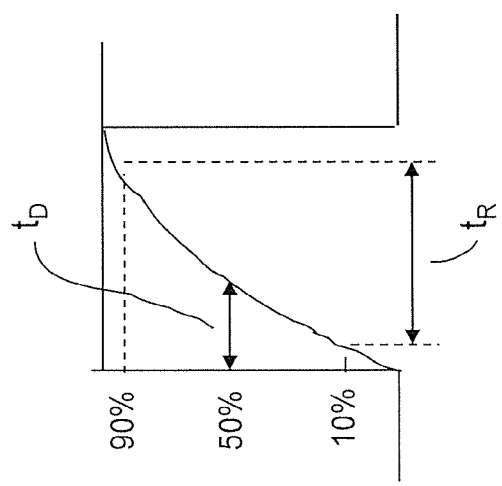

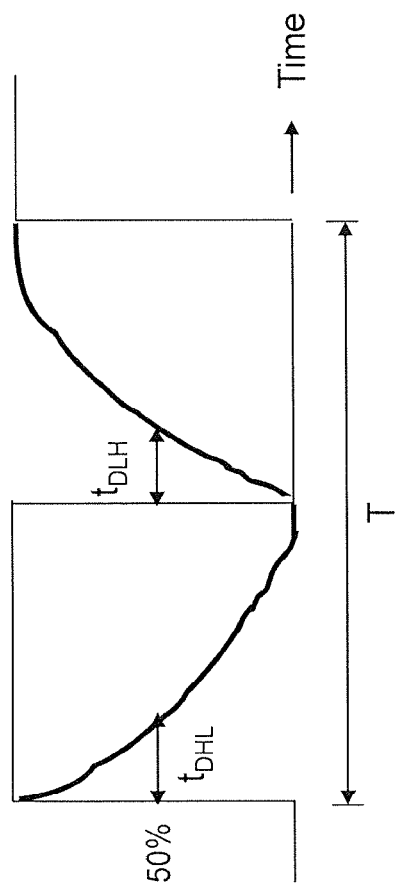

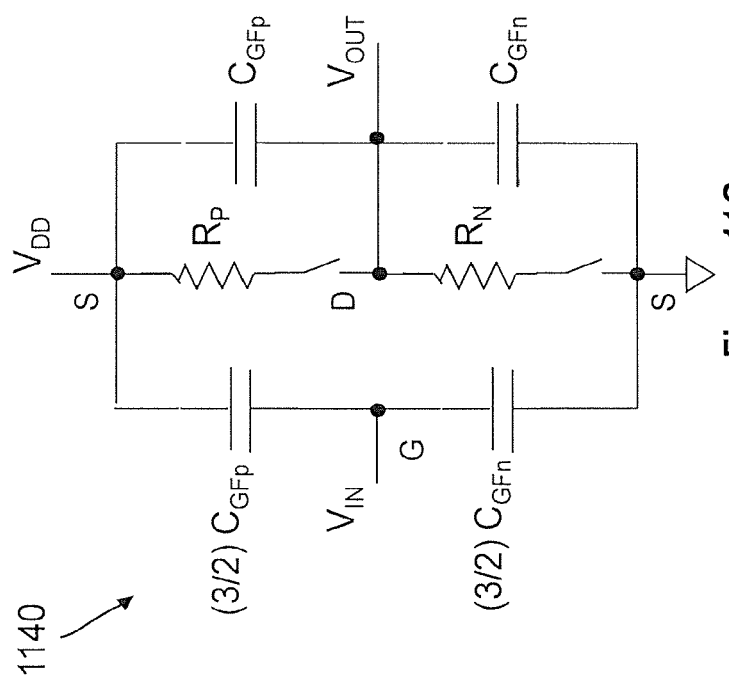

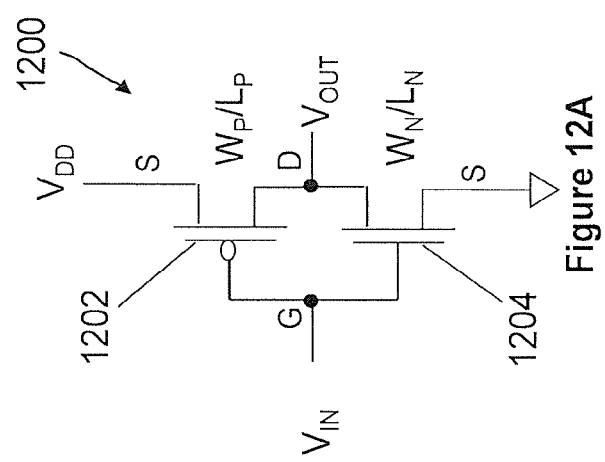

Table 1:

| Nanotube Fabric | Effective L | Device Model | m = 15 Stages | m = 5 Stages |
|---|---|---|---|---|
| NAN-82 Fabric<br>NTFC$_P$ = 4x10$^5$<br>NTFC$_N$ = 8x10$^5$ | L = 0.2 um<br>W$_N$ = 0.2<br>W$_P$ = 0.4 | R & C | f$_{osc}$ = 60 MHz | f$_{osc}$ = 180 MHz |
| 2 x NTFC<br>(2 x Density) | L = 0.2 um<br>W$_N$ = 0.2<br>W$_P$ = 0.4 | R/2 & 2C | Same | Same |
| 2 x NTFC<br>(2 x Fabric Mobility) | L = 0.2<br>W$_N$ = 0.2<br>W$_P$ = 0.4 | R/2 & C | f$_{osc}$ = 120 MHz | f$_{osc}$ = 360 MHz |
| NAN-82 Fabric | L = 0.1<br>W$_N$ = 0.1<br>W$_P$ = 0.2 | R & C/4 | f$_{osc}$ = 240 MHz | f$_{osc}$ = 720 MHz |

Figure 15

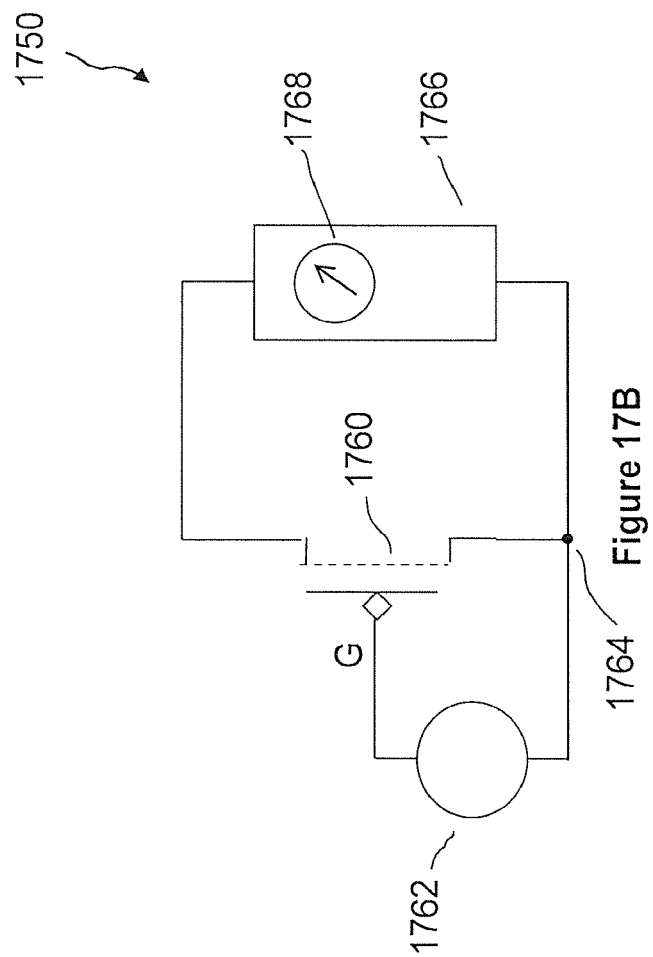

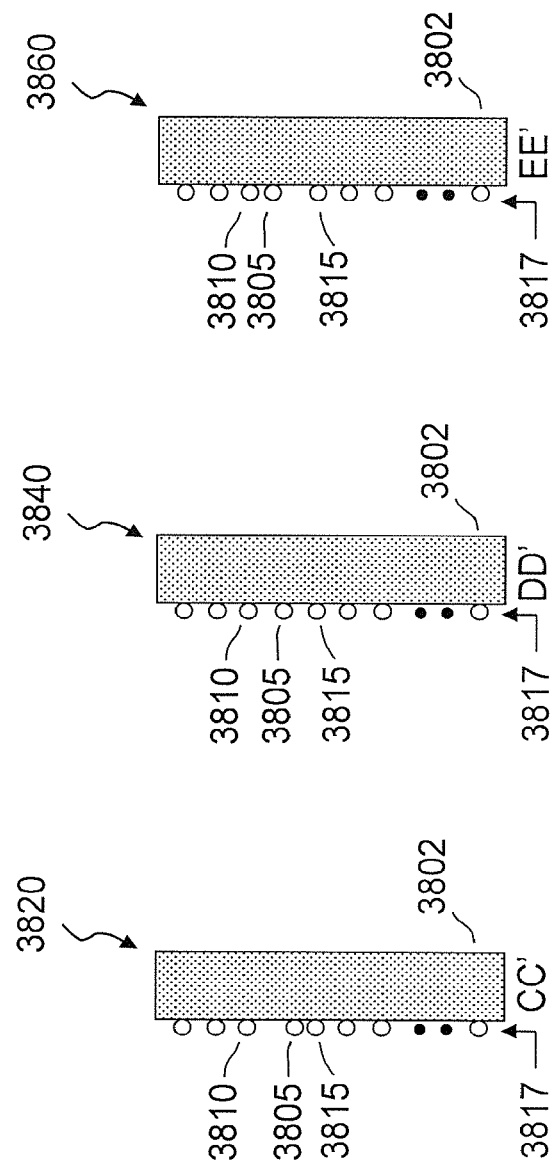

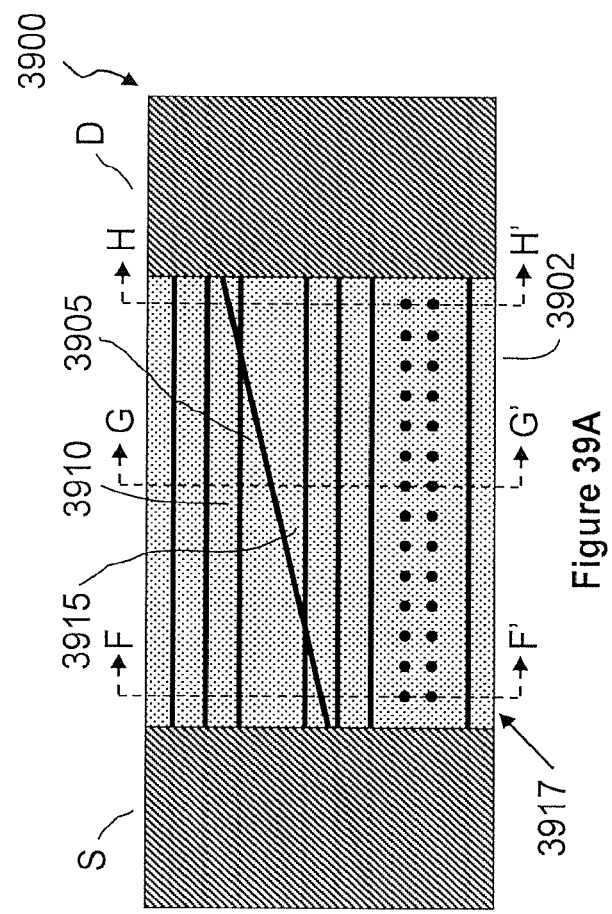

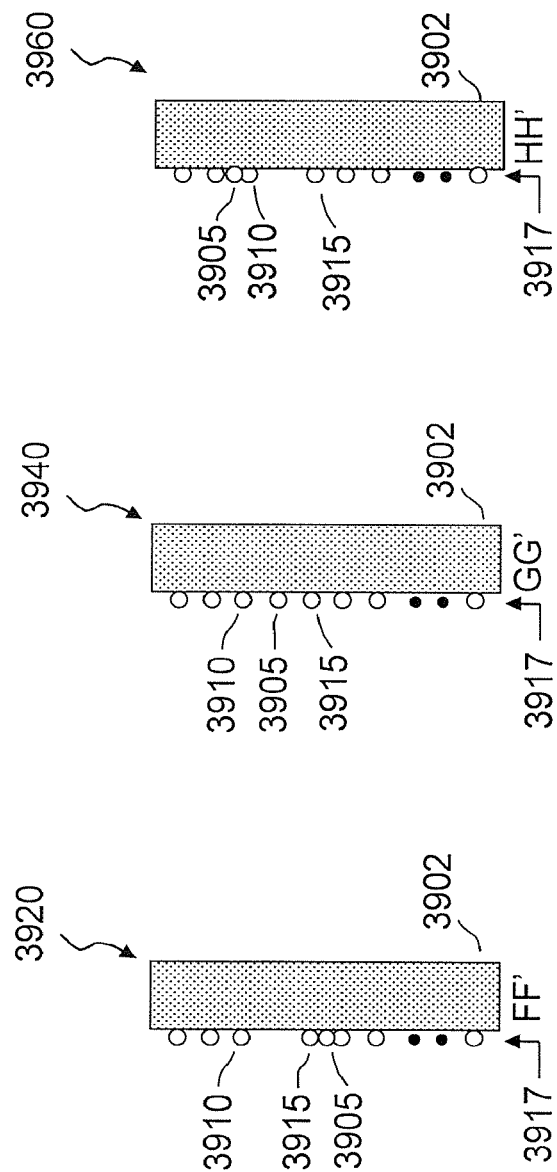

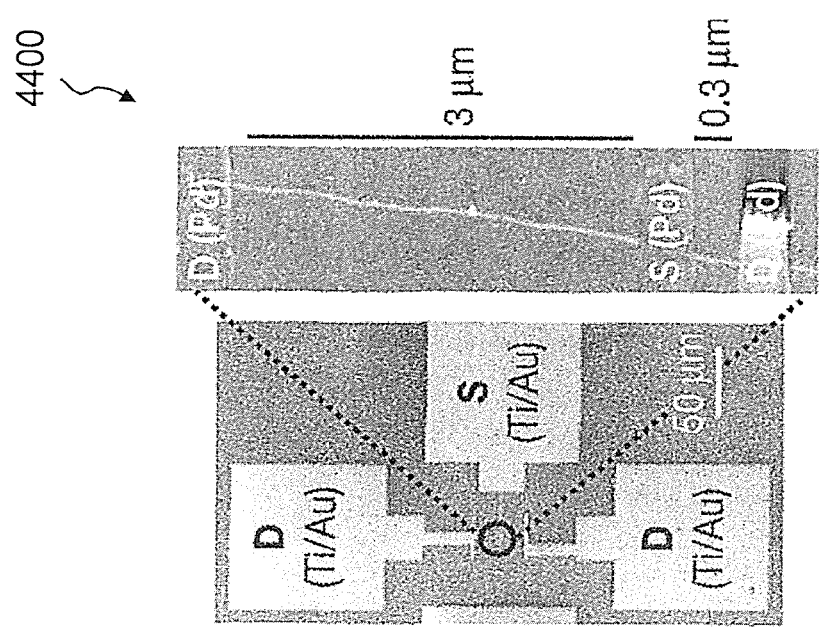
Prior Art Figure 44A

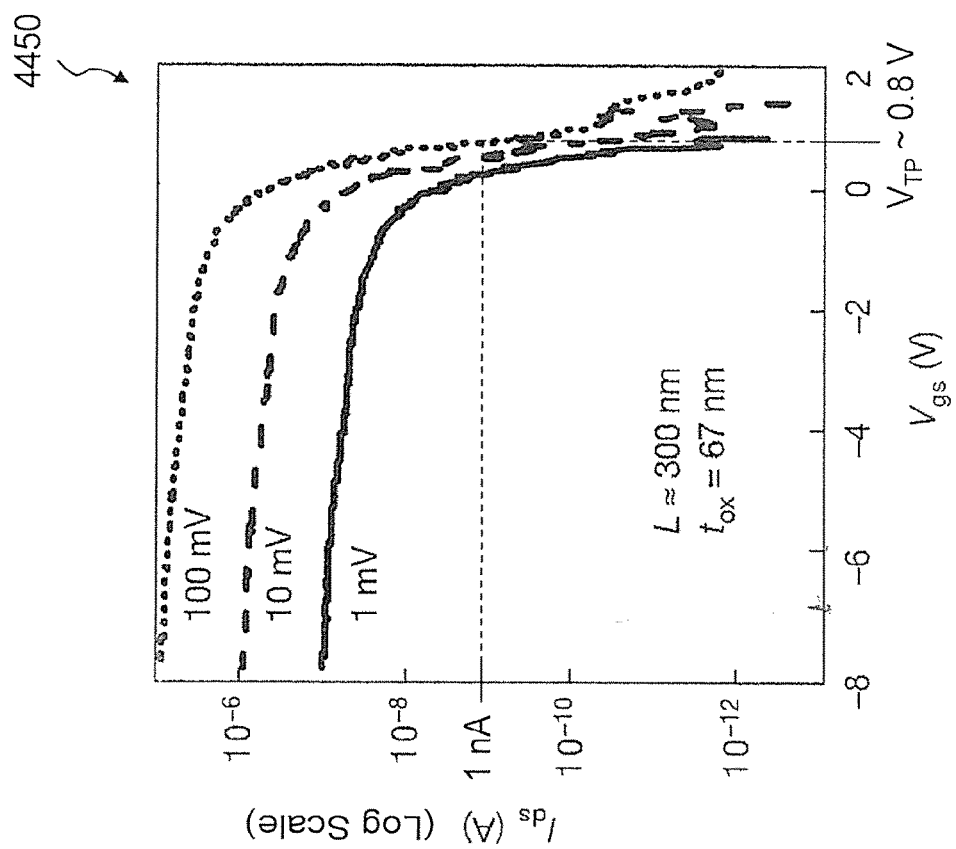
Prior Art Figure 44B

| 4540 | NT Diam. $d_{NT}$ (nm) | Gate Insul. Thick. $t_G$ (nm) | Rel. Dielect. Const. $\epsilon_R$ | Minimum Dense Fabric Characteristics Gate-to-NT Fabric Cap. for W = 400 nm device; & Ordered NT Fabric Density | Maximum Dense Fabric Characteristics Gate-to-NT Fabric Cap. for W = 400 nm device; & Ordered NT Fabric Density | Allowed Cap. & NT Fabric Density Variation |
|---|---|---|---|---|---|---|
| | 0.75 | 7 | 4 | $C_{t\text{-}TOT}(N) = 1.99 \times 10^{-11}$ F/cm<br>N = 115 NTs, W = 400 nm<br>Ordered NT Fabric Density:<br>287 NTs/um² | $C_{t\text{-}TOT}(N) = 2.09 \times 10^{-11}$ F/cm<br>N = 533 NTs, W = 400 nm<br>Ordered NT Fabric Density:<br>1,332 NTs/um² | <= 5%<br><br>4.7X |
| | 1.0 | 7 | 4 | $C_{t\text{-}TOT}(N) = 1.99 \times 10^{-11}$ F/cm<br>N = 101 NTs, W = 400 nm<br>Ordered NT Fabric Density:<br>252 NTs/um² | $C_{t\text{-}TOT}(N) = 2.08 \times 10^{-11}$ F/cm<br>N = 401 NTs, W = 400 nm<br>Ordered NT Fabric Density:<br>1,002 NTs/um² | <= 5%<br><br>4.0X |
| | 1.5 | 7 | 4 | $C_{t\text{-}TOT}(N) = 1.91 \times 10^{-11}$ F/cm<br>N = 75 NTs, W = 400 nm<br>Ordered NT Fabric Density:<br>187 NTs/um² | $C_{t\text{-}TOT}(N) = 2.03 \times 10^{-11}$ F/cm<br>N = 267 NTs, W = 400 nm<br>Ordered NT Fabric Density:<br>667 NTs/um² | <= 5%<br><br>3.5X |
| | 2.0 | 7 | 4 | $C_{t\text{-}TOT}(N) = 1.91 \times 10^{-11}$ F/cm<br>N = 67 NTs, W = 400 nm<br>Ordered NT Fabric Density:<br>167 NTs/um² | $C_{t\text{-}TOT}(N) = 2.00 \times 10^{-11}$ F/cm<br>N = 201 NTs, W = 400 nm<br>Ordered NT Fabric Density:<br>502 NTs/um² | <= 5%<br><br>3.0X |

- In [EQ 40.6], $r = t_G$, $R = d_{NT}/2$, & S = NT-to-NT center distance, N = # NTs, m = any NT from 1-N
- Dense Fabric_Max. Density: defined as when S = $d_{NT}$; capacitance $C_{t\text{-}TOT}(N) = C_{MAX}$ [EQ 40.8]
- Dense Fabric_Min. Density: defined when capacitance $C_{t\text{-}TOT}(N) >= 0.95\ C_{MAX}$ [EQ 40.8]

Figure 45E

| 4550 NT Diam. $d_{NT}$ (nm) | Gate Insul. Thick. $t_G$ (nm) | Rel. Dielect. Const. $\epsilon_R$ | Minimum Dense Fabric pCNTFET Device $I_{DS}$: L = 200 & W = 400 nm $I_{DS}/W$ (µA/µm) ($V_{DD}$ = 1.5 & $\|V_{TP}\|$ = 0.4 V) | Maximum Dense Fabric pCNTFET Device $I_{DS}$: L = 200 & W = 400 nm $I_{DS}/W$ (µA/µm) ($V_{DD}$ = 3.5 & $\|V_{TP}\|$ = 0.5 V) | $I_{DS}$ Variation For Fabric Density Variation |
|---|---|---|---|---|---|
| 0.75 | 7 | 4 | $I_{DSp}$ = 466 µA; W = 400 nm<br>$I_{DSp}/W$ = 1,165 µA/µm<br>Ave. $I_{DSp}/NT$ = 4 µA/NT<br>$I_{DSp}/Circ$ = 1.7 µA/nm/NT | $I_{DSp}$ = 490 µA; W = 400 nm<br>$I_{DSp}/W$ = 1,225 µA/µm<br>Ave. $I_{DSp}/NT$ = 0.9 µA/NT<br>$I_{DSp}/Circ$ = 0.4 µA/nm/NT | <= 5% |
| 1.0 | 7 | 4 | $I_{DSp}$ = 466 µA; W = 400 nm<br>$I_{DSp}/W$ = 1,165 µA/µm<br>Ave. $I_{DSp}/NT$ = 4.6 µA/NT<br>$I_{DSp}/Circ$ = 1.5 µA/nm/NT | $I_{DSp}$ = 488 µA; W = 400 nm<br>$I_{DSp}/W$ = 1,220 µA/µm<br>Ave. $I_{DSp}/NT$ = 1.2 µA/NT<br>$I_{DSp}/Circ$ = 0.4 µA/nm/NT | <= 5% |
| 1.5 | 7 | 4 | $I_{DSp}$ = 455 µA; W = 400 nm<br>$I_{DSp}/W$ = 1,138 µA/µm<br>Ave. $I_{DSp}/NT$ = 6.1 µA/NT<br>$I_{DSp}/Circ$ = 1.3 µA/nm/NT | $I_{DSp}$ = 476 µA; W = 400 nm<br>$I_{DSp}/W$ = 1,190 µA/µm<br>Ave. $I_{DSp}/NT$ = 1.8 µA/NT<br>$I_{DSp}/Circ$ = 0.4 µA/nm/NT | <= 5% |
| 2.0 | 7 | 4 | $I_{DSp}$ = 448 µA; W = 400 nm<br>$I_{DSp}/W$ = 1,120 µA/µm<br>Ave. $I_{DSp}/NT$ = 6.7 µA/NT<br>$I_{DSp}/Circ$ = 1.1 µA/nm/NT | $I_{DSp}$ = 469 µA; W = 400 nm<br>$I_{DSp}/W$ = 1,173 µA/µm<br>Ave. $I_{DSp}/NT$ = 2.3 µA/NT<br>$I_{DSp}/Circ$ = 0.4 µA/nm/NT | <= 5% |

- Dense Fabric_Max. Density: Current flow $I_{DS}$ = $I_{DS-MAX}$ & $I_{DS/W}$ = $I_{DS/W-MAX}$
- Dense Fabric_Min. Density: Current flow $I_{DS-MIN}$ >= 0.95 $I_{DS-MAX}$ & $I_{DS/W-MIN}$ >= 0.95 $I_{DS/W-MAX}$
- Comparing over all NT diameters: $I_{DS-MIN}$ for $d_{NT}$ = 2.0 nm > 0.9 $I_{DS-MAX}$ for $d_{NT}$ = 0.75 nm; < 10% variation

Figure 45F

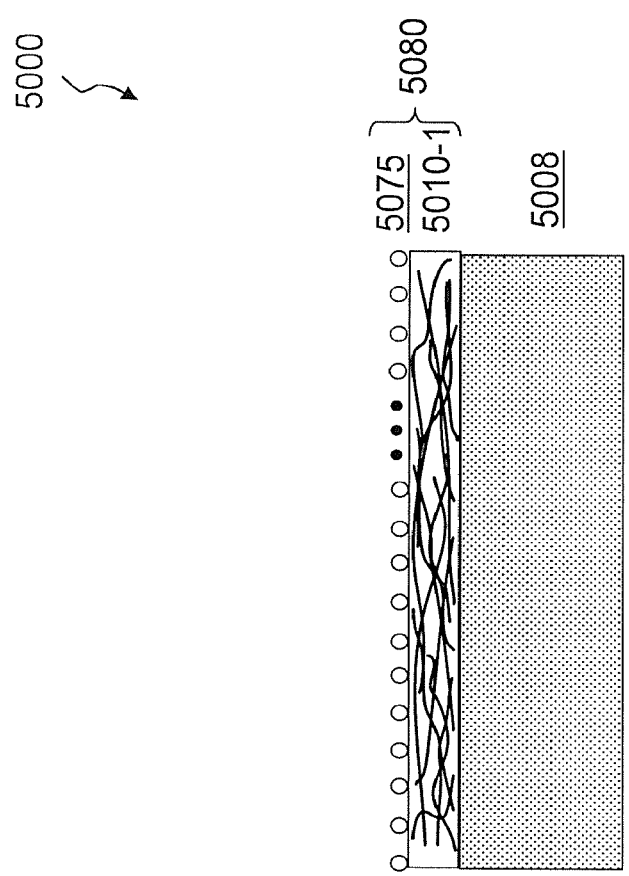

| Nanotube Fabric | Effective L | 4-Stage Delay | m = 15 Stages | m = 5 Stages |
|---|---|---|---|---|
| Unordered NT fabric<br>$NTFC_P = 4 \times 10^5$ cm/V·s<br>$NTFC_N = 8 \times 10^5$ cm/V·s | L = 0.2 um<br>$W_N$ = 0.2 um<br>$W_P$ = 0.4 um | $t_D$ = 4.4 ns | $f_{OSC}$ = 60 MHz | $f_{OSC}$ = 180 MHz |
| Ordered NT fabric<br>$\mu_P$ = 775 cm2/V·s<br>$\mu_N$ = 775 cm2/V·s | L = 0.2 um<br>$W_N$ = 0.2 um<br>$W_P$ = 0.2 um | $t_D$ = 16 ps | $f_{OSC}$ = 16.7 GHz | $f_{OSC}$ = 50 GHz |
| Relative Delay & Oscillating Frequency | | Delay Reduction<br>~ 275x | Frequency Increase<br>~ 278x | Frequency Increase<br>~ 278x |

| Nanotube Fabric | Effective L | NAND Circuit Delays 2-D Integration FO = 6 | Fall Times | Rise Times |
|---|---|---|---|---|
| Unordered NT fabric $NTFC_P = 4 \times 10^5$ cm/V·s $NTFC_N = 8 \times 10^5$ cm/V·s | L = 0.2 um $W_N$ = 8 um $W_P$ = 4 um | $t_{DHL}$ = 2.41 ns [EQ 22.2] $t_{DLH}$ = 2.30 ns [EQ 23.2] $t_{DHL} + t_{DLH}$ = 4.71 ns | $t_F$ = 4.59 ns [EQ 24.4] | $t_R$ = 4.59 ns [EQ 25.4] |
| Ordered NT fabric $\mu_P$ = 775 cm2/V·s $\mu_N$ = 775 cm2/V·s | L = 0.2 um $W_N$ = 8 um $W_P$ = 2 um | $t_{DHL}$ = 10.5 ps [EQ 40.43] $t_{DLH}$ = 9.7 ps [EQ 40.46] $t_{DHL} + t_{DLH}$ = 20.2 ps [EQ 50.56] | $t_F$ = 9.9 ps [EQ 40.50] | $t_R$ = 9.7 ps [EQ 40.54] |
| Propagation Delay = $t_{DHL} + t_{DLH}$ Reduction | | ~ 233x | | |

| 5750 | | NAND Circuit Delays 3-D Integration FO = 5 | | |
|---|---|---|---|---|
| Nanotube Fabric | Effective L | | Fall Times | Rise Times |
| Unordered NT fabric<br>NTFC$_P$ = 4x10$^5$ cm/V·s<br>NTFC$_N$ = 8x10$^5$ cm/V·s | L = 0.2 um<br>W$_N$ = 8 um<br>W$_P$ = 4 um | t$_{DHL}$ = 2.07 ns [EQ 22.3]<br>t$_{DLH}$ = 1.96 ns [EQ 23.3]<br>t$_{DHL}$+t$_{DLH}$ = 4.03 ns | t$_F$ = 3.92 ns<br>[EQ 24.5] | t$_R$ = 3.92 ns<br>[EQ 25.6] |
| Ordered NT fabric<br>μ$_P$ = 775 cm2/V·s<br>μ$_N$ = 775 cm2/V·s | L = 0.2 um<br>W$_N$ = 8 um<br>W$_P$ = 2 um | t$_{DHL}$ = 9.0 ps [EQ 40.44]<br>t$_{DLH}$ = 8.3 ps [EQ 40.47]<br>t$_{DHL}$+t$_{DLH}$ = 17.3 ps<br>[EQ 50.57] | t$_F$ = 8.4 ps<br>[EQ 40.51] | t$_R$ = 8.3 ps<br>[EQ 40.55] |
| Propagation Delay<br>= t$_{DHL}$ + t$_{DLH}$<br>Reduction | | ~ 233x | | |

LOGIC ELEMENTS COMPRISING CARBON NANOTUBE FIELD EFFECT TRANSISTOR (CNTFET) DEVICES AND METHODS OF MAKING SAME

This application is a continuation of U.S. patent application Ser. No. 13/579,828 filed Aug. 17, 2012, which is the National Phase application of International Application No. PCT/US2011/025694 filed Feb. 22, 2011 and which has a § 371 (c)(1), (2) and (4) date of Mar. 28, 2013, which PCT/US2011/025694 claims the benefit of U.S. Provisional Patent Application No. 61/306,735 filed Feb. 22, 2010, the entire contents of each of which are incorporated herein by reference.

TECHNICAL FIELD

The present disclosure relates to semiconductor logic elements, and more particularly to semiconductor logic elements comprising carbon nanotube field effect transistor devices (CNTFETs) and methods of making such elements.

BACKGROUND

A traditional inverter circuit or NOT gate is constructed from two complementary switches connected in series and configured such that the switches are alternatively enabled. Metal-oxide-semiconductor field-effect transistors (MOSFET) are currently widely used in the fabrication of inverter circuits or NOT gates because their high input impedance results in low power dissipation after the MOSFETs are driven to enabled and disabled states, their low output impedance results in fast switching speeds for sharp edges, and their small size relative to bipolar junction transistors (BJT) provides for a high level of packing density. Complementary MOSFET (CMOS) inverters are typically fabricated with a p-well region formed in an n-substrate with an n-channel MOSFET fabricated in the p-well region and a p-channel MOSFET fabricated in the n-substrate, alternatively a CMOS inverter can be fabricated with a n-well region formed in a p-substrate with the n-channel MOSFET fabricated in the p-substrate and the p-channel MOSFET fabricated in an n-well.

FIG. 1A illustrates the basic structure for a CMOS inverter 100 having an n-channel MOSFET 102 fabricated in a p-well region 106 in an n-substrate 108 and a p-channel MOSFET 104 fabricated in the n-substrate 108. The n-channel MOSFET 102 is constructed by depositing an n-region 110 in the p-well region 106 and a conductor 112 above the n-region 110 to form a drain terminal, depositing a separate n-region 114 in the p-well region 106 and a conductor 116 above the n-region 114 to form source terminal, and depositing an insulating layer 118 of dielectric material on the p-well region separating the two separate n-regions, called the channel region, and a conductor 120 above the insulating layer 118 to form a gate terminal. The p-channel MOSFET 104 is constructed by depositing a p-region 122 in the n-substrate 108 and a conductor 124 above the p-region 122 to form a drain terminal, depositing a separate p-region 126 in the n-substrate and a conductor 128 above the p-region 126 to form a drain terminal, and depositing an insulating layer of dielectric material 130 on the n-substrate region separating the two separate p-regions, called the channel region, and a conductor 132 above the insulating layer 130 to form a gate terminal. The gate terminal conductor 120 of the n-channel MOSFET 102 and the gate terminal conductor 132 of the p-channel MOSFET are connected to each other to form an input 136 for the CMOS inverter. The drain terminal conductor 116 of the n-channel MOSFET and the drain terminal conductor 124 of the p-channel MOSFET are connected to each other to form an output 134 for the CMOS inverter. The source terminal conductor 112 of the n-channel MOSFET and the p-well 106 are connected to ground to minimize the voltage differential between the source terminal and the p-well to reduce the change in threshold voltage of the n-channel MOSFET caused the body effect. The source terminal conductor 128 of the p-channel MOSFET and the n-substrate 108 are connected to a voltage source Vdd to minimize the voltage differential between the source terminal and the n-substrate to reduce change in threshold voltage of the p-channel MOSFET caused by the body effect. The body effect can negatively impact the performance of the CMOS inverter by changing the threshold voltages of the n-channel MOSFET and the p-channel MOSFET.

FIG. 1A further illustrates the CMOS inverter in operation converting a positive voltage input signal to a ground voltage output signal. The positive voltage input signal is applied to the CMOS inverter input 136 and the positive voltage input signal charges both the gate terminal conductor 120 for n-channel MOSFET 102 and the gate terminal conductor 132 for the p-channel MOSFET 104 to the voltage level of the positive voltage input signal. The gate terminal conductors 120, 132, insulating layers 118, 130, and channel regions of both the n-channel MOSFET 102 and the p-channel MOSFET 104 form structures similar to parallel plate capacitors. Charging the gate terminal conductor 120 of the n-channel MOSFET 102 to a positive voltage level with respect to the p-well 106 induces a uniform electric field between the gate terminal conductor 120 and the channel region of the p-well 106 for relatively long channel regions and a somewhat non-uniform electric field will be induced for short channel regions. When the positive voltage level has sufficient amplitude to induce an electric field that penetrates the channel region of p-well 106, the electric field pushes the holes in the p-well 106 away from the channel region and pulls the electrons in p-well 106 toward the channel region forming an electron inversion layer 138 in the channel region of the p-well 106. The electron inversion layer 138 connects n-region 110 formed as part of the source terminal with the n-region 114 formed as part of the drain terminal and allows current to flow between the source terminal and the drain terminal. Charging the gate terminal conductor 132 of the p-channel MOSFET to the positive voltage level with respect to the n-substrate induces a uniform electric field between the gate terminal conductor 132 and the channel region of the n-substrate 108 for relatively long channel regions and a somewhat non-uniform electric field will be induced for short channel regions. When the positive voltage level has sufficient amplitude to induce an electric field that penetrates the channel region of n-substrate 108, the electric field pulls electrons in the n-substrate toward the channel region forming an electron accumulation layer, not shown in FIG. 1A. The electron accumulation layer limits current from flowing between the p-region 126 formed as part of the source terminal and p-region 122 formed as part of the drain terminal.

FIG. 1B illustrates the basic structure for a CMOS inverter 150 having an n-channel MOSFET 152 fabricated in a p-substrate 158 and p-channel MOSFET 154 fabricated in an n-well 156 in the p-substrate 158. The n-channel MOSFET 152 is constructed by depositing an n-region 160 in the p-substrate 158 and a conductor 162 above the n-region 160 to form a drain terminal, depositing a separate n-region 164 in the p-substrate 158 and a conductor 166 above the n-region 164 to form source terminal, and depositing an insulating layer 168 of dielectric material on the p-substrate region separating the two separate n-regions, called the channel region, and a conductor 170 above the insulating layer 168 to form a gate terminal. The p-channel MOSFET 154 is constructed by depositing a p-region 172 in the n-well 156 and a conductor 174 above the p-region 172 to form a drain terminal, depositing a separate p-region 176 in the n-well and a conductor 178 above the p-region 176 to form a drain terminal, and depositing an insulating layer 180 of dielectric material on the n-well region separating the two separate p-regions, called the channel region, and a conductor 182 above the insulating layer 180 to form a gate terminal. The gate terminal conductor 170 of the n-channel MOSFET 152 and the gate terminal conductor 182 of the p-channel MOSFET are connected to each other to form an input 186 for the CMOS inverter. The drain terminal conductor 166 of the n-channel MOSFET and the drain terminal conductor 174 of the p-channel MOSFET are connected to each other to form an output 184 for the CMOS inverter. The source terminal conductor 162 of the n-channel MOSFET and the p-substrate 158 are connected to ground to minimize the voltage differential between the source terminal and the p-substrate to reduce the change in threshold voltage of the n-channel MOSFET caused the body effect. The source terminal conductor 178 of the p-channel MOSFET and the n-well 156 are connected to a voltage source Vdd to minimize the voltage differential between the source terminal and the n-well to the reduce change in threshold voltage of the p-channel MOSFET caused by the body effect. The body effect can negatively impact the performance of the CMOS inverter by changing the threshold voltages of the n-channel MOSFET and the p-channel MOSFET.

FIG. 1B further illustrates the CMOS inverter in operation converting a negative voltage input signal to a Vdd voltage output signal. The negative voltage input signal is applied to the CMOS inverter input 186 and the negative voltage input signal charges both the gate terminal conductor 170 for n-channel MOSFET 152 and the gate terminal conductor 182 for the p-channel MOSFET 154 to the negative voltage level of the negative voltage input signal. The gate terminal conductors 170, 182, insulating layers 168, 180, and channel regions of both the n-channel MOSFET 152 and the p-channel MOSFET 154 form structures similar to parallel plate capacitors. Charging the gate terminal conductor 170 of the n-channel MOSFET 152 to a negative voltage level with respect to the p-substrate 158 induces a uniform electric field between the gate terminal conductor 170 and the channel region of the p-substrate 158 for relatively long channel regions and a somewhat non-uniform electric field will be induced for short channel regions. When the negative voltage level has sufficient amplitude to induce an electric field that penetrates the channel region of p-substrate 158, the electric field pulls holes in the p-substrate toward the channel region forming a hole accumulation layer, not shown in FIG. 1B. The hole accumulation layer limits current from flowing between the n-region 164 formed as part of the drain terminal and n-region 160 formed as part of the source terminal. Charging the gate terminal conductor 182 of the p-channel MOSFET to the negative voltage level with respect to the n-well induces a uniform electric field between the gate terminal conductor 182 and the channel region of the n-well 156 for relatively long channel regions and a somewhat non-uniform electric field will be induced for short channel regions. When the negative voltage level has sufficient amplitude to induce an electric field that penetrates the channel region of n-well 156, the electric field pushes the electrons in the n-well 156 away from the channel region and pulls the holes in n-well 156 toward the channel region forming a hole inversion layer 188 in the channel region of the n-well 156. The hole inversion layer 188 connects p-region 176 formed as part of the source terminal with the p-region 172 formed as part of the drain terminal and allows current to flow between the source terminal and the drain terminal.

The coplanar layout of the complementary MOSFETs coupled with the increasingly difficult scaling of MOSFETs to smaller sizes creates a barrier to reducing the amount of chip area consumed by the inverter circuits or NOT gates. MOSFETs at the 90 nm technology node have high leakage currents resulting in high standby power dissipation at short channel lengths due to well-known problems associated with scaling FET devices threshold voltages. In large measure this scaling problem is caused by the difficulty in gate control of the electrical characteristics of the FET channel region in the silicon substrate. The problem is expected to get much worse as technology dimensions shrink to 65 nm, 45 nm, and 20 nm values. There is concern that scaling below 20 nm using silicon substrates may become impractical from both technical feasibility and a fabrication cost perspectives. In addition to the problems presented by scaling FET devices to smaller sizes, the physical construction of an inverter circuit or NOT gate from MOSFETs having individually doped regions and doped well regions fabricated in a semiconductor substrate creates parasitic components that negatively impact performance of the inverter circuit or NOT gate.

U.S. Pat. No. 7,598,544 discloses carbon nanotube FETs, static random access memory fabricated using carbon nanotube FETs, and methods for making the same. U.S. Published Patent Application No. 20060183278 also discloses carbon nanotube FETs and methods for making the same.

U.S. Pat. Nos. 6,835,591, 7,335,395, 7,259,410, 6,924,538, and 7,375,369 disclose approaches for making nanotube films and articles, e.g., nanotube fabrics such as carbon nanotube fabrics and articles made therefrom, the entire contents of each of which is incorporated herein by reference.

U.S. Patent Application Publication Nos. 20080299307, 20050058797, 20080012047, 20060183278, 20080251723, 20080170429 also disclose approaches for making nanotube films and articles, e.g., nanotube fabrics such as carbon nanotube fabrics and articles made therefrom, the entire contents of each of which is incorporated herein by reference.

U.S. Pat. No. 7,115,901 discloses non-volatile field effect devices and circuits having an electromechanically-deflectable, nanotube switching element that may comprise a nanofabric, and methods for making the same. U.S. Patent Application Publication No. 20100039138 discloses field programmable device chips comprising nanotube elements, which may comprise carbon nanotube fabrics, for example, and methods for making the same. U.S. Patent Application Publication No. 20080159042 discloses non-volatile latch circuits comprising nanotube switching elements, which may comprise carbon nanotube fabrics, for example, and methods for making the same. U.S. Patent Application Publication No. 20080157126 discloses non-volatile nanotube diode devices comprising nanotube switching elements, which may comprise carbon nanotube fabrics, for example, and methods for making the same. U.S. Patent Application Publication No. 20100001267 discloses nanotube memory arrays comprising memory cells having nanotube fabric layers and methods for making the same. The entire contents of U.S. Patent Application Publication Nos. 20100039138, 20080159042, 20080157126, and 20100001267 and U.S. Pat. No. 7,115,901 are incorporated herein by reference.

SUMMARY OF THE DISCLOSURE

The present disclosure relates to semiconductor logic elements, and more particularly to semiconductor logic elements comprising carbon nanotube field effect transistor devices (CNTFETs) and methods of making such elements. Such elements can be used in the fabrication of inverter circuits or NOT gates used in logic circuits, integrated circuits, large scale integrated (LSI) circuits, driver circuits, delay circuits, memory, computer systems, digital systems, and electronic devices.

According to one exemplary embodiment, a semiconductor nanotube inverter device is described. The inverter comprises a first field effect transistor comprising a first source, a first drain, a first channel region between said first source and first drain, and a first gate positioned proximate said first channel region, wherein said first channel region comprises a first fabric of semiconducting nanotubes of a first conductivity type. The inverter also comprises a second field effect transistor comprising a second source, a second drain, a second channel region between said second source and second drain, and a second gate positioned proximate said second channel region, wherein said second channel region comprises a second fabric of semiconducting nanotubes of a second conductivity type. A power supply line is electrically coupled to the first source. A ground line is electrically coupled to the second source. An input line is electrically coupled to the first gate and the second gate. An output line is electrically coupled to the first drain and the second drain.

According to another exemplary embodiment a method of making a semiconductor nanotube inverter device is described. The method comprises forming a first field effect transistor comprising a first source, a first drain, a first channel region between said first source and first drain, and a first gate positioned proximate said first channel region, wherein said first channel region comprises a first fabric of semiconducting nanotubes of a first conductivity type. The method also comprises forming a second field effect transistor comprising a second source, a second drain, a second channel region between said second source and second drain, and a second gate positioned proximate said second channel region, wherein said second channel region comprises a second fabric of semiconducting nanotubes of a second conductivity type. A power supply line is electrically coupled to the first source. A ground line is electrically coupled to the second source. An input line is electrically coupled to the first gate and the second gate. An output line is electrically coupled to the first drain and the second drain.

Inverter circuits and other types of circuits using CNTFET devices, may be placed at any level of integration such as integrated with wiring layers for example. CNTFET device-based circuits may be placed at multiple levels in an integrated structure. Inverter circuits or NOT gates may be used as buffer circuits, delay circuits, and ring oscillator circuits. Further, inverter circuits or NOT gates serve as the basis for most logic circuits and the concepts developed from the inverter circuit or NOT gate fabricated using nanotube fabrics can be applied to other logic circuits.

BRIEF DESCRIPTION OF THE DRAWINGS

FIG. 5D illustrates a cross section of an exemplary pCNTFET;

FIG. 9A illustrates an exemplary nCNTFET with the parasitic capacitance components depicted;

FIG. 10B illustrates an exemplary response of an RC network to a pulse with rise and fall times much faster than the RC time constant;

FIG. 10C illustrates the high-to-low transition delay and low-to-high transition delay for an exemplary RC network;

FIG. 11C illustrates an exemplary digital model of an inverter having a pCNTFET pull-up device and an nCNTFET pull down device;

FIG. 12A illustrates an exemplary inverter having a pCNTFET pull-up device and an nCNTFET pull down device according to a specific embodiment of the invention;

FIG. 15 illustrates exemplary results of using a ring oscillator as a measure of CNTFET technology performance;

FIG. 17B illustrates an exemplary circuit for measuring a current-voltage characteristics of a CNTFET;

FIGS. 38A-D illustrate nanotubes substantially parallel to each other and substantially perpendicular to the edge of source S and drain D, except for an individual nanotube that is not parallel to the other nanotubes, forming a semiconducting nanotube channel element;

FIGS. 39A-D illustrate nanotubes substantially parallel to each other and substantially perpendicular to the edge of source S and drain D, except for an individual nanotube that is not parallel and overlays adjacent nanotubes, forming a semiconducting nanotube channel element

FIG. 44A illustrates a prior art backgated p-type CNTFET (pCNTFET) device with a single semiconducting nanotube;

FIG. 44B illustrates the electrical characteristics of prior art backgated p-type CNTFET (pCNTFET) depicted in FIG. 44A;

FIG. 45E illustrates a table comparing minimum and maximum dense fabric characteristics for ordered fabrics and corresponding gate-to-NT fabric capacitance values as a function of fabric density and nanotube diameters;

FIG. 45F illustrated a table comparing saturation current and saturation current per width for pCNTFET devices formed with ordered nanotube fabrics as a function of fabric density and nanotube diameters;

FIG. 50B illustrates a cross-sectional view of a second ordered nanotube fabric structure;

FIG. 55 illustrates a CNTFET-based NOT circuit performance table comparing the speed of CNTFET-based NOT circuits formed using p- and n-type CNTFETs with unordered nanotube fabrics, and the speed of CNTFET-based NOT circuits formed using p- and n-type CNTFETs with ordered nanotube fabrics;

FIG. 57A illustrates a CNTFET-based NOT circuit performance table comparing the speed of CNTFET-based NAND circuits formed using p- and n-type CNTFETs with unordered nanotube fabrics, and the speed of CNTFET-based NAND circuits formed using p- and n-type CNTFETs with ordered nanotube fabrics for two-dimensional layouts;

FIG. 57B illustrates a CNTFET-based NOT circuit performance table comparing the speed of CNTFET-based NAND circuits formed using p- and n-type CNTFETs with unordered nanotube fabrics, and the speed of CNTFET-based NAND circuits formed using p- and n-type CNTFETs with ordered nanotube fabrics for three-dimensional layouts.

DETAILED DESCRIPTION

The present disclosure is directed toward NOT gates (or inverter circuits) and NAND circuits (or gates) fabricated using nanotube fabrics to replace semiconductor substrates. The NOT gates and NAND circuits can be constructed using carbon nanotube field-effect transistors (CNTFET) having nanotube fabrics as sources, drains, and channel regions. The nanotube fabric in each CNTFET is made of semiconducting carbon nanotubes to form either p-type, n-type, or ambipolar-type CNTFET devices. Therefore, parasitic components present in a MOSFET between p-type regions and n-type regions and the underlying semiconductor substrates are not present in CNTFETs. This is because the source, drain, and channel regions are formed in nanotube fabrics on insulating substrates, which replace semiconductor substrates and eliminates depletion region capacitances. Also, threshold modulation effects (body effects) of devices in series associated with semiconductor substrates, such as in NAND circuits for example, are eliminated. Further, the NOT gates and NAND circuits can be stacked to reduce the amount of chip area integrated circuits using NOT gates and/or NAND circuits consume and the CNTFETs can be stacked to reduce the amount of chip area the NOT gates or NAND circuits consume.

The construction of the sources, drains, and channel regions of a CNTFET with nanotube fabrics creates current-voltage characteristics for the CNTFET that are different from the current-voltage characteristics for field effect transistors (FETs) having semiconductor substrates. The electric field induced in the gate region of the CNTFET has an electric field pattern that is different from the electric field pattern for FETs constructed having semiconductor substrates. The electrical connection between the nanotube fabrics and source conductors and drain conductors have electrical characteristics that are different from the electrical connections between the semiconductor substrate and the source conductors and drain conductors for FETs constructed having semiconductor substrates.

Figure 2A:
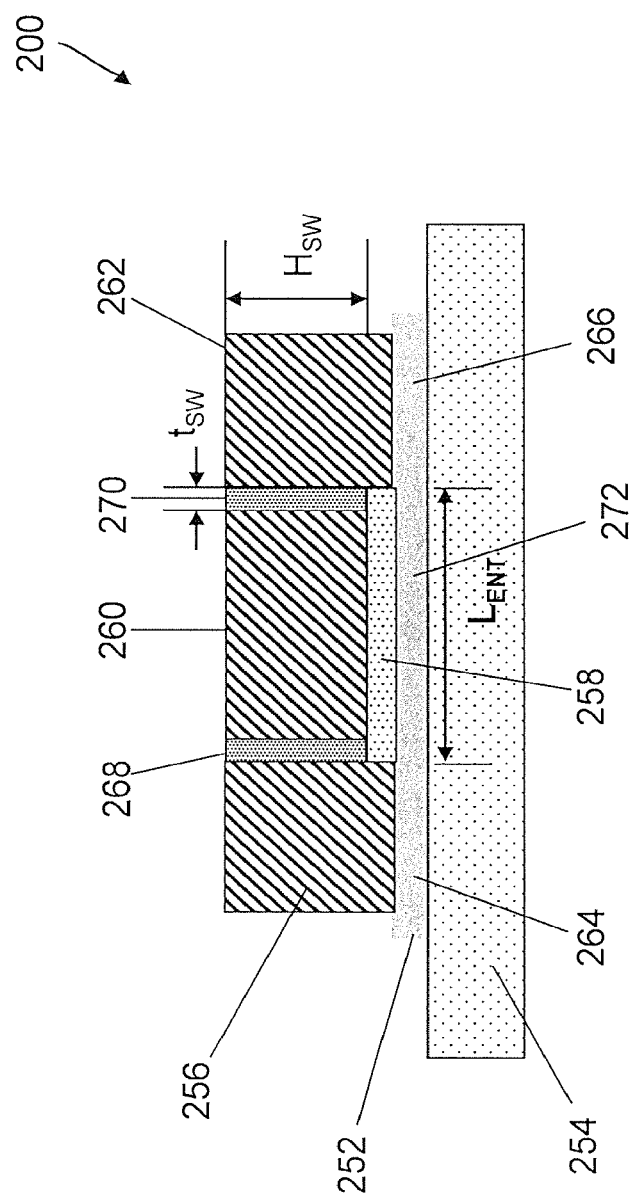
FIG. 2A illustrates a cross section view of an exemplary CNTFET.

FIG. 2A illustrates a cross section of an exemplary CNTFET 200 having a CNT fabric 252 deposited on an insulator 254. The CNT fabric 252 is a fabric comprising semiconducting carbon nanotubes, e.g., a non-woven fabric of semiconducting carbon nanotubes, for instance, as explained further below. The CNTFET 200 has a source conductor 256, a gate insulator 258, a gate conductor 260, and a drain conductor 262 fabricated above the CNT fabric 252. A source region 264 of the CNT fabric corresponds to the CNT fabric below the source conductor 256 and a drain region 266 of the CNT fabric corresponds to the CNT fabric below the drain conductor 262. A channel region 272 of the CNT fabric corresponds to the CNT fabric below the gate insulator 258 and gate conductor 260. The CNTFET 200 has a spacer 268 separating the source conductor 256 and the gate conductor and a spacer 270 separating the gate conductor 260 and the drain conductor 262. The spacer 268 has a height $H_{SW}$ and a thickness $t_{SW}$ and the spacer 270 has a height $H_{SW}$ and a thickness $t_{SW}$. The insulators 254 and 258 and spacers 268 and 270 can be any suitable insulator, such as described elsewhere herein. The source and drain conductors 256 and 262 can be any suitable conductor; transition metals such as Ti, Pd, and Co may be used as conductors to form relatively low resistance contacts after annealings with both metallic and semiconducting nanotubes in the NT fabric. In the exemplary devices described in this application, conductors were formed using Ti/Pd annealed to approximately 400 deg. C. Other conductors such as metals, metal alloys, semiconductors, may also be used as described further below. Ion implantation, or other process methods, may used to adjust channel region threshold voltage values by controlling the position of the Fermi level in the band gap between conduction and valence bands, thereby facilitating the use of a broad range of conductive materials. Ti/Pd conductors can make near-ohmic contact with metallic SWNTs in the NT fabric and Ti/Pd conductors in contact with the NT fabric 252 can make Schottky-type contacts with semiconducting nanotubes in the NT fabric 252. After burn-off electrical post processing as described with respect to FIG. 6, only semiconducting-type nanotubes remain in NT fabric 252. Schottky-type contacts may tend to inject majority carriers into the junctions at the source and drain (e.g., electrons for n-type CNT material, and holes for p-type CNT material, and both n and p-type carriers in the case of ambipolar CNTFETs as described in FIGS. 17A-B and 18). The position of the Fermi level in the conductor-to-NT fabric contact regions may also be adjusted by ion implantation or other process methods thereby favoring hole injection in the case of unipolar pCNTFET devices and electron injection in the case of unipolar nCNTFET devices. In the case of ambipolar CNTFET devices, the position of the Fermi level may be positioned in the middle of the bandgap such that both strong hole and electron injection occurs depending on the voltages applied to the ambipolar CNTFET device as described further below with respect to FIG. 18.

Figure 2B:
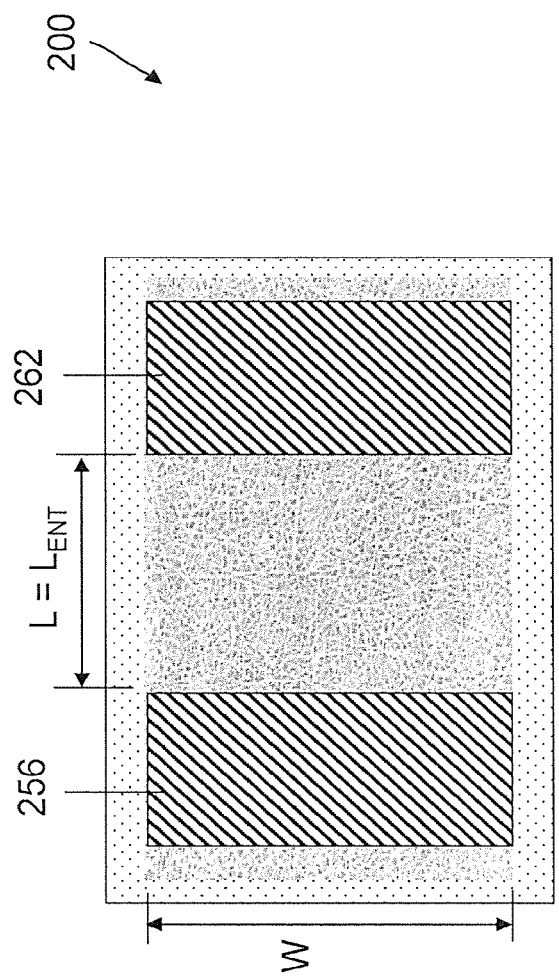
FIG. 2B illustrates a top view of the channel region of an exemplary CNTFET.

FIG. 2B illustrates a top view of the CNTFET 200 with the gate conductor 260, gate insulator 258 and spacers 268, 270 not shown to provide an unobstructed view of the channel region of the CNT fabric 252. The channel length L is equal to the spacing between source conductor 256 and drain conductor 262 with respect to the CNT fabric 252. This length is equal to an "effective" nanotube channel length, which is the effective length of nanotube(s) to bridge the distance between the source and drain, and is designated as $L_{ENT}$ as shown in FIG. 2B. The channel width W is equal to the width of the source conductor 256 and the drain conductor 262 in this example.

The CNT fabric 252 comprises a layer of multiple, interconnected carbon nanotubes. A fabric of nanotubes (or nanofabric), in the present disclosure, e.g., a non-woven CNT fabric, may, for example, have a structure of multiple entangled nanotubes that are irregularly arranged relative to one another. Alternatively, or in addition, for example, the fabric of nanotubes for the present disclosure may possess some degree of positional regularity of the nanotubes, e.g., some degree of parallelism along their long axes. The fabrics of nanotubes retain desirable physical properties of the nanotubes from which they are formed. The fabric preferably has a sufficient amount of nanotubes in contact so that at least one electrically semi-conductive pathway exists from a given point within the fabric to another point within the fabric. Individual nanotubes may typically have a diameter of about 1-2 nm and may have lengths ranging from a 100 nm to about 200 microns, for example. The nanotube lengths used in the exemplary devices were in the range of 500 nm to 2 um for example. The nanotubes may curve and occasionally cross one another. Gaps in the fabric, i.e., between nanotubes either laterally or vertically, may exist. Such fabrics may comprise single-walled nanotubes, multi-walled nanotubes, or both. The fabric may have small areas of discontinuity with no tubes present. The fabric may be prepared as an individual layer or as multiple fabric layers, one formed upon another. The thickness of the fabric can be chosen as thin as substantially a monolayer of nanotubes or can be chosen much thicker, e.g., tens of nanometers to hundreds of microns in thickness. The porosity of the fabrics can be tuned to generate low density fabrics with high porosity or high density fabrics with low porosity. The porosity and thickness can be chosen as desired depending upon the application at hand. Such fabrics can be prepared by growing nanotubes using chemical vapor deposition (CVD) processes in conjunction with various catalysts, for example. Other methods for generating such fabrics may involve using spin-coating techniques and spray-coating techniques with preformed nanotubes suspended in a suitable solvent. Nanoparticles of other materials can be mixed with suspensions of nanotubes in such solvents and deposited by spin coating and spray coating to form fabrics with nanoparticles dispersed among the nanotubes. Such exemplary methods are described in more detail in the related art cited in the Background section of this disclosure.

The CNT fabric can be formed by various methods such as explained below. The source, drain, gate, gate insulator and spacers can be formed using deposition and lithographic patterning techniques that are well known to those of ordinary skill in the art. The CNT fabric can likewise be patterned using such lithographic patterning techniques.

The formation of such nanotube layers is taught in several of the incorporated references. For example, U.S. Pat. No. 7,335,395 to Ward et al., incorporated herein by reference in its entirety, teaches a plurality of methods for forming nanotube layers and films on a substrate element using preformed nanotubes. The methods include, but are not limited to, spin coating (wherein a solution of nanotubes is deposited on a substrate which is then spun to evenly distribute the solution across the surface of the substrate), spray coating (wherein a plurality of nanotube are suspended within an aerosol solution which is then disbursed over a substrate) and roll-to-roll coating (or roll coating, for brevity) such as Gravure coating (wherein an engraved roller with a surface spinning in a coating bath picks up the coating solution in the engraved dots or lines of the roller, and where the coating is then deposited onto a substrate as it passes between the engraved roller and a pressure roller). Further, U.S. Pat. No. 7,375,369 to Sen et al., incorporated herein by reference in its entirety, teaches solvents that are well suited for suspending nanotubes and for forming a nanotube layer over a substrate element via a spin coating process. For example, such solvents include but are not limited to ethyl lactate, dimethyl sulfoxide (DMSO), monomethyl ether, 4-methyl-2 pentanone, N-methylpyrrolidone (NMP), t-butyl alcohol, methoxy propanol, propylene glycol, ethylene glycol, gamma butyrolactone, benzyl benzoate, salicyladehyde, tetramethyl ammonium hydroxide and esters of alpha-hydroxy carboxylic acids. Such solvents can disperse the nanotubes to form a stable composition without the addition of surfactants or other surface-active agents.

Depending on their physical structure, individual carbon nanotubes can be highly conductive or semiconducting. The conductivity of an individual carbon nanotube is determined by the orientation of the hexagonal rings around the wall of the nanotube. This orientation is referred to as the chirality (or twist) of the nanotube by those skilled in the art and can be quantified as the angle between the hexagonal pattern of the individual carbon rings making up the wall of the nanotube and the axis of the nanotube itself. Within a typical distribution of fabricated carbon nanotubes, for example, roughly one third will be conducting (often simply referred to as metallic nanotubes) and two thirds will be semiconducting. In the case of semiconducting nanotubes the chirality of the nanotubes is responsible for the mobility of holes and/or electrons.

Further, as the need for semiconducting carbon nanotubes increases, additional techniques are being developed within the industry to manufacture supplies of semiconducting only carbon nanotubes. Such techniques include methods to sort metallic carbon nanotubes from semiconducting nanotubes, as well as methods for fabricating carbon nanotubes such that the percentage of metallic nanotubes produced is much smaller than the percentage of semiconducting nanotubes produced. As these techniques continue to develop, supplies of semiconducting only carbon nanotubes are expected to become more readily available. Current separation techniques of metallic SWNTs and MWNTs impurities from s-SWNT result in s-SWNT concentrations in the range of greater than 80%, but less than 100%, with some metallic CNTs remaining. Examples of separation techniques in use are metallic burnoff, dielectrophoresis (e.g., AC dielectrophoresis and agarose gel electrophoresis), amine extraction, polymer wrapping, selective oxidation, CNT functionalization, and density-gradient ultracentrifugation.

In some applications it is desirable to form a layer of carbon nanotube elements that includes substantially only semiconducting carbon nanotubes. For example, U.S. Published Patent. Application No. 20060183278 to Bertin et al., incorporated herein by reference in its entirety, teaches the construction of a FET device which includes a layer of semiconducting carbon nanotubes as the channel element. U.S. 20060183278 teaches a method of "burning off" the metallic nanotubes within a deposited nanotube layer during the fabrication of a FET device. A nanotube layer is deposited over a substrate and thermally isolated from the underlying substrate (in at least one embodiment, by forming a gap within the substrate beneath the nanotube layer). An electrical current is then passed through the nanotube layer. With no structure available to dissipate the heat generated, the thermally isolated metallic nanotubes within the nanotube layer are burnt off, leaving behind a nanotube layer comprised of substantially only semiconducting nanotubes.

Typically, semiconducting carbon nanotubes are formed as p-type semiconducting elements. However semiconducting carbon nanotubes can be converted to n-type semiconducting elements through a plurality of methods well known to those skilled in the art. These include, but are not limited to, high temperature thermal anneal processes and doping a layer of p-type carbon nanotubes with other materials such as nitrogen or potassium. Various synthesis technologies for producing CNTs themselves in significant quantities include arc discharge, laser ablation, high pressure carbon monoxide (HiPCO), Chemical Vapor Deposition (CVD) including Plasma Enhanced CVD (PECVD), and controlled flame synthesized SWNTs (e.g., Nano-C) as known to those skilled in the art.

Figure 3A:
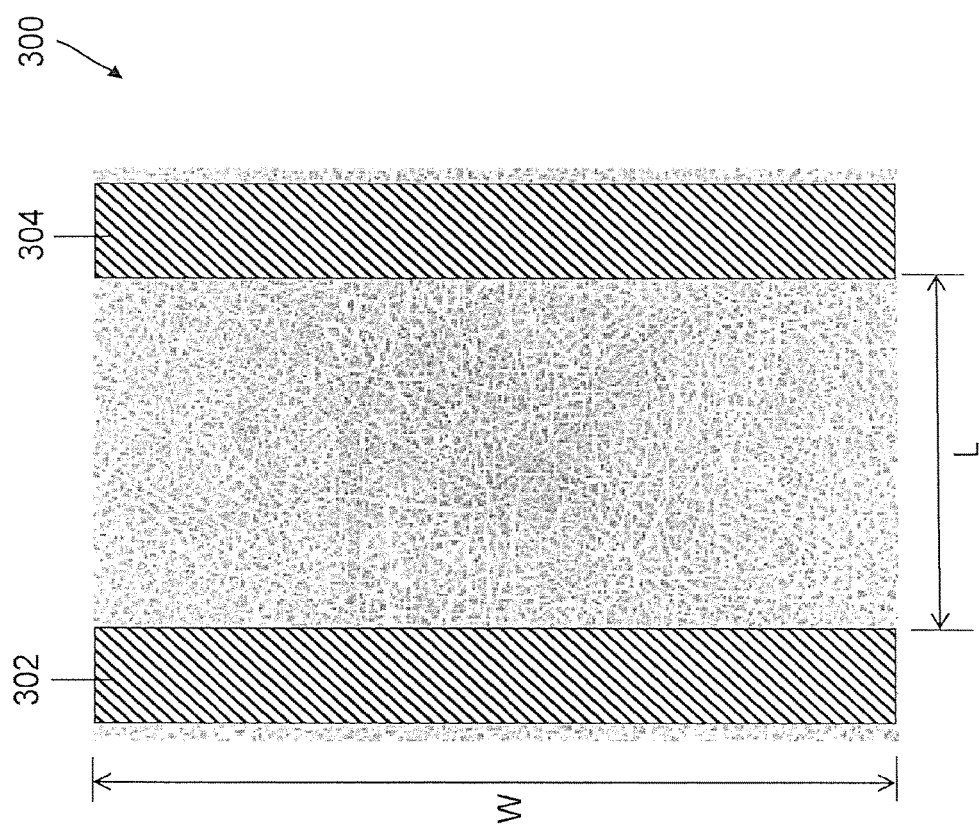
FIG. 3A illustrates a close-up top view of an exemplary CNT fabric in a channel region of a CNTFET.
Figure 3B:
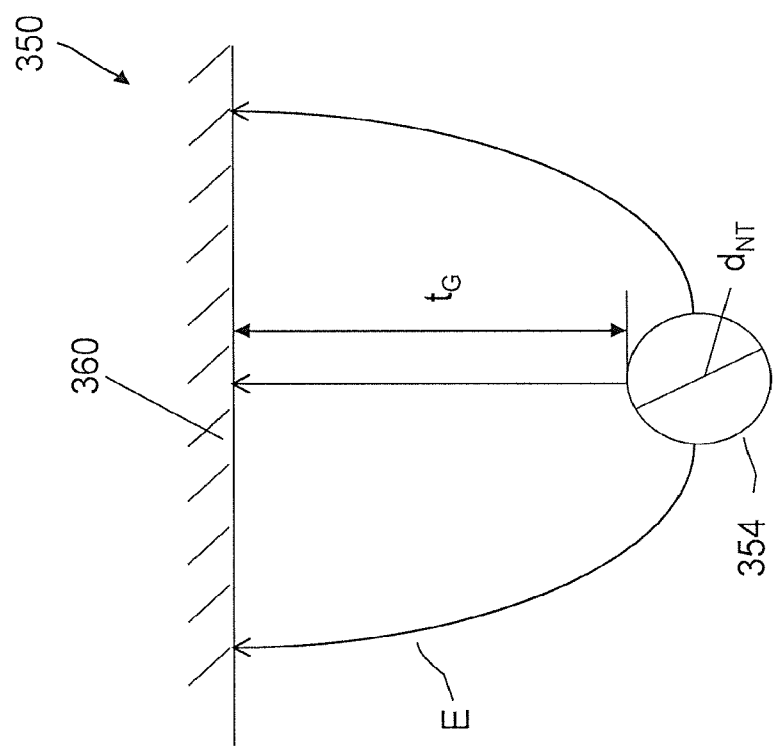
FIG. 3B illustrates the electric field lines between a gate terminal conductor of a CNTFET and a carbon nanotube.

One of the objects of this disclosure is to provide design equations to assist with selecting design parameters for devices fabricated using CNTFETs. Therefore, some preliminary concepts in that regard are now described. FIG. 3A (similar to FIG. 2B) illustrates a close-up top view of a CNT fabric in a channel region of a CNTFET 300 with the gate conductor not shown and the gate insulator not shown to provide an unobstructed view of the channel region. Individual CNT spacings are much greater than CNT diameters such that the electrical field associated with a nanotube is not significantly influenced by the presence of other CNTs. The channel region has the dimensions W×L with the source conductor 302 and the drain conductor 304 shown above the nanotube fabric that forms source and drain regions. FIG. 3B shows a cross section of a gate region 350 of a CNTFET having a gate conductor 352 and a representative carbon nanotube 354. A gate insulator is not shown, but the gate insulator would typically be present between the gate conductor 352 and the carbon nanotube 354. The carbon nanotube 354 has a diameter $d_{NT}$, a radius $R_{NT}=d_{NT}/2$ and a separation distance from the top of carbon nanotube to the gate conductor of $t_G$. FIG. 3B further shows the gate conductor 352 held at a negative voltage to induce an electrical field illustrated by electric field lines E from the CNT 354 and terminating on the gate conductor 352. A reversal of voltage polarity would change the direction of the electric field. Spacings between individual CNTs in the CNT fabric are generally much greater than CNT diameters such that the electrical field associated with one nanotube is not significantly influenced by the presence of other CNTs. In this example, the nanotubes occupy less than 10% of the NT fabric layer, with voids in excess of 90%. The nanotube spacing is at least 10× the nanotube diameter; typically NT diameters are in the 1-2 nm range. The total electric field induced at any given point is the sum of the electric field contributions at that point of an effective number of CNTs that electrically couple to the CNTFET gate conductor.

The gate region of a CNTFET is constructed from a gate conductor, an insulating layer of dielectric material, and a channel region of semiconducting nanotube fabric. In comparison, the gate region of a conventional MOSFET is constructed from a gate conductor, an insulating layer of dielectric material, and a channel region of semiconducting material. The gate conductor and the channel region of semiconducting material in the MOSFET are smooth surfaces allowing uniform distribution of charge. Therefore, the gate region of MOSFET can be modeled by a parallel-plate capacitor with a capacitance per unit area determined by $C=\varepsilon_R \cdot \varepsilon_0/d$, ignoring minimal fringing electric fields; where $\varepsilon_R$ is the relative dielectric constant of the insulating layer of dielectric material, $\varepsilon_0$ is the permittivity of free space $8.85 \times 10^{-14}$ F/cm, and d is the distance between the gate conductor and the semiconducting material. Those of skill in the art will appreciate that the product $\varepsilon_R \cdot \varepsilon_0$ is equivalent to the dielectric constant $\varepsilon$ for a given material. The distance d is often equivalent to the thickness of the insulating layer of dielectric material. The gate conductor in the CNTFET is a smooth surface allowing uniform distribution of charge, but the nanotube fabric cannot be considered a smooth surface allowing a uniform distribution of charge and thus the gate region of a CNTFET can not be modeled by a parallel-plate capacitor.

The nanotubes in the nanotube fabric can be modeled as cylindrical conductors (wires) and the gate conductor is a smooth surface allowing the uniform distribution of charge. Therefore, the gate region of a CNTFET constructed with a low density nanotube fabric can be modeled by a single cylindrical conductor above a conducting plane with CNFET capacitance per unit length determined by $C=2\pi\varepsilon_R\varepsilon_0/\ln\ (1+t_G/R_{NT}+\sqrt{(t_G/R_{NT}+1)^2-1})$, with mostly fringing electric fields; where $\varepsilon_R$ is the relative dielectric constant of the insulating layer of dielectric material, $\varepsilon_0$ is the permittivity of free space $8.85\times10^{-14}$ F/cm, $t_G$ is the distance between the gate conductor and the top of the cylindrical carbon nanotube, and $R_{NT}$ is the radius of a cylindrical carbon nanotube. For simplified calculations of the capacitance per unit length $C=2\pi\varepsilon_R\varepsilon_0/\ln(2t_G/R_{NT})$ provides a good approximation of the capacitance per unit length for CNTFETs constructed with a low density nanotube fabric. The capacitance between the carbon nanotube and gate conductor will vary as the nanotube fabric density changes.

The current-voltage equations for a CNTFET as a function of nanotube fabric characteristics, geometries, and insulator materials are calculated. These current-voltage equations are used to calculate the electrical characteristics of inverter circuits or NOT gates. US Patent Application Publication No. US 20060183278 and U.S. Pat. No. 7,598,544 issued on Oct. 6, 2009, which are hereby incorporated by reference, describe device characteristics that can be used to calculate CNTFET device properties. U.S. application Ser. No. 12/536,736, which is hereby incorporated by reference, describes methods of fabricating various CNTFET devices.

The current-voltage relationships for a CNTFET can be expressed for a CNTFET in the non-saturated region by Eq. 2.1, for a CNTFET at the non-saturation-saturation regions boundary by Eq. 2.2, and for a CNTFET in the saturation region by Eq. 2.3. Presented here is a quantity referred to as the "nanotube fabric constant" (NTFC), which provides a measure of the current carrying ability of a section of nanotube fabric. Consider that the planar structure of silicon FETs (MOSFETs) has a gate forming and unforming a channel in a semiconductor substrate between source and drain regions. These source and drain regions have very low Ohmic contact resistances, milli-Ohms for example, and are formed by conductors in contact with the heavily doped semiconductor regions in a semiconductor substrate such that drain-to-source voltages appear almost entirely across the FET channel region. CNTFET devices formed on nanotube fabric on an insulating substrate that replaces a semiconductor substrate cannot be directly compared with planar FET devices.

In a CNTFET device, the NT fabric is formed with multiple nanotubes of approximately cylindrical structure, and current flows through a network of individual nanotubes with a gate that forms and unforms a channel in individual nanotubes between source and drain regions formed where corresponding conductors come in contact with individual nanotubes forming the NT fabric as illustrated in FIGS. 2A and 2B. Conductors may form Schottky barrier diodes corresponding to source and drain regions in series with and on either side of the channel region under the gate. Resistance values associated with Schottky barrier diodes are much higher than the low resistance FET contacts and may be in the range of 10% to 50% of the ON resistance value of the channel. These Schottky diodes can be an integral part of the CNTFET electrical characteristics. Therefore, what is needed is a way to quantify CNTFET design equations with nanotube fabric as the substrate such that a CNTFET drain-to-source current can be calculated as a function of a nanotube fabric constant that reflects the diameter of individual nanotubes, the nanotube fabric density, and nanotube fabric mobility, in addition to gate insulator dielectric constant, threshold voltage, and applied voltages, and the width and length dimensions of the device.

One approach is to define a "nanotube fabric constant" (NTFC) that reflects the nanotube density in terms of an effective number of nanotubes $N_{EFF}$ having an effective nanotube length of $L_{EFF}$ and an effective nanotube fabric mobility $\mu_{FM}$. Such a nanotube fabric constant NTFC should include not just the effects of the channel region, but also the contact resistances associated with any Schottky diodes in series with the channel region, because the drain-to-source voltage drop appears not only across the channel but also as a voltage drop across the two Schottky diode resistances in series with the channel region. The channel region of the CNTFET device may be viewed as having a reduced channel region nanotube fabric mobility $\mu_{FM}$ that reflects additional series resistance drops included in a nanotube fabric constant (NTFC). The $NTFC_P$ for p-type CNTFET devices is not the same as the $NTFC_N$ for n-type CNTFET devices.

The current equation for a CNTFET device may be calculated from first principles of field effect transistors as described further below with respect to FIG. 4 and is reflected in Equation 4.8 with the NTFC defined in Equation 4.9. When designing a circuit function such as inverter, a NAND gate, other logic functions using CNTFET devices, it is desirable to define a NTFC in terms of a constant value per square of NT fabric. This NTFC may be viewed as a constant reflecting the ability of a nanotube fabric of a certain density to carry a certain current. The current flow of a CNTFET device may then be scaled based on the dimensions chosen by multiplying the NTFC by W/L. So for example, for a fixed value of channel length L, if the width W is doubled, the current carrying capability of the CNTFET device is doubled; if W is four times as wide, the current carrying capability of the CNTFET device is four times as much; and so on. Also, for the same values of W and L, if the nanotube fabric density is increased by a factor of 2, the NTFC is increased by a factor of 2 and the current carrying capability of a corresponding CNTFET device is doubled for the same device dimensions. In other words the current density per unit width of the device has increased by a factor of 2. Having defined a NTFC, the value of the NTFC may be measured for a device of known dimensions with known currents flowing when known voltages are applied as illustrated in Equation 6.2 for a pCNTFET for example. Also, the relative values of nanotube fabric constants for both n and p-type CNTFET may be measured using an ambipolar CNTFET such that both p and n-mode CNTFET device operations use the same NT fabric and dimensions and the ratio of nCNTFET to pCNTFET may be determined as described further below with respect to FIG. 18. With p-type CNTFET device nanotube fabric constant $NTFC_P$ and n-type CNTFET device nanotube fabric constant $NTFC_N$ known for a given fabric, current equations may be used to design various CNTFET-based complementary circuits (using both pCNTFET and nCNTFET devices) selecting device widths and lengths based on the nanotube fabric constants and dielectric constant, threshold voltages, and applied voltages as described further below with respect to complementary CNTFET-based inverter circuits and complementary CNTFET-based NAND circuits described further below. As reflected by Eq. 4.9 below, NTFC has units of cm/V·s. Along with the quantity NTFC, the quantities $\varepsilon_R$ (the relative dielectric constant of the insulating layer of dielectric material), $\varepsilon_0$ (the permittivity of free space 8.85× $10^{-14}$ F/cm), $t_G$ (the distance between the gate conductor and the nanotube fabric), and $R_{NT}$ (the radius of a cylindrical nanotube) are essentially constants and can be used in calculating a current-voltage relationship for a CNTFET. The geometric parameter of width-to-length ratio (W/L) is typically a design variable for a CNTFET to produce a desired current-voltage characteristic and therefore is not a constant when calculating a current-voltage relationship. In particular, W/L, and W and L individually, are parameters that a designer would like to determine based upon desired voltage and current characteristics that can be specified. In other words, for given desired voltage and current characteristics, we seek equations that will provide W/L, such that W and L (dimensional characteristics of CNTFETs) can then be suitably determined and/or adjusted to provide the desired dimensional layout and operational characteristics.

In Equation 2.3 below, λ is a multiplier that may range from 0 to 0.1. The λ multiplier is an adjustable factor described further in Baker et al., "CMOS", IEEE Press, 1997 pp. 96-98, which is hereby incorporated by reference. A recommended value for λ is λ=0 for digital circuits, and λ can be measured for analog circuits, such as described in Baker et al. For digital circuits described herein, λ can be taken as equal to zero.

With those preliminary comments in mind, equations for CNTFETs that relate current and voltage with W and L are as follows. These equations are used further below to derive design equations appropriate for p-type devices and design equations appropriate for n-type devices.

Equation for Non-Saturation Region ($V_{DS} < V_{GS} - V_T$):

$$I_{DS} = [(W/L) \cdot NTFC \cdot (2\pi\varepsilon_R\varepsilon_0/\ln(2t_G/R_{NT}))] \cdot [(V_{GS} - V_T)V_{DS} - V^2_{DS}/2].$$ [EQ 2.1]

Equation for Non-Saturation–Saturation Region Boundary at $V_{GS} - V_T = V_{DS,SAT}$:

$$I_{DS} = [(W/L) \cdot NTFC \cdot (2\pi\varepsilon_R\varepsilon_0/\ln(2t_G/R_{NT}))] \cdot [(V_{GS} - V_T)^2/2].$$ [EQ 2.2]

Equation for Saturation Region ($V_{DS} > V_{GS} - V_T$):

$$I_{DS} = [(W/L) \cdot NTFC \cdot (2\pi\varepsilon_R\varepsilon_0/\ln(2t_G/R_{NT}))] \cdot [(V_{GS} - V_T)V_{DS} - V^2_{DS}/2] \cdot [1 + \lambda(V_{DS} - V_{DS,SAT})].$$ [EQ 2.3]

Design Equations

Figure 4:
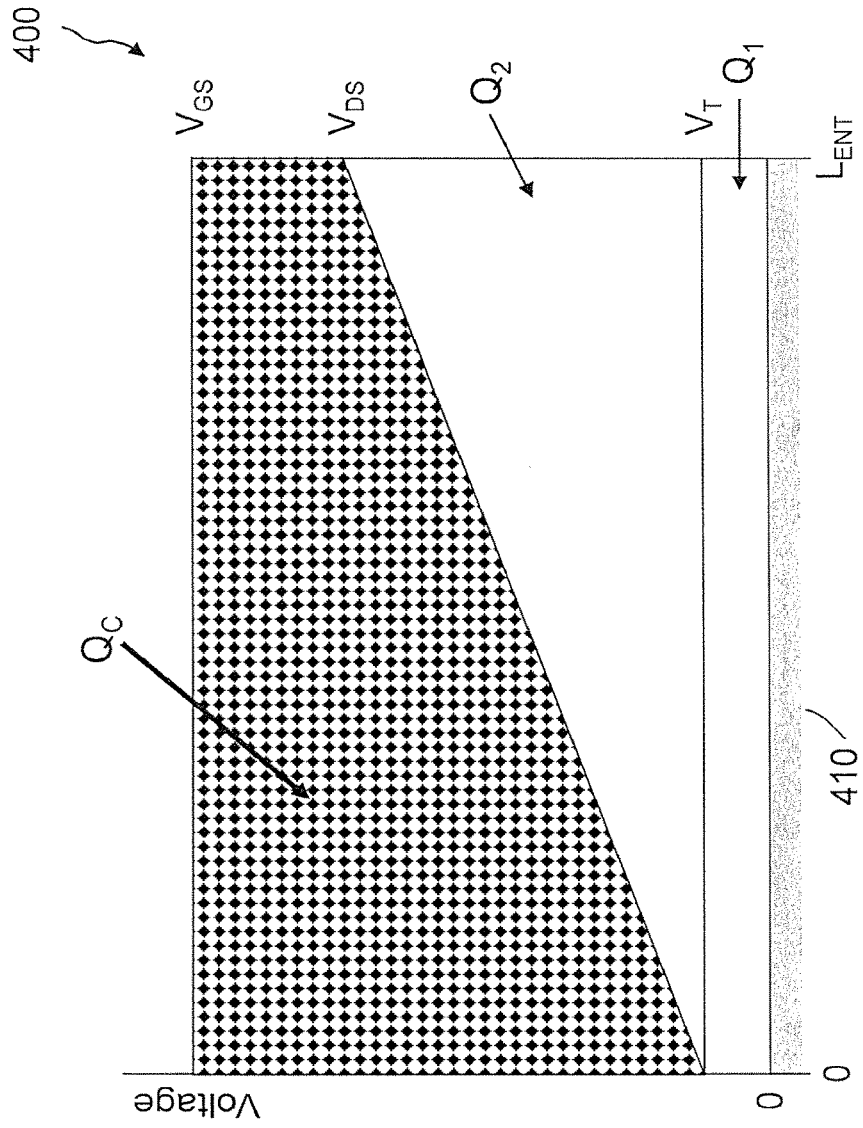
FIG. 4 illustrates a charge induced in a nanotube fabric in a gate region of an exemplary CNTFET.

FIG. 4 shows a charge-in-transit $Q_C$ 400 induced in a nanotube fabric 410 in a channel region of an nCNTFET having a source terminal connected to ground and a drain terminal connected to a voltage source. The charge induced between the gate conductor and the nanotube fabric is calculated using $Q = N_{ENT} \cdot C \cdot V$, where $N_{ENT}$ is the number of nanotubes in the channel region, C is the simplified calculation of the capacitance per unit length for CNTFETs constructed with a low density nanotube fabric, and V is the voltage difference between the nanotube fabric and the gate conductor. The amount of charge induced in the nanotube fabric decreases from the source terminal to the drain terminal because the voltage difference between the gate conductor and the nanotube fabric decreases from the source terminal to the drain terminal. The voltage drop from the nanotube fabric near the source terminal to the nanotube fabric near the drain terminal is modeled by a linear approximation for relatively long channels. The charge-in-transit $Q_C$ induced in the nanotube fabric is approximated by subtracting $Q_1$ and $Q_2$ from $Q_T$ as shown in Eq. 4.1. Where $Q_1$ is induced charge lost due to the threshold voltage $V_T$, where $V_T$ is determined by the insulating layer thickness and the materials used to construct a CNTFET as shown in Eq. 4.2, $Q_2$ is induced charge lost due to the voltage drop across the nanotube fabric as shown in Eq. 4.3, and $Q_T$ is induced charge without any loss as shown in Eq. 4.4. The calculation for charge-in-transit $Q_C$ induced in the nanotube fabric can be simplified to Eq. 4.5 considering the following:

$$Q_C = Q_T - Q_1 - Q_2,$$ [EQ 4.1]

$$Q_1 = N_{ENT} \cdot (2\pi\varepsilon_R\varepsilon_0 L_{ENT}/\ln(2t_G/R_{NT})) \cdot V_T,$$ [EQ 4.2]

$$Q_2 = N_{ENT} \cdot (2\pi\varepsilon_R\varepsilon_0 L_{ENT}/\ln(2t_G/R_{NT})) \cdot V_{DS}/2,$$ [EQ 4.3]

$$Q_T = N_{ENT} \cdot (2\pi\varepsilon_R\varepsilon_0 L_{ENT}/\ln(2t_G/R_{NT})) \cdot V_{GS},$$ [EQ 4.4]

$$Q_C = N_{ENT} \cdot (2\pi\varepsilon_R\varepsilon_0 L_{ENT}/\ln(2t_G/R_{NT})) \cdot [V_{GS} - V_T - V_{DS}/2].$$ [EQ 4.5]

The current $I_{DS}$ flowing through the nCNTFET can then be calculated based on the charge-in-transit $Q_C$ between the drain and source for the nCNTFET divided by a transit time τ for charges flowing between the drain and source. The transit time τ is calculated as shown in Eq. 4.6, where $L_{ENT}$ is the effective nanotube length, u is a mobility constant, and $V_{DS}$ is the voltage between the drain and the source. The current $I_{DS}$ is then calculated as the ratio of $Q_C$ to τ as illustrated by Eq. 4.7 and Eq. 4.8. The charge in transit $Q_C$ is a function of the CNTFET device geometry and the applied voltage. The voltage between source and drain is assumed to be linear (negligible short channel effects for example). The charge-in-transit $Q_C$ given by Eq. 4.5 and the transit time τ given by Eq. 4.6 are, for $V_{GS} \geq V_T$ and $V_{DS} < V_{GS} - V_T$:

$$\tau = L_{ENT}^2/\mu \cdot V_{DS},$$ [EQ 4.6]

$$I_{DS} = Q_C/\tau, \text{ and}$$ [EQ 4.7]

$$I_{DS} = [(N_{ENT} \cdot \mu/L_{ENT}) \cdot (2\pi\varepsilon_R\varepsilon_0/\ln(2t_G/R_{NT}))] \cdot [(V_{GS} - V_T)V_{DS} - V^2_{DS}/2].$$ [EQ 4.8]

A nanotube fabric constant in cm/V·s can be calculated per square of nanotube fabric from Eq. 4.9, where $N_{ENT}$ is effective number of nanotubes in the channel region, $\mu_{FM}$ is the fabric mobility constant, $L_{ENT}$ is the effective nanotube length, W is the width of the channel region as depicted in FIG. 3A, and L is the length of the channel region as depicted in FIG. 3A. The current $I_{DS}$ in Eq. 4.8 can be then rewritten in terms of the nanotube fabric constant NTFC and the CNTFET channel length L and width W dimensions as illustrated by Eq. 4.10. The current $I_{DSp}$ for pCNTFET devices is given by Eq. 4.11 and the current $I_{DSn}$ for nCNTFET devices is given by Eq. 4.12. For calculations further below, $t_G$ and $R_{NT}$ can be taken as the same for p-type and n-type CNTFET devices and $|V_{TP}| = V_{TN}$. Thus:

$$N_{ENT} \cdot \mu_{FM}/L_{ENT} = (W/L) \cdot NTFC, \text{ and}$$ [EQ 4.9]

$$I_{DS} = [(W/L) \cdot NTFC \cdot (2\pi\varepsilon_R\varepsilon_0/\ln(2t_G/R_{NT}))] \cdot [(V_{GS} - V_T)V_{DS} - V^2_{DS}/2].$$ [EQ 4.10]

For a pCNTFET Device:

$$I_{DSp} = [(W_P/L_P) \cdot NTFC_P \cdot (2\pi\varepsilon_R\varepsilon_0/\ln(2t_G/R_{NT}))] \cdot [(V_{GS} - V_{TP})V_{DS} - V^2_{DS}/2].$$ [EQ 4.11]

For an nCNTFET Device:

$$I_{DSn} = [(W_N/L_N) \cdot NTFC_N \cdot (2\pi\varepsilon_R\varepsilon_0/\ln(2t_G/R_{NT}))] \cdot [(V_{GS} - V_{TN})V_{DS} - V^2_{DS}/2].$$ [EQ 4.12]

Figure 5A:
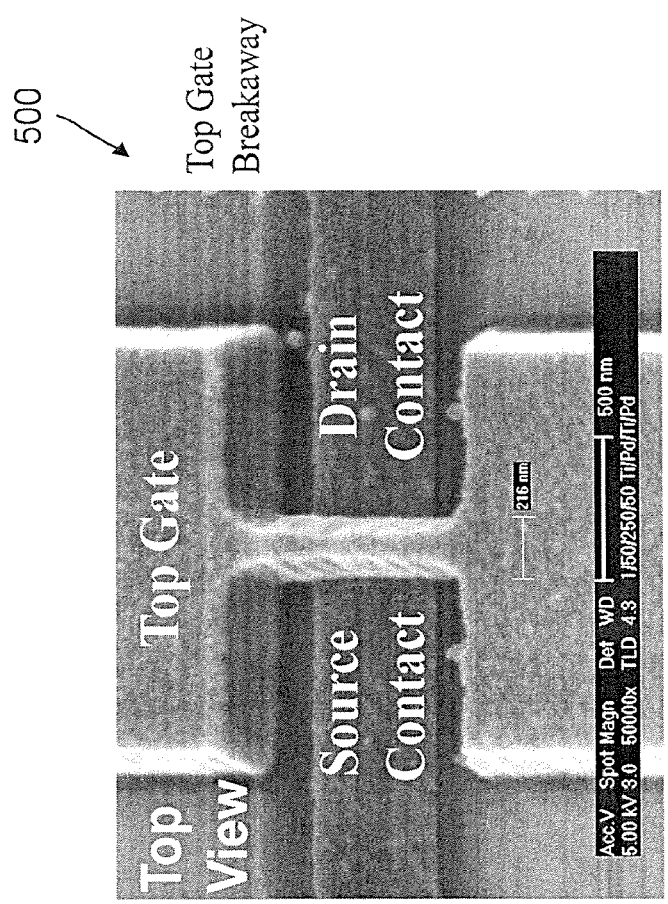
FIG. 5A illustrates a top view of an exemplary pCNTFET device.
Figure 5B:
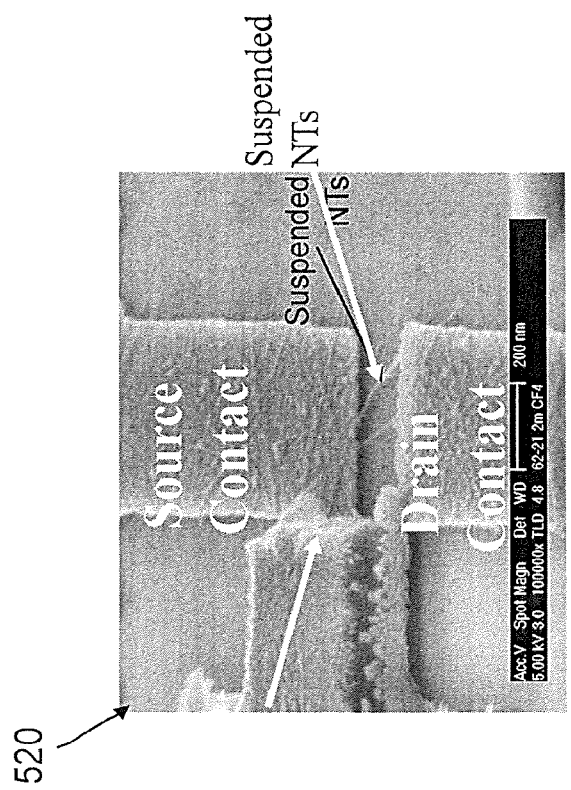
FIG. 5B illustrates a top gate breakaway view of an exemplary pCNTFET device.
Figure 5C:
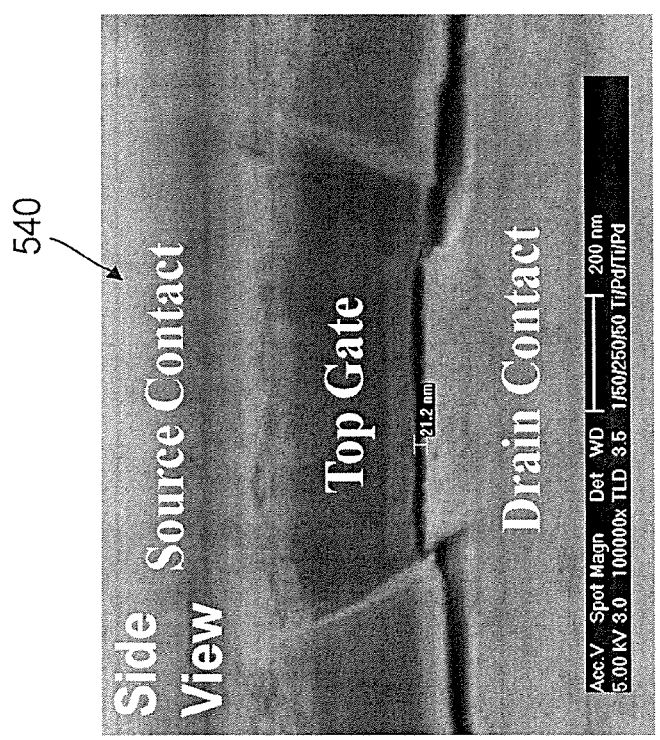
FIG. 5C illustrates a side view of an exemplary pCNTFET device.

FIGS. 5A-5C illustrate a top view of a pCNTFET device 500, a top gate breakaway view of a pCNTFET device 520, and side view of a pCNTFET device 540. FIG. 5D illustrates a cross section of a pCNTFET 560 constructed on a silicon substrate 562. The pCNTFET has an insulating layer 564 deposited on the silicon substrate 562, an insulator 566 deposited on the insulating layer 564, a source conductor 568, a suspended CNT fabric 570, a gate conductor 572, and a drain conductor 574. A gate insulator between the gate conductor 572 and the suspended CNT fabric 570 is not shown, however the relative dielectric constant of the gate insulator is $\varepsilon_R = 1$. The channel region of the pCNTFET has a length of 200 nm and a width of 400 nm and the distance between the gate conductor and the suspended CNT fabric is 20 nm. The electrical characteristics of the pCNTFET 560 device and the materials used for construction are described in greater detail in US Patent Application Publication No. US 20060183278 and U.S. Pat. No. 7,598,544. Further, US Patent Application Publication No. US 20060183278 and U.S. Pat. No. 7,598,544 illustrate the possible use of a back gate in addition to a top gate. The use of a back gate is compatible with disclosed inverter circuit or NOT gate and NAND circuit; however no back gate is required or assumed.

Figure 5E:
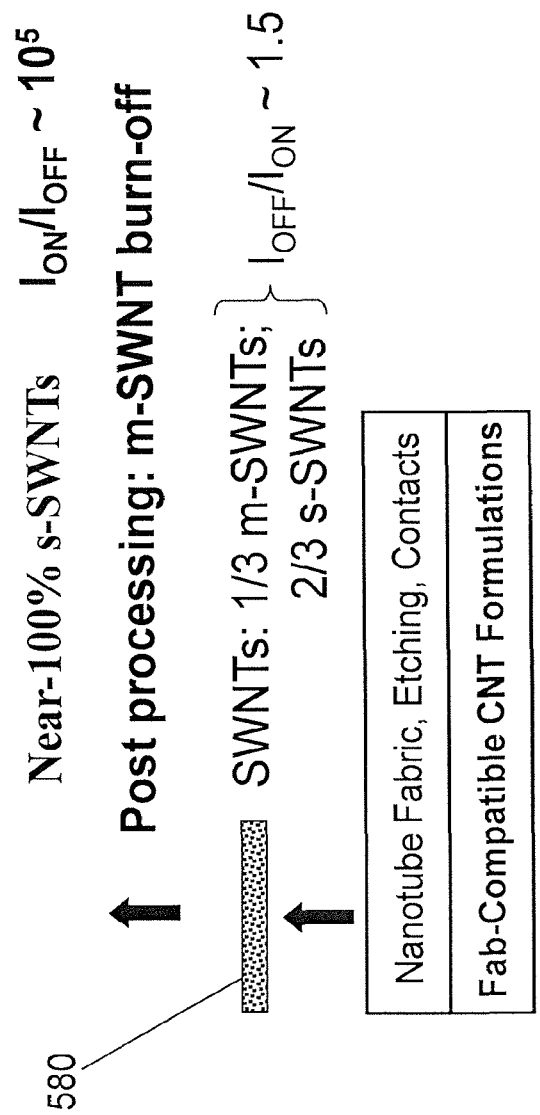
FIG. 5E illustrates a flow chart for an exemplary method of fabrication of a CNTFET that includes post processing on the nanotube fabric used in construction of the CNTFET.

FIG. 5E illustrates a flow chart for a method of fabrication for a CNTFET that includes post processing on the nanotube fabric 580 used in construction of the CNTFET. The nanotube fabric 580 as described in detail in US Patent Application Publication No. US 20060183278 may comprise mostly single wall nanotubes (SWNTs) with approximately ⅓ metallic and ⅔ semiconducting nanotubes. Metallic SWNT burn-off can be used as a post processing method to eliminate metallic nanotubes in the nanotube fabric; however chemical post processing may be used on the nanotube fabric as described in U.S. application Ser. No. 12/536,736 to eliminate metallic nanotubes. If a source of near-100% mostly semiconducting SWNTs is available, then near-100% semiconducting SWNT fabric may be deposited that does not require post processing. The CNTFET prior to metallic SWNT burn-off may have an $I_{ON}/I_{OFF}$ ratio of 1.5 due the metallic SWNTs creating a conducting path between the source and drain terminals regardless of the state of the CNTFET; however once metallic SWNT burn-off is complete the CNTNET may have an $I_{ON}/I_{OFF}$ ratio of $10^5$. Metallic SWNT burn-off is described in detail further below with respect to FIG. 6.

Figure 5F:
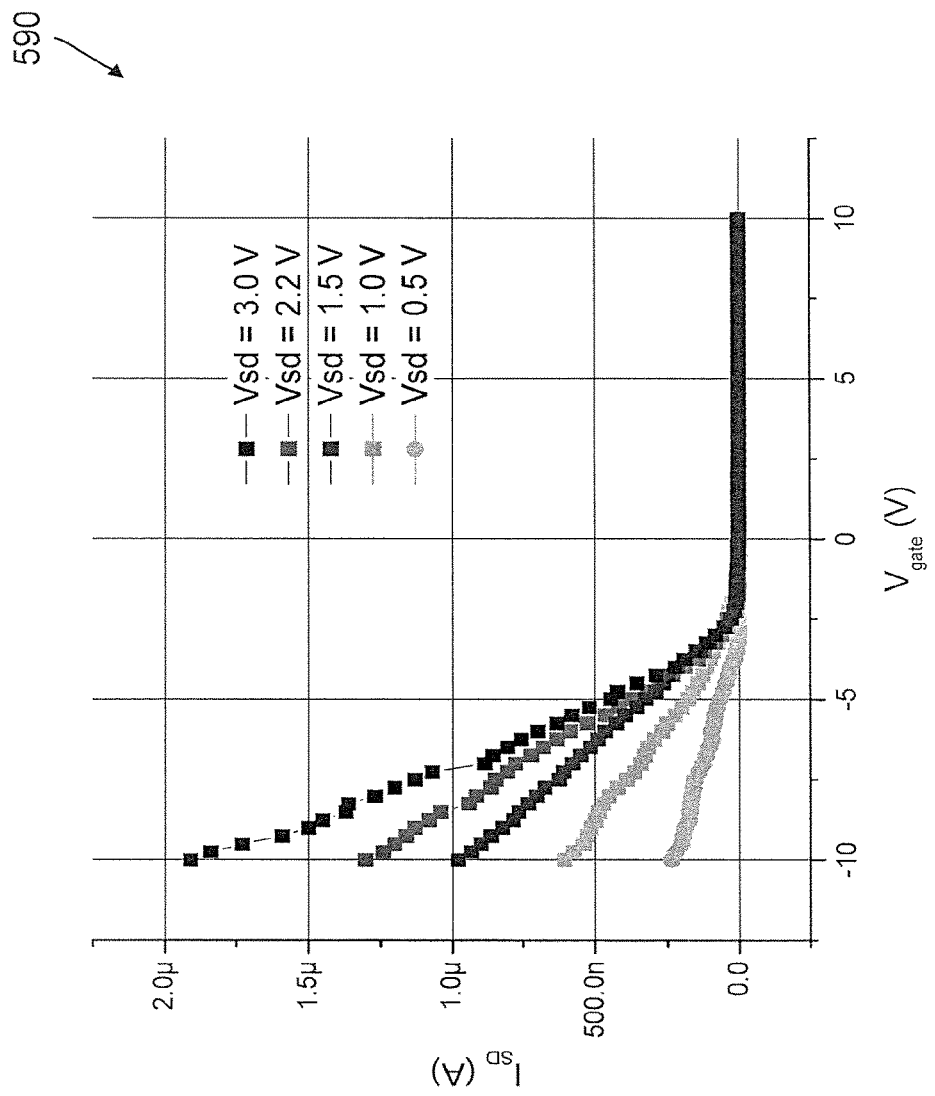
FIG. 5F illustrates current voltage characteristics for an exemplary pCNTFET.

After the metallic SWNT burn-off is complete pCNTFET devices remain as illustrated by pCNTFET current voltage characteristics 590 shown in FIG. 5F and also in Bertin et al. U.S. Pat. No. 7,598,544, which is hereby incorporated by reference. The pCNTFET current voltage characteristics 590 shows that with gate to source voltage equal to zero, the corresponding pCNTFET device is OFF and begins to turn on at a threshold voltage of approximately −2.5 volts. That is, the corresponding pCNTFET device begins to turn ON when the gate voltage is 2.5 volts below the source voltage. The pCNTFET devices may be left as pCNTFETs, or may be converted to ambipolar CNTFETs and/or to nCNTFETs by applying heat to the entire assembly or by selectively passing elevated currents for extended periods through the semiconducting channel region of pCNTFET devices as described in U.S. Pat. No. 7,598,544. Such an ambipolar CNTFET can be used to measure voltages and currents used to calculate both $NTFC_N$ and $NTFC_P$ as described further below; therefore, device dimensions and materials used can be identical for both n-type and p-type modes of operation, which eliminates these variables when comparing NTFC values. Alternatively, chemical processes such as ion implantation followed by annealing may be used instead to convert pCNTFETs to ambipolar CNTFETs and/or to nCNTFETs as described in U.S. application Ser. No. 12/536,736. A combination of pCNTFETs and nCNTFETs may be combined to form CNTFET inverter circuits or NOT gates as described further below.

The calculation of NTFCp for the pCNTFET device illustrated in FIG. 5D is based on the measured pCNTFET device electrical results, the device geometry, and the known permittivity of free space $\varepsilon_0 = 8.85 \times 10^{-14}$ F/cm. The nanotube fabric constant NTFCp (eqs. 6.1 and 6.2) is $4 \times 10^5$ cm/V-s for the nanotube fabric can be used for the pCNTFET devices illustrated in U.S. Pat. No. 7,598,544. The ratio of $NTFC_N/NTFC_P = 2$ as described further below with respect to equation 6.8, then $NTFC_N = 8 \times 10^5$ (Eq. 6.3). Current equations for pCNTFET and nCNTFET devices are shown by eqs. 6.4 and 6.5, respectively.

Results of measurements for an exemplary pCNTFET with suspended carbon nanotubes are as follows:
$L_{ENT} = 0.2$ um (200×10−7 cm); $I_{DS} = 1$ μA;
W=0.4 um; $V_T = 2.5$ V;
$t_G = 20$ nm; $V_{GS} = 10$ V;
$d_{NT} = 1$ nm; $V_{DS} = 1.5$ V;
$\varepsilon_R = 1$.

Thus, $$I_{DSp} = [(W_P/L_P) \cdot NTFC_P \cdot (2\pi\varepsilon_R\varepsilon_0/\ln(2t_G/R_{NT}))] \cdot [(V_{GS} - |V_{TP}|)V_{DS} - V^2_{DS}/2],$$ [EQ 4.11]

$$NTFC_P = (L_P/W_P) \cdot I_{DS}/[(2\pi\varepsilon_R\varepsilon_0/\ln(2t_G/R_{NT})) \cdot ((V_{GS} - |V_{TP}|)V_{DS} - V^2_{DS}/2)],$$ [EQ 6.1]

$$NTFC_P = (0.2/0.4) \cdot 1 \times 10^6/[(2\pi \cdot 1 \cdot \varepsilon_0/\ln(2 \times 20/0.5)) \cdot ((10-2.5)1.5 - (1.5)^2/2)],$$

and $$NTFC_P = 4 \times 10^5 \text{ cm}/V \cdot s,$$ [EQ.6.2]

as measured for an exemplary device such as disclosed in U.S. Pat. No. 7,598,544.

Using the measured ratio $NTFC_N/NTFC_P = 2$ described further below with respect to equation 6.8, the following parameters for p and n NTFC constants can be obtained:

$$NTFC_P = 4 \times 10^5 \text{ cm}/V \cdot s,$$ [EQ 6.2]

$$NTFC_N = 8 \times 10^5 \text{ cm}/V \cdot s.$$ [EQ 6.3]

The current equation for a pCNTFET device can be given by:

$$I_{DSp} = [(W_P/L_P) \cdot 4 \times 10^5 \cdot (2\pi\varepsilon_R 8.85 \times 10^{-14}/\ln(2t_G/R_{NT}))] \cdot [(V_{GS} - |V_{TP}|)V_{DS} - V^2_{DS}/2], \text{ and}$$

$$I_{DSp} = [(W_P/L_P) \cdot 0.45 \cdot \varepsilon_R/\ln(t_G/d_{NT}))] \cdot [(V_{GS} - |V_{TP}|)V_{DS} - V^2_{DS}/2]\mu A.$$ [EQ 6.4]

The current equation for an nCNTFET device can be given by:

$$I_{DSn} = [(W_N/L_N) \cdot 8 \times 10^5 \cdot (2\pi\varepsilon_R 8.85 \times 10^{-14}/\ln(2t_G/R_{NT}))] \cdot [(V_{GS} - V_{TN})V_{DS} - V^2_{DS}/2], \text{ and}$$

$$I_{DSn} = [(W_N/L_N) \cdot 0.45 \cdot \varepsilon_R/\ln(t_G/R_{NT}))] \cdot [(V_{GS} - V_{TN})V_{DS} - V^2_{DS}/2]\mu A.$$ [EQ 6.5]

Figure 6:
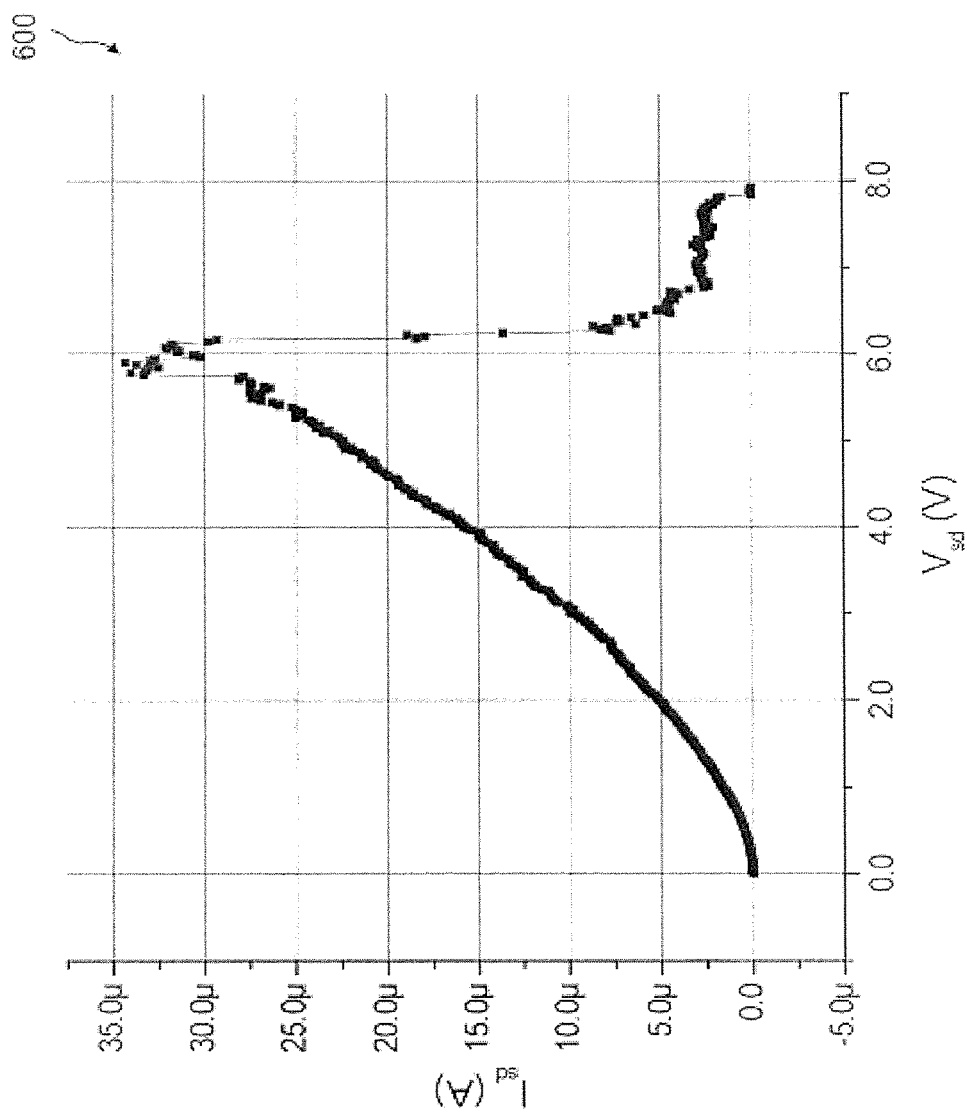
FIG. 6 illustrates exemplary burn-off I-V characteristics for burn-off of metallic SWNTs.

In order to calculate the capacitance of CNTFET devices, the effective number of nanotubes in the channel region is needed. FIG. 6 illustrates the burn-off current-voltage characteristics 600 for burn-off of metallic SWNTs and the number of semiconducting nanotubes can be estimated based on the burn-off current measured on the pCNTFET illustrated in FIG. 5D.

An estimate of the number of Effective Semiconducting SWNTs (s-SWNTs) can be determined as follows:

$I_{B\text{-}OFF \text{ }CURRENT \text{ }DENSITY/NT} \sim 10^9$ A/cm$^2$; $d_{NT} \sim 1$ nm;

CNT cross section area $\sim \pi(d_{NT}/2)^2 = 0.785 \times 10^{-14}$ cm$^2$;

$I_{B\text{-}OFF/NT} \sim 7.85$ μA;

$I_{B\text{-}OFF} \sim 30$-$35$ μA for metallic SWNTs;

Metallic SWNTs~4;

Semiconducting SWNTs~2×#Metallic SWNTs; and

Semiconducting SWNTs after Burn-Off~8.

For the pCNTFET exemplary devices of U.S. Pat. No. 7,598,544, using the effective number of nanotubes $N_{ENT} = 8$ in a channel region, and using width W=400 nm=0.4 um, one can determine that each nanotube has an effective length of $L_{ENT} = 200$ nm=0.2 um. The gate to fabric capacitance $C_{GF}$ is given by Eq. 7.1 where W and L are W=0.4 um and $L_{ENT} = 0.2$ um. Therefore, the pCNTFET device of U.S. Pat. No. 7,598,544 has 8 effective semiconducting SWNTs in W=400 nm×L=200 nm fabric region.

For nanotube fabrics, the electric field can be taken as the sum of the individual nanotube fringing fields, while also considering diffusion capacitance. A calculation of capacitance for SWNT of effective nanotube length $L_{ENT}$ can be given by $$C_{G\text{-}1N}=2\pi\varepsilon_R\varepsilon_0 L_{ENT}/\ln(2t_G/R_{NT})$$

for $t_G > 2\,d_{NT}$, where $t_G$=Gate-CNT separation and $d_{NT}$=NT diameter.

For $L_{ENT}$=200 nm and $\varepsilon_0$=8.85×10$^{-14}$ F/cm, it can be found that:

$$C_{G\text{-}1N}=2\pi\varepsilon_R 8.85\times 10^{-14}\times 200\times 10^{-7}/\ln(2t_G/R_{NT}),\text{ and}$$

$$C_{G\text{-}1N}=11.1\times\varepsilon_R/\ln(2t_G/R_{NT})\text{ aF for }L_{ENT}\text{=0.2 um long nanotube.}$$

A calculation of capacitance for a 0.2 um×0.4 um fabric region of the exemplary device of US Patent Application Publication No. US 20060183278 can be given as follows (assuming that there are effectively eight semiconducting CNTs in 0.08 um² NT fabric area), where W & L are in μm:

$$C_{GF}=8\times 11.1\times\varepsilon_R/\ln(2t_G/R_{NT})\text{ aF for a 0.08 um}^2\text{ NT fabric region;}$$

$$C_{GF}/\text{um}^2=88.8/0.08\times\varepsilon_R/\ln(2t_G/R_{NT})\text{ aF;}$$

$$C_{GF}/\text{um}^2=1.1\times\varepsilon_R/\ln(2t_G/R_{NT})\text{ fF/um}^2;\text{ and}$$

$$C_{GF}=W\cdot L[1.1\varepsilon_R/\ln(2t_G/R_{NT})]\text{ fF.} \quad [\text{EQ 7.1}]$$

Figure 7:
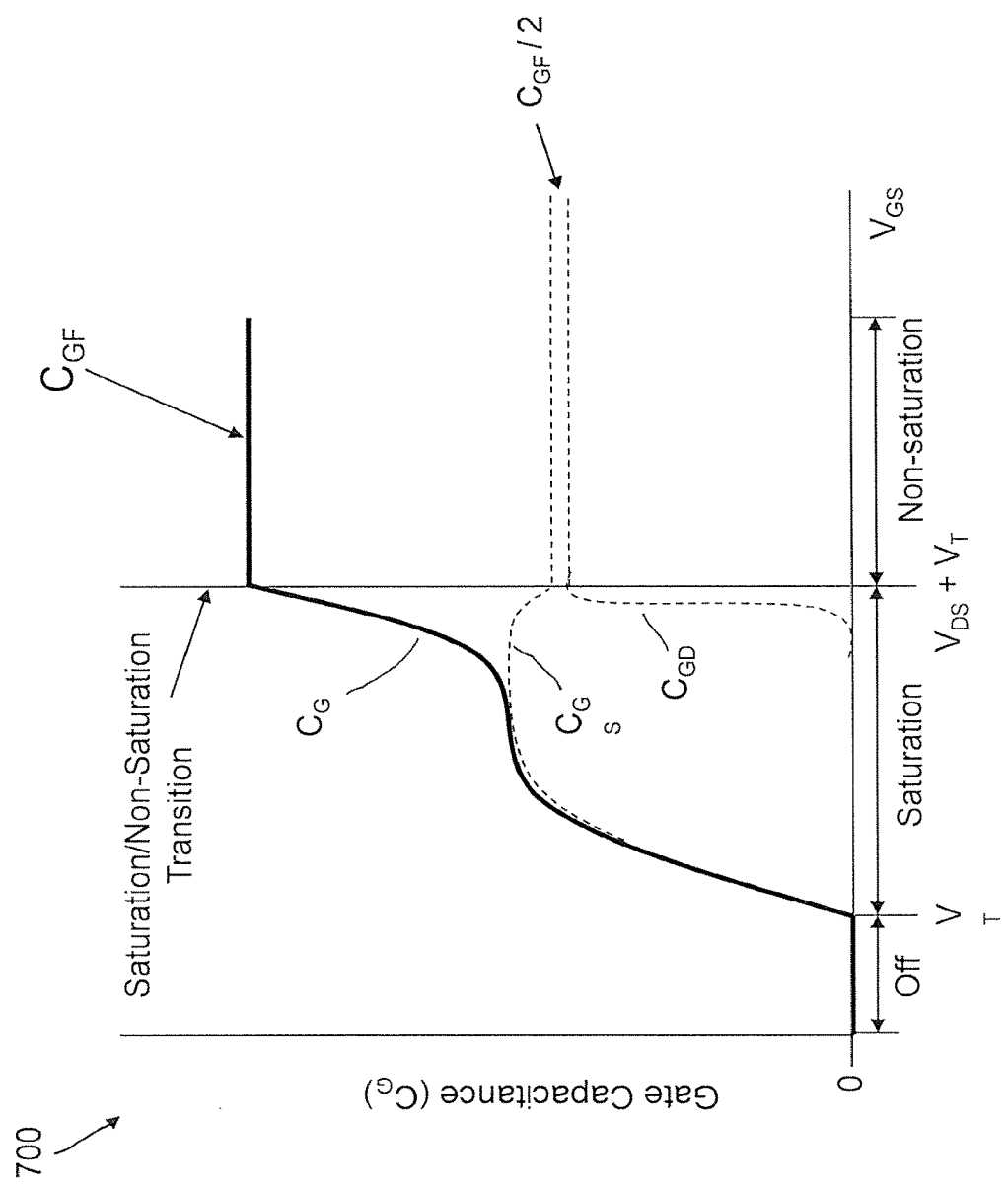
FIG. 7 illustrates gate capacitance vs. gate to source voltage for an exemplary CNTFET.

FIG. 7 shows graphical representation 700 of gate capacitance vs gate to source voltage for a CNTFET where the gate capacitance shown does not include the gate to source overlap capacitance or gate to drain overlap capacitance, and further there is diffusion capacitance. The gate-to-fabric capacitance $C_{GF}$ shown in FIG. 7 is calculated by Eq. 7.1 and overlap capacitance $C_{OL}$ not shown in FIG. 7 is calculated by Eq. 7.2. The overlap capacitance $C_{OL}$ is a function of the spacers 268, 270, shown in FIG. 2B, of the CNTFET where $\varepsilon_{SW}$ is the relative dielectric constant of the spacers, $\varepsilon_0$ the permittivity of free space 8.85×10$^{-14}$ F/cm, W is the width of the spacers, $H_{SW}$ is the height of the spacers, and $t_{SW}$ is the thickness of the spacers. The CNTFET device 250, shown in FIG. 2B, is similar to those described in U.S. application Ser. No. 12/536,736, and can be designed such that $C_{OL} \ll C_{GF}$, so Eq. 7.1 can be used for capacitance calculations further below.

A calculation of capacitance of gate-to-NT fabric can be given by:

$$C_{GF}=W\cdot L[1.1\varepsilon_R/\ln(2t_G/R_{NT})]\text{ fF} \quad [\text{EQ 7.1}]$$

where W & L are in μm. A calculation of gate to source and gate to drain overlap capacitance can be given by:

$$C_{OL}=\varepsilon_{SW}\varepsilon_0 W\cdot H_{SW}/t_{SW}. \quad [\text{EQ 7.2}]$$

The calculations that follow assume that $C_{GF} \gg C_{OL}$. The calculation of the fabric mobility for the exemplary nanotube fabric of US Patent Application Publication No. US 20060183278 based on measured electrical characteristic and pCNTFET device geometry can be illustrated by Eqs. 9.1, 9.2, 9.3, and 9.4. Fabric mobility $\mu_{FMp}$=1.3 cm²/V·s. If electron mobility is 3× higher than hole mobility, then an nCNTFET device mobility is $\mu_{FMn}$=3.9 cm2/V·s. U.S. application Ser. No. 12/536,736 describes methods of forming both p and n-type CNTFETs in nanotube fabrics. Exemplary parameters applicable to those devices include:

$$TP=L^2_{ENT}/\mu_{FMp}\cdot V_{DS}; \quad [\text{EQ 4.6}]$$

$$I_{DSp}=Q_{P}/TFM_P; \quad [\text{EQ 4.7}]$$

$$\mu_{FMp}=L^2_{ENT/TP}\cdot VDS;\ TFMp=Q_P/I_{DS}; \quad [\text{EQ 9.1}]$$

$$T_p=Q_P/I_{DSP}=N_{ENT}\cdot(2\pi\varepsilon_R\varepsilon_0 L_{ENT}/\ln(2t_G/R_{NT}))\cdot[V_{GS}-V_{TP}-V_{DS}/2]/I_{DSp}. \quad [\text{EQ 9.2}]$$

For exemplary devices such as illustrated in US Patent Application Publication No. US 20060183278:

L=0.2 um & W=0.4 um, $N_{ENT}$=8 semiconducting CNTs;

$\varepsilon_R$=1, $\varepsilon_0$=8.85×10-14 F/cm, $t_G$=20 nm, $d_{NT}$=1 nm;

$I_{DSP}$=1 uA, $V_{GS}$=10 V, |$VTp$|=2.5 V., $V_{DS}$=1.5 V;

$$T_p=Q_P/I_{DSP}=[8\cdot(2\pi\cdot 1\cdot 8.85\times 10^{-14}\text{ F/cm}\times 200\times 10^{-7}\text{ cm}/\ln(80))\cdot(10-2.5-1.5/2)]/1\times 10^{-6};$$

$T_p$=136 ps;

$\mu_{FMp}=L^2_{ENT}/T_p\cdot V_{DS};$ $\mu_{FMp}=(200\times 10^{-7})^2/[136\times 10^{-12}\cdot 1.5];$ $$\mu_{FMp}=2\text{ cm}^2/V\cdot s. \quad [\text{EQ 9.3}]$$

Equation 9.3 includes the effects of two contact resistances between terminals and the CNT fabric in series with the CNTFET channel region. In other words, mobility in the CNT fabric channel region is significantly higher.

Referring to equation 4.9, if NENTp=NENTn; LENTp=LENTn; WP=$W_N$; and $L_P$=$L_N$, then μNTn/μNTp=NTFC$_N$/NTFC$_P$=2. Therefore, $$\mu_{FMp}=4\text{ cm}^2/V\cdot s \quad [\text{EQ 9.4}]$$

A digital model can be developed based on the pCNTFET and nCNTFET devices described further above with respect to FIGS. 1A-B, 2A-B, 3A-B, 5A-F, 6-8 and 9A-B, similar to that described in Baker et al., "CMOS: Circuit Design, Layout, and Simulation", IEEE Press, 1998. Chapters 10 and 11 present simple digital models based on physical FET device parameters that compare well with computer simulations. These models may be adapted to CNTFET devices as described further below.

Figure 8:
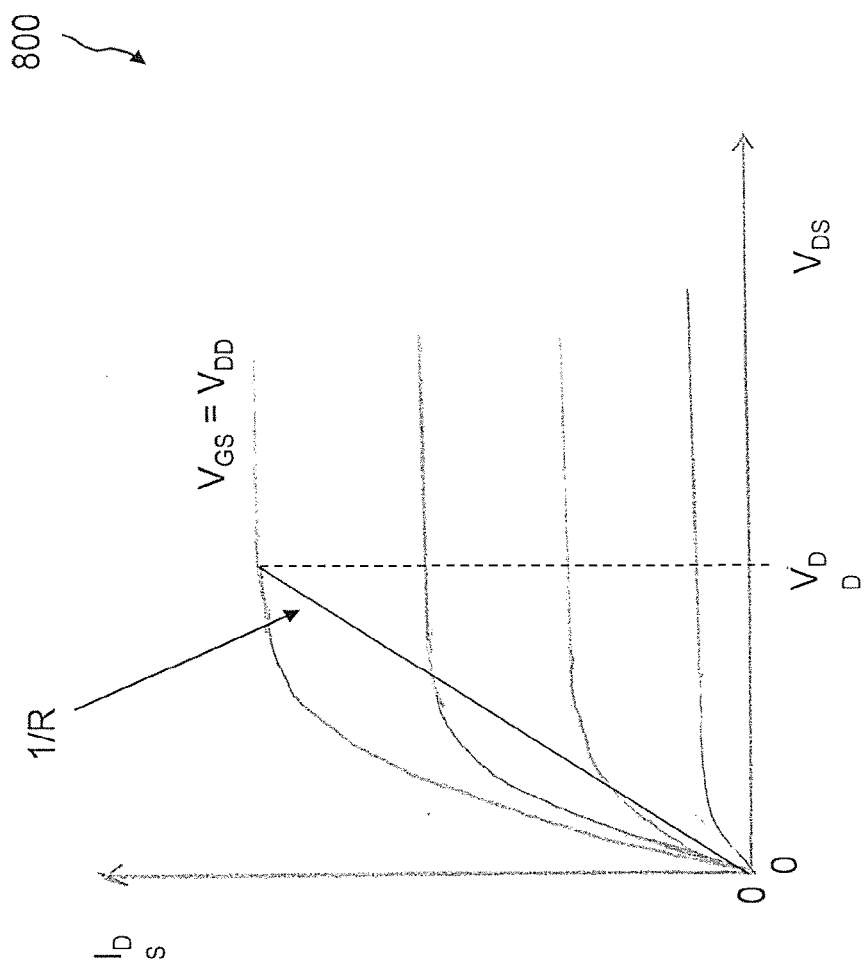
FIG. 8 illustrates an $I_{DS}$ vs $V_{DS}$ characteristic for an exemplary CNTFET device.

FIG. 8 illustrates an $I_{DS}$ vs $V_{DS}$ characteristic 800 for a CNTFET device. An approximation of the switching characteristics based on a resistance R approximation may be used as part of a model for CNTFET devices. Exemplary resistance values for a pCNTFET device with the nanotube fabric characteristics of a U.S. Pat. No. 7,598,544 device is calculated below, but with an insulator of thickness $t_G$=7 nm and $\varepsilon_R$=4 for both p-type and n-type CNTFETs. The pCNTFET width Wp=2 Wn and Lp=Ln in the embodiment below. The resistance R is the same for both pCNTFET and nCNTFET devices; Rp=Rn=1.4 MΩ. Thus:

$R=V_{DS}/I_{DS};$ $I_{DS}=[(W/L)\cdot NTFC\cdot(2\pi\varepsilon_R\varepsilon_0/\ln(2t_G/R_{NT}))]\cdot[(V_{GS}-V_T)^2/2];$ at $V_{GS}$=$V_{DD}$;

$$R=V_{DD}/([(W/L)\cdot NTFC\cdot(2\pi\varepsilon_R\varepsilon_0/\ln(2t_G/R_{NT}))]\cdot[(V_{DD}-V_T)^2/2]). \quad [\text{EQ 9.5}]$$

For $R_P$=$R_N$; $W_P$=(NTFC$_N$/WNTC$_P$) $W_N$; $L_P$=$L_N$; $L_P$=$L_N$=0.2 um; $W_N$=0.2 um; $W_P$=0.4 um; $t_G$=7 nm; $d_{NT}$=1 nm; $\varepsilon_R$=4; $V_{DD}$=3.5 V, |$VT_P$|=$V_{TN}$=0.5 V:

$R_P$=3.5/{[(0.4/0.2)·4×10$^5$·2·π·4·8.85×10$^{-14}$/ln(2×7/0.5))]·[(3.5−0.5)²/2]};

$R_P$=1.4 MΩ; and $R_N$=1.4 MΩ.

The calculation of the exemplary gate-to-fabric capacitance of the p-type and n-type CNTFET devices is shown below. $C_{GFn}$=53 aF and $C_{GFp}$=106 aF because Wp=2·Wn. $C_{GF}$=W·L [1.1 $\varepsilon_R$/ln(2$t_G$/$R_{NT}$)] fF, where W & L are in μm. For $R_P$=$R_N$; $W_P$=(NTFC$_N$/NTFC$_P$) $W_N$; $L_P$=$L_N$; $L_P$=$L_N$=0.2 um; $W_N$=0.2 um; $W_P$=0.4 um; NTFCN/NTFCP=2; $t_G$=7 nm; $d_{NT}$=1 nm; $\varepsilon_R$=4; $V_{DD}$=3.5 V, |$V_{TP}$|=$V_{TN}$=0.5V:

$$C_{GFn}=(0.2 \cdot 0.2)[1.1 \cdot 4/\ln(2 \times 7/0.5)] \text{ fF};$$

$$C_{GFn}=53 \text{ aF; and}$$

$$C_{GFp}=106 \text{ aF}.$$

FIG. 9A shows an nCNTFET 900 with the parasitic capacitance components depicted as a gate to drain capacitance $C_{GD}$, a gate to source capacitance $C_{GS}$, and a drain to source capacitance $C_{DS}$. The gate to drain capacitance $C_{GD}$ is a nonlinear function of voltage because the gate to drain capacitance $C_{GD}$ creates a feedback loop between the gate and the drain. When the nCNTFET 900 is in a disabled state the gate to drain capacitance $C_{GD}$ is negatively charged because the gate voltage is low and the drain voltage is high and when the nCNTFET 900 is in an enabled state the gate to drain capacitance $C_{GD}$ is positively charged because the gate voltage is high and the drain voltage is low. The application of a voltage step $V_{DD}$ to the gate to change the nCNTFET 900 from the disabled state to the enabled state increases the gate voltage and decreases the drain voltage. Therefore, the feedback loop created by the gate to drain capacitance $C_{GD}$ has a negative gain A=$\Delta$Vds/$\Delta$Vgs=−$V_{DD}$/$V_{DD}$=−1. The well known Miller Effect describes the gate to drain capacitance $C_{GD}$ as seen by the gate terminal during the transition of the nCNTFET 900 from the disabled state to the enabled state or the enabled state to the disabled state as $C_{GD}$=Static Capacitance Value×(1−A), where (1−A) is the Miller Effect term and in the current the static gate-to-drain capacitance will by multiplied by 2 because of the well-known Miller Effect.

Figure 9B:
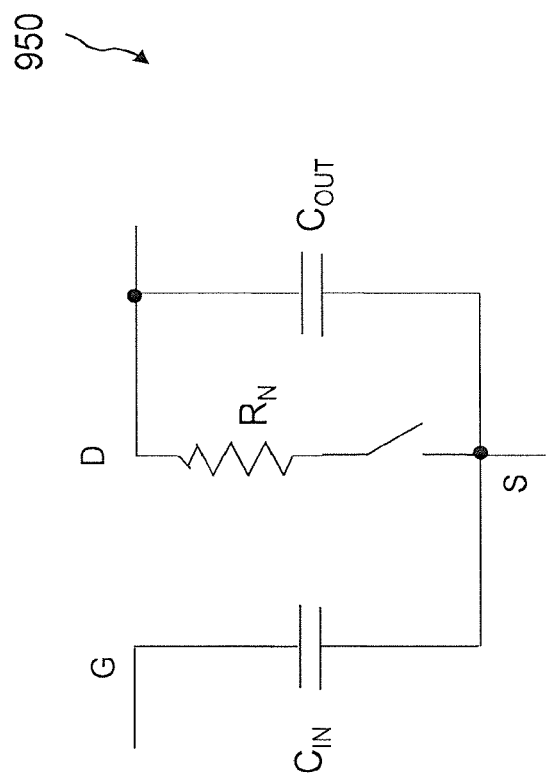
FIG. 9B illustrates a simplified electrical model representing an exemplary nCNTFET.

FIG. 9B shows a simplified electrical model 950 representing an nCNTFET having a resistance $R_N$, half of the gate to fabric $C_{GF}$ capacitance ($C_{GF}$/2) assigned to the gate to drain capacitance $C_{GD}$, and half the gate to fabric $C_{GF}$ capacitance assigned to the gate to source capacitance $C_{GS}$. However, the input capacitance $C_{IN}$ is greater than the gate to fabric capacitance $C_{GF}$ because of the Miller Effect $C_{GD}$=(1−A)($C_{GF}$/2)=2($C_{GF}$/2)=$C_{GF}$, while $C_{GS}$=$C_{GF}$/2. Therefore, the input capacitance $C_{IN}$=$C_{GD}$+$C_{GS}$=(3/2)$C_{GF}$ and the output capacitance $C_{OUT}$=$C_{GF}$.

Figure 10A:
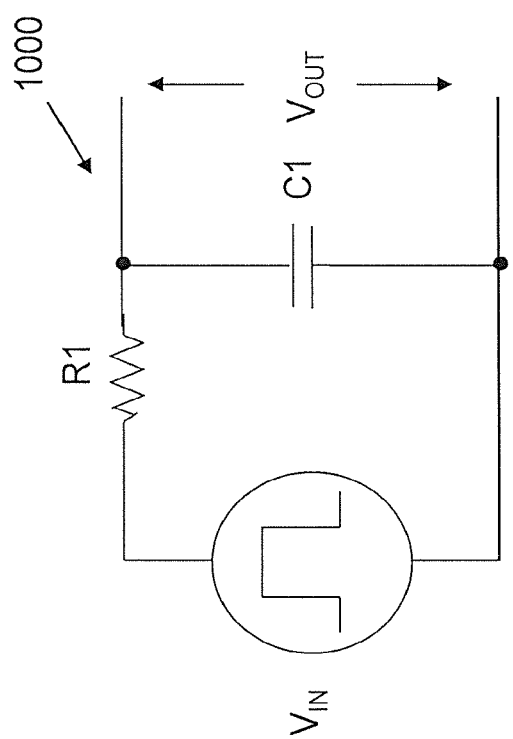
FIG. 10A illustrates an exemplary resistor-capacitor network.

FIG. 10A depicts a resistor-capacitor (RC) network 1000 having a resistor R1 and a capacitor C1. The response of the RC network 1000 to a pulse with rise and fall times much faster than the RC time constant is shown in FIG. 10B. The response of the RC network is described in Baker et al. reference, which is hereby incorporated by reference, as having a rise time response $t_R$=2.2 RC and a delay time $t_D$=0.7 RC. For simplified calculations the rise time response can be approximated as $t_R$=2 RC and the delay time can be approximated as $t_D$=RC. FIG. 10C shows the high-to-low transition delay $t_{DHL}$ and the low-to-high transition delay $t_{DLH}$ for an RC network where the resistance is function of the nCNTFET resistance $R_N$ and the capacitance is a function of the total capacitance $C_{TOT}$ which is the sum of the device output capacitance $C_{OUTn}$ and the load capacitance $C_L$. The waveform repeats with a time periodicity T. Equation 10.1 provides the time constant for an nCNTFET and equation 10.2 provides the time constant for a pCNTFET:

$$t_{DHL}=R_N \cdot (C_{OUT}+C_L)=R_N C_{TOT}, \quad [\text{EQ 10.1}]$$

$$t_{DLH}=R_P \cdot (C_{OUT}+C_L)=R_P C_{TOT} \quad [\text{EQ 10.2}]$$

Figure 11A:
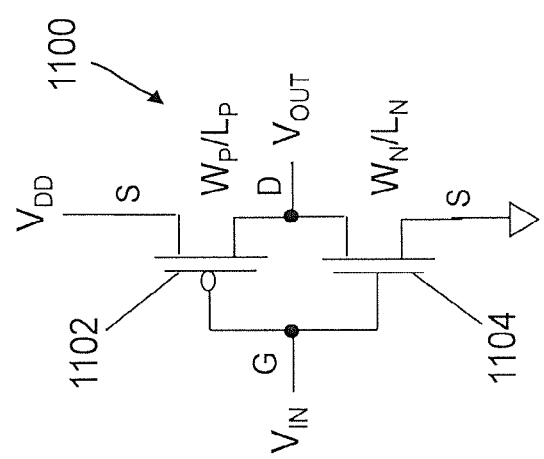
FIG. 11A illustrates an exemplary inverter having a pCNTFET pull-up device and an nCNTFET pull down device.
Figure 11B:
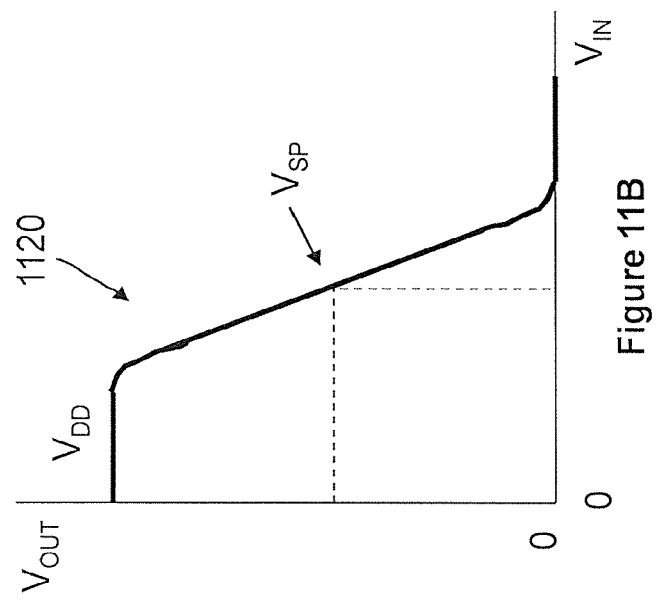
FIG. 11B illustrates exemplary transfer characteristic of an inverter having a pCNTFET pull-up device and an nCNTFET pull down device.

FIG. 11A depicts an inverter 1100 having a pCNTFET pull-up device 1102 with a source S connected to $V_{DD}$, a drain D connected to an output terminal with output voltage $V_{OUT}$, a gate 1102 connected to input G with an input waveform $V_{IN}$, and a width/length ratio Wp/Lp. Inverter 1100 also includes an nCNTFET pull-down device 1104 with a source S connected to GND, a drain D connected to an output terminal with output voltage $V_{OUT}$, a gate 1104 also connected to input G, and a width/length ratio Wn/Ln. In the embodiments described further below, Lp is typically equal to Ln. FIG. 11B shows the CNTFET device transfer characteristic 1120 of inverter 1100 where Lp=Ln, Wp=2 Wn, |$V_{TP}$|=$V_{TN}$, $t_G$ are the and $R_{NT}$ are the same for both p-type and n-type CNTFET devices. Since, the pCNTFET and the nCNTFET are connected in series, $I_{DSp}$=$I_{DSn}$ and the switching point voltage $V_{SP}$ is such that output voltage $V_{OUT}$=$V_{SP}$=$V_{DD}$/2 when input voltage $V_{IN}$=$V_{DD}$/2 as calculated using equations 4.11 and 4.12.

Figure 11D:
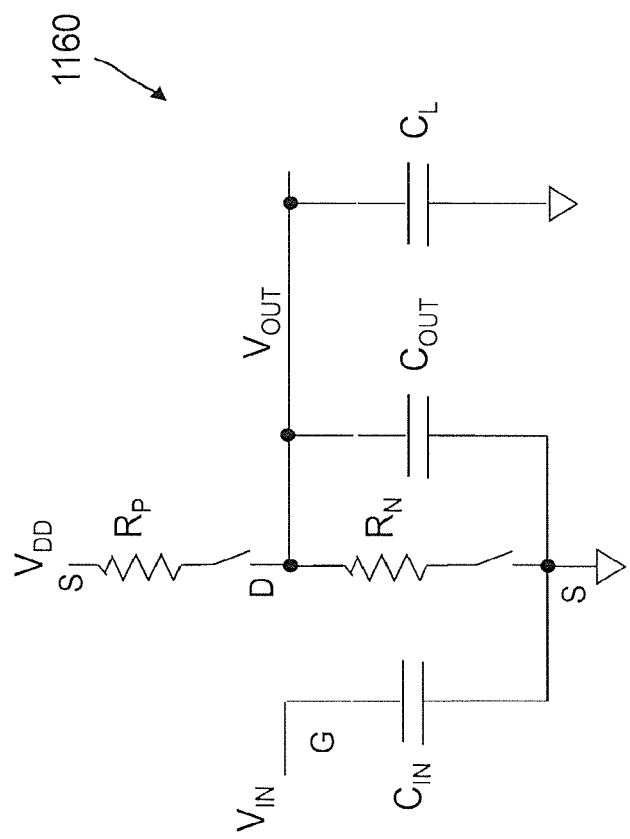
FIG. 11D illustrates an exemplary simplified digital model of an inverter having a pCNTFET pull-up device and an nCNTFET pull down device.

The digital model representation 1140 of inverter 1100 is shown in FIG. 11C with pCNTFET and nCNTFET digital models based on FIG. 9B. The pCNTFET is depicted having a resistance $R_P$ with a series switch which closes when the corresponding threshold voltage is exceeded (but is otherwise open), an input capacitance (3/2) $C_{GFp}$, and an output capacitance $C_{GFp}$, where $C_{GFp}$ is the gate to fabric capacitance for the pCNTFET and the input capacitance is greater than the output capacitance due to the Miller Effect. The nCNTFET is depicted having a resistance $R_N$ with a series switch which closes when the corresponding threshold voltage is exceeded (but is otherwise open), an input capacitance (3/2) $C_{GFn}$, and an output capacitance $C_{GFn}$, where $C_{GFn}$ is the gate to fabric capacitance for the nCNTFET and the input capacitance is greater than the output capacitance due to the Miller Effect. The simplified digital model 1160 of inverter 1100 is shown in FIG. 11D, where $C_{IN}$=(3/2)$C_{GFn}$+(3/2)$C_{GFp}$ $C_{OUT}$=$C_{GFn}$+$C_{GFp}$, and the load capacitance $C_L$.

Figure 12B:
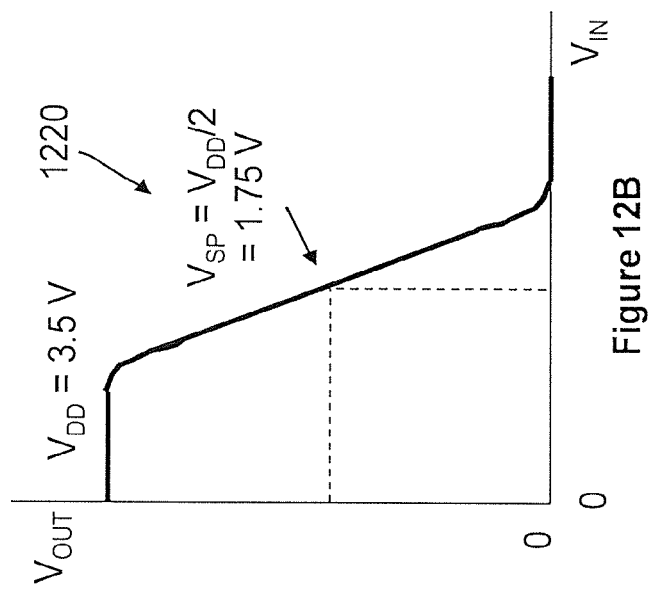
FIG. 12B illustrates an exemplary transfer characteristic of an inverter having a pCNTFET pull-up device and an nCNTFET pull down device according to a specific embodiment of the invention.
Figure 12C:
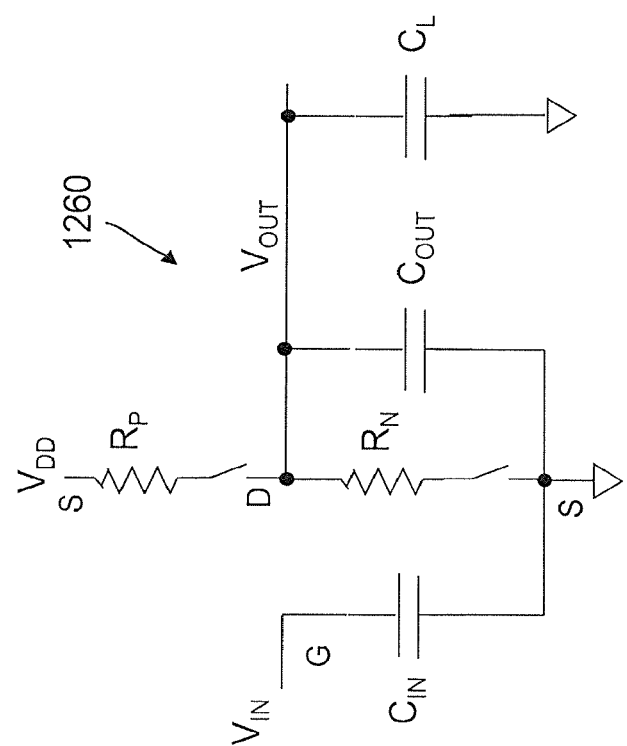
FIG. 12C illustrates an exemplary simplified digital model of an inverter having a pCNTFET pull-up device and an nCNTFET pull-down device according to a specific embodiment of the invention.

FIG. 12A depicts an inverter 1200, corresponding to inverter 1100 depicted in FIG. 11A, having a pCNTFET pull-up device 1202 with width/length ratio=2 and an nCNTFET pull-down device 1204 with width/length ratio=1. FIG. 12B shows the transfer characteristics 1220 of the inverter 1200. The circuit design point for inverter 1200 is chosen such that switching point voltage $V_{SP}$ is equal to half the value of the power supply voltage $V_{DD}$, in this example, $V_{DD}$=3.5 V so $V_{SP}$=1.75V. The switching point $V_{SP}$ is defined such that when inverter 1200 input voltage $V_{IN}$=$V_{SP}$=$V_{DD}$/2, which turns both pCNTFET pull-up device 1202 and nCNTFET pull-down device 1204 to an ON state, the output voltage $V_{OUT}$=$V_{SP}$=$V_{DD}$/2. $W_P$/$L_P$=2 $W_N$/$L_N$ meets the transfer characteristic 1220 design requirements. FIG. 12C shows the corresponding simplified digital model 1260 of inverter 1200 based on CNTFET device characteristics shown in FIG. 12B. As described above the CNTFET inverter model 1260 parameters include Rp=Rn=1.4 MΩ, also, as described further above, $C_{GFn}$=53 aF and $C_{GFp}$=106 aF. Therefore, for inverter digital model 1260, $C_{OUT}$=53+106=159 aF and $C_{IN}$=238 aF. These values are for a minimum size inverter to calculate inherent technology speed. Logic circuits can use larger width to length ratios to achieve performance objectives as illustrated further below.

Exemplary CNTFET device characteristics can be given by:

Ln=Lp=0.2 um, Wn=0.2 um, Wp=0.4 um, $t_G$=7 nm, $d_{NT}$=1 nm, $\varepsilon_R$=4, $\varepsilon_0$=8.85×10$_{-14}$ F/cm, NTFCp=4×10$^5$ cm/V·s, NTFCn=8×10$^5$ cm/V·s.

Exemplary parameters for a CNTFET inverter can be given by:

$R_P$=1.4 MΩ, $R_N$=1.4 MΩ, $C_{GFn}$=53 aF, $C_{GFp}$=106 aF, $C_{IN}$=(3/2) $(C_{GFn}+C_{GFp})$=238 aF, $C_{OUT}=C_{GFn}+C_{GFp}$=159 aF.

Figure 13:
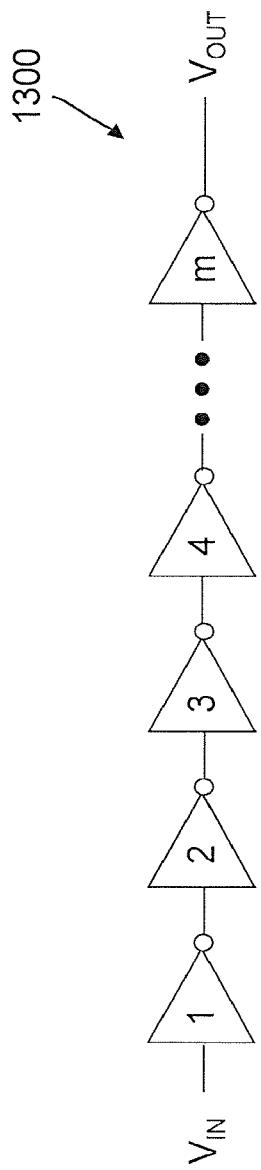
FIG. 13 illustrates an exemplary inverter delay chain.

FIG. 13 shows an exemplary inverter delay chain 1300 of m NOT gates (inverter circuits) in series, where m can be an even or odd number, with an input voltage $V_{IN}$ and an output voltage $V_{OUT}$. Inverter chains can be used as delay elements in digital circuits and they can be used to change logic polarity and to act as buffers between logic circuits. Delay times associated with rise and fall times may be estimated using inverter digital model 1260, with the input capacitance of the next stage as a load ($C_L=C_{IN}$). Based on equations 10.1 and 10.2 the delay estimates, $t_{DHL}$=Rn $(C_{OUT}+C_L)$. $t_{DHL}$=1.4×10$^6$·(159+238)×10$^{-18}$=$t_{DHL}$=556 ps. Since Rp=Rn, then $t_{DLH}$=556 ps. The time delay T for a down transition followed by an up transition is $t_{DHL}+t_{DLH}$=1.11 ns. Assuming that inverter chain 1300 is to provide a non-inverting buffer (or delay) of m=4 stages, then the delay through the four-inverter chain is m($t_{DHL}+t_{DLH}$)=4 (1.11) =4.44 ns.

Figure 14:
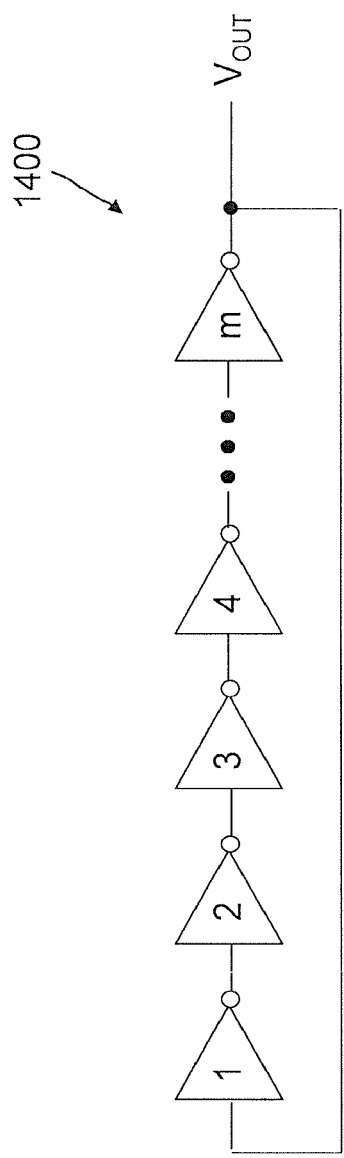
FIG. 14 illustrates an exemplary ring oscillator.

An exemplary inverter chain with a feedback loop such as ring oscillator 1400 illustrated in FIG. 14, with an odd number of stages m, will oscillate after fabrication and the output voltage $V_{OUT}$ may be used as a measure of a technology's performance (speed) and power dissipation. This may be expressed as a power-delay product (PDP) value for example. The oscillating frequency may be calculated as $f_{OSC}$=1/[m $(t_{DHL}=t_{DLH})$]. Table 1 in FIG. 15 shows exemplary oscillating frequencies for ring oscillators with inverter stages constructed from CNTFETs with varying nanotube fabrics. The CNTFET specifications common to all inverter stages are $R_P=R_N$,$W_N$=0.2 um; $W_P$=2 $W_N$; $L_P=L_N$=0.2 um; $NTFC_P$=4×10$^5$; NTFCN=8×10$^5$ cm/V-s; $t_G$=7 nm; $d_{NT}$=1 nm; $\varepsilon_R$=4; $|V_{TP}|=V_{TN}$=0.5 V; and $V_{DD}$=3.5V. If the CNTFET horizontal device dimensions are scaled from L=0.2 um to L=0.1 um for both p-type and n-type of CNTFETs, and Wn is scaled from 0.2 to 0.1 um and Wp is scaled from 0.4 to 0.2 um, then the inverter delay is reduced by a factor of 4×. This is because the resistance values for Rn and Rp remain unchanged at 1.4 MΩ. However, the capacitance is reduced by W·L (Eq. 7.1). In this example, Wp·Lp goes from 0.4×0.2 um$^2$ to 0.2×0.1 um$^2$ and Wn·$L_N$ goes from 0.2×0.2 um2 to 0.1×0.1 um$^2$ thereby reducing $C_{IN}$, $C_{OUT}$ and $C_L$ by 4×. Therefore, $t_{DHL}+t_{DLH}$=278 ps for Ln=Lp=0.1 um and Wp=0.2 um and Wn=0.1 um for a delay reduction of 4× from 1.11 ns to 278 ps. The four stage delay of inverter chain 1300 is also reduced by 4× from 4.44 ns to 1.11 ns. The ring oscillator for m=15 stages speeds up from $f_{OSC}$=60 MHz to 240 MHz. The ring oscillator for m=5 stages speeds up from $f_{OSC}$=180 MHz to 720 MHz. If the fabric mobility is enhanced by 2×, the resistance values Rn and Rp decrease by a factor of 2; however, the capacitance remains the same and the performance enhancement is improved by a factor of 2.

CNTFET Technology Characteristics Determined by Calculating Carbon Nanotube Fabric Constants (NTFC) for p and n-type Operation based on Electrical Device Measurements on an Ambipolar CNTFET (aCNTFET) Device The mobility of electrons and holes in semiconductor materials, and especially silicon, is well known. This mobility is determined by bandgap energy, population of electrons and holes in conduction and valence bands, respectively, band curvature, and other factors. The mobility of electrons is approximately 3× the mobility of holes for silicon semiconductor devices such as those illustrated in FIGS. 1A and 1B.

The fabricated CNTFET devices tested (measured) in this example include NT fabric channel regions formed of semiconducting single wall nanotubes (s-SWNTs) that replace semiconductor substrates. The current-voltage equations describing the behavior of CNTFET devices with semiconducting NT fabric channel regions includes a nanotube fabric constant (NTFC), which represents the electrical properties per square of a NT fabric; there is a nanotube fabric constant for electrons ($NTFC_N$) and a nanotube fabric constant for holes ($NTFC_P$) as described further above. These NTFC values are measured on fabricated CNTFET devices such as the pCNTFET device illustrated in FIG. 5D further above. The pCNTFET device illustrated in FIG. 5D was used to calculate the value of $NTFC_P$. However, an nCNTFET device is needed to calculate the value of nCNTFET devices.

Ambipolar CNTFET (aCNTFET) devices are particularly useful in calculating both $NTFC_P$ and $NTFC_N$ nanotube fabric constants for nanotube fabrics. This is because both n-type and p-type CNTFET behavior is exhibited in the same device as illustrated further below in FIG. 18. Therefore, for aCNTFET devices, the same nanotube fabric forms the substrate region; there is the same gate-to-fabric separation; the same gate and contact materials; and the same physical device dimensions when measuring n-type and p-type electrical characteristics. Contacts to aCNTFET devices are able to inject both holes and electrons thereby enabling both n-type and p-type CNTFET characteristics over a portion of the aCNTFET operating range.

Figure 16:
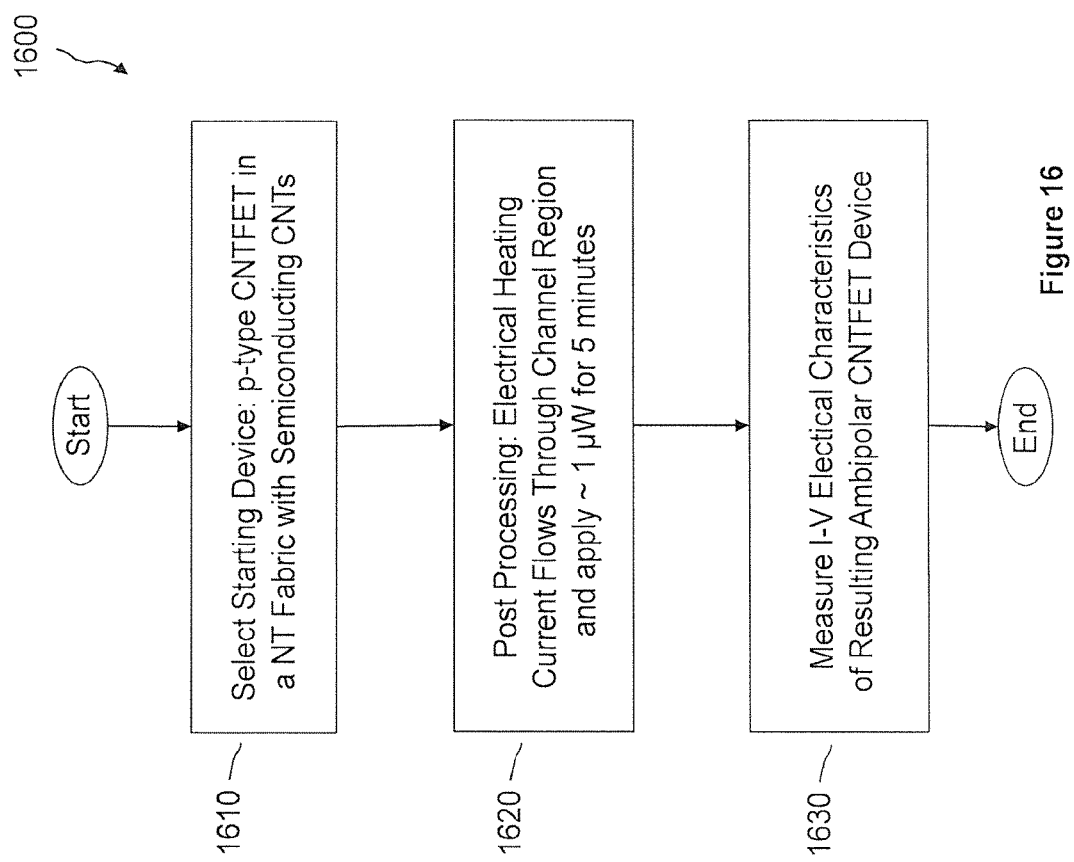
FIG. 16 illustrates a flow chart an exemplary approach for transforming a pCNTFET into an ambipolar CNTFET.

FIG. 16 illustrates the formation of CNTFET devices by transforming pCNTFET devices to aCNTFET devices as described in incorporated Bertin et al. U.S. Pat. No. 7,598, 544 issued Oct. 6, 2009. Once metallic SWNT burn-off is complete using mSWNT burn-off electrical post processing methods as described further above with respect to FIGS. 5E and 6, pCNTFET devices remain as illustrated by pCNTFET electrical characteristics 590 illustrated in FIG. 5F and also in Bertin et al. U.S. Pat. No. 7,598,544. These devices may be left as pCNTFETs, or may be converted (transformed) into ambipolar CNTFETs and/or to nCNTFETs by applying heat to the entire assembly, or by transformational electrical post processing methods 1620 as part of electrical post processing methods 1600 illustrated in FIG. 16 that selectively pass currents for extended periods through semiconducting SWNTs that form the contact and semiconducting channel regions of pCNTFET devices. Alternatively, chemical processes such as ion implantation followed by annealing may be used instead to convert pCNTFET devices to ambipolar CNTFET devices and/or to nCNTFET devices as described in U.S. application Ser. No. 12/536,736.

Figure 17A:
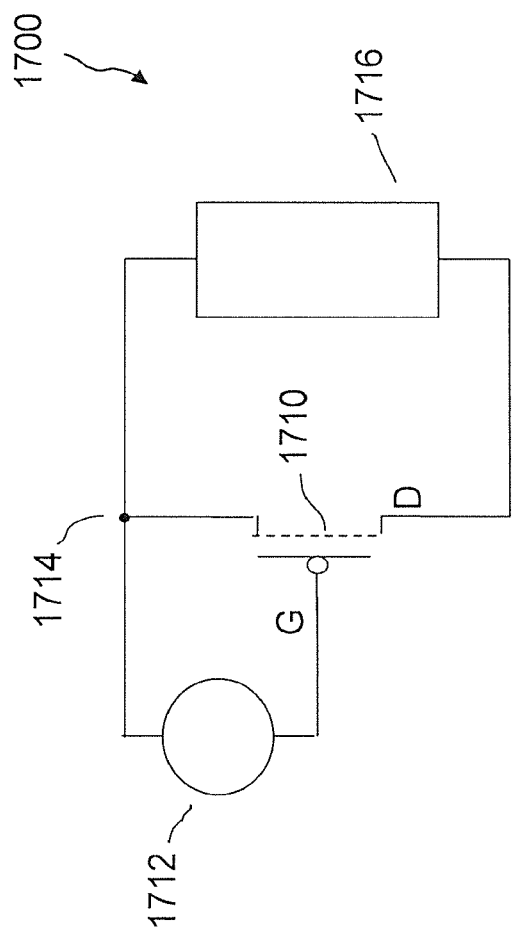
FIG. 17A illustrates an exemplary circuit for generating and applying voltage to a CNTFET.
Figure 18:
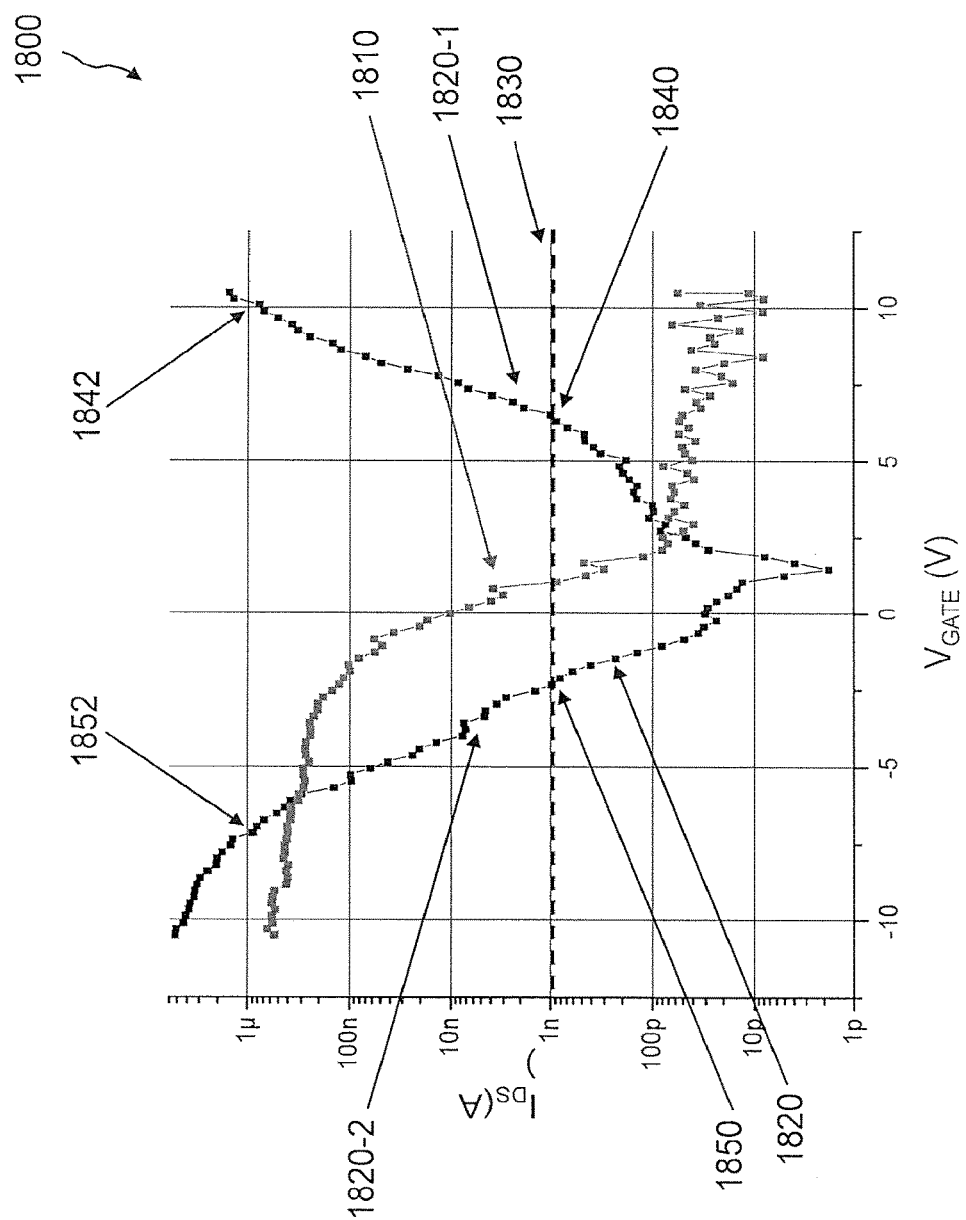
FIG. 18 illustrates an exemplary current-voltage characteristic for an ambipolar CNTFET and a pCNTFET.

At step 1610 pCNTFET devices are selected to be converted from pCNTFET to aCNTFET. FIG. 17A illustrates circuit 1700 used to generate and apply known voltages and currents to pCNTFET device 1710-1 as described further below. pCNTFET electrical characteristic 1810, illustrated as part of electrical characteristics 1800 shown in FIG. 18, is representative of pCNTFET device 1710-1 electrical characteristics.

Next, at step 1620 transformational electrical post processing causes circuit 1700 to apply controlled current and voltage excitations to pCNTFET 1710 dissipating approximately 1 Watt for five minutes as described further below with respect to circuit 1700 and U.S. Pat. No. 7,598,544. The total transformational electrical post processing energy dissipated may be calculated as E=P·t, where P is the power dissipation and t is the time in seconds. Since P~1 µW and t=5 minutes=300 seconds, an energy E~300 µJ (micro-Joules) was applied. In other words, methods 1620 transformational electrical post processing energy dissipates approximately 300 µJ and transforms pCNTFET device 1710-1 with pCNTFET electrical characteristic 1810 into the carbon nanotube fabric-based aCNTFET device 1710-2 with aCNTFET electrical characteristic 1820 illustrated in FIG. 18.

Next, at step 1630 the current-voltage (I-V) characteristics of pCNTFET device 1710-1 are measured. In this example, methods 1620 transformational electrical post processing excitations have caused pCNTFET device 1710-1 to transform to aCNTFET device 1710-2 illustrated schematically in FIG. 17B as measured using methods 1630. The "a" in aCNTFET refers to the designation of an ambipolar device. aCNTFET device 1710-2 electrical characteristic 1820, as measured by circuit 1750 illustrated in FIG. 17B and described further below, is illustrated in FIG. 18. aCNTFET device 1710-2 displays nCNTFET device behavior illustrated by nCNTFET segment 1820-1 of electrical characteristics 1820; pCNTFET device behavior is illustrated by pCNTFET segment 1820-2 of electrical characteristic 1820; with a very low current region of electrical characteristic 1820 between the two segments where the device is considered OFF. Source-drain current has been plotted on a log scale, and instrument noise distorts low current readings below 100 µA, so 1 nA is used as an approximate current onset value 1830. Electrical characteristics 1800 are also illustrated in U.S. Pat. No. 7,598,544. n-type carbon nanotube fabric constant $NTFC_N$ may be calculated from n-CNTFET segment 1820-1, and p-type carbon nanotube fabric constant $NTFC_P$ may be calculated from p-CNTFET segment 1820-2 as described further below.

At this point in the process, a pCNTFET transformation to an aCNTFET device with aCNTFET electrical characteristics 1820 has been formed and verified using electrical post processing methods 1600.

Circuit 1700 illustrated in FIG. 17A can be used to apply excitations (voltages and currents) to pCNTFET device 1710-1. Circuit 1700 includes pCNTFET device 1710-1 with source 1712-1, drain 1714-1, and gate 1716-1 terminals (electrodes); gate input circuit 1720; and voltage-current source 1730, which controls the voltage across source 1712-1 and drain 1714-1 and the current flowing between source 1712-1 and drain 1714-1. Gate input circuit 1720 has a first terminal connected to node 1722, which is also connected to source 1712-1, and a second terminal connected to gate 1716-1. Source-drain voltage-current source 1730 has a first terminal connected to node 1722 and a second terminal connected to drain 1714-1. pCNTFET devices are bi-directional so source and drain are interchangeable. In an inverter circuit with a pCNTFET pull-up device, for example, the terminal connected to voltage $V_{DD}$ becomes the source terminal. However, either one of the pCNTFET terminals in contact with the NT fabric may be connected to $V_{DD}$.

In operation, gate input circuit 1720 applies a gate-to-source voltage, and voltage-current source 1730 applies a drain-to-source voltage and measures drain-to-source current. The excitations (voltages and currents) applied by gate input circuit 1720 and voltage-current source 1730 to pCNTFET device 1710-1 are determined by methods 1620 transformational electrical post processing excitations such that power dissipation of sufficient amplitude and duration are applied to transform pCNTFET device 1710-1 into aCNT-FET device 1710-2. In this example, approximately 1 µW for 5 minutes, or an energy dissipation of approximately 300 µJ was used as described further above.

Circuit 1750 illustrated in FIG. 17B can be used to measure the electrical (I-V) characteristics of aCNTFET device 1710-2. aCNTFET device 1710-2 has the identical physical attributes as pCNTFET device 1710-1 as described further above. However, aCNTFET device 1710-2 and pCNTFET device 1710-1 have different electrical characteristics 1820 and 1810, respectively, as illustrated in FIG. 18. aCNTFET device 1710-2 may be used as an nCNTFET device, or as a pCNTFET device, or as an aCNTFET device depending on the voltage region of operation as illustrated and described further above with respect to electrical characteristic 1820. aCNTFET devices are bidirectional so source and drain are interchangeable as described further above with respect to nCNTFET and pCNTFET devices. aCNTFET devices may replace nCNTFET and/or pCNTFET in circuit. However, when describing aCNTFET devices, drain and source terminals are described as drain-source and source-drain to differentiate aCNTFET devices with respect to p-type and n-type CNTFET devices.

Now, continuing with the circuit 1750 description, circuit 1750 includes aCNTFET device 1710-2 with drain-source 1712-2, source-drain 1714-2, and gate 1716-2 terminals (electrodes); gate input circuit 1760; and source-drain voltage source 1770, which controls the voltage across drain-source 1712-2 and source-drain 1714-2 and the current flowing between drain-source 1712-2 and source-drain 1714-2. Gate input circuit 1760 has a first terminal connected to node 1762, which is also connected to source-drain electrode 1714-2, and a second terminal connected to gate 1716-2. Source-drain voltage source 1770 has a first terminal connected to node 1762 and a second terminal connected to drain-source 1714-2.

In operation, gate input circuit 1760 applies a gate-to-source voltage, and source-drain voltage source 1770 applies a drain-to-source voltage and measures drain-to-source current. The excitations (voltages and currents) applied by gate input circuit 1760 and source-drain voltage source 1770 to aCNTFET device 1710-2 are used to measure electrical characteristics 1820 illustrated in FIG. 18, as described further above with respect to methods 1630 in FIG. 16.

As discussed further above with respect to FIGS. 16, 17A-B and 18, aCNTFET devices may be used to calculate the nanotube fabric constants $NTFC_N$ for n-type CNTFETs and $NTFC_P$ for p-type CNTFETs with identical physical characteristics using the same NT fabric channel and source/drain region. Also, the ratio of $NTFC_N$ to $NTFC_P$ ($NTFC_N/NTFC_P$) may be calculated and applied to other CNTFET devices, such that if the $NTFC_P$ has been measured or is known for a NT fabric for example, this ratio may be used to calculate a corresponding value of $NTFC_N$. The $NTFC_N/NTFC_P$ ratio of approximately 2 based on aCNTFET device 1710-2 measurements, as calculated further below, was used further above to calculate the $NTFC_N$ value in equation 6.3 corresponding to the $NTFC_P$ value in equation 6.2 aCNTFET device 1710-2 can be used to calculate n and p-type nanotube fabric constants (NTFC). nCNTFET segment 1820-1 of aCNTFET electrical characteristic 1820 illustrated in FIG. 18, and the device dimensions corresponding to CNTFET device 560 illustrated in FIG. 5D, are used to calculate $NTFC_N$ as illustrated further below.

Circuit 1700 illustrated in FIG. 17B was used to apply gate voltages $V_{GATE}$ between gate 1716-2 and source-drain 1714-2 of aCNTFET 1710-2, while holding the voltage between drain-source 1712-2 and source-drain 1714-2 at 1.5 volts, and measuring corresponding current values flowing between drain-source 1712-2 and source-drain 1714-2. The resulting electrical characteristic 1820, also sometimes referred to as a transfer characteristic, is illustrated in FIG. 18. FIG. 18 illustrates transfer characteristics 1800 which include pCNTFET transfer characteristic 1810 as well as ambipolar CNTFET (aCNTFET) transfer characteristic 1820. nCNTFET segment 1820-1 portion of electrical characteristic 1820 is used to calculate $NTFC_N$. When operating aCNTFET device 1770-2 as an nCNTFET, drain-source 1712-2 behaves as the drain; source-drain 1714-2 behaves as the source; and the corresponding gate voltage of gate 1716-2 is referenced to source-drain 1714-2. The threshold voltage $V_{TN}$ nCNTFET segment 1820-1 is approximately 7 volts, defined by intersection 1840 of current onset value 1830 and nCNTFET segment 1820-1. The current flow $I_{DS}$ between drain-source 1712-2 and source-drain 1714-2 is $I_{DS}$=1 µA at $V_{GATE}$=10 V as indicated by the intersection 1842 between the 1 µA reference line and nCNTFET segment 1820-1

As described further above, the relationship between gate voltage, drain-to-source voltage, and threshold voltage, and drain-to-source current for an nCNTFET is given by equation 4.12 as follows:

$$I_{DSn} = [(W_N/L_N) \cdot NTFC_N \cdot (2\pi\varepsilon_R\varepsilon_0/\ln(2t_G/R_{NT}))] \cdot [(V_{GS} - V_{TN})V_{DS} - V^2_{DS}/2] \qquad [EQ\ 4.12]$$

where $t_G$ is the gate-NT fabric distance, $R_{NT}$=CNT radius=$d_{NT}/2$, $d_{NT}$ is NT diameter, $\varepsilon_R$=relative dielectric constant of gate insulator, $\varepsilon_0$=8.85×10$^{-14}$ F/cm permittivity of free space, $L_N$=NT fabric length between source & drain regions, $W_N$=fabric width between source and drain regions, and $NTFC_N$=nanotube fabric constant in cm/V·s.

Therefore, the nanotube fabric constant $NTFC_N$ may be given using equation 6.6 as follows:

$$NTFC_N = (L_N/W_N) \cdot I_{DSn}/[(2\pi\varepsilon_R\varepsilon_0/\ln(2t_G/R_{NT})) \cdot ((V_{GS} - V_{TN})V_{DS} - V^2_{DS}/2)], \qquad [Eq.\ 6.6]$$

where
$t_G$=20 nm;
$d_{NT}$=1 nm;
$\varepsilon_R$=1;
$\varepsilon_0$=8.85×10$^{-14}$ F/cm;
$L_N$=0.2 µm;
$W_N$=0.4 µm.
$I_{DS}$=1 µA;
$V_{TN}$=7 V;
$V_{GS}$=10 V;
$V_{DS}$=1.5 V;
Thus, $$NTFC_N = (0.2/0.4) \cdot 1 \times 10^{-6}/[(2\pi \cdot 1 \cdot 8.85 \times 10^{-14}/\ln(2 \times 20/1)) \cdot ((10-7)1.5 - (1.5)^2/2)],$$

and $$NTFC_N = 12 \times 10^5\ cm/V \cdot s. \qquad [EQ\ 6.7]$$

The value of $NTFC_N$ includes contact resistance between electrodes and the NT fabric at both drain-source and source-drain terminals in series with the NT fabric channel resistance; therefore, $NTFC_N$ in just the channel region is a larger value.

aCNTFET device 1710-2 is used to calculate n and p-type nanotube fabric constants (NTFC). pCNTFET segment 1820-2 of aCNTFET electrical characteristic 1820 illustrated in FIG. 18, and the device dimensions corresponding to CNTFET device 560 illustrated in FIG. 5D, are used to calculate $NTFC_P$ as illustrated further below.

Circuit 1700 illustrated in FIG. 17B was used to apply gate voltages $V_{GATE}$ between gate 1716-2 and source-drain 1714-2 of aCNTFET 1710-2, while holding the voltage between drain-source 1712-2 and source-drain 1714-2 at 1.5 volts, and measuring corresponding current values flowing between drain-source 1712-2 and source-drain 1714-2. The resulting electrical characteristic 1820, also sometimes referred to as a transfer characteristic, is illustrated in FIG. 18. pCNTFET segment 1820-2 portion of electrical characteristic 1820 is used to calculate $NTFC_P$. When operating aCNTFET device 1770-2 as a pCNTFET, drain-source 1712-2 behaves as the source; source-drain 1714-2 behaves as the drain; and the corresponding gate voltage of gate 1716-2 is referenced to drain source 1712-2 which behaves as the source. Since drain-source 1712-2, acting as pCNTFET source, is held at 1.5 volts, then the gate voltage is referenced to drain-source 1712-2. However, the gate voltage $V_{GATE}$ shown in FIG. 18 is applied relative to source-drain 1714-2. Therefore, the threshold voltage $V_{TP}$ is determined by the intersection 1850 of current onset value 1830 and pCNTFET segment 1820-2, plus a voltage translation of 1.5 volts. The threshold voltage $V_{TP}$ corresponding to pCNTFET segment 1820-2 is approximately |VTP|=4 volts, with a gate-to-source voltage $V_{GS}$ referenced to +1.5 volts. The current flow $I_{DS}$ between drain-source 1712-2 and source-drain 1714-2 is $I_{DS}$=1 µA at |$V_{GS}$|=7.5+1.5=9 V as indicated by the intersection 1852 between the 1 µA reference line and pCNTFET segment 1820-2.

As described further above, the relationship between gate voltage, drain-to-source voltage, and threshold voltage, and drain-to-source current for an pCNTFET can be given by equation 4.11 as follows:

$$I_{DSp} = [(W_P/L_P) \cdot NTFC_P \cdot (2\pi\varepsilon_R\varepsilon_0/\ln(2t_G/R_{NT}))] \cdot [(V_{GS} - |V_{TP}|)V_{DS} - V^2_{DS}/2], \qquad [EQ\ 4.11]$$

where $t_G$ Gate-NT fabric distance, $R_{NT}$=CNT radius=$d_{NT}/2$, $d_{NT}$ is NT diameter, $\varepsilon_R$=relative dielectric constant of gate insulator, $\varepsilon_0$=8.85×10$^{-14}$ F/cm permittivity of free space, $L_P$=NT fabric length between source & drain regions, $W_P$=fabric width between source & drain regions, and $NTFC_P$=nanotube fabric constant in cm/V·s.

Therefore, the nanotube fabric constant $NTFC_N$ may be given using equation 6.7 as follows:

$$NTFC_P = (L_P/W_P) \cdot I_{DSp}/[(2\pi\varepsilon_R\varepsilon_0/\ln(2t_G/R_{NT})) \cdot ((V_{GS} - |V_{TP}|)V_{DS} - V^2_{DS}/2)], \qquad [Eq.\ 6.7]$$

where
$t_G$=20 nm;
$d_{NT}$=1 nm;
$\varepsilon_R$=1;
$\varepsilon_0$=8.85×10$^{-14}$ F/cm;
$L_P$=0.2 µm;
$W_P$=0.4 µm.
$I_{DS}$=1 µA;
|$V_{TP}$|=4 V;
|$V_{GS}$|=9 V;
$V_{DS}$=1.5 V;
Thus, $$NTFC_P = (0.2/0.4) \cdot 1 \times 10^{-6}/[(2\pi \cdot 1 \cdot 8.85 \times 10^{-14}/\ln(2 \times 20/1)) \cdot ((9-4)1.5 - (1.5)^2/2)],$$

and $$NTFC_P = 6.2 \times 10^5\ cm/V \cdot s. \qquad [EQ\ 6.7]$$

The value of $NTFC_P$ includes contact resistance between electrodes and the NT fabric at both drain-source and source-drain terminals in series with the NT fabric channel resistance; therefore, $NTFC_P$ in just the channel region is a larger value.

The ratio $NTFC_N/NTFC_P=1.94$. Therefore, the approximate value $$NTFC_n/NTFC_p=2 \qquad [EQ\ 6.8]$$

can be used further above with respect to equation 6.3.

Two-Input Complementary Carbon Nanotube NAND Circuit Performance and Layouts Based on Design Equations and Models of CNTFET Technology Characteristics The CNTFET technology described further above with respect to US Patent Application Publication No. US 20060183278, U.S. Pat. No. 7,598,544, and U.S. application Ser. No. 12/536,736 may be used to design any nanotube-based logic function. In the example described further below, a two-input complementary carbon nanotube NAND circuit is described, modeled, and response times are calculated. Such circuits may be interconnected to form any logic function. In the examples described further below, CNTFET technologies with minimum dimensions F=0.2 um and F=0.1 um are evaluated. Also, 2-D and 3-D layouts options are illustrated.

Figure 19:
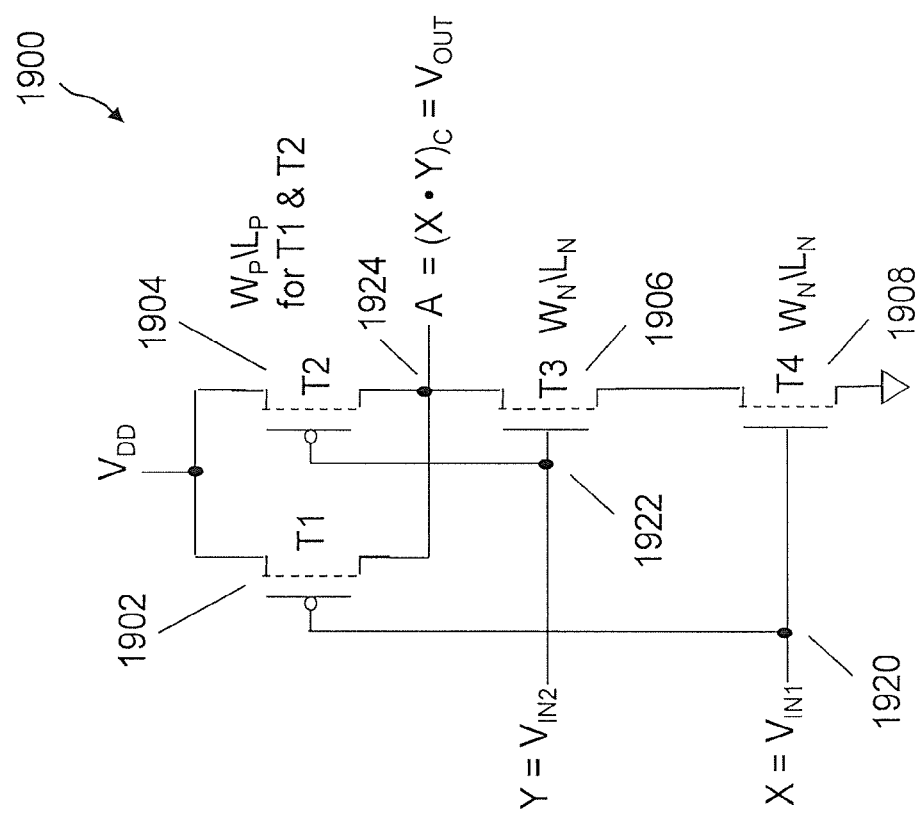
FIG. 19 illustrates a schematic representation of an exemplary two input complementary carbon nanotube NAND (CCN-NAND) circuit.

FIG. 19 is a schematic representation of an exemplary two input complementary carbon nanotube NAND (CCN-NAND) circuit 1900, which is a two-input CNFET device-based NAND circuit. pCNFETs devices 1902 (T1) and 1904 (T2) are connected in parallel with sources connected to power source $V_{DD}$ and drains connected to output node 1924; such pCNTFET devices are sometimes referred to as pull-up devices. Output node 1924 is also connected to a drain of nCNFET device 1906 (T3) in series with nCNFET device 1908 (T4) whose source is connected to ground GND. The source of nCNTFET device 1906 is connected to the drain of nCNTFET device 1908. Input node 1920 is connected to the gates of pCNTFET device 1902 and nCNTFET device 1908, and input node 1922 is connected to the gates of pCNTFET device 1904 and nCNTFET device 1906; such nCNTFET devices are sometimes referred to as pull-down devices.

In operation, logic input X, with corresponding input signal voltage $V_{IN1}$, is applied to node 1920, and logic input Y, with corresponding input signal voltage $V_{IN2}$ is applied to node 1922. Signal voltages $V_{IN1}$ and $V_{IN2}$ swing between a low reference voltage such as ground (GND) and voltage source $V_{DD}$. When $V_{IN1}$ is at $V_{DD}$, nCNTFET device 1908 is ON and pCNTFET device 1902 is OFF; conversely, when $V_{IN1}$ is at a low voltage such as ground (zero volts, for example), nCNTFET device 1908 is OFF and pCNTFET device 1902 is ON. Similarly, when $V_{IN2}$ is at $V_{DD}$, nCNTFET device 1906 is ON and pCNTFET device 1904 is OFF; conversely, when $V_{IN2}$ is at a low voltage such as ground (zero volts, for example), nCNTFET device 1906 is OFF and pCNTFET device 1904 is ON. If either or both $V_{IN1}$ and $V_{IN2}$ are at zero volts, corresponding to a logic "0" state for example, then output voltage $V_{OUT}$ on output node 1924 will be at voltage $V_{DD}$, corresponding to a logic "1" state for example, for logic output A. However, if both $V_{IN1}$ and $V_{IN2}$ are at $V_{DD}$, corresponding to logic inputs X and Y, respectively, in a logic "1" state, then $V_{OUT}$ on output node 1924 will be a zero volts, corresponding to a logic "0" state for logic output A. The output logic function A may be expressed as the complement of the product of X and Y Boolean logic inputs X and Y as expressed by the equation $A=(X \cdot Y)_C$.

Figure 1A:
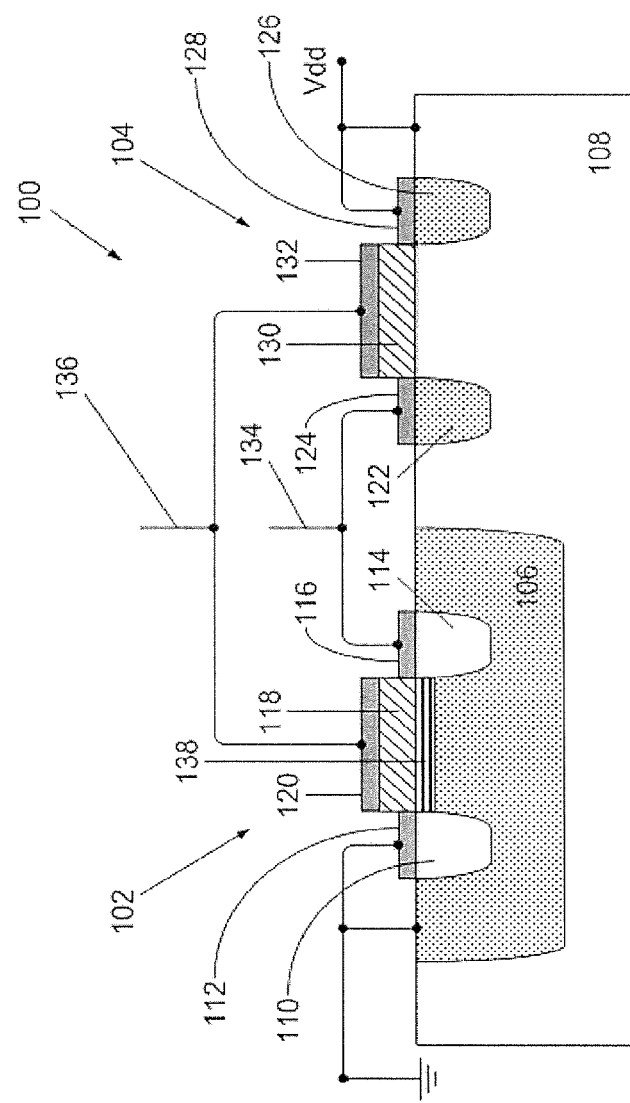
FIG. 1A illustrates a prior art CMOS inverter formed on an n-substrate.
Figure 1B:
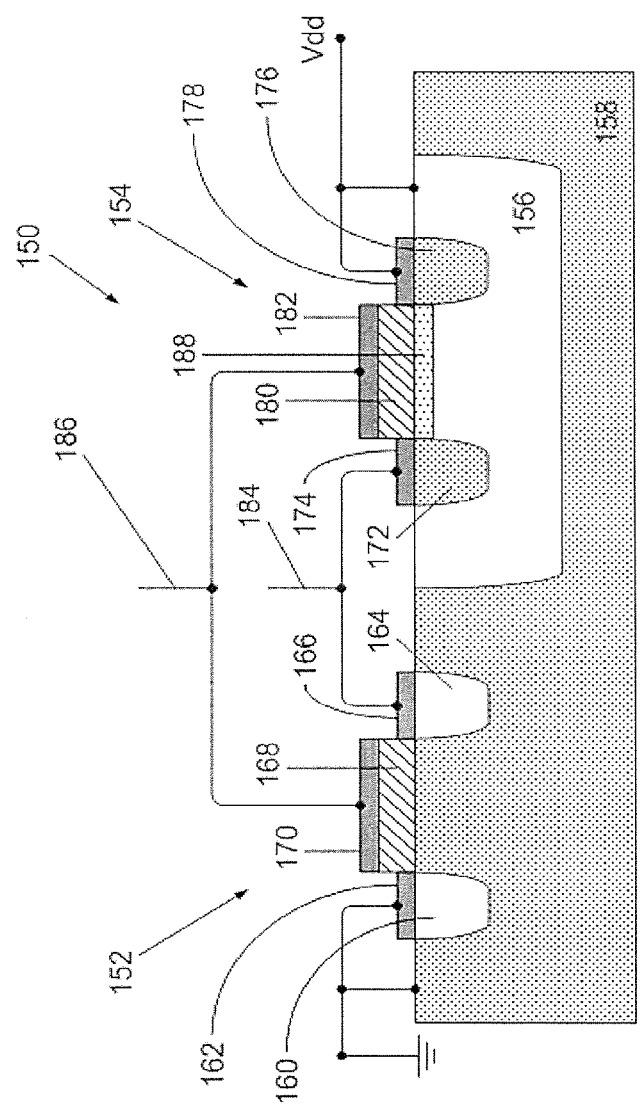
FIG. 1B illustrates a prior art CMOS inverter formed on a p-substrate.

Two-input CCN-NAND circuit 1900 does not require a semiconductor substrate and can be denser than current industry CMOS circuits formed using FETs in semiconductor substrates corresponding to those illustrated in FIGS. 1A and 1B, which requires a p-doped region (substrate or well) for NFETs and a n-doped region (substrate or well) for PFETs which substantially increase the area required for FET-type CMOS circuits relative to those using n and p-type CNTFET devices. Two-input CCN-NAND circuit 1900 can, therefore, fit in a smaller area (or footprint). Any logic function may be realized using 2-input CCN-NAND circuit 1900. Also, since no substrate is required for the CNFET devices, 2-input CCN-NAND circuit 1900 may be placed anywhere (at any level) in the integration flow and enables three-dimensional logic integration as also described in U.S. application Ser. No. 12/536,736. Two-input CCN-NAND circuit 1900 may also be formed in two nanotube fabric layers (two levels), with pCNTFET devices 1902 and 1904 in one NT fabric layer (or level) and nCNTFET devices 1906 and 1908 in another NT fabric layer (or level) as illustrated further below with respect to FIG. 30.

CNTFET Two-Input NAND Circuit (0.2 μm Technology Node)

Inverters described further above with respect to FIGS. 12A-C and 13-15 can be designed with minimum dimensions. Chains of these inverters, with the output of the previous stage driving the input of the next stage (a fan-out FO=1), are used to build delay chains that may be connected as ring oscillators which are useful as a measure of the inherent speed (performance) of a CNTFET technology. Ring oscillators oscillate when power supplies are applied to chips prior to chip separation as a performance characterization tool. Ring oscillators may also be tested at the packaged level.

Logic circuit performance objectives determine logic circuit design and corresponding CNTFET device dimensions. Logic circuit performance includes an ability to drive multiple inputs of other logic circuits, often referred to as fan-out (FO) drive capability, which is important when generating (forming) and interconnecting logic functions. When designing logic circuits for performance, the W/L ratios of devices are typically in the range of 10-50. Fan-out drive capability for CMOS circuits (and other circuit types as well) is typically based on a fan-out FO=4; that is, the ability to drive the inputs of four circuits. However, in addition to the capacitance of four input circuits, the wiring (interconnect) capacitance must be included as well. When designing logic circuits in the early stages of technology definition, when layout ground rules have not been fully developed as is the case in this example, wiring capacitance is typically expressed as part of the fan-out loading. So for example, to drive four logic inputs, a fan-out (FO) of 5 or 6 may be used. When a technology if fully defined, capacitance values are extracted from actual layout wiring. Typically, extracted wiring capacitance values are less than those capacitance values included as part of the FO load as described further above.

Figure 20A:
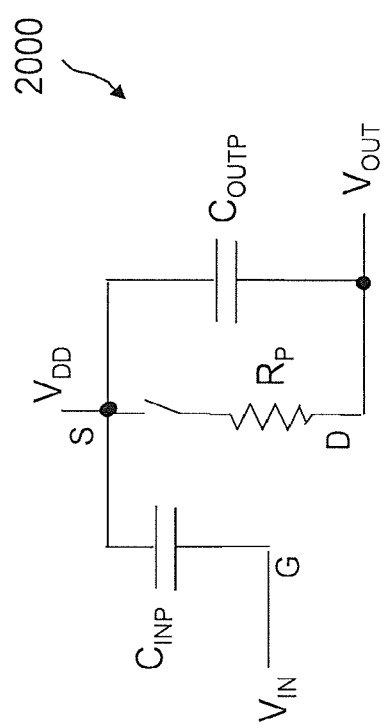
FIG. 20A illustrates an exemplary pCNTFET device model.
Figure 20B:
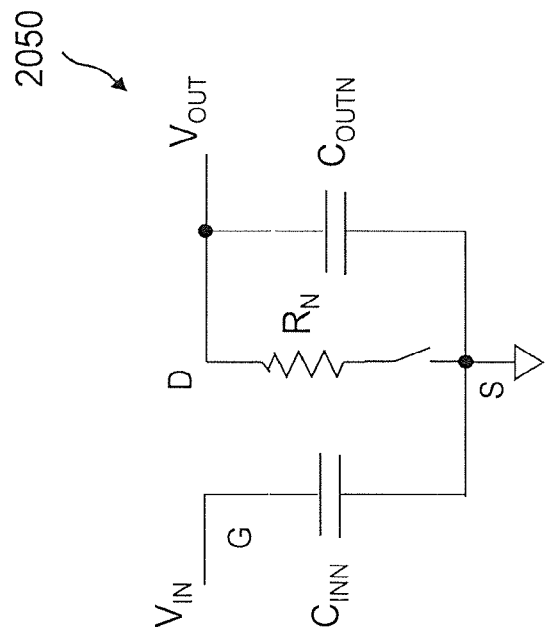
FIG. 20B illustrates an exemplary nCNTFET device.

In this example, a logic family can be provided in terms of a CNTFET-based two-input NAND, 2-input CCN-NAND circuit 1900 shown in FIG. 19. In this example, the CNTFET devices forming 2-input CCN-NAND circuit 1900 and interconnect wiring may be laid out in two dimensions on a single NT fabric layer (level) as illustrated further below in FIGS. 28 and 29. Alternatively, the CNTFET devices forming 2-input devices forming 2-input CCN-NAND circuit 1900 and interconnect wiring may be laid out in three dimensions on two NT fabric layers (levels) resulting in a smaller footprint with less wiring capacitance as illustrated further below in FIGS. 30 and 31. For a 2-input CCN-NAND circuit 1900 layout in two dimensions, a FO=6 is used; that is FO=4 for logic circuit input loading and FO=2 for wiring interconnect capacitance loading. However, for a 2-input CCN-NAND circuit 1900 layout in three dimensions, a FO=5 is used; that is FO=4 for logic circuit input loading and FO=1 for interconnect capacitance loading. Also, in the case of three-dimensional layouts, one layer (or level) may be optimized for pCNTFETs and another layer (or level) may be optimized for nCNTFETs. Hence, for three-dimensional layouts, the nanotube fabric density (or other parameters) may be adjusted such that the values of NTFC for both p-type and n-type CNTFETs are the same, for example, thereby further optimizing the CNTFET-based 2-input NAND circuit design.

pCNTFET device model 2000 illustrated in FIG. 20A corresponds to the pCNTFET device representation illustrated in FIGS. 11A-D further above. pCNTFET device model 2000 is depicted as having a resistance $R_P$, an input capacitance $C_{INP}$ between gate G and source S, an output capacitance $C_{OUTP}$ between drain D and source S. A switch in series with $R_P$ forms and unforms a path between drain D and source S, through resistance $R_P$, as a function of input voltage $V_{IN}$ applied to gate G with respect to the source S connected to $V_{DD}$ and relative to the pCNTFET threshold voltage. The pCNTFET input capacitance $C_{INP}=(3/2)\,C_{GFp}$ and output capacitance $C_{OUTP}=C_{GFp}$, where $C_{GFp}$ is the capacitance between the gate G and the NT fabric channel.

nCNTFET device model 2050 illustrated in FIG. 20B corresponds to the nCNTFET device representation illustrated in FIGS. 11A-D further above. nCNTFET device model 2050 is depicted as having a resistance $R_N$, an input capacitance $C_{INN}$ between gate G and source S, an output capacitance $C_{OUTN}$ between drain D and source S. A switch in series with $R_N$ forms and unforms a path between drain D and source S, through resistance $R_N$, as a function of input voltage $V_{IN}$ applied to gate G with respect to the source S connected to a low voltage reference such as ground (zero volts) and relative to the nCNTFET threshold voltage. The nCNTFET input capacitance $C_{INN}=(3/2)\,C_{GFn}$ and output capacitance $C_{OUTN}=C_{FGn}$, where $C_{GFn}$ is the capacitance between the gate G and the NT fabric channel.

pCNTFET device model 2000 may be used when designing pCNTFET devices 1902 (T1) and 1903 (T2) illustrated schematically in 2-input CCN-NAND circuit 1900, and nCNTFET device model 2050 may be used when designing nCNTFET devices 1906 and 1908 illustrated schematically in 2-input CCN-NAND circuit 1900. As was described further above with respect to transfer characteristic 1220 of inverter 1200 illustrated in FIGS. 12A-C, the circuit design point is selected such that when pCNTFET and nCNTFET devices are in ON state with $V_{IN}$ is set to switching point voltage $V_{SP}(V_{IN}=V_{SP})$, $V_{OUT}=V_{SP}$, where $V_{SP}=V_{DD}/2$. A similar design approach is used in the case of 2-input CCN-NAND circuit 1900 illustrated in FIG. 19, such that when $V_{IN1}=V_{IN2}=V_{SP}=V_{DD}/2$, pCNTFET device 1902 (T1), pCNTFET device 1904 (T2), nCNTFET device 1906 (T3), and nCNTFET device 1908 (T4) are all in an ON state. The dimensions, width and length, of these pCNTFET and nCNTFET devices are selected such that $V_{OUT}=V_{SP}=V_{DD}/2$ when $V_{IN1}=V_{IN2}=V_{SP}=V_{DD}/2$. The dimensions of pCNTFET device 1902 (T1) and pCNTFET device 1904 (T2) are the same. Also, the dimensions of nCNTFET device 1906 (T3) and nCNTFET device 1908 (T4) are the same, but typically not the same as those of the pCNTFET devices. However, layouts may be optimized by adjusting NTFCP and NTFCN to be approximately the same value to optimize layouts as described further below with respect to FIGS. 30 and 31.

The following methods may be used to calculate the dimensions $W_P$ and $L_P$ for pCNTFET devices 1902 (T1) and 1904 (T2), and $W_N$ and $L_N$ for nCNTFET devices 1906 (T3) and 1908 (T4).

First, since all CNTFET devices depicted in 2-terminal CCN-NAND circuit 1900 are in an ON state when $V_{IN1}=V_{IN2}=V_{SP}=V_{DD}/2$, we can treat pCNTFET device 1902 (T1) and pCNTFET device 1904 (T2) connected in parallel as a single pCNTFET device having a width $2\,W_P$ and a length $L_P$, and nCNTFET device 1906 (T3) and nCNTFET device 1908 (T4) connected in series as a single nCNTFET device of width $W_N$ and length $2\,L_N$.

Next, $W_P$, $L_P$, $W_N$, and $L_N$ may be calculated because current $I_{DSp}$ flowing into node 1924 from pCNTFET devices 1902 (T1) and 1904 (T2) must be equal to the current $I_{DSn}$ flowing out of node 1924 through nCNTFET devices 1906 (T3) and 1908 (T4) such that $I_{DSp}=I_{DSn}$. Equation 4.11 further above gives the equation for $I_{DSp}$ with respect to pCNTFET dimensions, materials, threshold voltages, and applied voltages, and equation 4.12 further above gives the equation for $I_{DSn}$ with respect to nCNTFET dimensions, materials, threshold voltages, and applied voltages. When $V_{IN1}=V_{IN2}=V_{SP}$ and $V_{OUT}=V_{SP}$, the CNTFET devices are in the saturation region. Substituting $2W_P$ for $W_P$ in equation 4.11 and $2L_N$ in equation 4.12:

$$[(W_N/2L_N)\cdot\text{NTFC}_N\cdot(2\pi\varepsilon_R\varepsilon_0/\ln(2t_G/R_{NT}))]\cdot[(V_{SP}-V_{TN})^2/2]=[(W_P/2L_P)\cdot\text{NTFC}_P\cdot(2\pi\varepsilon_R\varepsilon_0/\ln(2t_G/R_{NT}))]\cdot[(V_{DD}-V_{SP}-|V_{TP}|)^2/2]. \qquad [\text{EQ 11.1}]$$

For $V_{DD}=3.5$ V, $V_{SP}=V_{DD}/2=1.75$ V, $V_{TN}=0.5$ V, $|V_{TP}|=0.5$ V, $t_G=7$ nm for both p and n-type CNTFETs, $R_{NT}=d_{NT}/2=0.5$ nm, the CNT radius, $\text{NTFC}_N=8\times10^5$, and $\text{NTFC}_P=4\times10^5$ cm/V·s.

Therefore, $$[(W_N/2L_N)\cdot8\times10^5\cdot(2\pi\cdot4\cdot8.85\times10^{-14}/\ln(2\cdot7/0.5))]\cdot[(1.75-0.5)^2/2]=[(W_P/2L_P)\cdot4\times10^5\cdot(2\pi\cdot4\cdot8.85\times10^{-14}/\ln(2\cdot7/0.5))]\cdot[(3.5-1.75-0.5)^2/2], \qquad [\text{EQ 11.2}]$$

and $$(W_N/2L_N)\cdot8\times10^5=(2W_P/L_P)\cdot4\times10^5.$$

For 2-input CCN-NAND circuit 1900, the ratio W/L ratios for nCNTFET and pCNTFET devices is:

$$W_N/L_N=2(W_P/L_P). \qquad [\text{EQ 11.3}]$$

Various values of $W_N$, $L_N$, $W_P$, and $L_P$ values may be chosen that satisfy equation 11.3. CNTFET device design parameter relationships that satisfies equation 11.3 are illustrated by equations 11.4 and 11.5:

$$W_N=\sqrt{2}W_P; \qquad [\text{EQ 11.4}]$$

$$L_P=\sqrt{2}L_N. \qquad [\text{EQ 11.5}]$$

Another set of CNTFET device design parameter relationships that satisfies equation 11.3 are also illustrated by equations 11.4A and 11.5A:

$$W_N=2\,W_P; \qquad [\text{EQ 11.4A}]$$

$$L_P=L_N. \qquad [\text{EQ 11.5A}]$$

As is shown further below, layouts corresponding to two-input CCN-NAND circuit 1900 using CNTFET device dimensions illustrated in equations 11.4A and 11.5A result in a preferred layout.

One set of CNTFET device design dimensions used in this example that meet the condition that $V_{OUT}=V_{SP}=V_{DD}/2$ when inputs $V_{IN1}=V_{IN2}=V_{SP}=V_{DD}/2$ for a minimum technology dimension F=0.2 um is as follows. If $L_N$ is chosen as 0.2 um and $W_N$ is chosen as 8 um, and equations 11.4A and 11.5A are satisfied, then for 2-terminal CCN-NAND circuit 1900 illustrated in FIG. 19:

$L_N$=0.2 um and $W_N$=8 um for pCNTFET devices 1902 (T1) and 1904 (T2); and $L_P$=0.2 um and $W_P$=4 um.

Then, carbon nanotube (CNT)-based design methods can be used to calculate values of resistance for pCNTFET device model 2000 and nCNTFET device model 2050 using CNTFET device dimensions, material parameters such as dielectric constants and nanotube fabric constants, threshold voltages, and applied voltages. In this example:

$V_{DD}$=3.5 V, $V_{SP}=V_{DD}/2$=1.75 V, $V_{TN}$=0.5 V, $|V_{TP}|$=0.5 V, $t_G$=7 nm (for both p and n-type CNTFETs), $R_{NT}=d_{NT}/2$=0.5 nm, the CNT radius, $NTFC_N$=8×10$^5$, $NTFC_P$=4×10$^5$ cm/V-s, $W_P$=4 um, $L_P$=0.2 um, $W_N$=8 um, and $L_N$=0.2 um.

Resistance values $R_P$ and $R_N$ can be calculated using equation 4.5 further above which gives resistance value as a function of CNTFET device dimensions, material parameters, threshold voltages, and applied voltages. For pCNTFET devices 1902 (T1) and 1904 (T2), approximated by pCNTFET device model 2000, the resistance value $R_P$ can be calculated as follows:

$$R_P=V_{DD}/([(W_P/L_P) \cdot NTFC_P \cdot (2\pi\varepsilon_R\varepsilon_0/\ln(2t_G/R_{NT}))] \cdot [(V_{DD}-|V_{TP}|)^2/2]). \quad [EQ\ 11.6]$$

Substituting parameter values in equation 11.6 results in the following value for $R_P$ yields:

$$R_P=3.5/([(4/0.2) \cdot 4\times10^5 \cdot (2\pi \cdot 4 \cdot 8.85\times10^{-14}/\ln(2 \cdot 7/0.5))] \cdot [(3.5-0.5)^2/2])$$

and $$R_P=144\ k\Omega. \quad [EQ\ 11.7]$$

For nCNTFET devices 1906 (T3) and 1908 (T4), approximated by nCNTFET device model 2050, the resistance value $R_N$ can be calculated as follows:

$$R_N=V_{DD}/([(W_N/L_N) \cdot NTFC_N \cdot (2\pi\varepsilon_R\varepsilon_0/\ln(2t_G/R_{NT}))] \cdot [(V_{DD}-V_{TN})^2/2]). \quad [EQ\ 11.8]$$

Substituting the parameter values in equation 11.8 results in the following value for $R_N$:

$$R_N=3.5/([(8/0.2) \cdot 8\times10^5 \cdot (2\pi \cdot 4 \cdot 8.85\times10^{-14}/\ln(2 \cdot 7/0.5))] \cdot [(3.5-0.5)^2/2])$$

and $$R_N=36\ k\Omega. \quad [EQ\ 11.9]$$

Next, CNT-based design methods calculate the capacitance values for pCNTFET device model 2000 and nCNTFET device model 2050 using CNTFET device dimensions and material parameters. In this example:

$V_{DD}$=3.5 V, $V_{SP}=V_{DD}/2$=1.75 V, $V_{TN}$=0.5 V, $|V_{TP}|$=0.5 V, $t_G$=7 nm (for both p and n-type CNTFETs), $R_{NT}=d_{NT}/2$=0.5 nm, the CNT radius, $NTFC_N$=8×10$^5$, $NTFC_P$=4×10$^5$ cm/V-s, $W_P$=4 um, $L_P$=0.2 um, $W_N$=8 um, and $L_N$=0.2 um.

Capacitance values $C_{INP}$, $C_{OUTP}$ and $C_{INN}$, $C_{OUTN}$ shown in pCNTFET device model 2000 and nCNTFET device model 2050, respectively, are calculated from corresponding gate-to-fabric capacitance values $C_{GFp}$ and $C_{GFn}$ for pCNTFET and nCNTFET devices, respectively. $C_{GFp}$ and $C_{GFn}$ are calculated using equation 7.1 further above which gives gate-to-fabric capacitance values as a function of CNTFET device dimensions and material parameters. For pCNTFET devices 1902 (T1) and 1904 (T2), approximated by pCNTFET device model 2000, the capacitance value $C_{GFp}$ is calculated as follows (where W & L are in μm):

$$C_{GFp}=(W_P \cdot L_P)[1.1\varepsilon_R/\ln(2t_G/R_{NT})]\ fF, \quad [EQ\ 11.10]$$

$$C_{GFp}=(4\times0.2)[1.1\times4/\ln(2\times7/0.5)],$$

$$C_{GFp}=1.07\ fF. \quad [EQ\ 11.11]$$

Then, input and output capacitance values for pCNTFET model 2000 can be calculated as follows:

$$C_{INP}=(3/2)C_{GFp};\ C_{INP}=1.6\ fF, \quad [EQ\ 11.12]$$

$$C_{OUTP}=C_{GFp};\ C_{OUTP}=1.07\ fF. \quad [EQ\ 11.13]$$

For nCNTFET devices 1906 (T3) and 1908 (T4), approximated by nCNTFET device model 2050, the capacitance value $C_{GFn}$ can be calculated as follows (where W & L are in μm):

$$C_{GFn}=(W_N \cdot L_N)[1.1\varepsilon_R/\ln(2t_G/R_{NT})]\ fF, \quad [EQ\ 11.14]$$

$$C_{GFn}(8\times0.2)[1.1\times4/\ln(2\times7/0.5)],$$

$$C_{GFn}=2.13\ fF. \quad [EQ\ 11.15]$$

Then, input and output capacitance values for pCNTFET model 2000 can be calculated as follows:

$$C_{INN}=(3/2)C_{GFn};\ C_{INP}=3.19\ fF, \quad [EQ\ 11.16]$$

$$C_{OUTN}=C_{GFn};\ C_{OUTP}=2.13\ fF. \quad [EQ\ 11.17]$$

At this point, CNT-based design methods have been used to calculate $R_P$, $C_{INP}$, $C_{OUTP}$ for pCNTFET model 2000, and $R_N$, $C_{INN}$, and $C_{OUTN}$ for nCNTFET model 2050 for CNTFET technology with minimum dimension F=0.2 um.

The performance of two-input CCN-NAND circuit 1900 illustrated in FIG. 19 can be calculated using pCNTFET model 2000 and nCNTFET model 2050 and corresponding resistance and capacitance values given further above. Delay times for high-to-low and low-to-high output voltage transitions as well as corresponding fall times and rise times can be calculated using CCN-NAND circuit model 2100 illustrated in FIG. 21 as shown further below.

Figure 21:
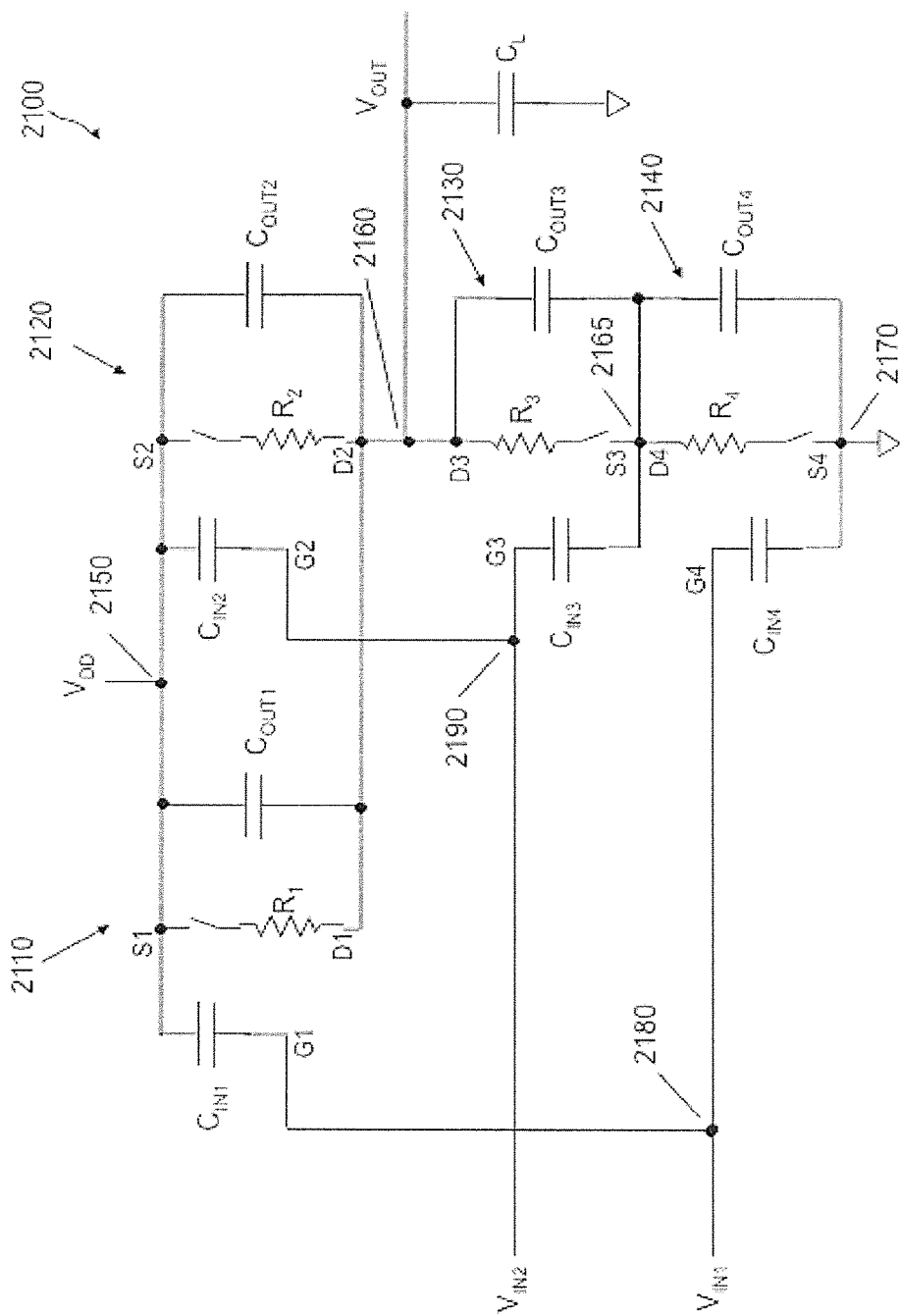
FIG. 21 illustrates an exemplary CCN-NAND circuit model.

CCN-NAND circuit model 2100 illustrated in FIG. 21, corresponding to two-input CCN-NAND circuit 1900, is illustrated in FIG. 19. pCNTFET device model 2110 corresponds to pCNTFET device model 2000, and is representative of pCNTFET 1902 (T1); pCNTFET device model 2120 corresponds to pCNTFET device model 2000, and is representative of pCNTFET 1904 (T2); nCNTFET device model 2130 corresponds to nCNTFET device model 2050, and is representative of nCNTFET 1906 (T3); and nCNTFET device model 2140 corresponds to nCNTFET device model 2050, and is representative of nCNTFET 1908 (T4). pCNTFET device model 2110 has source S1 connected to voltage source $V_{DD}$ at terminal 2150, drain D1 connected to output node 2160, and gate input G1 connected to input node 2180. pCNTFET device model 2110 input capacitance $C_{IN1}$, output capacitance $C_{OUT1}$, and resistor R1 correspond to $C_{INP}$, $C_{OUTP}$, and resistor $R_P$, respectively, illustrated in pCNTFET device model 2000. pCNTFET device model 2120 has source S2 connected to voltage source $V_{DD}$ at terminal 2150, drain D2 connected to output node 2160, and gate input G2 connected to input node 2190. pCNTFET device model 2120 input capacitance $C_{IN2}$, output capacitance $C_{OUT2}$, and resistor R2 correspond to $C_{INP}$, $C_{OUTP}$, and resistor $R_P$, respectively, illustrated in pCNTFET device model 2000. nCNTFET device model 2130 has drain D3 connected to output node 2160, source S3 connected to drain D4 at node 2165, and gate G3 connected to input node 2190. nCNTFET device model 2130 input capacitance $C_{IN3}$, output capacitance $C_{OUT3}$, and resistor R3 correspond to $C_{INN}$, $C_{OUTN}$, and resistor $R_N$, respectively, illustrated in nCNTFET device model 2050. nCNTFET device model 2140 has source S4 connected to ground at terminal 2170, drain D4 connected to source S3 at node 2165, and gate input G4 connected to input node 2180. nCNTFET device model 2140 input capacitance $C_{IN4}$, output capacitance $C_{OUT4}$, and resistor R4 correspond to $C_{INN}$, $C_{OUTN}$, and resistor $R_N$, respectively, illustrated in nCNTFET device model 2050. Capacitive load $C_L$ between output node 2160 and ground 2170 is a combination of other NAND circuit input capacitances and wire interconnect capacitance. For 2-D CCN-NAND circuit 1900 layouts, a fan out FO=6 is used. FO=4 for four gate inputs and FO=2 for the wire interconnect capacitance, and $C_L$ may be shown as $C_{L-2D}$ equal to 6 times in the input capacitance of one of the inputs of 2-input CCN-NAND circuit 1900. However, for 3-D CCN-NAND circuit 1900 layouts, a fan out FO=5 is used, FO=4 for gate input capacitance and FO=1 for the wire interconnect capacitance, and $C_L$ may be shown as $C_{L-3D}$ equal to 5 times in the input capacitance of one of the inputs of 2-input CCN-NAND circuit 1900.

CNT-based circuit response calculation methods can be used to calculate the output voltage $V_{OUT}$ based on input voltages $V_{IN1}$ and $V_{IN2}$ for two-terminal CCN-NAND circuit 1900 illustrated schematically in FIG. 19 by using corresponding CCN-NAND circuit model 2100 illustrated in FIG. 21. CNT-based circuit response calculation methods calculate R and C values corresponding to RC network 1000 illustrated in FIGS. 10A-C. A square wave corresponding to $V_{IN}$ in RC network 1000 is applied to input voltages $V_{IN1}$ and $V_{IN2}$, and the output voltage $V_{OUT}$ response is calculated. CCN-NAND circuit model 2100 is simplified for each calculation. For example, high-to-low delay time model 2200 illustrated in FIG. 22 can be used to calculate high-to-low delay time $t_{DHL}$; low-to-high delay time model 2300 illustrated in FIG. 23 can be used to calculate low-to-high delay time $t_{DLH}$; fall time model 2400 illustrated in FIG. 24 can be used to calculate fall time $t_F$, and rise time model 2500 illustrated in FIG. 25 can be used to calculate rise time $t_R$; $t_{DHL}$, $t_{DLH}$, $t_F$, and $t_R$ correspond to the definitions in FIGS. 10A-C. Output voltage $V_{OUT}$ response delays and waveform fall times and rise times have been calculated for circuit loads $C_L$ corresponding to 2-D and 3-D layouts described further below with respect to FIGS. 28-31. The two-input CCN-NAND circuit 1900 response is first calculated for a CNTFET technology with minimum dimensions F=0.2 um as described further below.

Figure 22:
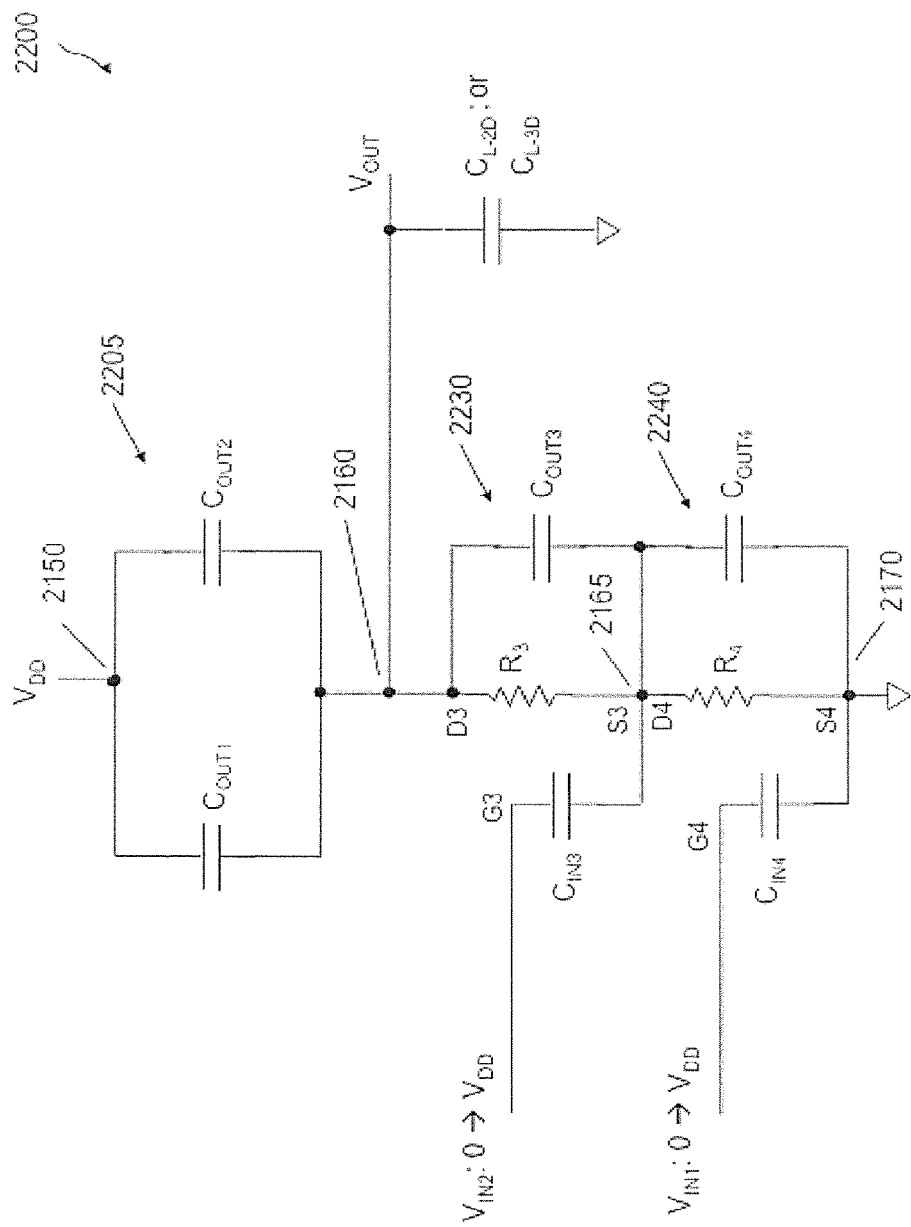
FIG. 22 illustrates an exemplary high-to-low delay time response model.

FIG. 22 illustrates an exemplary high-to-low delay time ($t_{DHL}$) response model device 2200, which is a subset of CCN-NAND circuit model 2100, when $V_{IN1}$ and $V_{IN2}$ have been at zero volts with $V_{OUT}$ charged to $V_{DD}$ and $V_{IN1}$ and $V_{IN2}$ transition to $V_{DD}$ thereby discharging output node 2160. When $V_{IN1}=V_{IN2}=V_{DD}$, switches in series with R1 and R2 open and switches in series with R3 and R4 close resulting in $t_{DHL}$ response model 2200. Model 2205 corresponds to the combination of pCNTFET device models 2110 and 2120 with switches in series with R1 and R2 in an open position, model 2230 corresponds to nCNTFET device model 2130 with the switch corresponding to R3 in a closed position, and model 2240 corresponds to nCNTFET device model 2140 with the switch corresponding to R4 in a closed position. Source, drain, gate nodes and capacitors and resistors correspond those described further above with respect to CCN-NAND circuit model 2100 illustrated in FIG. 21.

CNT-based circuit response calculation methods can be used to calculate $t_{DHL}$ as follows:

$$t_{DHL}=(R3+R4)\cdot[(C_{OUT3}\cdot C_{OUT4})/(C_{OUT3}+C_{OUT4})+C_{OUT1}+C_{OUT2}+C_L]+R4\cdot C_{IN3},$$

and $$t_{DHL}=2R_N\cdot[(C_{OUTN}/2+2C_{OUTP}+C_L]+R_N\cdot C_{IN3}, \quad [\text{EQ 22.1}]$$

where the load $C_L$ may be $C_{L-2D}$ or $C_{L-3D}$ for 2-D and 3-D layouts, respectively, of two-input CCN-NAND circuit 1900.

For a 2-input CCN-NAND circuit 1900 2-D layouts using minimum dimension F=0.2 um and $C_L=C_{L-2D}$:
$R_N$=36 kΩ, $C_{OUTN}$=2.13 fF, $C_{OUTP}$=1.07 fF, $C_{INN}$=3.19 fF, and $C_{L-2D}$=28.7 fF.

Substituting in Equation 22.1 results in:

$$t_{DHL}=2.41 \text{ ns.} \quad [\text{EQ 22.2}]$$

For a 2-input CCN-NAND circuit 1900 3-D layouts using minimum dimension F=0.2 um and $C_L=C_{L-3D}$:
$R_N$=36 kΩ, $C_{OUTN}$=2.13 fF, $C_{OUTP}$=1.07 fF, $C_{INN}$=3.19 fF; $C_{L-3D}$=24.0 fF.

Substituting in equation 22.1 results in:

$$t_{DHL}=2.07 \text{ ns.} \quad [\text{EQ 22.3}]$$

Figure 23:
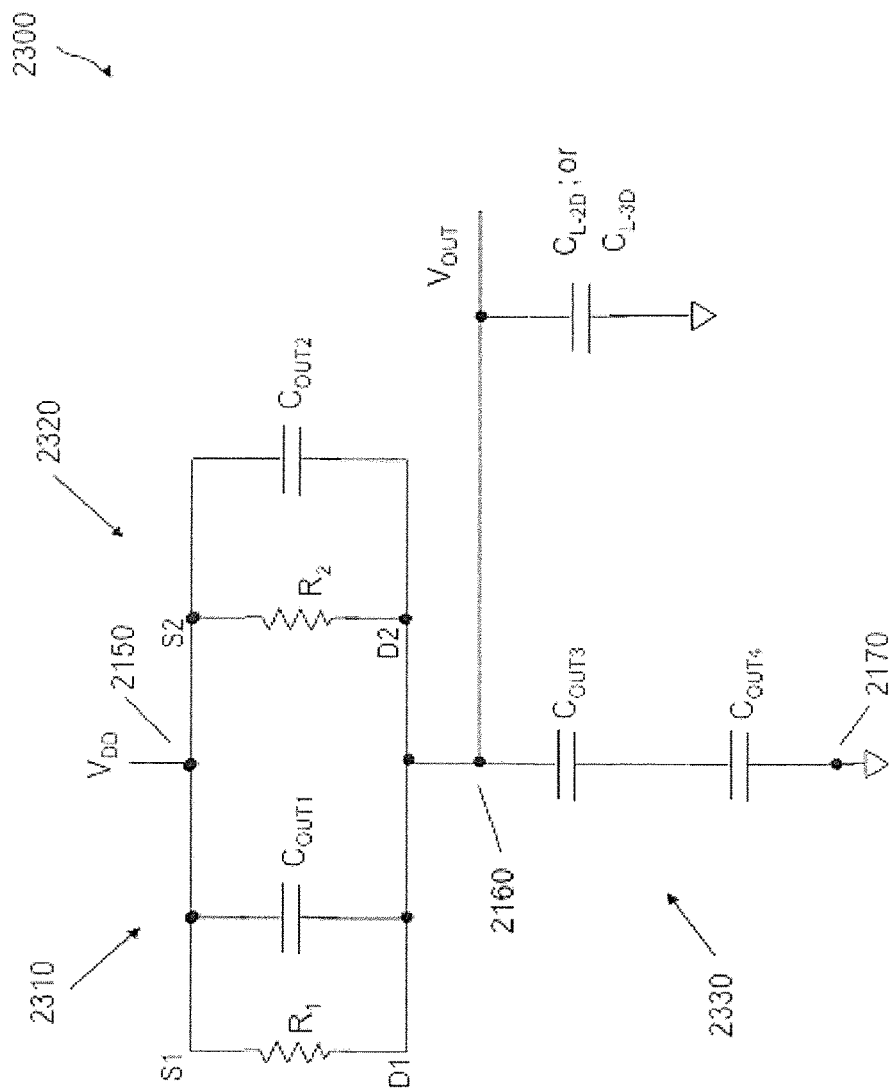
FIG. 23 illustrates an exemplary low-to-high delay time response model.

FIG. 23 illustrates an exemplary low-to-high delay time ($t_{DLH}$) response model device 2300, which is a subset of CCN-NAND circuit model 2100, when $V_{IN1}$ and $V_{IN2}$ have been at $V_{DD}$ with $V_{OUT}$ discharged to ground (zero volts in this example) and $V_{IN1}$ and $V_{IN2}$ transition to zero volts thereby charging output node 2160. When $V_{IN1}=V_{IN2}=0$, switches in series with R1 and R2 close and switches in series with R3 and R4 open resulting in $t_{DLH}$ response model 2300. Model 2310 corresponds to pCNTFET device model 2110 with the switch in series with R1 in a closed position, and model 2320 corresponds to pCNTFET device model 2120 with the switch in series R2 in a closed position. Model 2330 corresponds to the combination of nCNTFET device models 2130 and 2140 with switches in series with R3 and R4 in an open position. Source, drain, gate nodes and capacitors and resistors correspond those described further above with respect to CCN-NAND circuit model 2100 illustrated in FIG. 21.

CNT-based circuit response calculation methods can be used to calculate $t_{DLH}$ as follows:

$$t_{DLH}=(R1\cdot R2)/(R1+R2)\cdot[(C_{OUT3}\cdot C_{OUT4})/(C_{OUT3}+C_{OUT4})+C_{OUT1}+C_{OUT2}+C_L], \text{ and}$$

$$t_{DLH}=(R_P/2)\cdot[2C_{OUTP}+C_{OUTN}/2+C_L], \quad [\text{EQ 23.1}]$$

where the load $C_L$ may be $C_{L-2D}$ or $C_{L-3D}$ for 2-D and 3-D layouts, respectively, of two-input CCN-NAND circuit 1900.

For a 2-input CCN-NAND circuit 1900 2-D layouts using minimum dimension F=0.2 um and $C_L=C_{L-2D}$:
$R_P$=144 kΩ, $C_{OUTP}$=1.07 fF, $C_{OUTN}$=2.13 Ff; $C_{L-2D}$=28.7 fF.

Substituting in equation 23.1 results in:

$$t_{DLH}=2.30 \text{ ns.} \quad [\text{EQ 23.2}]$$

For a 2-input CCN-NAND circuit 1900 3-D layouts using minimum dimension F=0.2 um and $C_L=C_{L-3D}$:
$R_P$=144 kΩ, $C_{OUTN}$=2.13 fF, $C_{OUTP}$=1.07 fF; $C_{L-3D}$=24.0 fF.

Substituting in equation 23.1 results in:

$t_{DLH}$=1.96 ns. [EQ 23.3]

Figure 24:
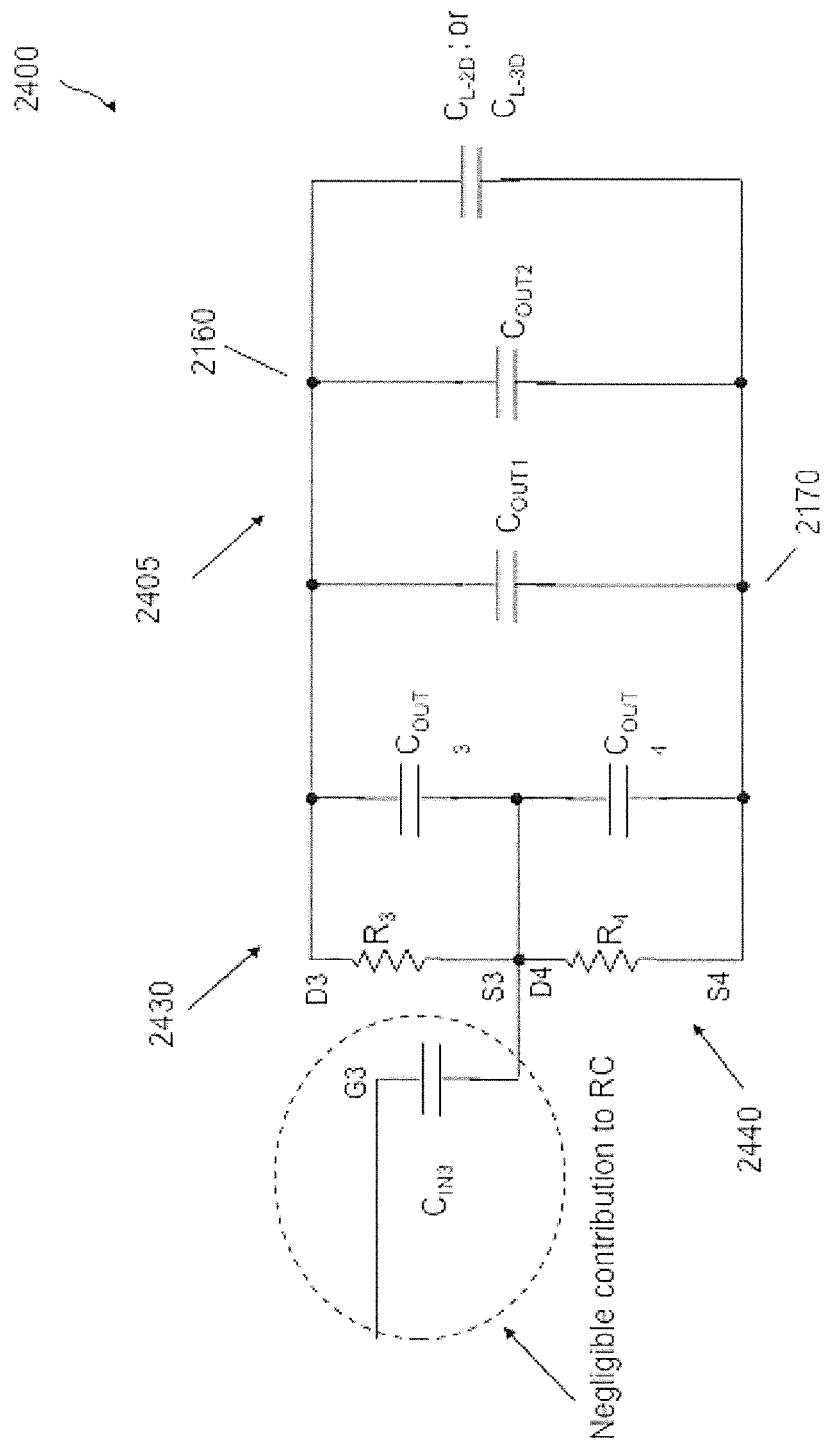
FIG. 24 illustrates an exemplary fall time response model.

FIG. 24 illustrates an exemplary fall time ($t_F$) response model 2400, which is a subset of CCN-NAND circuit model 2100, when $V_{IN1}$ and $V_{IN2}$ have been at zero volts with $V_{OUT}$ charged to $V_{DD}$ and $V_{IN1}$ and $V_{IN2}$ transition to $V_{DD}$ thereby discharging output node 2160. When $V_{IN1}=V_{IN2}=V_{DD}$, switches in series with R1 and R2 open and switches in series with R3 and R4 close resulting in $t_F$ response model 2400. Model 2405 corresponds to the combination of pCNTFET device models 2110 and 2120 with switches in series with R1 and R2 in an open position, model 2430 corresponds to nCNTFET device model 2130 with the switch corresponding to R3 in a closed position, and model 2440 corresponds to nCNTFET device model 2140 with the switch corresponding to R4 in a closed position. Source, drain, gate nodes and capacitors and resistors correspond those described further above with respect to CCN-NAND circuit model 2100 illustrated in FIG. 21.

CNT-based circuit response calculation methods can be used to calculate $t_F$. In particular, capacitors discharge, and output voltage $V_{OUT}$ on node 2160 with respect to ground 2170 decays from $V_{DD}$ to ground (zero) with a time constant $t_F$. The time constant $t_F$ can be calculated as follows (as illustrated in FIGS. 10A-C):

$t_F$=2RC. [EQ 24.1]

For a 2-input CCN-NAND circuit 1900 2-D layouts using minimum dimension F=0.2 um and $C_L=C_{L-2D}$:

$R=R3+R4$=36 kΩ+36 kΩ=72 kΩ, and [EQ 24.2]

$C$=2.13/2+2×1.07+28.7=31.9 fF. [EQ 24.3]

Substituting in equation 24.1 results in:

$t_F$=4.59 ns. [EQ 24.4]

For a 2-input CCN-NAND circuit 1900 3-D layouts using minimum dimension F=0.2 um and $C_L=C_{L-3D}$:

$R=R3+R4$=36 kΩ+36 kΩ=72 kΩ, and $C$=2.13/2+2×1.07+24.0=27.2 fF. [EQ 24.5]

Substituting in equation 24.1 results in:

$t_F$=3.92 ns. [EQ 24.5]

Figure 25:
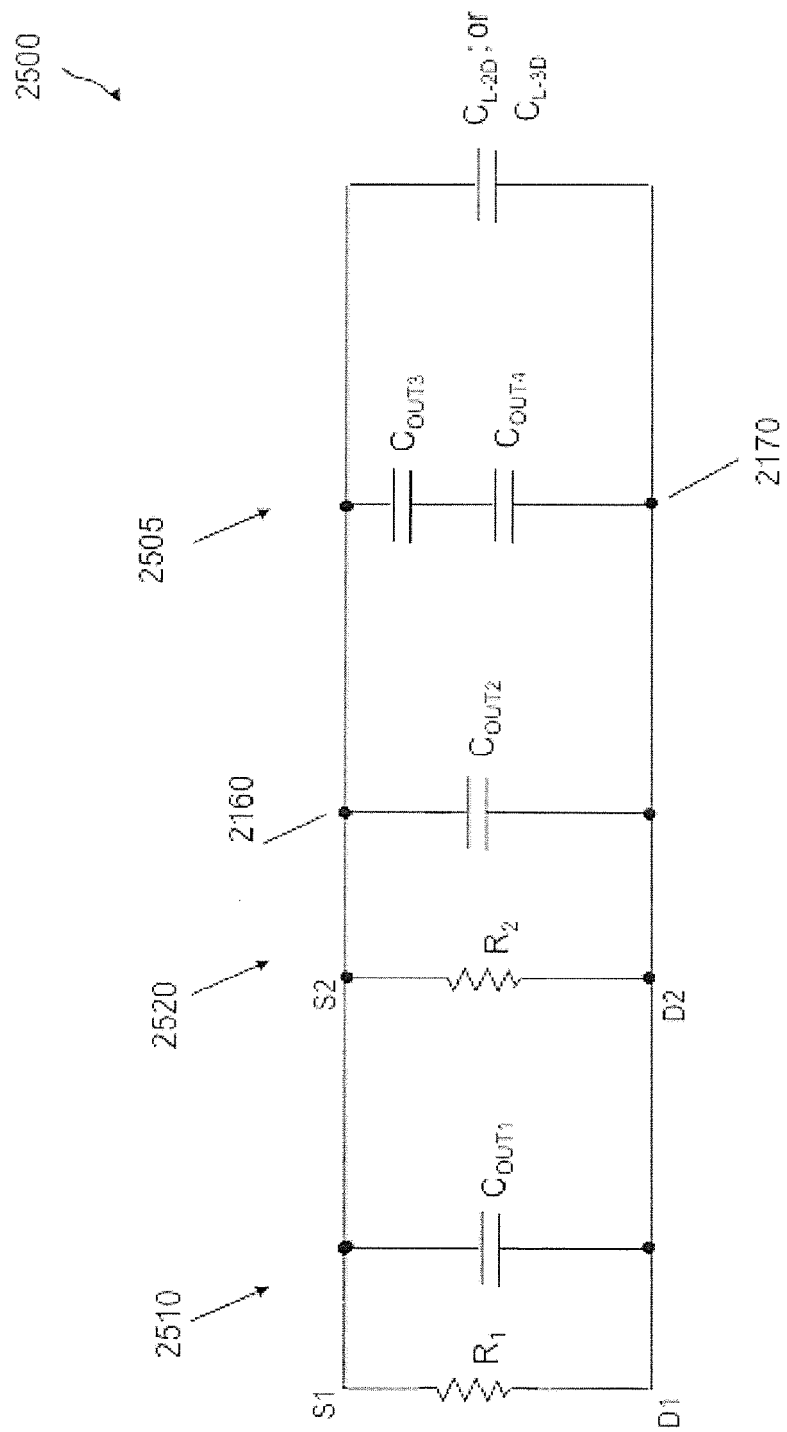
FIG. 25 illustrates an exemplary rise time response model.

FIG. 25 illustrates an exemplary rise time ($t_R$) response model device 2500, which is a subset of CCN-NAND circuit model 2100, when $V_{IN1}$ and $V_{IN2}$ have been at $V_{DD}$ with $V_{OUT}$ discharged to ground (zero volts in this example) and $V_{IN1}$ and $V_{IN2}$ transition to zero volts thereby charging output node 2160. When $V_{IN1}=V_{IN2}=0$, switches in series with R1 and R2 close and switches in series with R3 and R4 open resulting in $t_R$ response model 2500. Model 2510 corresponds to pCNTFET device model 2110 with the switch in series with R1 in a closed position, and model 2520 corresponds to pCNTFET device model 2120 with the switch in series R2 in a closed position. Model 2505 corresponds to the combination of nCNTFET device models 2130 and 2140 with switches in series with R3 and R4 in an open position. Source, drain, gate nodes and capacitors and resistors correspond those described further above with respect to CCN-NAND circuit model 2100 illustrated in FIG. 21.

CNT-based circuit response calculation methods can be used to calculate $t_R$. In particular, capacitors discharge, and output voltage $V_{OUT}$ on node 2160 with respect to ground 2170 changes from ground (zero) to $V_{DD}$ with a time constant $t_R$. Time constant $t_R$ can be calculated as follows (as illustrated in FIGS. 10A-C):

$t_R$=2 RC. [EQ 25.1]

For aq 2-input CCN-NAND circuit 1900 2-D layouts using minimum dimension F=0.2 um and $C_L=C_{L-2D}$:

$R=R1 \cdot R2/(R1+R2)$; $R=R1/2$ or $R2/2$ since $R1=R2$, $R$=144 kΩ/2; $R$=72 kΩ, and [EQ 25.2]

$C$=2×1.07+2.13/2+28.7=31.9 fF. [EQ 25.3]

Substituting in equation 25.1 results in:

$t_R$=4.59 ns. [EQ 25.4]

For a 2-input CCN-NAND circuit 1900 3-D layouts using minimum dimension F=0.2 um and $C_L=C_{L-3D}$:

$R$=72 kΩ, and $C$=2×1.07+2.13/2+24.0=36.8 Ff. [EQ 25.5]

Substituting in equation 25.1 results in:

$t_R$=3.92 ns. [EQ 25.6]

Figure 26A:
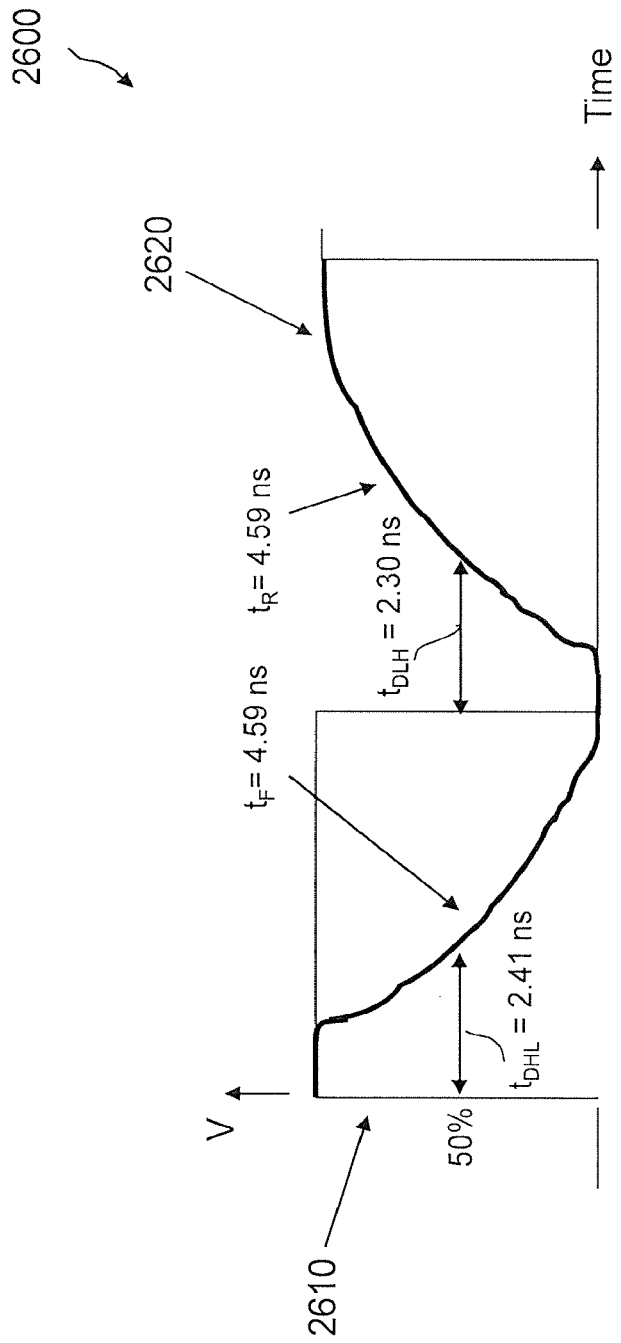
FIG. 26A illustrates an exemplary combined input/output voltage response.

The output voltage ($V_{OUT}$) signal (response) of 2-input CCN-NAND circuit 1900 to input signal voltages $V_{IN1}$ and $V_{IN2}$, using calculations of $t_{DHL}$, $t_{DLH}$, $t_F$, and $t_R$ shown further above and based on the circuit response corresponding CCN-NAND circuit 2100 model, is illustrated by combined input/output voltage response 2600 shown in FIG. 26A. $t_{DHL}$, $t_{DLH}$, $t_F$, and $t_R$ are given by equations 22.2, 23.2, 24.4, and 25.4, respectively, shown further above. Output voltage ($V_{OUT}$) signal 2620 at node 1924 corresponds to input signal 2610 applied to input nodes 1920 and 1922 of 2-input CCN-NAND circuit 1900 for 2-D layouts using minimum dimension F=0.2 um and a load capacitance $C_{L-2D}$=28.7 fF as described further above.

CNT-based circuit response calculation methods can be used to calculate the propagation delay as follows:

propagation delay=$t_{DHL}+t_{DLH}$=2.41+2.30=4.71 ns. [EQ 26.1]

Figure 26B:
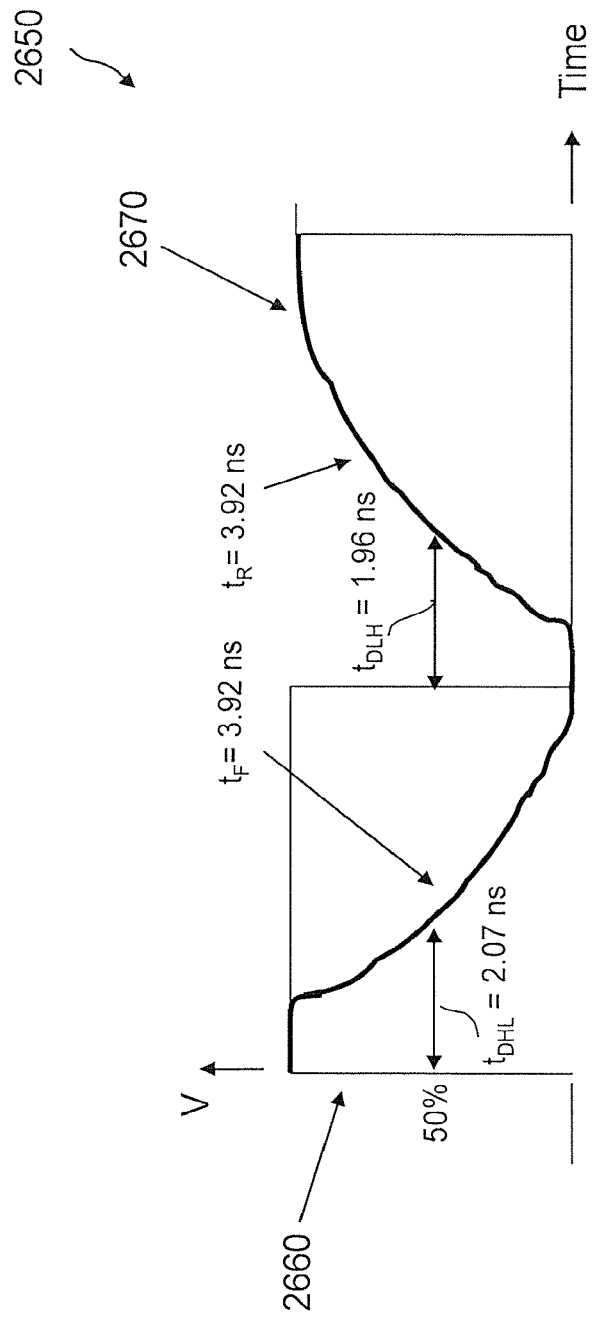
FIG. 26B illustrates an exemplary combined input/output voltage response.

The output voltage ($V_{OUT}$) signal (response) of 2-input CCN-NAND circuit 1900 to input signal voltages $V_{IN1}$ and $V_{IN2}$, using calculations of $t_{DHL}$, $t_{DLH}$, $t_F$, and $t_R$ shown further above and based on the circuit response corresponding CCN-NAND circuit 2100 model, is illustrated by combined input/output voltage response 2650 shown in FIG. 26B. $t_{DHL}$, $t_{DLH}$, $t_F$, and $t_R$ are given by equations 22.3, 23.3, 24.5, and 25.5, respectively, shown further above. Output voltage ($V_{OUT}$) signal 2670 at node 1924 corresponds to input signal 2660 applied to input nodes 1920 and 1922 of 2-input CCN-NAND circuit 1900 for 3-D layouts using minimum dimension F=0.2 um and a load capacitance $C_{L-3D}$=24.0 as described further above.

CNT-based circuit response calculation methods can be used to calculate the propagation delay as follows:

propagation delay=$t_{DHL}+t_{DLH}$=2.07+1.96=4.03 ns. [EQ 26.2]

CNTFET Two-Input NAND Circuit (0.1 μm Technology Node)

Having completed two-input CCN-NAND circuit 1900 response calculations for CNTFET technology with minimum dimensions F=0.2 um and capacitive loading $C_{L-2D}$ and $C_{L-3D}$ layouts described further above, two input CCN-NAND circuit 1900 response is calculated for a CNTFET technology with a minimum dimension F=0.1 um as described further below. These calculations use the same CNT-based circuit response calculation methods described further above for CNTFET technology with minimum dimensions F=0.2 um. For example, high-to-low delay time model 2200 illustrated in FIG. 22 is used to calculate high-to-low $t_{DHL}$; low-to-high delay time model 2300 illustrated in FIG. 23 is used to calculate low-to-high $t_{DLH}$; fall time model 2400 illustrated in FIG. 24 is used to calculate fall time $t_F$, and rise time model 2500 illustrated in FIG. 25 is used to calculate rise time $t_R$; $t_{DHL}$, $t_{DLH}$, $t_F$, and $t_R$ correspond to the definitions in FIGS. 10A-C. Output voltage $V_{OUT}$ response delays and waveform fall times and rise times have been calculated for circuit loads $C_L$ corresponding to 2-D and 3-D layouts described further below with respect to FIGS. 28-31. However, CNTFET device length and width dimensions are reduced by a factor of 2 and corresponding circuit model parameter values change as well because of the smaller dimensions associated with a CNTFET technology with minimum dimension F=0.1 um, resulting in shorter delay times and faster fall times and rise times.

As described further above, various values of $W_N$, $L_N$, $W_P$, and $L_P$ may be chosen that satisfy equation 11.3. CNTFET device design parameter relationships that satisfies equation 11.3 are illustrated by equations 11.4 and 11.5:

$$W_N = \sqrt{2} W_P, \quad \text{[EQ 11.4]}$$

$$L_P = \sqrt{2} L_N. \quad \text{[EQ 11.5]}$$

Another set of CNTFET device design parameter relationships that satisfies equation 11.3 can be illustrated by equations 11.4A and 11.5A:

$$W_N = 2 W_P, \quad \text{[EQ 11.4A]}$$

$$L_P = L_N. \quad \text{[EQ 11.5A]}$$

As is shown further below, layouts corresponding to two-input CCN-NAND circuit 1900 using CNTFET device dimensions illustrated in equations 11.4A and 11.5A result in a preferred layout.

One set of CNTFET device design dimensions that meet the condition that $V_{OUT} = V_{SP} = V_{DD}/2$ when inputs $V_{IN1} = V_{IN2} = V_{SP} = V_{DD/2}$ for a minimum technology dimension F=0.1 um is as follows. If $L_N$ is chosen as 0.1 um and $W_N$ is chosen as 4 um, and equations 11.1A and 11.5A are satisfied, then:

$L_N$=0.1 um and $W_N$=4 um for pCNTFET devices 1902 (T1) and 1904 (T2); and $L_P$=0.1 um and $W_P$=2 um for 2-terminal CCN-NAND circuit 1900 illustrated in FIG. 19.

Then, carbon nanotube (CNT)-based design methods can be used to calculate values of resistance for pCNTFET device model 2000 and nCNTFET device model 2050 using CNTFET device dimensions, material parameters such as dielectric constants and nanotube fabric constants, and nanotube fabric constants. In this example:

$V_{DD}$=3.5 V, $V_{SP}$=$V_{DD}$/2=1.75 V, $V_{TN}$=0.5 V, $|V_{TP}|$=0.5 V, $t_G$=7 nm (for both p and n-type CNTFETs), $R_{NT}$=$d_{NT}$/2=0.5 nm, the CNT radius, $NTFC_N$=$8\times10^5$, $NTFC_P$=$4\times10^5$ cm/V·s, $W_P$=2 um, $L_P$=0.1 um, $W_N$=4 um, and $L_N$=0.1 um.

For CNTFET technology with minimum dimension F=0.1, $W_P/L_P$=2.8/0.14=20 and $W_N/L_N$=4/0.1=40, the same ratios can be used as illustrated further above for CNTFET technology with F=0.2 um. All other parameters remain the same. Therefore, based on equations 11.6 and 11.8, $R_P$ and $R_N$ remain unchanged. Therefore, for CNTFET technology with F=0.1 um:

$$R_P = 144 \text{ k}\Omega, \quad \text{[EQ 11.18]}$$

and $$R_N = 36 \text{ k}\Omega. \quad \text{[EQ 11.19]}$$

Next, CNT-based design methods calculate the capacitance values for pCNTFET device model 2000 and nCNTFET device model 2050 using CNTFET device dimensions, material parameters, and nanotube fabric constants for CNTFET technology with minimum dimension F=0.1. In this example:

Capacitance values $C_{INP}$, $C_{OUTP}$ and $C_{INN}$, $C_{OUTN}$ shown in pCNTFET device model 2000 and nCNTFET device model 2050, respectively, illustrated in FIGS. 20A and 20B are calculated from corresponding gate-to-fabric capacitance values $C_{GFp}$ and $C_{GFn}$ for pCNTFET and nCNTFET devices, respectively. $C_{GFp}$ and $C_{GFn}$ are calculated using equation 7.1 further above which gives gate-to-fabric capacitance values as a function of CNTFET device dimensions and material parameters. For pCNTFET devices 1902 (T1) and 1904 (T2), approximated by pCNTFET device model 2000, the capacitance value $C_{GFp}$ is calculated as follows (where W & L are in μm):

$$C_{GFp} = (W_P \cdot L_P)[1.1 \varepsilon_R / \ln(2 t_G / R_{NT})] \text{ fF}, \quad \text{[EQ 11.10]}$$

$$C_{GFp} = (2 \times 0.1)[1.1 \times 4 / \ln(2 \times 7 / 0.5)], \text{ and}$$

$$C_{GFp} = 0.27 \text{ fF}. \quad \text{[EQ 11.20]}$$

Then, input and output capacitance values for pCNTFET model 2000 are calculated as follows:

$$C_{INP} = (3/2) C_{GFp}; \ C_{INP} = 0.41 \text{ fF, and} \quad \text{[EQ 11.21]}$$

$$C_{OUTP} = C_{GFp}; \ C_{OUTP} = 0.27 \text{ fF}. \quad \text{[EQ 11.22]}$$

For nCNTFET devices 1906 (T3) and 1908 (T4), approximated by nCNTFET device model 2050, the capacitance value $C_{GFn}$ can be calculated as follows (where W & L are in μm):

$$C_{GFn} = (W_N \cdot L_N)[1.1 \varepsilon_R / \ln(2 t_G / R_{NT})] \text{ fF}, \quad \text{[EQ 11.14]}$$

$$C_{GFn} = (4 \times 0.1)[1.1 \times 4 / \ln(2 \times 7 / 0.5)], \text{ and}$$

$$C_{GFn} = 0.53 \text{ fF}. \quad \text{[EQ 11.23]}$$

Then, input and output capacitance values for pCNTFET model 2000 can be calculated as follows:

$$C_{INN} = (3/2) C_{GFn}; \ C_{INN} = 0.79 \text{ fF}, \quad \text{and [EQ 11.24]}$$

$$C_{OUTN} = C_{GFn}; \ C_{OUTN} = 0.53 \text{ fF}. \quad \text{[EQ 11.25]}$$

At this point, CNT-based design methods have been used to calculate $R_P$, $C_{INP}$, $C_{OUTP}$ for pCNTFET model 2000, and $R_N$, $C_{INN}$, and $C_{OUTN}$ for nCNTFET model 2050 for CNTFET technology with minimum dimension F=0.1 um.

CNT-based circuit response calculation methods, similar to those described further above, can be used to calculate $t_{DHL}$, based on $t_{DHL}$ response model 2200 illustrated in FIG. 22, as follows:

$$t_{DHL} = (R3+R4) \cdot [(C_{OUT3} \cdot C_{OUT4})/(C_{OUT3}+C_{OUT4}) + C_{OUT1}+C_{OUT2}+C_L] + R4 \cdot C_{IN3},$$

and $$t_{DHL} = 2 R_N \cdot [(C_{OUTN}/2 + 2 C_{OUTP} + C_L] + R_N \cdot C_{IN3}, \quad \text{[EQ 22.1]}$$

where the load $C_L$ may be $C_{L-2D}$ or $C_{L-3D}$ for 2-D and 3-D layouts, respectively, of two-input CCN-NAND circuit 1900.

For a 2-input CCN-NAND circuit 1900 2-D layouts using minimum dimension F=0.1 um and $C_L = C_{L-2D}$:

$R_N$=36 kΩ, $C_{OUTN}$=0.53 fF, $C_{OUTP}$=0.27 fF, $C_{INN}$=0.79 fF, $C_{L-2D}$=7.2 fF.

Substituting in Equation 22.1 results in:

$t_{DHL}$=604 ps. [EQ 22.4]

For a 2-input CCN-NAND circuit 1900 3-D layouts using minimum dimension F=0.2 um and $C_L$=$C_{L-3D}$:
$R_N$=36 kΩ, $C_{OUTN}$=0.53 fF, $C_{OUTP}$=0.27 fF, $C_{INN}$=0.79 fF; $C_{L-3D}$=6.0 fF.

Substituting in Equation 22.1 results in:

$t_{DHL}$=518 ps. [EQ 22.5]

CNT-based circuit response calculation methods, similar to those described further above, can be used to calculate $t_{DLH}$, based on $t_{DLH}$ response model 2300 illustrated in FIG. 23, as follows:

$t_{DLH}$=(R1·R2)/(R1+R2)·[($C_{OUT3}$·$C_{OUT4}$)/($C_{OUT3}$+ $C_{OUT4}$)+$C_{OUT1}$+$C_{OUT2}$+$C_L$], and $t_{DLH}$=($R_P$/2)·[2$C_{OUTP}$+$C_{OUTN}$/2+$C_L$], [EQ 23.1]

where the load $C_L$ may be $C_{L-2D}$ or $C_{L-3D}$ for 2-D and 3-D layouts, respectively, of two-input CCN-NAND circuit 1900.

For a 2-input CCN-NAND circuit 1900 2-D layouts using minimum dimension F=0.1 um and $C_L$=$C_{L-2D}$:
$R_P$=144 kΩ, $C_{OUTN}$=0.53 fF, $C_{OUTP}$=0.27 Ff; $C_{L-2D}$=7.2 fF.

Substituting in equation 23.1 results in:

$t_{DLH}$=576 ps. [EQ 23.3]

For a 2-input CCN-NAND circuit 1900 3-D layouts using minimum dimension F=0.1 um and $C_L$=$C_{L-3D}$:
$R_P$=144 kΩ, $C_{OUTN}$=53 fF, $C_{OUTP}$=0.27 fF; $C_{L-3D}$=6.0 fF.

Substituting in equation 23.1 results in:

$t_{DLH}$=490 ps. [EQ 23.4]

CNT-based circuit response calculation methods can be used to calculate $t_F$. In particular, capacitors discharge, and output voltage $V_{OUT}$ on node 2160 with respect to ground 2170 decays from $V_{DD}$ to ground (zero) with a time constant $t_F$. Time constant $t_F$ can be calculated as follows (as illustrated in FIGS. 10A-C):

$t_F$=2RC. [EQ 24.1]

For a 2-input CCN-NAND circuit 1900 2-D layouts using minimum dimension F=0.1 um and $C_L$=$C_{L-2D}$:

$R$=R3+R4=36 kΩ+36 kΩ=72 kΩ, and [EQ 24.6]

$C$=0.53/2+2×0.27+7.2=8.0 fF. [EQ 24.7]

Substituting in equation 24.1 results in:

$t_F$=1.15 ns. [EQ 24.8]

For a 2-input CCN-NAND circuit 1900 3-D layouts using minimum dimension F=0.1 um and $C_L$=$C_{L-3D}$:

$R$=R3+R4=36 kΩ+36 kΩ=72 kΩ, and $C$=0.53/2+2×0.27+6.0=6.8 fF. [EQ 24.9]

Substituting in equation 24.1 results in:

$t_F$=979 ps. [EQ 24.10]

CNT-based circuit response calculation methods can be used to calculate $t_R$. In particular, capacitors discharge, and output voltage $V_{OUT}$ on node 2160 with respect to ground 2170 changes from ground (zero) to $V_{DD}$ with a time constant $t_R$. Time constant $t_R$ can be calculated as follows (as illustrated in FIGS. 10A-C):

$t_R$=2RC. [EQ 25.1]

For a 2-input CCN-NAND circuit 1900 2-D layouts using minimum dimension F=0.1 um and $C_L$=$C_{L-2D}$:

R=R1·R2/(R1+R2); R=R1/2 or R2/2 since R1=R2,

R=144 kΩ/2; R=72 kΩ, and [EQ 25.2]

C=2×0.27+0.53/2+7.2=8.0 fF. [EQ 25.7]

Substituting in equation 25.1 results in:

$t_R$=1.15 ns. [EQ 25.8]

For a 2-input CCN-NAND circuit 1900 3-D layouts using minimum dimension F=0.1 um and $C_L$=$C_{L-3D}$:

R=72 kΩ,

C=2×0.27+0.53/2+6.0=6.8 Ff, and [EQ 25.9]

$t_R$=979 ps. [EQ 25.10]

Figure 27A:
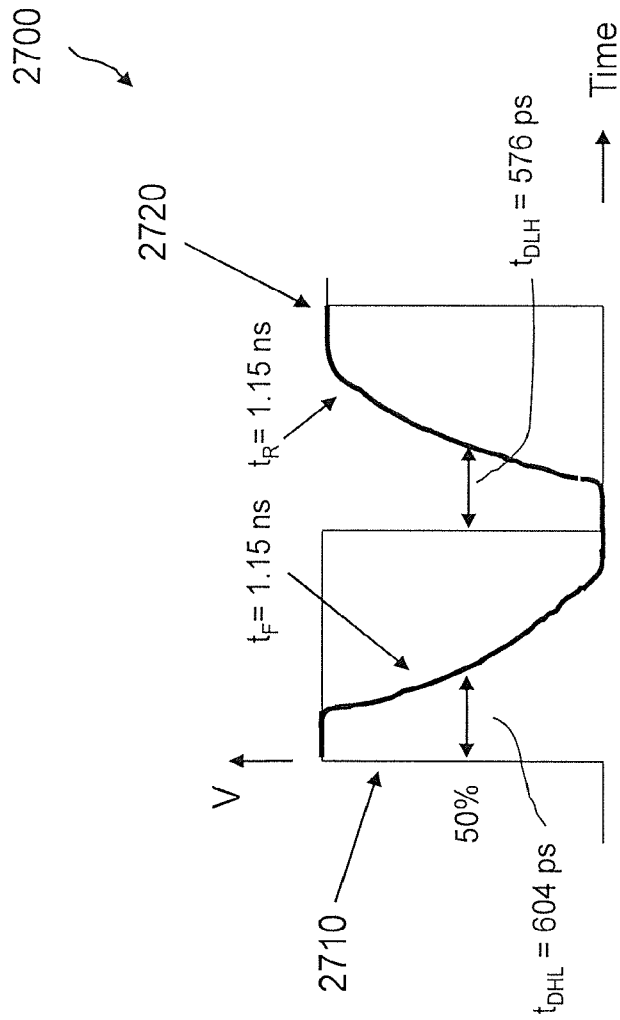
FIG. 27A illustrates an exemplary combined input/output voltage response.

The output voltage ($V_{OUT}$) signal (response) of 2-input CCN-NAND circuit 1900 to input signal voltages $V_{IN1}$ and $V_{IN2}$, using calculations of $t_{DHL}$, $t_{DLH}$, $t_F$, and $t_R$ shown further above and based on the circuit response corresponding CCN-NAND circuit 2100 model, is illustrated by combined input/output voltage response 2700 shown in FIG. 27A. $t_{DHL}$, $t_{DLH}$, $t_F$, and $t_R$ are given by equations 22.4, 23.3, 24.8, and 25.8, respectively, shown further above. Output voltage ($V_{OUT}$) signal 2720 at node 1924 corresponds to input signal 2710 applied to input nodes 1920 and 1922 of 2-input CCN-NAND circuit 1900 for 2-D layouts using minimum dimension F=0.1 um and a load capacitance $C_{L-2D}$=9.5 fF as described further above.

CNT-based circuit response calculation methods can be used to calculate the propagation delay as follows:

propagation delay=$t_{DHL}$+$t_{DLH}$=604 ps+576 ps=1.18 ns. [EQ 27.1]

Figure 27B:
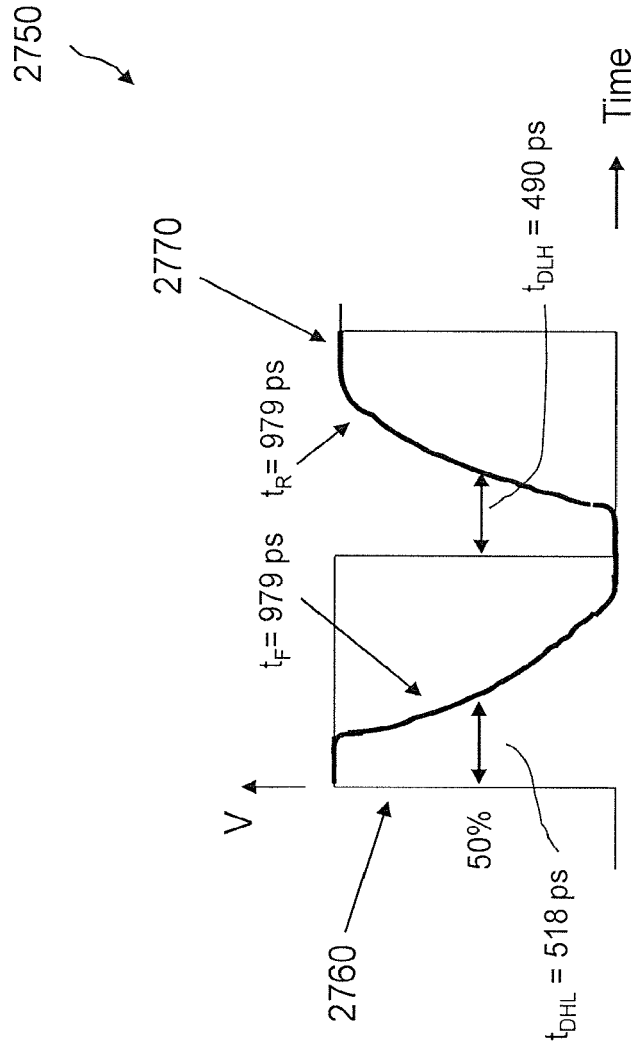
FIG. 27B illustrates an exemplary combined input/output voltage response.

The output voltage ($V_{OUT}$) signal (response) of 2-input CCN-NAND circuit 1900 to input signal voltages $V_{IN1}$ and $V_{IN2}$, using calculations of $t_{DHL}$, $t_{DLH}$, $t_F$, and $t_R$ shown further above and based on the circuit response corresponding CCN-NAND circuit 2100 model, is illustrated by combined input/output voltage response 2750 shown in FIG. 27B. $t_{DHL}$, $t_{DLH}$, $t_F$, and $t_R$ are given by equations 22.5, 23.4, 24.9, and 25.9, respectively, shown further above. Output voltage ($V_{OUT}$) signal 2770 at node 1924 corresponds to input signal 2760 applied to input nodes 1920 and 1922 of 2-input CCN-NAND circuit 1900 for 3-D layouts using minimum dimension F=0.1 um and a load capacitance $C_{L-3D}$=7.8 as described further above.

CNT-based circuit response calculation methods can be used to calculate the propagation delay as follows:

propagation delay=$t_{DHL}$+$t_{DLH}$=518 ps+490 ps=1.00 ns. [EQ 27.2]

Two-Input Complementary Carbon Nanotube NAND Circuit Two-Dimensional and Three-Dimensional Layouts The flexibility of placement and wiring of CNTFET devices using nanotube fabric layers results in denser layouts when compared with standard CMOS technology using FET devices coupled to a semiconductor substrate as illustrated further below. FIGS. 28-31 illustrate two-input circuit 1900 designed in two-dimensional (2-D) and three-dimensional (3-D) configurations.

Figure 28:
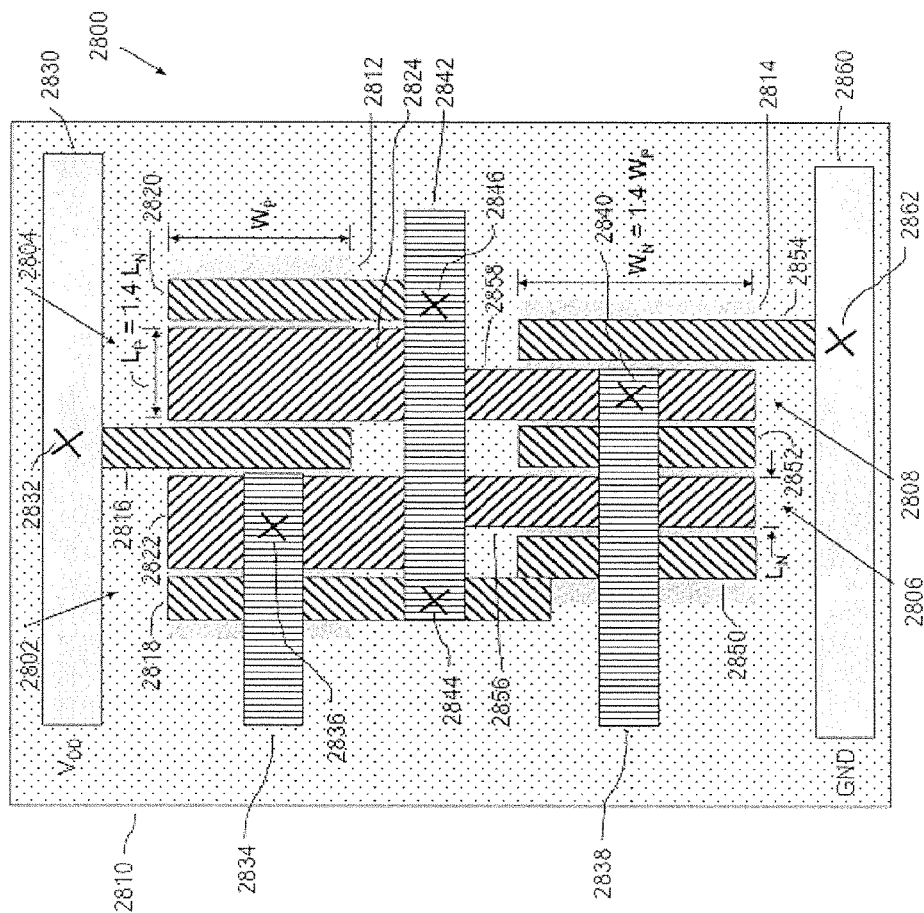
FIG. 28 illustrates a layout plan view of an exemplary two-input complementary carbon nanotube NAND circuit.

FIG. 28 illustrates layout plan view 2800 corresponding to two-input CCN-NAND circuit 1900 illustrated schematically in FIG. 19. pCNTFET devices 2802 and 2804 correspond to pCNTFET devices 1902 (T1) and 1904 (T2), respectively, and nCNTFET devices 2806 and 2808 correspond to nCNTFET devices 1906 (T3) and 1908 (T3), respectively, shown schematically in two-input CCN-NAND circuit 1900. Interconnections correspond to those shown schematically in two-input CCN-NAND circuit 1900. Layout plan view 2800 corresponds to CNTFET technologies with minimum dimensions F. In the examples illustrated further above, CNTFET device characteristics for F=0.2 um and F=0.1 um have been described.

pCNTFET devices 2802 and 2804 and nCNTFET devices 2806 and 2806 structures correspond to the structures of CNTFET devices illustrated by the top view of CNTFET 200 described further above with respect to FIG. 2A and the cross section of CNTFET 250 described further above with respect to FIG. 2B. The CNTFET device structures and wiring (interconnection) is used to form two-input CCN-NAND circuit 1900 illustrated schematically further above in FIG. 19 for both pCNTFET devices 1902 and 1904 and nCNTFET devices 1906 and 1908. The relationship between $W_N$, $W_P$, $L_N$, and $L_P$ is given further above for minimum technology dimensions F=0.2 um and 0.1 um. Wiring dimensions are typically approximately equal to F.

FIG. 28 illustrates layout plan view of an exemplary NAND device 2800 with patterned nanotube fabric regions forming nanotube fabric islands 2812 and 2814 on the surface of insulator 2810. Nanotube fabric islands may be formed by etching (removing) portions of the nanotube fabric using known process methods. Nanotube fabric islands 2812 and 2814 correspond to NT fabric 252 and insulator 2810 corresponds to insulator 254 illustrated in FIGS. 2A and 2B. pCNTFET devices 2802 and 2804 are formed on NT fabric island 2812. Shared source conductor 2816, corresponding to source conductor 202 in FIGS. 2A and 2B and connected to power supply wiring 2830 by contact 2832, provides a shared source region corresponding to source region 264. Drain conductor 2818 forms a drain region corresponding to drain region 266 and is connected to output 2842 by contact 2844; and drain conductor 2820 forms a drain region corresponding to drain region 266 and is connected to output 2842 by contact 2846. Gate conductor 2822 with an underlying gate insulator (not visible), connected to input 2834 by contact 2836, corresponds to gate conductor 260 with gate insulator 258 illustrated in FIGS. 2A and 2B. Gate conductor 2824 with an underlying gate insulator (not visible), connected to input 2838 by contact 2840, corresponds to gate conductor 260 with gate insulator 258 illustrated in FIGS. 2A and 2B. nCNTFET devices 2806 and 2808 are formed on a patterned NT fabric region forming NT fabric island 2814. Drain conductor 2850, corresponding to source conductor 202 in FIGS. 2A and 2B, provides a source region corresponding to source region 264. Shared drain and source conductor 2852 forms both the source region of nCNTFET 2806 and the drain region of nCNTFET 2808 (nCNTFET devices 2806 and 2808 are in series). Source conductor 2854 forms a source region corresponding to source region 264 and is connected to ground wiring 2860 by contact 2862. Source 2850 is connected to source 2818. Gate conductor 2856 with an underlying gate insulator (not visible), connected to gate conductor 2822 and input 2834 by contact 2836, corresponds to gate conductor 260 with gate insulator 258 illustrated in FIGS. 2A and 2B. Gate conductor 2858 with an underlying gate insulator (not visible), connected to gate conductor 2824 and input 2838 by contact 2840, corresponds to gate conductor 260 with gate insulator 258 illustrated in FIGS. 2A and 2B.

Figure 29:
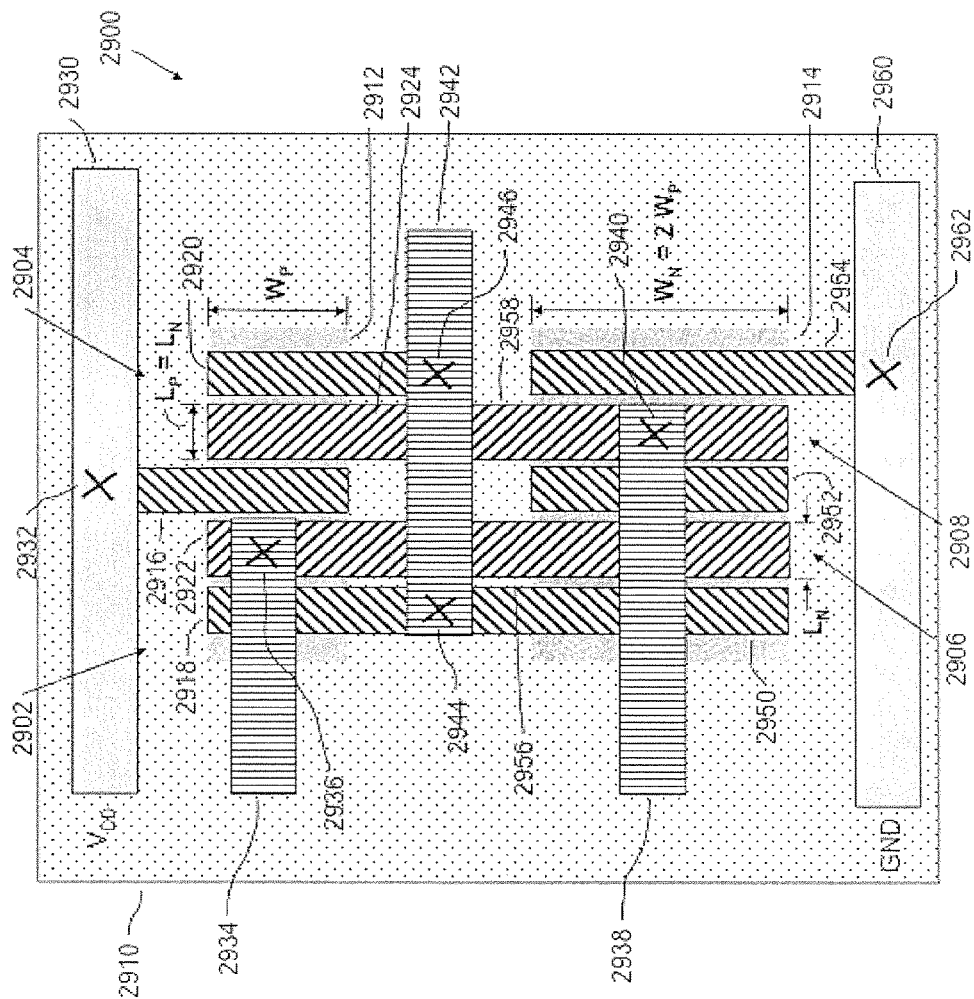
FIG. 29 illustrates a layout plan view of an exemplary two-input complementary carbon nanotube NAND circuit.

FIG. 28 shows a layout plan view of exemplary device 2800 corresponding to two-input CCN-NAND circuit 1900 illustrated schematically in FIG. 19, also corresponds to CCN-NAND circuit model 2100 illustrated in FIG. 21, and combined input/output voltage response 2600 illustrated in FIG. 26A for CNTFET technology with minimum dimensions F=0.2 volts as well as combined input/output voltage response 2700 illustrated in FIG. 27A for CNTFET technology with minimum dimensions F=0.1 volts. Device 2800 uses values of $W_P$, $L_P$ and $W_N$, $L_N$ that satisfy equation 11.3. In this example, $W_N=\sqrt{2}W_P$ and $L_P=\sqrt{2}L_N$ as illustrated in equations 11.4 and 11.5, respectively. However, as illustrated by layout plan view 2800, different values of $L_N$ and $L_P$ make gate conductors 2822 and 2824 wider than gate conductors 2856 and 2858. FIG. 29 shows a layout plan view of exemplary device 2900 and shows how satisfying equation 11.3 with $W_N=2\ W_P$ and $L_P=L_N$ as illustrated in equations 11.4A and 11.4B, respectively, can improve layout efficiency for two-input CCN-NAND circuit 1900 and corresponds model parameters used to calculate two-input CCN-NAND circuit 1900 switching characteristics described further above.

FIG. 29 illustrates device 2900 with patterned nanotube fabric regions forming nanotube fabric islands 2912 and 2914 on the surface of insulator 2910. Nanotube fabric islands may be formed by etching (removing) portions of the nanotube fabric using known process methods. Nanotube fabric islands 2912 and 2914 correspond to NT fabric 252 and insulator 2910 corresponds to insulator 254 illustrated in FIGS. 2A and 2B. pCNTFET devices 2902 and 2904 are formed on a patterned NT fabric forming NT fabric island 2912. Shared source conductor 2916, corresponding to source conductor 202 in FIGS. 2A and 2B and connected to power supply wiring 2930 by contact 2932, provides a shared source region corresponding to source region 264. Drain conductor 2918 forms a drain region corresponding to drain region 266 and is connected to output 2942 by contact 2944; and drain conductor 2920 forms a drain region corresponding to drain region 266 and is connected to output 2942 by contact 2946. Gate conductor 2922 with an underlying gate insulator (not visible), connected to input 2934 by contact 2936, corresponds to gate conductor 260 with gate insulator 258 illustrated in FIGS. 2A and 2B. Gate conductor 2924 with an underlying gate insulator (not visible), connected to input 2938 by contact 2940, corresponds to gate conductor 260 with gate insulator 258 illustrated in FIGS. 2A and 2B. nCNTFET devices 2906 and 2908 are formed on a patterned NT fabric region forming NT fabric island 2914. Drain conductor 2950, corresponding to drain conductor 204 in FIGS. 2A and 2B, provides a drain region corresponding to drain region 266. Shared drain and source conductor 2952 forms both the source region of nCNTFET 2906 and the drain region of nCNTFET 2908 (nCNTFET devices 2906 and 2908 are in series). Source conductor 2954 forms a source region corresponding to source region 264 and is connected to ground wiring 2960 by contact 2962. Drain 2950 is connected to drain 2918. Gate conductor 2956 with an underlying gate insulator (not visible), is connected to gate conductor 2922 and input 2934 by contact 2936, corresponds to gate conductor 260 with gate insulator 258 illustrated in FIGS. 2A and 2B. Gate conductor 2958 with an underlying gate insulator (not visible), connected to gate conductor 2924 and input 2938 by contact 2940, corresponds to gate conductor 260 with gate insulator 258 illustrated in FIGS. 2A and 2B.

Device 2900 illustrated in FIG. 29 shows a layout improvement with respect to device 2800 because $L_P=L_N$ such that all gate conductors 2922, 2924, 2956, and 2958 such that pCNTFET devices 2902 and 2904 and nCNTFET devices 2906 and 2908 fit on the same horizontal pitch. The overall area of layout plan view 2900 is smaller than the layout plan view 2800; both layouts correspond to two-input CCN-NAND circuit 1900. For 2-D layout plan view 2900 illustrated in FIG. 29, two-input CCN-NAND circuit 1900 with CNTFET technology with minimum dimensions F=0.2 um, the calculated propagation delay=4.7 ns as shown by equation 26.1. For CNTFET technology with minimum dimensions F=0.1 um, the calculated propagation delay=4.03 ns as shown by equation 26.2.

Nanotube fabrics offer flexibility not possible when using semiconductor substrate-based devices in CMOS technology similar to those illustrated in FIGS. 1A and 1B. For example, NT fabric island 2912 and NT fabric island 2914 illustrated in FIG. 29 may be optimized selectively using process methods such as ion implantation, for example, described further in U.S. application Ser. No. 12/536,726. The region occupied by nCNTFET devices 2906 and 2908 is two-times wider along the width of the devices because $W_N=2W_P$ as described further above in equation 11.3. This is a consequence of $NTFC_N=2NTFC_P$ (equation 6.8) for pCNTFET devices and nCNTFET devices in the same NT fabric, and the selection of two-input CCN-NAND circuit 1900 as the logic circuit. However, $NTFC_N$ can be modified by process methods, such as ion implantation methods for example, so that NT fabric island 2914 has $NTFC_{N2914}=4 \cdot NTFC_{P2912}=16\times10^5$ cm/V-s for example, while NT fabric island 2912 remains unchanged. Substituting the new $NTFC_{N2914}$ with the unchanged $NTFC_{P2912}$ in equation 11.1 results in $W_N/L_N=W_P/L_P$ (instead of equation 11.3 $W_N/L_N=2(W_P/L_P)$) as the device design choice because $NTFC_{N2914}=16\times10^5$ cm/V-s increases the current per unit width for nCNTFET devices 3006 and 3008 by 2×, enabling a corresponding $W_N$ reduction of 2×. As a result, the region (area) occupied by nCNTFETs 2906 and 2908 and corresponding interconnect wiring is approximately equal to the region (area) occupied by pCNTFETs 2902 and 2904 and corresponding interconnect wiring, which reduces the area of layout plan view by approximately 1.5 times (1.5×). In other words, portions of NT fabric layers (levels) forming NT fabric islands can be optimized for particular logic circuit implementations. In this example, layout plan view 2900 can be optimized for one or multiple two-input CCN-NAND circuits 1900. However, since NT fabrics can be selectively optimized, NT fabrics can be selectively optimized for various circuit types within a NT fabric layer (level) forming NT fabric islands. NT fabric island optimization can be at for individual CNTFET devices; or for groups of devices such as pCNTFET devices 2802 and 2804, for example, in which the electrical parameter tracking of the pair of pCNTFET devices is optimized; or can be optimized for a circuit function such as two-input CCN-NAND circuit 1900; or for groups of memory, and/or logic and/or analog functions.

Figure 30:
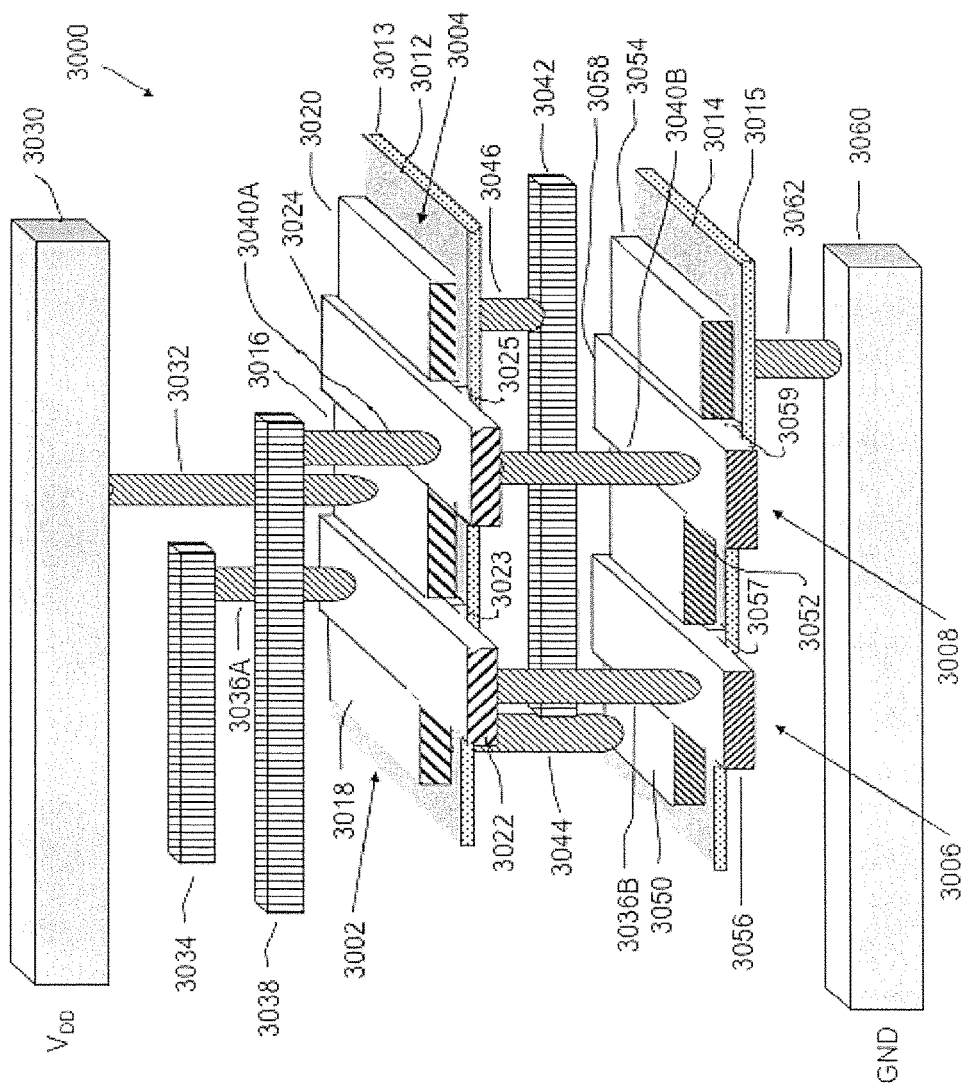
FIG. 30 illustrates a layout perspective view of an exemplary two-input complementary carbon nanotube NAND circuit.

Up to this point, layouts have been illustrated within a two dimensional (2-D) plane. CNTFET devices are formed and interconnected using NT fabrics formed on an insulating layer. However, multiple levels of circuits may be stacked one above the other as described further in U.S. application Ser. No. 12/536,726 to create a stacked NAND circuit as described further below with respect to FIGS. 30 and 31. In these examples, a first layer corresponding to a patterned NT fabric forming NT fabric island 2914 with $NTFC_{n2914}=16\times10^5$ cm/V-s may be formed on a first insulator with nCNTFET devices 2906 and 2908 and interconnects to form a pair of pull-down devices for two-input CCN-NAND circuit 1900 for example. Next, on a second insulator above the first insulator, a second NT fabric layer (level) corresponding to a patterned NT fabric forming NT fabric island 2912 with $NTFC_{P2912}=4\times10^5$ cm/V-s may be formed with a pair of pCNTFET devices such as pCNTFET devices 2902 and 2904 and interconnects to form pull-up devices for two-input CCN-NAND circuit 1900. By way of example, $NTFC_{N2914}$ may be formed by depositing a NT fabric of 2× the density used for $NTFC_{P2912}$; that is 2× the effective number of semiconducting SWNTs as illustrated by equation 4.9. Alternatively, process methods such as ion implantation may be used. FIG. 30 illustrates a perspective view of a three-dimensional (3-D) layout implementation of two-input CCN-NAND circuit 1900, including interconnections between the devices on the first and second NT fabric layers (levels).

Exemplary device 3000 illustrated in layout perspective view in FIG. 30 shows a 3-D layout perspective of two-terminal CCN-NAND circuit 1900 with pCNTFET and nCNTFET device dimensions $W_P=W_N$ and $L_P=L_N$ based on the CNTFET design point described further above. FIG. 30 illustrates device 3000 with patterned nanotube fabric regions forming NT fabric islands 3012 and 3014 on the surface of second insulator 3013 and first insulator 3015, respectively. Patterned nanotube fabric regions forming NT fabric islands 3012 and 3014 correspond to NT fabric 252 and second insulator 3013 and first insulator 3015 correspond to insulator 254 illustrated in FIGS. 2A and 2B. pCNTFET devices 3002 and 3004 are formed on NT fabric island 3012. Shared source conductor 3016, corresponding to source conductor 202 in FIGS. 2A and 2B and connected to power supply wiring 3030 by stud 3032, provides a shared source region corresponding to source region 264. Drain conductor 3018 forms a drain region corresponding to drain region 266 and is connected to output 3042 by stud 3044; and drain conductor 3020 forms a drain region corresponding to drain region 266 and is connected to output 3042 by stud 3046. Stud 3044 penetrates through second insulator 3013 to contact the drain region formed under drain conductor 3018 and also contacts underlying drain conductor 3050 as well as output 3042. Stud 3046 penetrates through second insulator 3013 to contact the drain region formed under drain conductor 3020 and also contacts output 3042. Gate conductor 3022, with underlying gate insulator 3023 on the top surface of NT fabric 3012 and forming a corresponding NT fabric channel region, is connected to input 3034 by stud 3036A, and corresponds to gate conductor 260 with gate insulator 258 illustrated in FIGS. 2A and 2B. Gate conductor 3024, with underlying gate insulator 3025 on the top surface NT fabric 3012 and forming a corresponding NT fabric channel region, is connected to input 3038 by stud 3040A, and corresponds to gate conductor 260 with gate insulator 258 illustrated in FIGS. 2A and 2B. nCNTFET devices 3006 and 3008 are formed on patterned NT fabric 3014. Drain conductor 3050, corresponding to drain conductor 204 in FIGS. 2A and 2B, provides a drain region corresponding to drain region 266. Shared drain and source conductor 3052 forms both the source region of nCNTFET 2906 and the drain region of nCNTFET 3008 (nCNTFET devices 3006 and 3008 are in series). Source conductor 3054 forms a source region corresponding to source region 264 and is connected to ground wiring 3060 by stud 3062. Stud 3062 penetrates through first insulator 3015 to contact the drain region formed under drain conductor 3054 and also contacts ground wiring 3060. Drain 3050 is connected to drain 3018 by stud 3044 as described further above. Gate conductor 3056, with underlying gate insulator 3057 on the top surface of NT fabric 3014 and forming a corresponding NT fabric channel region, is connected to gate conductor 3022 by stud 3036B, and then to input 3034 by stud 3036A, and corresponds to gate conductor 260 with gate insulator 258 illustrated in FIGS. 2A and 2B. Stud 3036B penetrates second insulator 3013. Gate conductor 3058 with underlying gate insulator 3059 on the top surface of NT fabric 3014 and forming a corresponding NT fabric channel region, is connected to gate conductor 3024 by stud 3040B, and then to input 3038 by stud 3040A, and corresponds to gate conductor 260 with gate insulator 258 illustrated in FIGS. 2A and 2B. Stud 3040B penetrates first insulator 3013.

Figure 31:
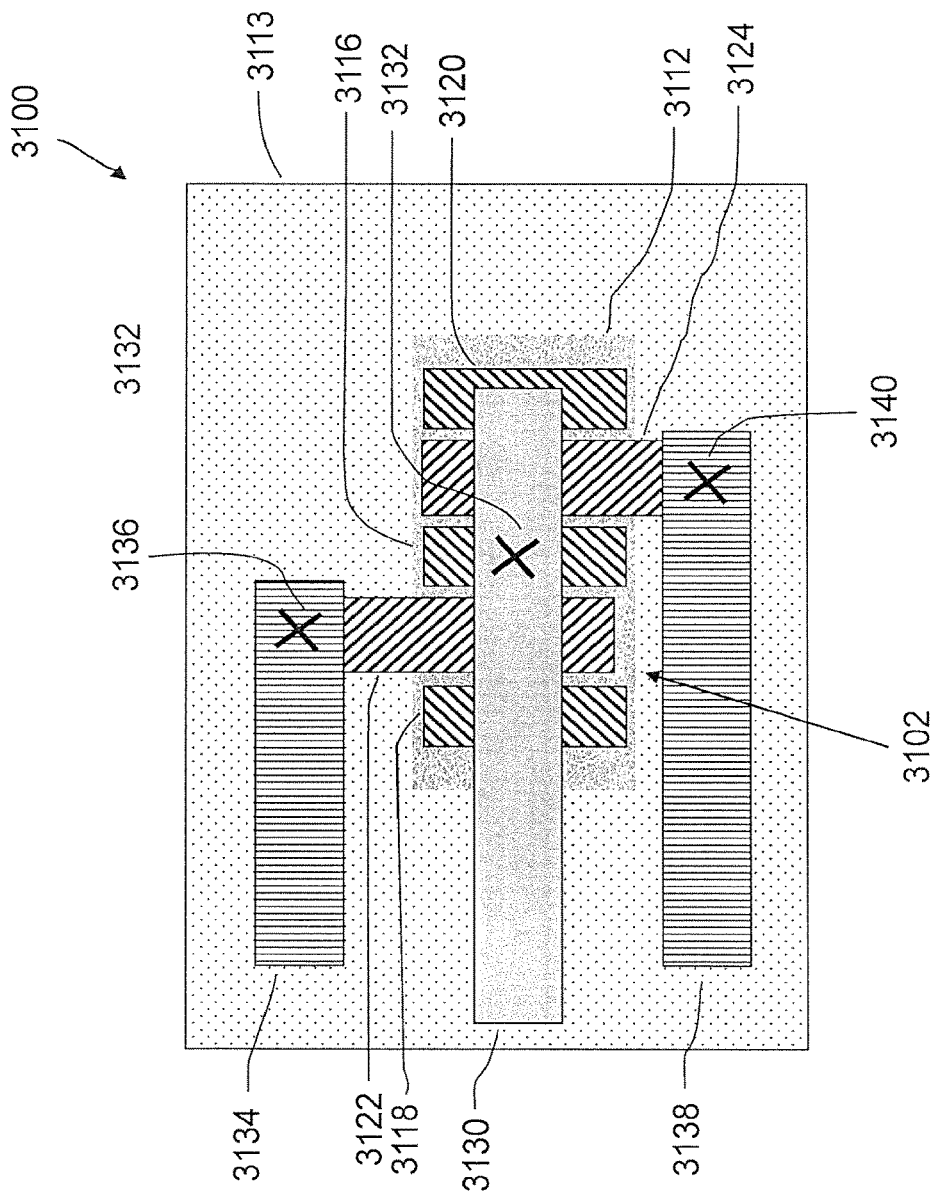
FIG. 31 illustrates a layout plan view of an exemplary two-input complementary carbon nanotube NAND circuit corresponding to FIG. 30.

FIG. 31 illustrates a layout plan view of exemplary device 3100 of two-input CCN-NAND circuit 1900, corresponding to layout perspective view 3000 illustrated in FIG. 30 illustrating a three-dimensional (3-D) layout of two-input CCN-NAND circuit 1900. FIG. 31 for device 3100 shows the top surface of second insulator 3113, which corresponds to second insulator 3013 illustrated in FIG. 30. Only structures in layout perspective view 3000 that are above second insulator 3013 are visible in layout plan view 3100. Nanotube fabric island 3112 on the surface of second insulator 3113 corresponds to nanotube fabric island 3012 illustrated in FIG. 30. pCNTFET devices 3102 and 3104 are formed on NT fabric island 3112 and correspond to pCNTFET devices 3002 and 3004, respectively. Shared source conductor 3116, corresponding to source conductor 3016 illustrated in FIG. 30, is connected to power supply wiring 3130 by contact 3132, which corresponds to stud 3032. Drain conductor 3118 forms a corresponding drain region, and corresponds to drain conductor 3018 illustrated in FIG. 30. Stud 3044 contacting the drain region corresponding to drain conductor 3118 is not visible in layout plan view 3100. Drain conductor 3120 forms a corresponding drain region, and corresponds to drain conductor 3020 illustrated in FIG. 30. Stud 3046 contacting the drain region corresponding to drain conductor 3120 is not visible in layout plan view 3100. Gate conductor 3122, corresponding to gate conductor 3022 illustrated in FIG. 30, with an underlying gate insulator (not visible) corresponding to gate insulator 3023, is connected to input 3134 by contact 3136. Input 3134 corresponds to input 3034, and contact 3136 corresponds to stud 3036A. Gate conductor 3124, corresponding to gate conductor 3024 illustrated in FIG. 30, with an underlying gate insulator (not visible) corresponding to gate insulator 3025, is connected to input 3138 by contact 3140. Input 3138 corresponds to input 3038, and contact 3140 corresponds to stud 3040A. nCNTFET devices 3006 and 3008 and corresponding horizontal interconnections and vertical studs visible in FIG. 30, and occupying approximately the same area pCNTFET devices 3102 and 3104 with their respective interconnections, are present but not visible below first insulator 3113 in FIG. 31.

Device 3100, corresponding to three-dimensional (3-D) placement and wiring of CNTFET devices as illustrated in FIG. 30, represents the area used when two-input CCN-NAND circuit 1900 using a 3-D layout as illustrated in FIG. 30. The layout plan view 3100 area is approximately 3× less than the area corresponding to layout plan view 2900 illustrated in FIG. 29, which represents a two-dimensional (2-D) layout of two-input CCN-NAND 1900. The 3-D layout of two-input CCN-NAND 1900 results in lower load capacitance values and less circuit delay (faster operation). For 3-D device 3100 illustrated in FIG. 31, and corresponding device 3000 illustrated in FIG. 30, two-input CCN-NAND circuit 1900 with CNTFET technology with minimum dimensions F=0.2 um, the calculated propagation delay=1.18 ns as shown by equation 27.1. For CNTFET technology with minimum dimensions F=0.1 um, the calculated propagation delay=1.00 ns as shown by equation 27.2.

Stacked devices such as illustrated in FIG. 30 can be fabricated by coating a first device level with any suitable insulator, followed by planarization of that layer, e.g., by chemical-mechanical polishing followed by conventional surface cleaning, so as to prepare that surface for further growth of a next level of devices. Planarization techniques are well known to those skilled in the art. Registration between successive device levels can be maintained using suitable registration marks as known to those skilled in the art.

Inverter Circuits in Two-Dimensional and Three-Dimensional Layouts

Figure 32:
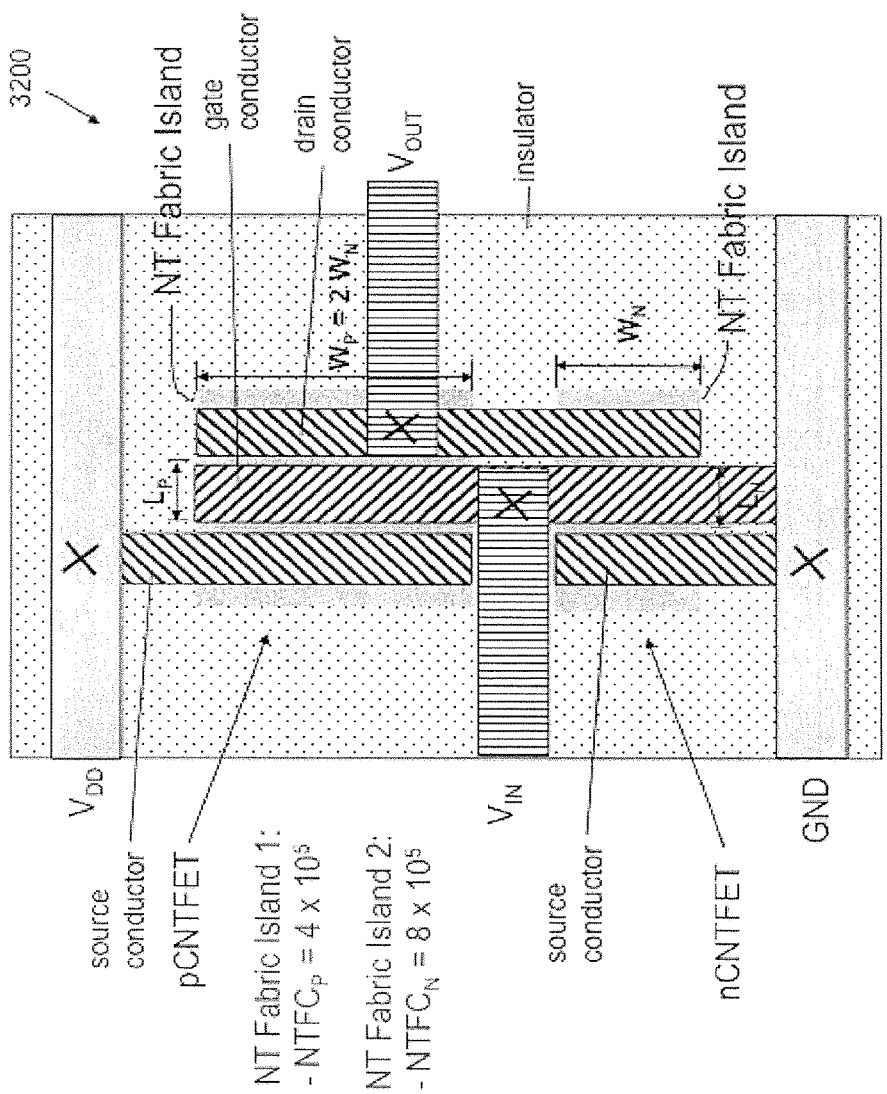
FIG. 32 illustrates a layout plan view of an exemplary carbon nanotube inverter circuit.

FIG. 32 illustrates an exemplary inverter device 3200 with patterned nanotube fabric regions forming nanotube fabric islands for a pCNTFET (upper) and for a nCNTFET (lower) on the surface of an insulator 2910. Nanotube fabric islands may be formed by etching (removing) portions of the nanotube fabric using known process methods. The nanotube fabric islands correspond to NT fabric 252 and the insulator corresponds to insulator 254 illustrated in FIGS. 2A and B. The pCNTFET device is formed on a patterned NT fabric forming the upper NT fabric island. A source conductor corresponding to source conductor 202 in FIGS. 2A and B is connected to power supply ($V_{DD}$) wiring by a contact (X). A drain conductor forms a drain region corresponding to drain region 266 of FIGS. 2A and B and is connected to output Vout via a contact (X). This drain conductor also forms a drain region for nCNTFET in this example. Gate conductor with an underlying gate insulator (not visible), connected to input Vin by a contact (X), corresponds to gate conductor 260 with gate insulator 258 illustrated in FIGS. 2A and B.

The nCNTFET device illustrated in FIG. 32 is formed on a patterned NT fabric forming the lower NT fabric island. A source conductor is connected to ground (GND) by a contact (X). The drain conductor forms a drain region and is connected to output Vout via a contact (X). The gate conductor with an underlying gate insulator (not visible) is connected to input Vin by a contact (X).

Device 3200 illustrated in FIG. 32 has a layout structure corresponding to $L_P=L_N$ such that all gate, source and drain conductors can fit on the same horizontal pitch. Nanotube fabrics offer flexibility not possible when using semiconductor substrate-based devices in CMOS technology similar to those illustrated in FIGS. 1A and 1B. For example, the NT fabric islands illustrated in FIG. 32 may be optimized selectively using process methods such as ion implantation, for example, described further in U.S. application Ser. No. 12/536,726. The region occupied by pCNTFET device is two-times wider along the width of the devices because $W_P=2\ W_N$. This is a consequence of $NTFC_N=2\ NTFC_P$ (equation 6.8) for pCNTFET devices and nCNTFET devices in the same NT fabric.

Also, $NTFC_P$ can be modified by process methods, such as ion implantation methods for example, so that NT fabric island for the pCNTFET has $NTFC_P=NTFC_N=8\times10^5$ cm/V·s, for example, while NT fabric island for the nCNTFET remains unchanged. Substituting the new $NTFC_P$ with the unchanged $NTFC_N$ in equation 11.1 results in $W_N/L_N=W_P/L_P$ (instead of equation 11.3 $W_N/L_N=2\ (W_P/L_P)$) as the device design choice because $NTFC_P=8\times10^5$ cm/V·s increases the current per unit width for the pCNTFET device by 2×, enabling a corresponding $W_P$ reduction of 2×. As a result, the region (area) occupied by the pCNTFET can be changed to be approximately equal to the region (area) occupied by nCNTFET, which can reduces the area of layout plan view by approximately 1.5 times (1.5×) In other words, portions of NT fabric layers (levels) forming NT fabric islands can be optimized for particular logic circuit implementations.

In addition, multiple levels of circuits may be stacked one above the other as described further in U.S. application Ser. No. 12/536,726 to fabricate a stacked inverter circuit 3300 as illustrated in the perspective view of FIG. 33. In this example, a first layer corresponding to a patterned NT fabric forming NT fabric island (lower) with $NTFC_n = 8 \times 10^5$ cm/V·s may be formed on a first insulator for the nCNTFET device. On a second insulator above the first insulator, a second NT fabric layer (upper) corresponding to a patterned NT fabric forming NT fabric island with $NTFC_P = 8 \times 10^5$ cm/V·s may be formed for the pCNTFET device. By way of example, $NTFC_P$ may be formed by depositing a NT fabric of 2× the density used for $NTFC_N$; that is 2× the effective number of semiconducting SWNTs as illustrated by equation 4.9. Alternatively, process methods such as ion implantation may be used.

Figure 33:
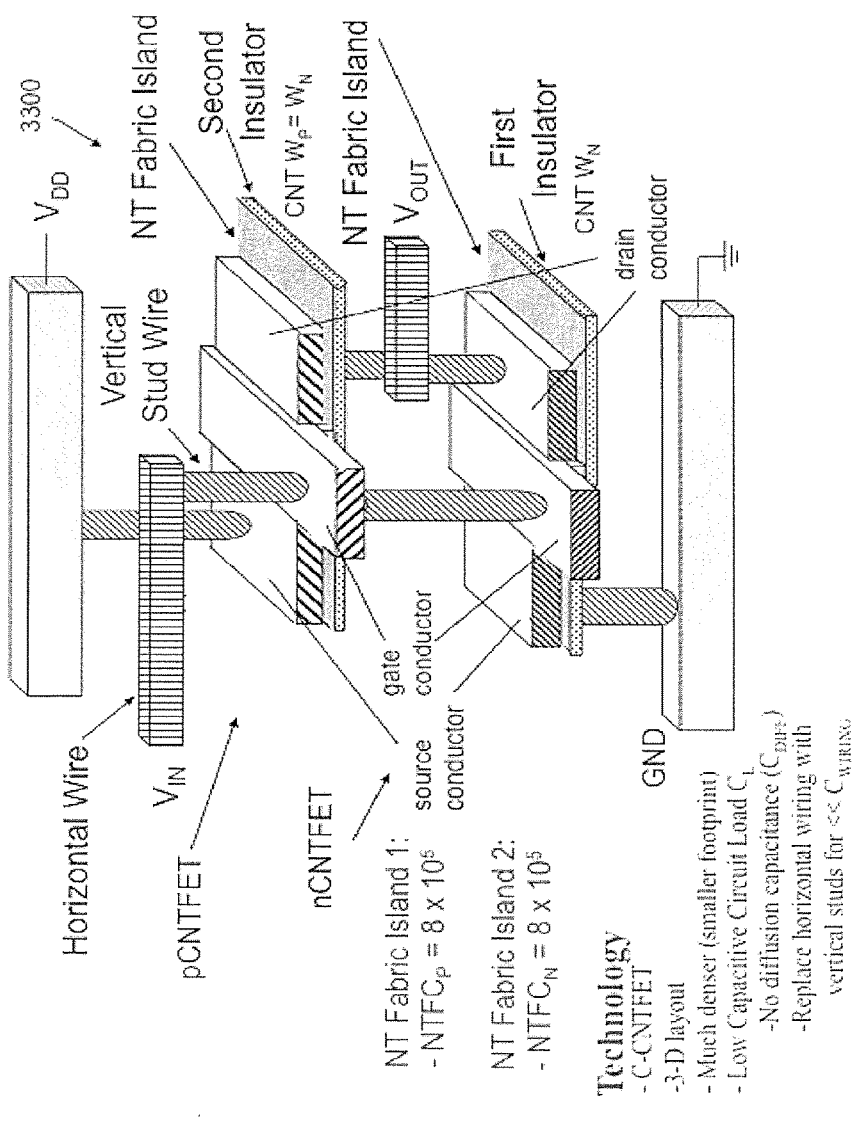
FIG. 33 illustrates a layout perspective view of an exemplary carbon nanotube inverter circuit.

Exemplary device 3300 illustrated in layout perspective view in FIG. 33 has pCNTFET and nCNTFET device dimensions $W_P = W_N$ and $L_P = L_N$ based on the CNTFET design point described further above. Interconnections can be made with horizontal wires and vertical stud wires as illustrated. Similar to the inverter illustrated in FIG. 32, Vin is connected to gate conductors of both the pCNTFET and the nCNTFET, Vdd is connected to the source of the pCTNFET, GND is connected to the source of nCNTFET, and Vout is connected to the drains of both the pCNTFET and the nCNTFET. With the ratio of $NTFC_N/NTFC_P = 1$, the widths of the NT fabric islands can be made the same. The layout illustrated in FIG. 33 represents an approximately 3× area reduction with respect to the layout illustrated in FIG. 32 because of layout optimization and by adjusting the NTFCN/NTFCP ratio.

Drain and source conductors, gate conductors, and studs such illustrated in FIGS. 29-33 (and in other figures as well) may be formed using various conductors and semiconductor materials and composites. Examples of preferable conductive materials are Ru, Ti, Cr, Al, Au, Pd, Ni, W, Cu, Co, Mo, Ag, In, Ir, Pb, Sn, as well as other suitable metals, and combinations of these such as Ti/Pd, for example. Metal alloys such as TiAu, TiCu, TiPd, PbIn, TiC, and TiW and conductive nitrides, oxides, or silicides such as RuN, RuO, TiN, TaN, $CoSi_x$ and $TiSi_x$ may also be used. Semiconducting material such as polysilicon, germanium, and silicides of silicon, and other semiconducting materials may also be used. Carbon may also be used to as well as carbon nanotube fabrics themselves (single walled, multiwalled, and/or double walled, for example) typically in the form of patterned nanotube fabrics that may include both metallic and semiconducting carbon nanotubes. Also, mixed or nanoscopic materials that include conductor and semiconductor nanoscopic particles such as W, Ti, TiN, TiC, B, P, K, Pd, Si, and Ge and may also include carbon and one more allotropes of carbon, and other conductive materials such as those listed further above. Nanoscopic particles may also include insulators such as $SiO_2$, SiN, $Al_2O_3$, and other insulators. Mixed or nanoscopic materials and nanoscopic particles are described in more detail in the incorporated U.S. application Ser. No. 12/356,447. Drain, source, and gate conductors may generally have a thickness in the range of 5 to 500 nm, for example.

Gate insulators and spacers may be formed using $SiO_2$, SiN, $Al_2O_3$, high dielectric constant materials such as such as $HfO_2$ and $TaO_5$, and polyimide for example. Insulating layers upon which to form nanotube fabrics may be formed with polyimide, TEOS, $Al_2O_3$, epoxy glass, and other insulating materials, such as CVD diamond for high thermal conductivity. Gate insulators may generally range in thickness from 1-25 nm, for example. Sidewall spacers may be in the range of 1-5 nm for example. Insulating layers upon which to form nanotube fabrics may generally range in thickness from 5 nm to 500 nm, when deposited as films, for example, and may typically range in thickness from 500 nm to any desired thickness when provided as insulating substrates upon which to build device structures.

Examples of underlying substrate structures (structures supporting insulating layers), below the insulating layer, may be rigid such as ceramic or flexible such as polymers for example. Substrates may also include semiconductor substrates, conductors for heat dissipation, display screens.

Ordered Nanotube Fabric: Technology, Devices, and Circuits

Two-dimensional (2-D) and three-dimensional (3-D) CNTFET-based NOT (inverter) and NAND circuits using pCNTFET and nCNTFET devices, such as exemplary CNTFET 200 device illustrated in FIGS. 2A and 2B and formed using semiconducting NT fabrics with non-woven randomly oriented nanotubes such as illustrated in FIGS. 5A-F, may be placed within and between wiring layers and used to achieve high density circuit layouts as described with respect to FIGS. 28 to 33, for example. Logic signal propagation delays for CNTFET-based NAND circuits may be in the approximately 1-5 ns range as described with respect to FIGS. 26A-B and 27A-B, for example. NT fabrics with non-woven randomly oriented nanotubes may be referred to as unordered nanotube (NT) fabrics, such as unordered NT fabric 3530 illustrated in FIG. 35A, for example.

A device figure-of-merit representative of logic high speed potential is referred to as the saturation current per width, widely used in the semiconductor industry to describe MOSFET devices, and typically expressed as micro-Amperes per micrometer of device width, and abbreviated as $I_{SAT}$ (µA/µm). This figure of merit is useful for CNTFET devices as well.

Figure 45A:
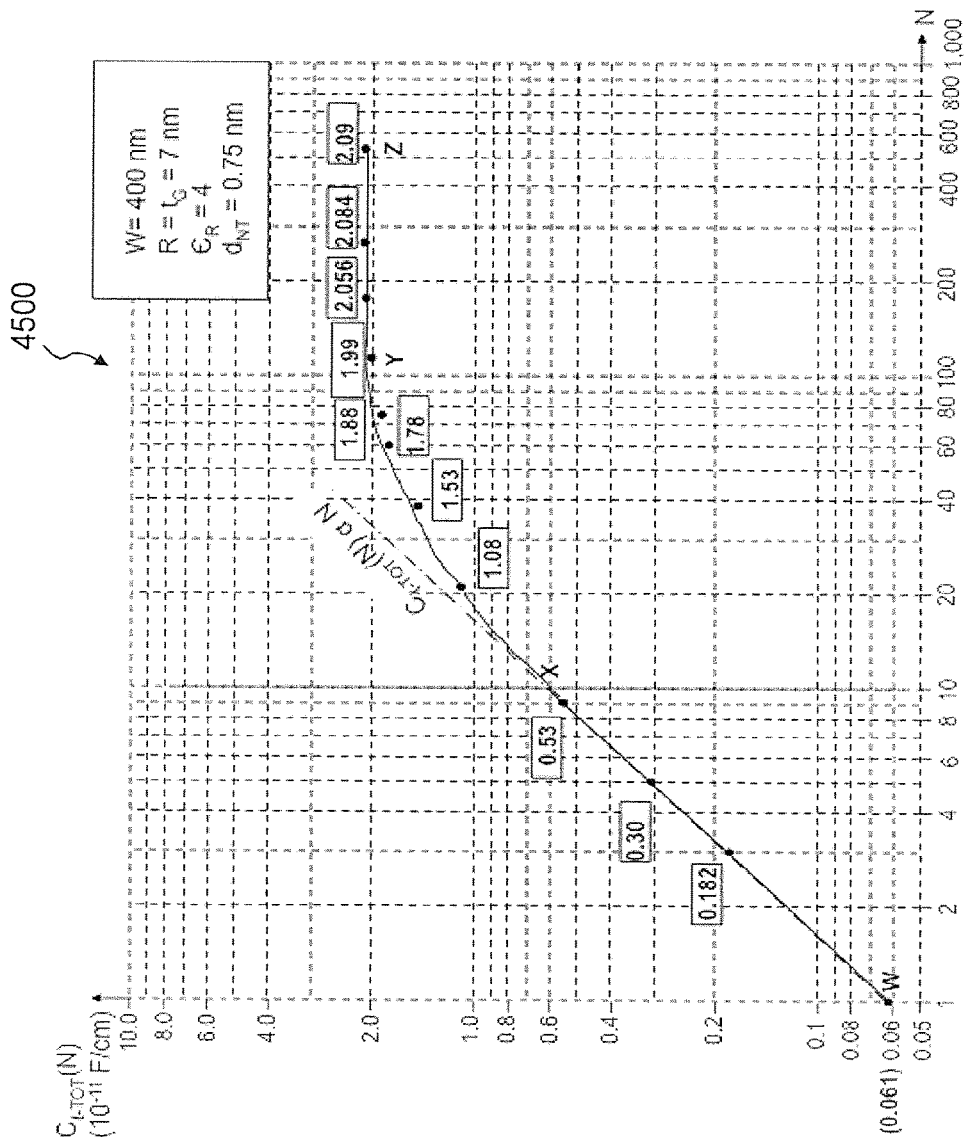
FIG. 45A illustrates a graphical representation of capacitance between gate and NT fabric as a function of nanotube density for a fabric composed of 0.75 nm diameter nanotubes.

Methods of fabrication and corresponding structures described further below with respect to FIGS. 34B, 35B, and FIGS. 36A-B, 37A-B, 38A-D, 39A-D, 40-43, 44A-B and 45A-F show that by replacing NT fabric 252 illustrated in FIGS. 2A and 2B with denser, ordered nanotube fabrics, and improving conductor-to-nanotube fabric contacts, pCNTFET devices can achieve saturation currents per unit width $I_{SATp}$ in the range of 1,120 to 1,225 µA/µm with a channel length or 200 nm and a 7 nm $SiO_2$ gate insulator as illustrated in FIG. 45F. Ordered NT fabrics are fabrics in which individual nanotubes are oriented in a preferred direction, which increases NT fabric density and reduces mobile carrier scattering. So a pCNTFET (or an nCNTFET), such as illustrated in FIGS. 2A and 2B, formed with an ordered NT fabric, such as ordered NT fabric 3570 described further below with respect to FIG. 35B, can increase circuit speed by more than two orders of magnitude.

CNTFET-based NOT (inverter) and NAND circuits described further below formed with pCNTFET and nCNTFET devices using ordered NT fabrics and improved conductor-to-NT contacts exhibit greater density and higher performance than MOSFET-based circuits. Logic signal propagation delays for CNTFET-based NAND circuits using these enhanced devices may be in the approximately 15-20 ps range as described with respect to FIGS. 57A and 57B, for example. CNTFET devices formed with ordered NT fabrics are described further below with respect to FIGS. 34B, 35B, and 36A-B, 37A-B, 38A-D, 39A-D, 40-43, 44A-B, 45A-F, 46A-C, 47A-B, 48, 49A-B, 50A-B, 51A-B, 52A-B, 53 and 54.

Ordered Nanotube (NT) Fabrics

Figure 34A:
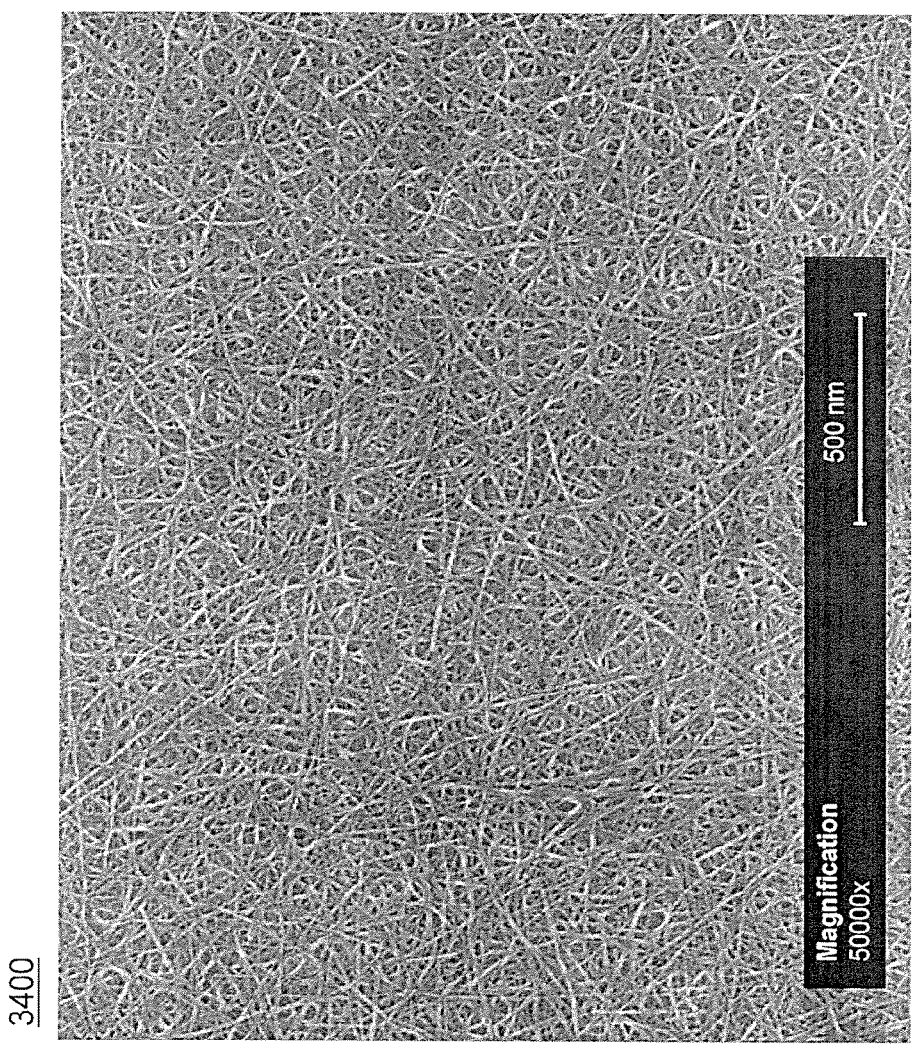
FIG. 34A illustrates an SEM image of unordered nanotube fabric.

The carbon nanotube fabric (CNT fabric) 252, described further above with respect to FIGS. 2A and 2B and FIG. 5B, comprises one or more layers of multiple, interconnected carbon nanotubes. In this application, the terms carbon nanotube (CNT) fabric, nanotube (NT) fabric, fabric of nanotubes, and nanofabric are used interchangeably. Such a nanotube fabric, in the present disclosure, e.g., a non-woven CNT fabric, may, for example, have a structure of multiple entangled nanotubes that are irregularly arranged relative to one another and may also be referred to as an unordered nanotube (NT) fabric. FIG. 34A further below also illustrates an unordered NT fabric. Nanotube fabrics retain desirable physical and electrical characteristics of the nanotubes from which they are formed. In the case of the unordered NT fabrics of relatively low density described further above with respect to FIGS. 2A and 2B and FIG. 5B, and further below with respect to FIGS. 34A and 35A, spacing between nanotubes are substantially greater than the nanotube diameters. For such relatively large spacing, the electrical field between a nanotube fabric forming a CNTFET channel element (nanotube channel element) and a corresponding CNTFET gate region may be calculated as the electric field coupling of a single nanotube multiplied by an effective number of nanotubes in the nanotube channel element. This is because the electric field between each nanotube element and the gate is not significantly influenced by the presence of other nanotube elements. CNTFET nanotube channel elements are formed using semiconducting nanotubes. Although individual SWNTs are typically used, MWNTs may also be used. Electrical characteristics of CNTFET devices and corresponding NOT and NAND circuit performance formed using unordered fabrics are described further above.

Alternatively, or in addition, for example, the fabric of nanotubes for the present disclosure may possess some degree of positional regularity of the nanotubes, e.g., some degree of parallelism along their long axes and may be referred to as an ordered nanotube fabric. An ordered NT fabric is a NT fabric in which individual nanotubes are substantially oriented in a single direction as illustrated further below with respect to FIGS. 34B, 35B, and 36A-B, 37A-B, 38A-D and 39A-D. The fabrics of nanotubes retain desirable physical properties of the nanotubes from which they are formed, and ordered nanotube fabrics formed of one or several layers may reduce voids, increase density, and increase the mobility of carrier transport through the nanotubes in the fabric as described further below with respect to FIGS. 35A, 35B, and 36A-B, 37A-B, 38A-D, 39A-D, 40-43, 44A-B, 45A-F, 46A-C and 47A-B.

Ordered NT fabrics may be formed on substrate elements that can be formed from a plurality of materials as best fits the needs of a specific application. For example, in some applications the substrate element may be a silicon wafer. In other applications, the substrate element may be a layer of conductive material, such as, but not limited to, tungsten, aluminum, copper, nickel, palladium, titanium nitride, and tungsten nitride. In still other applications, the substrate element may be a layer of semiconducting material such as, but not limited to, silicon and gallium arsenide. In other applications, the substrate element may be a layer of dielectric material such as, but not limited to, silicon oxide and aluminum oxide. In other applications, the substrate element may be a layer of organic semiconducting material such as, but not limited to, polyfluorene polythiophenes, polyacetylenes, poly(acetylene)s, poly(pyrrole)s, poly(thiophene)s, polyanilines, polythiophenes, poly(p-phenylene sulfide), and poly(p-phenylene vinylene)s. In some applications, the substrate element may be formed of a rigid material, such as, but not limited to, metal (e.g., steel or aluminum), ceramic, or glass. In other applications, the substrate element may be formed of a flexible material such as a plastic film or sheet—e.g., polyethylene terephthalate (PET), polymethylmethacrylate, polyamides, polysulfones, and polycyclic olefins.

Ordered NT fabrics may be formed within and between wiring layers at any level of an integrated process flow and corresponding integrated structure. Corresponding CNTFETs formed using ordered nanotube fabrics with ordered semiconductor nanotube channel elements may be formed within and between wiring layers anywhere in an integrated structure as described with respect to FIGS. 2A and 2B and FIGS. 48, 49A-B, 50A-B, 51A-B, 52A-B, 53 and 54, as well as FIGS. 28-33, and within such structures and devices further described in U.S. Patent Application Publication No. 20100134141, incorporated herein by reference in its entirety. The same applies to CNTFET devices formed using unordered NT fabrics.

An unordered nanotube fabric layer deposited on a substrate element, as shown by SEM image 3400 in FIG. 34A, has a plurality of nanotubes oriented in a plurality of directions with respect to each other. The unordered nanotube fabric layer contains gaps and voids between the nanotubes throughout the unordered nanotube fabric layer. Consequently, the unordered nanotube fabric layer may be considered to have a low density of nanotubes with a relatively low number of nanotubes per unit of cross-sectional area. An ordered nanotube fabric layer formed on a substrate element, as shown by SEM image 3450 in FIG. 34B, has a plurality of nanotubes in which a majority of the nanotubes are oriented in a substantially parallel direction with respect to each other and a substantially uniform arrangement along the direction of an applied force. The ordered nanotube fabric layer contains adjacent nanotubes grouped together along their sidewalls, reducing or substantially eliminating gaps and voids between nanotubes throughout the ordered nanotube fabric layer. Consequently, the ordered nanotube fabric layer might be considered to have a high density of nanotubes with a relatively high number of nanotubes per unit of cross-sectional area. In the NT fabric examples illustrated in FIGS. 34A and 34B, some metallic CNTs are present in addition to the semiconducting CNTs.

An unordered nanotube fabric layer deposited on a substrate element can be rendered into an ordered nanotube fabric layer through the use of an applied force. The applied force includes, but is not limited to, a directional mechanical force such as a rolling, rubbing, or polishing force applied to the deposited unordered nanotube fabric layer linearly, in an arc, or rotationally. The addition of a lubricant may optionally be included as part of the fabrication process. Pulsing of a gas, such as $CO_2$ for example, may also be used. In some applications, unordered nanotube fabric layers deposited individually on a substrate element will compress into each other under the applied force and reduce the thickness of an ordered nanotube fabric layer as a result. The rendering of an unordered nanotube fabric layer into an ordered nanotube fabric layer through the use of an applied force substantially reduces, and in some cases eliminates gaps and voids between nanotubes throughout the ordered nanotube fabric layer and also orients the nanotubes in a substantially parallel direction with respect to each other.

The application of a directional force over a nanotube fabric layer can be employed to render regions of the nanotube fabric layer into one or more networks of substantially ordered nanotube elements that is, regions wherein the nanotube elements are oriented in a substantially uniform arrangement such that they group together along their sidewalls. In some applications these regions of uniformly arranged nanotubes substantially comprise the entire nanotube fabric. In other applications these regions of uniformly arranged nanotubes comprise only the top surface of a nanotube fabric (with the underlying regions of the nanotube fabric remaining unordered). In still other applications these regions of uniformly arranged nanotubes comprise preselected areas of the nanotube fabric (for example, to provide a preferred conduction path through the nanotube fabric).

To this end it should be noted that within the methods of the present disclosure, a channel structure within a CNTFET (comprised of a region of ordered nanotubes) may be in physical contact and/or electrical communication with an unordered region of nanotubes and still function. Within such applications, the source and drain conductors (in direct contact with the ordered region of the nanotube fabric) will realize a significantly lower resistive path through the ordered network of nanotubes as compared with the resistive path through the unordered network.

It should also be noted that within the present disclosure the term "network" is used to describe an arrangement of nanotube elements dispersed over the surface of a substrate. In certain applications networks of nanotube elements are relatively dense, with nanotube elements packed tightly together and, in some cases, entwined with adjacent nanotube elements. In other applications network of nanotube elements are relatively sparse, with gaps and spaces between individual nanotube elements. Within certain applications, individual nanotube elements with sparse networks might be separated by gaps on the order of 1-2 nm. Within other applications such gaps might be on the order of 10 nm. Within still other applications such gaps might be on the order of 50 nm.

As previously discussed, the translation of a directional force across a nanotube fabric will tend to arrange the nanotube elements within the nanotube fabric into an ordered network oriented substantially along the path of the directional force. The work done by translating a directional force across a nanotube fabric imparts energy into the nanotube fabric, which is used to arrange the individual nanotube elements. In certain applications, multiple iterations of a directional force (that is, multiple passes of a directional force across the nanotube fabric) will impart such energy as to render more and more of the nanotube elements into an ordered arrangement with each successive pass.

In some applications a directional force is applied once over a nanotube fabric. In other applications a directional force is applied multiple times, with each iteration of the applied directional force following substantially the same path (either moving back and forth over this path, or returning to a starting position for each iteration such that the directional force is only applied in a single direction) across the nanotube fabric. In some applications a substantially uniform directional force (in terms of magnitude and direction) will be applied over an entire nanotube fabric in order to orient the nanotube elements within the fabric along a single direction. In other applications the magnitude and direction of a directional force will be selected for different regions of a nanotube fabric such as to orient the nanotube elements within a fabric into a preselected pattern. In some applications a directional force is applied over a nanotube fabric by moving a material surface across the nanotube fabric. In other applications a directional force is applied by moving a nanotube fabric (affixed to some substrate element, for example) across a fixed material surface.

The rendering of an unordered nanotube fabric layer deposited on a substrate element into an ordered nanotube fabric layer through the use of an applied force is described in more detail within U.S. patent application Ser. No. 12/945,501 incorporated herein by reference in its entirety.

Figure 34B:
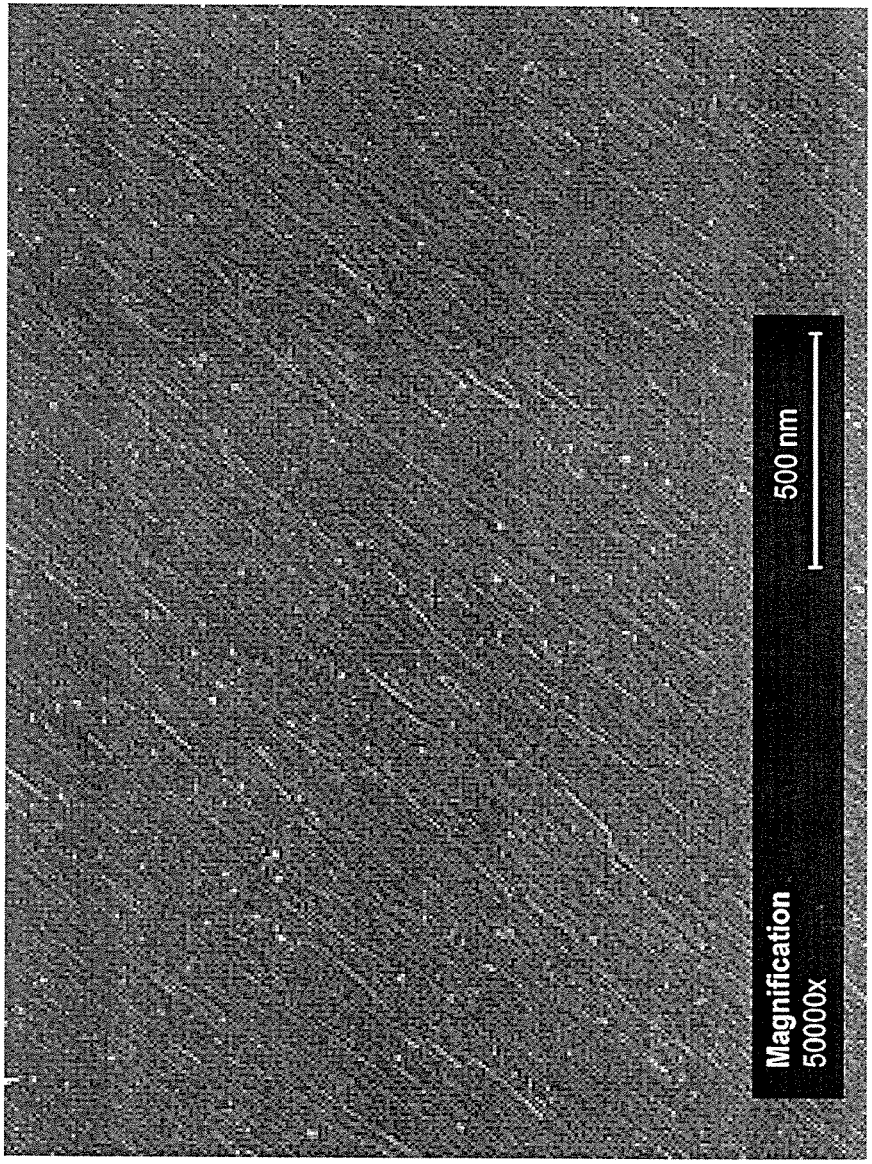
FIG. 34B illustrates an SEM image of ordered nanotube fabric.

The changes made to a nanotube fabric layer when rendering the nanotube fabric layer from an unordered layer into an ordered layer can change how the current passes though the nanotube fabric layer on a microscopic level. CNTFET devices using an ordered nanotube (NT) fabric with substantially oriented nanotubes, such as illustrated in FIG. 34B, may have different electrical characteristics than CNTFET devices formed with an unordered NT fabric with randomly oriented nanotubes illustrated in FIG. 34A as described further below.

Figure 35A:
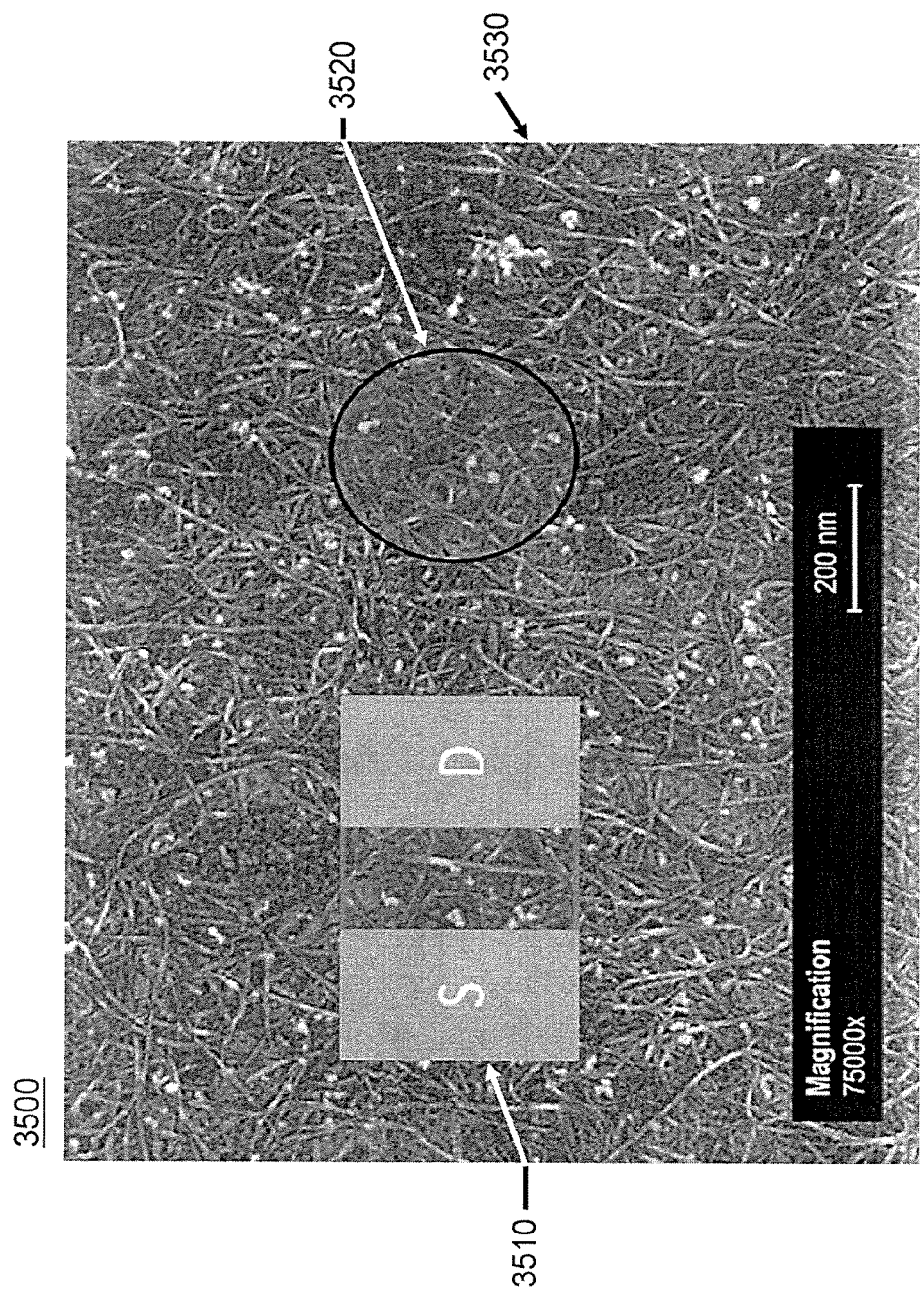
FIG. 35A illustrates an SEM image of an unordered nanotube fabric with a superimposed partial CNTFET device representation.

FIG. 35A illustrates plan view representation 3500, including a partial CNTFET device 3510 image with gate omitted to reveal the unordered NT fabric in the channel region between source S and drain D, and corresponding to the unordered NT fabric region 3520 of unordered NT fabric 3530. In this example, the CNTFET device orientation may be in any direction.

Figure 35B:
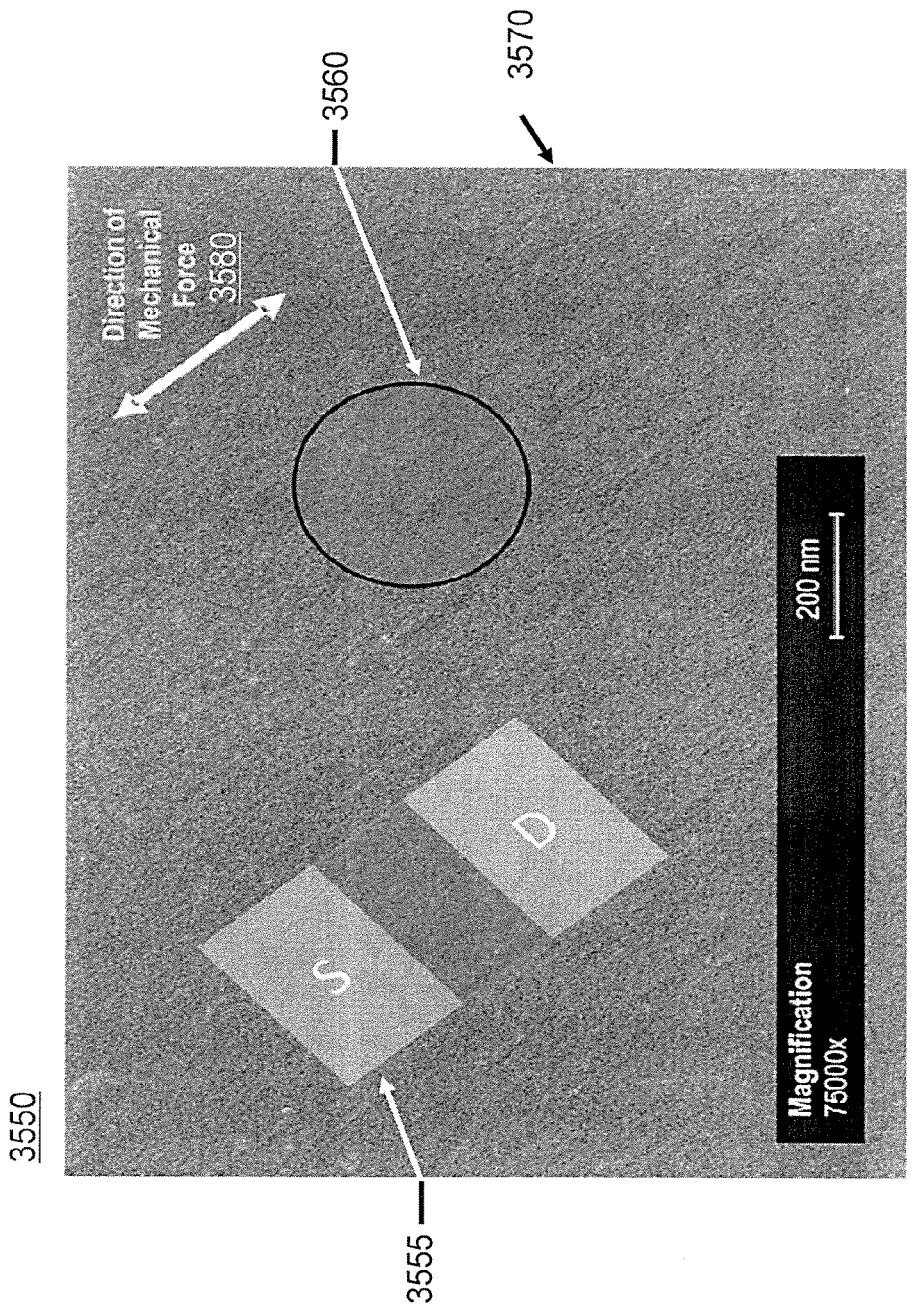
FIG. 35B illustrates an SEM image of an ordered nanotube fabric with a superimposed partial CNTFET device representation.

FIG. 35B illustrates plan view representation 3550, including a partial CNTFET device 3555 image with gate omitted to reveal the ordered NT fabric in the channel region between source S and drain D, and corresponding to the ordered NT fabric region 3560 of ordered NT fabric 3570. Ordered nanotube fabric 3570 is a NT fabric in which individual nanotubes are substantially oriented in a single direction corresponding to the direction of mechanical force 3580. CNTFET device 3555 may be placed (positioned) such that source S and drain D edges that define the NT channel element length are orthogonal to the nanotubes forming the nanotube channel between source S and drain D, which are aligned with the direction of mechanical force 3580.

FIGS. 36A-B, 37A-B, 38A-D and 39A-D illustrate various individual nanotubes within an ordered NT fabric, such as ordered NT fabric 3570 illustrated in FIG. 35B, that illustrate examples of individual nanotubes oriented in single direction. These patterned individual nanotubes are assumed to be formed from relatively long nanotubes such that individual nanotubes are continuous between source S and drain D regions. For CNTFET devices, individual nanotubes are semiconducting, and for source S and drain D separated by 200 nm, then individual nanotubes may be 400 nm or longer, such as 1 to 10 um for example. Shorter nanotubes may be used for closer source-drain separation. FIGS. 40A-D and 41-43 illustrate examples of capacitance between the nanotube channel element and the gate of the corresponding CNTFET device for NT channel elements formed using a variable number of nanotubes with different NT fabric densities. Capacitance values calculated further below illustrate the surprising result that for a given CNTFET device width, the capacitance value is a weak function of the number of nanotubes forming the NT fabric channel element; that is, a weak function of the NT fabric density, with gate-to-NT fabric capacitance changing by approximately 4% with a 4× change in ordered fabric density as described further below with respect to FIG. 42.

Figure 36A:
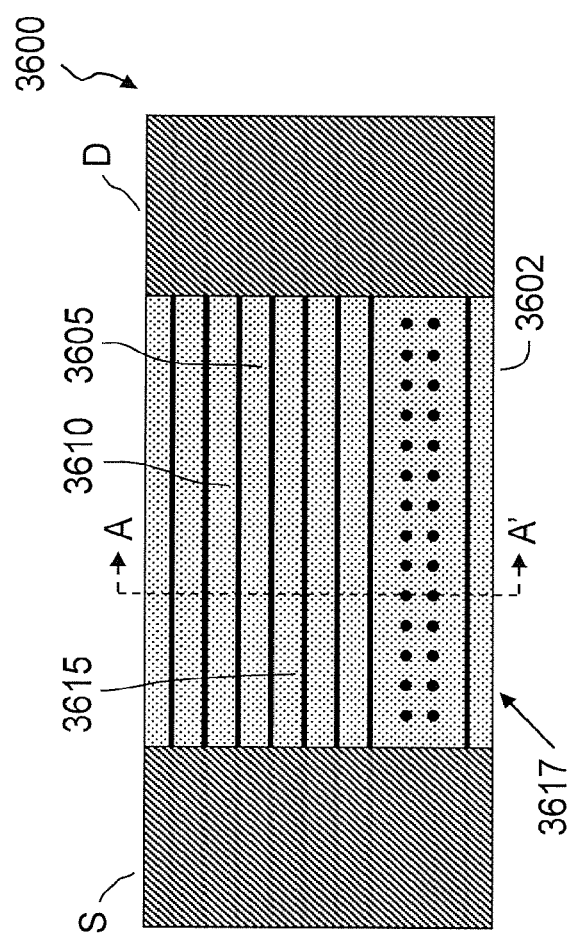
FIGS. 36A-B illustrate nanotubes substantially parallel to each other and substantially perpendicular to the edge of source S and drain D forming a semiconducting nanotube channel element.
Figure 36B:
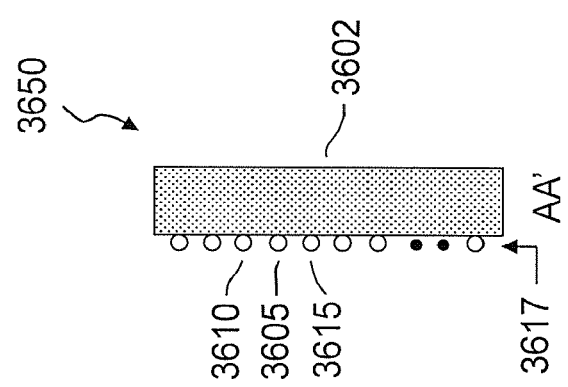

FIG. 36A illustrates a plan view 3600 of nanotubes substantially oriented in a single direction, substantially parallel to each other and substantially perpendicular to the edge of source S and drain D. FIG. 36B illustrates a cross section 3650 taken at location AA' through semiconducting NT fabric channel element 3617. Semiconducting NT channel element 3617 and source S and drain D are in contact with substrate 3602. In this example, the separation between nanotubes is substantially the same. For example, the separation between nanotubes 3605 and 3610 is essentially the same as the separation between nanotubes 3605 and 3615. Bertin et al. U.S. Pat. Nos. 7,567,414 and 7,839,615 illustrate the replacement of randomly oriented individual SWNTs with substantially parallel individual SWNTs between contacts (terminals), and are hereby incorporated in their entirety.

Figure 37A:
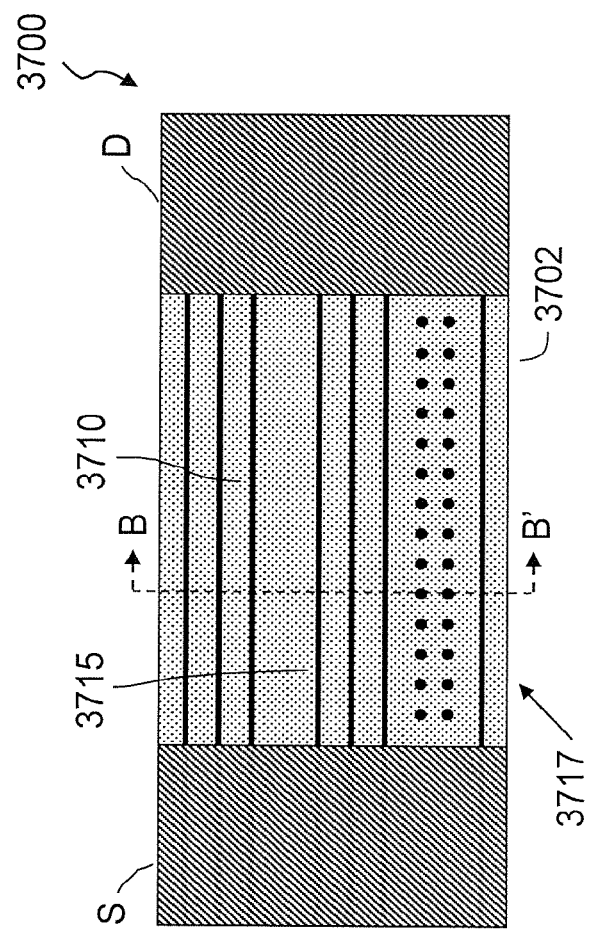
FIGS. 37A-B illustrate nanotubes essentially parallel to each other and essentially perpendicular to the edge of source S and drain D.
Figure 37B:
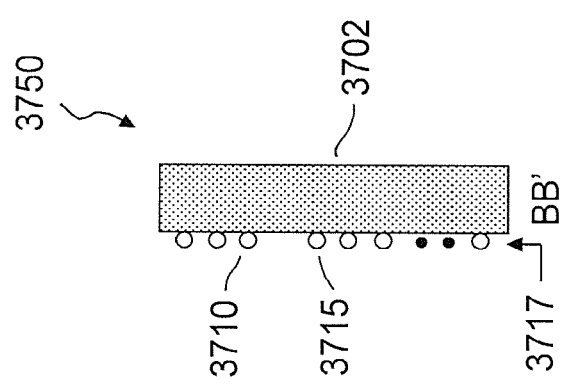
Figure 42:
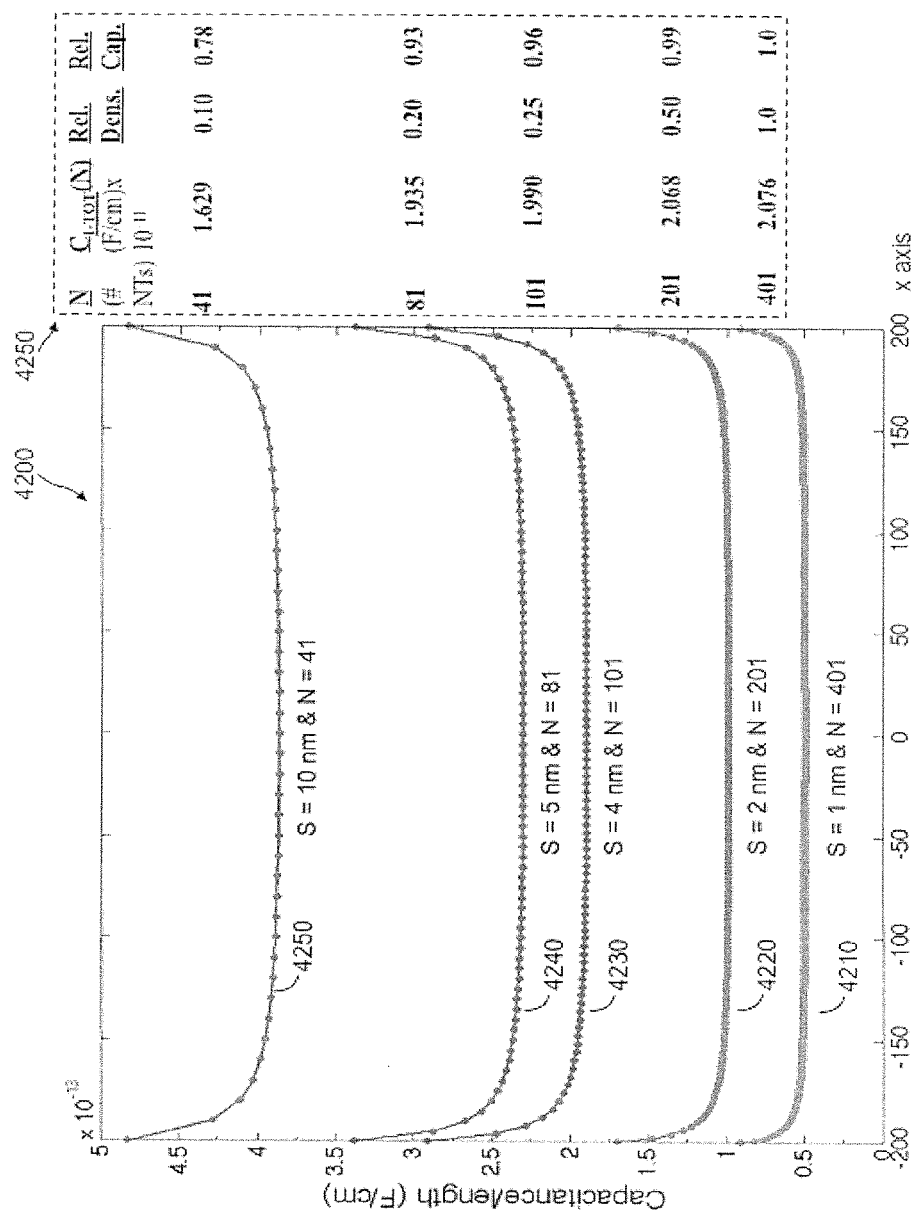
FIG. 42 illustrates the calculated capacitance per unit length of each substantially parallel nanotube as function of nanotube spacing, diameter, distance from a ground plane, insulating material, and total number of nanotubes, as well as the total capacitance per unit length of all the nanotubes combined.

FIG. 37A illustrates a plan view 3700 of nanotubes substantially oriented in a single direction, essentially parallel to each other and essentially perpendicular to the edge of source S and drain D. FIG. 37B illustrates a cross section 3750 taken at location BB' through the semiconducting NT fabric channel element 3717. Semiconducting NT fabric channel element 3717 and source S and drain D are in contact with substrate 3702. This example is similar to plan view 3600 and cross section 3650 except that nanotube 3605 is not included, so there is larger gap between nanotubes such as nanotubes 3710 and 3715 than between other individual nanotube pairs. As will be seen further below, the capacitance value between the NT channel element and the gate (not shown) is such a weak function of the number of nanotubes in a fixed CNTF ET device width that a missing nanotube has no appreciable effect on the capacitance. Examples illustrated further below with respect to FIG. 42 show that if every other nanotube is removed in FIG. 37A, resulting in half the NT fabric density for the same channel width, there is no appreciable reduction in capacitance between the NT channel element and the gate (not shown). In other words, for a fixed NT channel element width, the capacitance between the NT channel element and the gate varies only a small amount as a function of the nanotube fabric density for ordered NT fabrics.

Figure 38A:
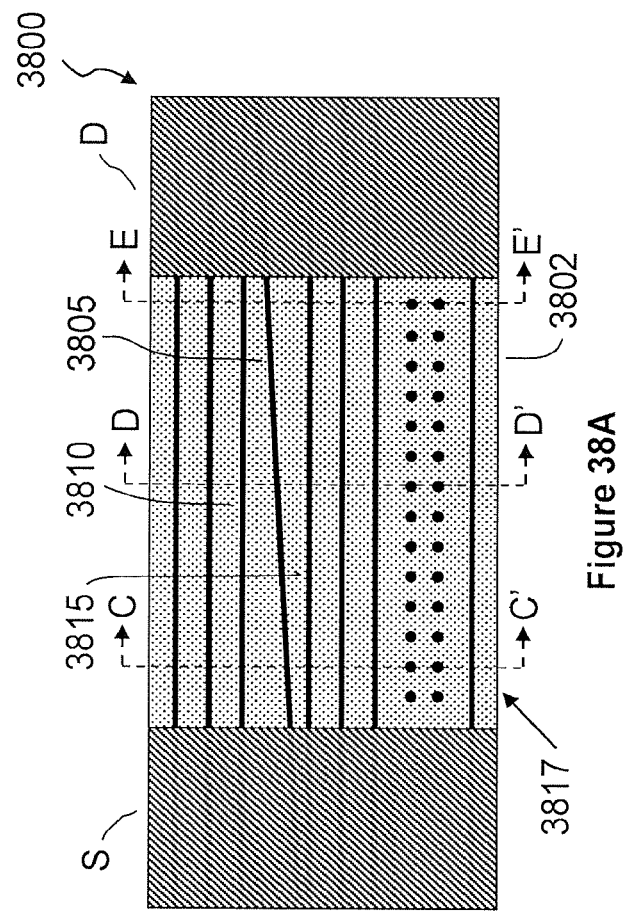
Figure 40:
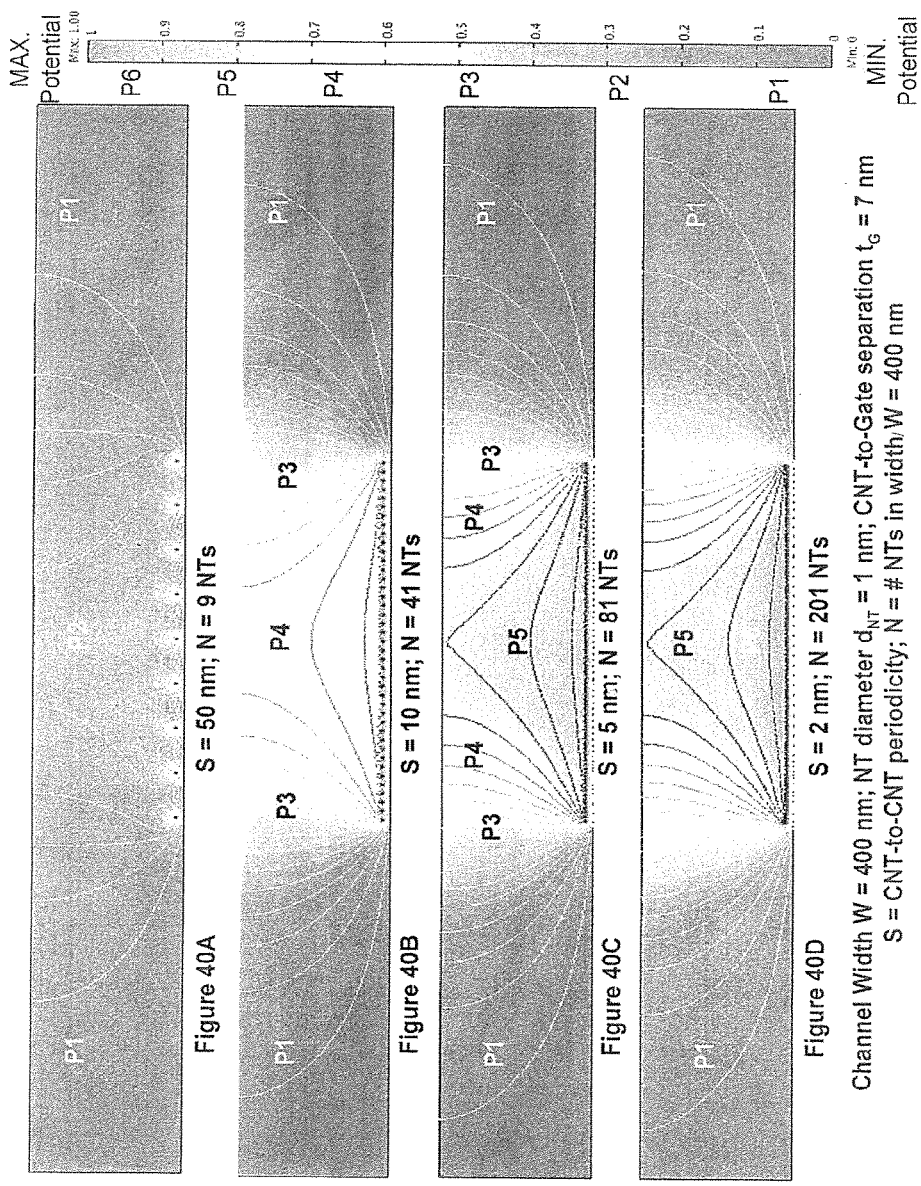
FIG. 40A illustrates electrostatic potential lines and relative field intensity corresponding to a low nanotube density in a fixed channel width.
FIG. 40B illustrates electrostatic potential lines and relative field intensity corresponding to an intermediate nanotube density in a fixed channel width.
FIG. 40C illustrates electrostatic potential lines and relative field intensity corresponding to a high nanotube density in a fixed channel width.
FIG. 40D illustrates electrostatic potential lines and relative field intensity corresponding to a very high nanotube density in a fixed channel width.

FIG. 38A illustrates a plan view 3800 of nanotubes substantially oriented in a single direction, substantially parallel to each other and substantially perpendicular to the edge of source S and drain D, except for individual nanotube 3805 that is not parallel to other nanotubes such as nanotubes 3810 and 3815. Nanotubes substantially oriented in a single direction in an ordered NT fabric include nanotubes that are not parallel to other nanotubes. However, individual nanotubes are not randomly oriented as in the case of an unordered NT fabric, as can be seen by comparing ordered nanotube fabric 3570 and unordered nanotube fabric 3530 illustrated in FIGS. 35B and 35A, respectively. FIG. 38B illustrates cross sections 3820, 3840, and 3860 taken at location CC', DD', and EE', respectively, through the semiconducting NT fabric channel element 3817. Semiconducting NT channel element 3817 and source S and drain D are in contact with substrate 3802. In this example, the separation between nanotubes varies as illustrated in FIGS. 38A and 38B; however, with negligible effect on the capacitance between the NT channel element and the gate of the CNTFET.

FIG. 39A illustrates a plan view 3900 of nanotubes substantially oriented in a single direction, substantially parallel to each other and substantially perpendicular to the edge of source S and drain D, except for individual nanotube 3905 that is not parallel to other nanotubes and overlays nanotubes 3910 and 3915. Nanotubes substantially oriented in a single direction in an ordered NT fabric, includes nanotubes that are not parallel to other nanotubes and overlap other nanotubes. However, individual nanotubes are not randomly oriented as in the case of unordered NT fabric, as can be seen by comparing ordered nanotube fabric 3570 and unordered nanotube fabric 3530 illustrated in FIGS. 35B and 35A, respectively. FIG. 39B illustrates cross sections 3920, 3940, and 3960 taken at location FF', GG', and HH', respectively, through the semiconducting NT fabric channel element 3917. Semiconducting NT channel element 3917 and source S and drain D are in contact with substrate 3902. In this example, the separation between nanotubes varies and some nanotubes overlap other nanotubes as illustrated in FIGS. 39A and 39B, where nanotube 3905 overlaps both nanotubes 3910 and 3915; however, with negligible effect on the capacitance between the NT channel element and the gate of the CNTFET.

CNTFET Device Characteristics for CNTFET Devices Formed with Ordered Semiconducting Nanotube Channel Elements CNTFET device structures and corresponding electrical characteristics were described further above with respect to unordered nanotube (NT) fabrics similar to the NT fabric illustrated in FIGS. 2A-B, 5B, and 34A. At this point in the specification, CNTFET device structures and corresponding electrical characteristics are shown for an ordered nanotube (NT) fabric similar to the NT fabric illustrated in FIG. 34B in which individual nanotubes are substantially oriented in a single direction; that is, some degree of parallelism along their long axes. FIGS. 36A-B, 37A-B, 38A-D and 39A-D illustrate various examples of ordered NT fabrics with some degree of parallelism, which correspond to ordered NT fabric 3570 illustrated in FIG. 34B Current flow between source and drain electrodes in an ordered NT fabric formed with semiconducting nanotubes having some degree of parallelism along their long axis, as illustrated in FIGS. 36A-B, 37A-B, 38A-D and 39A-D, is determined by the contact resistance between electrodes and the nanotubes, the carrier transport properties such as mobility determined by average carrier velocity, and the number of mobile carriers induced by the gate in each of the semiconducting nanotubes in the nanotube channel element. For pCNTFETs, nCNTFETs, and aCNTFETs, mobile carriers may be holes, electrons, or a combination of holes and electrons, respectively, that flow in individual nanotubes between source and drain electrodes. For relatively long nanotubes, such as 1 um for example, and relatively short source-to-drain electrode spacing, such as 200 nm, 100 nm, 50 nm, and even smaller spacing, nanotubes in the nanotube channel element span the entire distance between source and drain. Hole current flow is determined by current flow through the valence bands of high quality semiconducting SWNTs (s-SWNTs) and electron current flow is determined by current flow through the conduction bands of high quality s-SWNTs as described further below with respect to FIGS. 46A-C and 47A-B. In some cases, semiconducting MWNTs may be used. High quality semiconducting nanotubes typically result in CNTFETs with $I_{ON}/I_{OFF}$ ratios of $10^5$ to $10^6$ and even higher. For high quality semiconducting nanotubes fabrics, carrier transport in individual nanotubes may even approach ballistic conditions.

Capacitance Between CNTFET Nanotube Fabric Channel Element and Gate, and Sensitivity to NT Fabric Density For CNTFET devices, the gate-to-nanotube capacitance as a function of geometry, materials, and applied voltages determines the number of mobile carriers available in the nanotube fabric as described further below. The number of mobile carriers and the carrier mobility determines the corresponding current flow between source and drain regions of the CNTFET device.

FIGS. 40A-D illustrate a simulation of electrostatic potential for various nanotubes of center-to-center periodicity S. For each case in this example, the NT fabric is assumed to be approximately 400 nm wide. For the purpose of modeling electrical characteristics, individual nanotubes in the nanotube channel element are approximated as substantially parallel and evenly spaced cylinders as illustrated in FIGS. 36A-B, 40A-D, and 41. The number of nanotubes in width W=400 varies depending on the center-to-center periodicity S and the diameter of the nanotubes. FIGS. 40A-D illustrate changes in the electrostatic potential as the number of individual nanotubes in the NT fabric are increased and brought in closer proximity, all within the fixed width of approximately 400 nm.

The electrostatic potential simulation was carried out by solving Poisson's equation using finite element analysis methods. The simulation program used for this simulation is referred to as COMSOL. COMSOL Multiphysics simulation software is available from the COMSOL Multiphysics Company; however, other programs may be used to solve Poisson's equation. Poisson's equation is shown in a compact form by equation 40.1 and in expanded form by equation 40.2:

$$\nabla^2 \phi = -\rho/\in, \text{ where } \in = \in_R \in_0 \qquad [\text{EQ 40.1}]$$

This equation may be expanded as:

$$\partial^2 \phi/\partial^2 x + \partial^2 \phi/\partial^2 y + \partial^2 \phi/\partial^2 z = -\rho/\in \qquad [\text{EQ 40.2}]$$

The electrostatic potential $\Phi$ is calculated from Poisson's equation, with a charge per unit volume $\rho$, and a dielectric constant $\in$, which may be written as $\in = \in_R \in_0$, the product of the relative dielectric constant $\in_R$ and the dielectric constant of space $\in_0$ as described further above. Poisson's equation is solved in the x-y plane; the z direction is along the length of the nanotube. The electrostatic potential is assumed to remain essentially the same along each of the nanotubes (the z axis) so corresponding capacitance calculations are in Farads/unit length; in this simulation, in Farads/meter (F/m), which may be converted to Farads/centimeter (F/cm), for example. The electrostatic potential is a function of geometry and dielectric material. The NT diameter (cylindrical) $d_{NT}$, with R (sometimes also referred to as $R_{NT}$) the radius equal to $d_{NT}/2$ may be varied. The separation of individual nanotubes from a conductive plane, corresponds to a gate-to-the nearest NT surface distance, and is referred to as the gate separation $t_G$, and also as a distance r, in capacitance equations. The NT center-to-center periodicity S, the diameter of the nanotubes, and the number of nanotubes N determine the NT fabric width W.

Referring to FIGS. 40A-D, in these examples, the channel width W is approximately equal to 400 nm for all cases. The NT-to-gate separation $t_G=7$ nm, and the nanotube diameter is $d_{NT}=1$ nm or corresponding nanotube radius R=0.5 nm. The NT periodicity S and the number of nanotubes N vary. A scale on the right hand side of FIGS. 40A-D illustrates relative electrostatic field intensity from 0 to 1.00. Relative electrostatic potential region P1 has the weakest relative electrostatic potential. Relative electrostatic potential strength increases in regions P2, P3, P4, and P5, until the relative electrostatic potential reaches a maximum of P6.

FIG. 40A illustrates the electrostatic potential for S=50 and N=9 substantially parallel nanotubes. The separation between nanotubes is large enough that there is only a small overlap of electric fields between nanotubes, and a good approximation to the capacitance may be calculated using the capacitance per unit length of one nanotube and multiplying by N=9 to get the total nanotube capacitance per unit length of the NT fabric calculated using equations 40.3 or equation 40.4 shown further below. Equation 40.6 for a single nanotube N=1 may used as well. In FIG. 40A, the electric fields are mostly fringing fields concentrated around each nanotube, with relative electrostatic potential P3, P4, P5, and P6 concentrated around each individual nanotube. The region between nanotubes has weak relative electric potential P1 and P2. FIG. 40A represents a low density NT fabric with substantially parallel nanotubes. However, for CNTFET design purposes, high density NT fabrics are typically more desirable as explained further below with respect to FIGS. 45A-F.

As NT fabric density increases, separation between substantially parallel nanotubes decreases and the number of nanotubes increases. The electric potential contribution to a nanotube from other nanotubes increases and the pattern of fringing fields decreases. This effect is illustrated in FIGS. 40A-40D as the NT center-to-center periodicity S decreases from S=50 nm with N=9 NTs, to 10 nm with N=41 NTs, S=5 nm with N=81 NTs, and S=2 nm with N=201 NTs, respectively. In these examples shown in FIGS. 40A-40D, the NT fabric has a width W=400 nm. The strength of the relative electrostatic potential increases in the region between the individual nanotubes as the NT-to-NT spacing is reduced.

Figure 41:
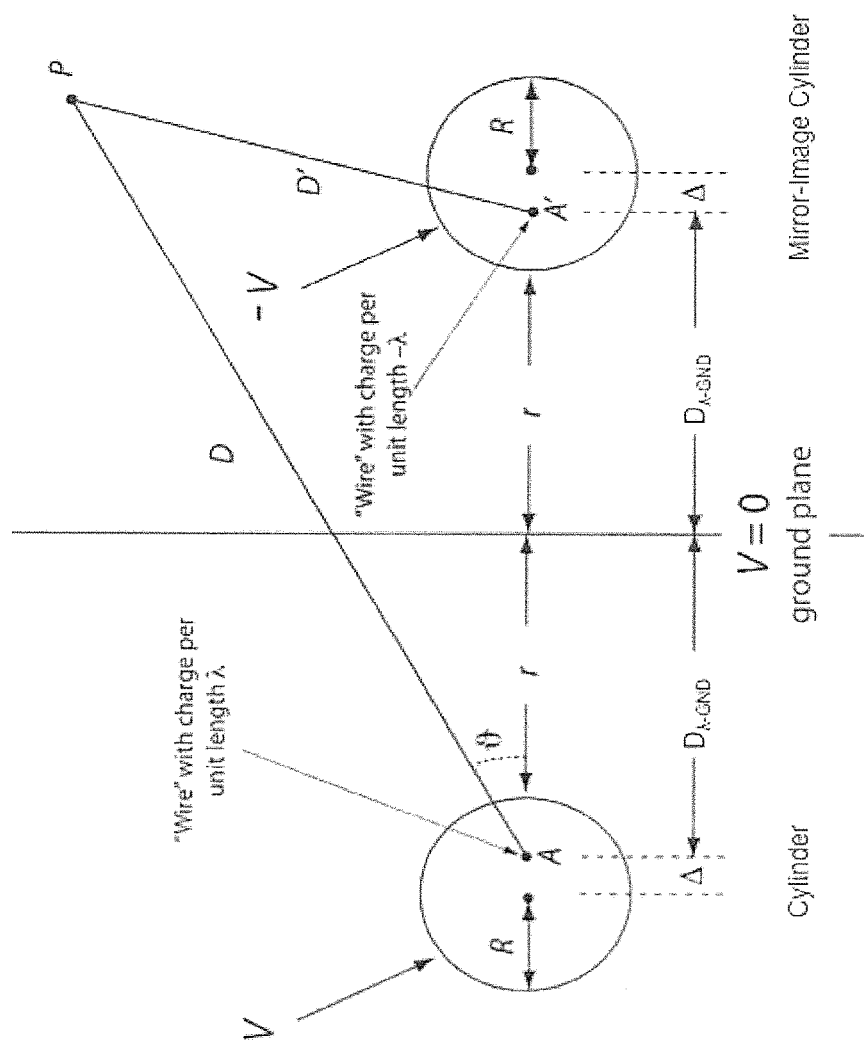
FIG. 41 illustrates a cylinder (representing a nanotube) and ground plane structure 4100, with a mirror image cylinder, used to calculate the electric fields and electrostatic potentials of a single cylinder and adjacent ground plane.

FIG. 41 illustrates a cylinder (representing a nanotube) and ground plane structure 4100, with a mirror image cylinder, used to calculate the electric fields and electrostatic potentials of a single cylinder and adjacent ground plane. A closed-form solution may be calculated based on a wire with a charge per unit length displaced (positioned) from the center of the cylinder by an amount that depends on cylindrical diameter and distance from of the outer circumference of the cylinder to a ground plane. In this example, an electrostatic potential of zero is present along the surface of the ground plane, and an electrostatic potential of V is present on the circumference of the cylinder, and a potential of −V is present on the circumference of the image cylinder. Cylinder and ground plane structure 4100 corresponds to a NT fabric with substantially parallel nanotubes that are widely separated, as illustrated in FIG. 40A, such that the capacitance of each nanotube may be calculated independently of other nanotubes. The equation for capacitance per unit length $C_l$ corresponding to FIG. 41, structure 4100 is as follows:

$$C_l = 2\pi \in_R \in_0 / \ln\left[(r+r/R) + ((r+r/R)^2 - 1)^{0.5}\right], \qquad [\text{EQ 40.3}]$$

where r corresponds to $t_G$, the separation between the cylindrical surface of a NT and the gate of a CNTFET, which is represented by a ground plane and R corresponds to the radius $R_{NT}$ of a nanotube. Equation 40.3 may be found in the article by Dequesnes, et al., "Static and dynamic analysis of carbon nanotube-based switches," Transactions of the ASME, Vol. 126, July 2004, pp. 230-237.

For the examples described in this specification, in which r>>R (may be used for r>2R), equation 40.3 may be simplified as:

$$C_l = 2\pi \in_R \in_0 / \ln(2t_G/R_{NT}), \qquad [\text{EQ 40.4}]$$

Equations 40.3 and 40.4 may not be used when substantially parallel nanotubes are closely spaced as illustrated in FIGS. 40B-40D.

The method of derivation of capacitance per unit length equation 40.3 may be modified and extended such that the electric potential contribution of all other NTs (cylinders) to each individual NT cylinder may be approximated, and the capacitance per unit length for nanotube m may calculated using derived equation 40.5.

$$C_l(m) = \frac{2\pi\varepsilon_0\varepsilon_r}{\left\{\ln\left[\left(1+\frac{r}{R}\right)+\sqrt{2\frac{r}{R}+\left(\frac{r}{R}\right)^2}\right]+ 2\sum_{n=1}^{+\infty}\ln\left(-\frac{\{n^2S^{2i}+[2(r+R)]^3\}^{1/2}}{|nS|}\right)\right\}} \quad [\text{EQ 40.5}]$$

Equation 40.5 is one of three equations derived to approximate the capacitance value of a nanotube in close proximity to other nanotubes. Equation 40.5 was selected because it was judged to be a good compromise between accuracy and complexity. Equation 40.5 may be used to calculate the capacitance per unit length $C_l(m)$ for nanotube m as part of an infinite number of substantially parallel nanotubes n=1 to ∞.

However, CNTFET devices use a finite number of nanotubes N in a NT fabric of width W as illustrated in FIGS. 40A-40D. Equation 40.5 may be modified to calculate the capacitance per unit length $C_l(m)$ for each of N nanotubes with a periodicity S, diameter $d_{NT}$, and separated from a gate by distance r (or $t_G$) as illustrated by equation 40.6, $$C_l(m) = \frac{2\pi\varepsilon_0\varepsilon_r}{\left\{\ln\left[\left(1+\frac{r}{R}\right)+\sqrt{2\frac{r}{R}+\left(\frac{r}{R}\right)^2}\right]+ \sum_{\substack{n=1 \\ \text{but } n \neq m}}^{N}\ln\left(\frac{\{(n-m)^2S^3+[2(r+R)]^2\}^{1/2}}{|(n-m)S|}\right)\right\}} \quad [\text{EQ 40.6}]$$

where r corresponds to $t_G$, the separation between the cylindrical surface of a NT and the gate of a CNTFET, R corresponds to the radius of a nanotube equal to ½ a NT diameter $d_{NT}$ (R=$d_{NT}$/2), S is the NT-to-NT center distance, N is the total number of nanotubes in a NT fabric (for example, N nanotubes in a width W), and m is any nanotube from nanotube 1 to nanotube N.

Equation 40.6 is sufficiently accurate for design purposes as illustrated by capacitance values 4300 illustrated in FIG. 43 further below, in which capacitance calculations using equation 40.6 are compared with simulations of Poisson's equation, using equations 40.1 and 40.2 simulated with the COMSOL simulator as described further above.

FIG. 42 illustrates capacitance values 4200 of each substantially parallel nanotube as a function of nanotube periodicity and the total number of nanotubes N in channel width W=400 nm calculated using equation 40.6. Table 4250 shows corresponding total capacitance values calculated using equations 40.8 and 40.6. Table 4250 also shows relative fabric densities (Rel. Dens.) and relative total capacitance (Rel. Cap.) values for ease of comparison of total capacitance values as a function of the ordered nanotube relative fabric density, as the number of nanotubes N in width W=400 nm is varied between N=41 and N=401.

Capacitance values 4210 illustrate the capacitance per unit length of each of N nanotubes as a function of position. There are N=401 nanotubes with a periodicity S=1 nm, which means that the substantially parallel nanotubes are at a maximum density with no separation. The nanotube at the mid-point of the NT fabric 3617 illustrated in FIGS. 36A and 36B may correspond to nanotube m=201 with a capacitance per unit length of $C_l(201)$ positioned along the x axis at x=0 of the NT fabric of width 400 nm in FIG. 42, if NT fabric 3617 is at a density corresponding to S=1 nm. The NT fabric of width 400 nm is shown as going from x=−200 nm to x=+200 nm in FIG. 42. Nanotube $C_l(201)$ has 200 nanotubes to the left, nanotubes n=1 to 200 and 200 nanotubes to the right, nanotubes n=202 to 401. The capacitance of $C_l(201)$ ~0.5×10$^{-13}$ F/cm. The capacitance per unit length increases slowly for NTs to the left and right of $C_l(201)$. For nanotubes near the edge of the NT fabric, fringing fields increase, and this increases the capacitance per unit length. For capacitance values 4210, $C_l(1)$=$C_l(401)$~0.8×10$^{-13}$ F/cm at the edge of the NT fabric, fringing fields are highest and the capacitance is approximately 60% higher than for $C_l(201)$ at the center of the NT fabric based on calculations using equation 40.6. Comparison of calculated capacitance with capacitance values based on Poisson simulations illustrated in FIG. 43 differ by less than a few percent, except for the two nanotubes at each end of the NT fabric with simulated capacitance values almost 20% higher. Correcting for this difference shows that capacitance per unit length for the nanotubes at the edge of the NT fabric in the width direction, are approximately 90% higher in value than for a nanotube in the middle, such as nanotube $C_l(201)$ for example. Since only a few NTs have such relatively high capacitance values, their effect on the total capacitance per unit length for all N substantially parallel nanotubes that form the NT fabric is relatively small. In these examples, values of N are chosen as odd numbers in these examples for ease of visualization and description, with equal number of nanotubes to the left and right of a nanotube in the center of the NT channel element width. However, N may use an even number of nanotubes instead.

Capacitance values 4220 shown in FIG. 42 illustrate the capacitance per unit length of each of N nanotubes as a function of position. There are N=201 nanotubes with a periodicity S=2 nm corresponding to the electrical potential simulation results illustrated in FIG. 40D, which means that the substantially parallel nanotubes are separated by the diameter of a nanotube. The capacitance per unit length for each nanotube corresponding to capacitance values 4220, is approximately double the capacitance per unit length for each nanotube corresponding to capacitance values 4210, because of changes (reduction) in the electrostatic potential coupling between the N=201 nanotubes and the N=401 nanotubes described further above. For example, at x=0, the mid-point of the NT fabric width, $C_l(101)$~1×10$^{-13}$ F/cm is approximately 2× higher than $C_l(201)$~0.5×10$^{-13}$ F/cm. Also, the nanotubes at the edge of the NT fabric width, $C_l(1)$=$C_l(201)$~1.7×10$^{-13}$ is approximately 2× higher than $C_l(1)$=$C_l(401)$~0.8×10$^{-13}$ F/cm. So in this example, reducing the nanotube density by a factor of 2 results in approximately 2× greater capacitance per unit length per nanotube, resulting in approximately the same total NT fabric capacitance. For example, table 4250, illustrated in FIG. 42, shows that the total capacitance value $C_{l-TOT}$=2.076×10$^{-11}$ F/cm for the 400 nm wide NT fabric with N=401 nanotubes, compared with $C_{l-TOT}$=2.068×10$^{-11}$ F/cm for the 400 nm wide NT fabric with N=201 nanotubes, shows the surprising result of a total capacitance per unit length reduction of 1% for a relative NT fabric density reduction of a factor of 2. As also shown in table 4250, the total capacitance per unit length is reduced by approximately 4% for a factor of 4 reduction in relative NT fabric density. For all cases illustrated in FIG. 42, the N nanotubes are positioned within the same NT fabric width of approximately W=400 nm.

The surprising insensitivity of total capacitance per unit length to nanotube fabric density illustrated in FIG. 42 shows why the total capacitance between the NT fabric channel element and gate described further above with respect to FIGS. 36A-B, 37A-B, 38A-B and 39A-B would not vary significantly as a function of variations in NT fabric density and geometry. For example, the gap between nanotubes 3710 and 3715 illustrated in FIGS. 37A-B would not cause a significant total capacitance per unit length change relative to that of FIGS. 36A-B because the capacitance per unit length of nanotubes 3710 and 3715, and others as well, would increase. In fact, if every other nanotube in NT fabric channel element 3717 were removed, the total capacitance per unit length change relative to NT fabric channel element 3617 would be approximately 1% as illustrated by table 4250 in FIG. 42.

FIG. 42 also illustrates capacitance values 4230, 4240, and 4250. Capacitance values 4240 and 4250 correspond to electrical potential simulations of Poisson's equation illustrated in FIGS. 40C and 40B, respectively. Capacitance values are used in equations 40.10 and 40.11 further below to calculated CNTFET device currents and voltages.

Figure 43:
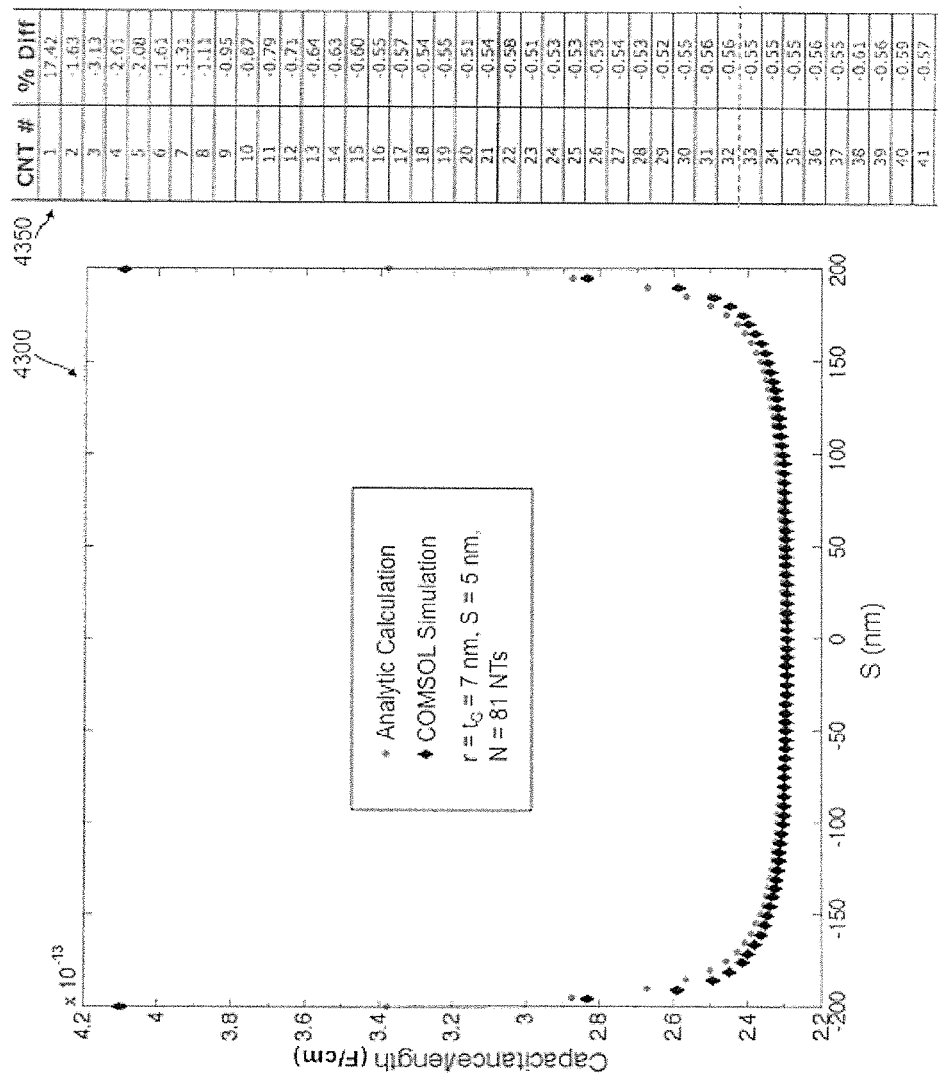
FIG. 43 illustrates a comparison of the calculated capacitance per unit length and a simulation of capacitance per unit length using finite elements methods to solve Poisson's equation.

FIG. 43 illustrates capacitance values calculated using equation 40.6, and compared with capacitance values calculated using Poisson's equation 40.1/40.2 simulated with the COMSOL program, and shown in graphical form by capacitance values 4300, and tabular form in table 4350. Capacitance values 4300 correspond to capacitance values 4240 illustrated in FIG. 42 and calculated using equation 40.6, and COMSOL simulated capacitance values corresponding to the electrostatic potential electrostatic potential simulation results illustrated in FIG. 40C. Table 4350 only shows half of the nanotubes because the curve is symmetrical. The deviation between capacitance values for individual nanotubes using COMSOL simulations and calculation for individual substantially parallel nanotubes using equation 40.6 forming the NT fabric varies between approximately 0.5% and 3% for 79 of the 81 nanotubes. The two nanotubes closest to the edge of the NT fabric, $C_f(1)$ and $C_f(81)$ deviate by approximately 17.5%. Therefore, the accuracy of the calculation for the total capacitance summed over all 81 nanotubes using equation 40.8 is less than a few percent different from the COMSOL simulation, illustrating the accuracy of capacitance calculations based on equations 40.6 and 40.8.

Mobile Carriers and Corresponding Current Flow as a Function of CNTFET Device Geometry (Structure), Materials, and Applied Voltages The total current flowing between source and drain electrodes may be calculated as $I_{DS}=Q_C/\tau$ (equation 4.7), where the quantity of mobile charge is represented by $Q_C$, the mobile charge transit time between source and drain electrodes is represented by $\tau$, where $\tau=L^2/\mu \cdot V_{DS}$, L is the separation between source and drain electrodes corresponding to $L_{ENT}$ illustrated in FIG. 2B, and $\mu$ is the carrier mobility in units of cm$^2$/V·s.

The total number of mobile carriers is determined by summing the mobile carriers (charge) induced in each nanotube as a function of gate-to-NT capacitance, the applied gate-to-source voltage, the threshold voltage of the device, and the voltage drop $V_{DS}$ due to current flow as described further above with respect to FIG. 4. The capacitance values in equation 40.6 are in capacitance per unit length and are multiplied by a length L to calculate the total capacitance between the gate and the NT channel element. Mobility as a function of the induced carriers (charge) may be used for each nanotube. The mobility p. is assumed to be approximately the same for each of the nanotubes. Accordingly, the total mobile charge $Q_C$ for a NT fabric with substantially parallel nanotubes is calculated as follows:

$$Q_C=L \cdot [C_f(1)+C_f(2)+ \ldots C_f(m) \ldots +C_f(N)] \cdot [V_{GS}-V_T-V_{DS}/2], \qquad [\text{EQ 40.7}]$$

where the capacitance value per unit length $C_f(m)$ for each nanotube is calculated using equation 40.6. The total capacitance per unit length is the sum of the capacitance per unit length of each nanotube. The total capacitance per unit length $C_{l-TOT}$ for N nanotubes may represented by:

$$C_{l-TOT}(N)=C_f(1)+C_f(2)+ \ldots C_f(m) \ldots +C_f(N), \qquad [\text{EQ 40.8}],$$

and the equation for total mobile charge $Q_C$ may be written as:

$$Q_C=L \cdot C_{l-TOT}(N) \cdot [V_{GS}-V_T-V_{DS}/2], \qquad [\text{EQ 40.9}]$$

Using $I_{DS}=Q_C/\tau$ (equation 4.7), where $\tau=L^2/\mu \cdot V_{DS}$, the current equation may be written as:

$$I_{DS}=\{L \cdot C_{l-TOT}(N) \cdot [V_{GS}-V_T-V_{DS}/2]\}/\{L^2/\mu \cdot V_{DS}\}, \text{ or}$$

$$I_{DS}=(\mu/L) \cdot C_{l-TOT}(N) \cdot [V_{GS}-V_T-V_{DS}/2]V_{DS}, \text{ or}$$

$$I_{DS}=(\mu/L) \cdot C_{l-TOT}(N) \cdot [(V_{GS}-V_T)V_{DS}-V^2_{DS}/2], \qquad [\text{EQ 40.10}]$$

for calculating the current flow in the linear region of CNTFET device operation. And, $$I_{DS}=(\mu/L) \cdot C_{l-TOT}(N) \cdot [(V_{GS}-V_T)^2/2], \qquad [\text{EQ 40.11}],$$

may be used to calculate $I_{DS}$ for CNTFET devices in saturation, where $V_{DS,sat}=V_{GS}-V_T$ at the onset of saturation as described further above.

At this point in the design of CNTFET devices, the carrier (charge) transport mobility μ (units of cm$^2$/V·s) is calculated based the measured electrical characteristics of a pCNTFET device with a single nanotube between source and drain regions. Research work on CNTFET device electrical properties has been carried out by various university, industrial, and government laboratories on a single semiconducting nanotube between two electrodes (terminals). In this example, the nanotube mobility μ is based on a mobility calculation using data for a single semiconducting nanotube from the reference A. Javey et al., "Ballistic carbon field-effect transistors", Nature, Vol. 424, 7 Aug. 2003, pp. 654-657 incorporated herein by reference in its entirety. Carrier transport through the valence or conduction bands of high-quality semiconducting SWNTs can achieve high values of mobility. However, differences in the work function of the contact metal and the energy gap of the semiconducting nanotube may result in a substantial Schottky barrier. Also, quantum resistance effects are present in the electrode (terminal) contact-to-nanotube region. These effects, and possible other sources of resistance, result in lower hole injection efficiency into the valence band of the CNTFET device and translate into lower voltages applied across the NT fabric channel element than is applied across the CNTFET device electrodes (also referred to as contacts, terminals, and conductors in this specification). These effects limit carrier injection and transport and result in a lower effective hole mobility for the CNTFET device 4400.

The Javey et al. referenced research paper uses palladium contacts on a semiconducting SWNT of 1.7 nm in diameter. This single nanotube pCNTFET device 4400 is fabricated using a single nanotube, on a surface of $SiO_2$ ($\epsilon_R$=4) of thickness 67 nm, on a silicon wafer acting as a back-gate as illustrated in prior art FIG. 44A. In the example illustrated in prior art FIG. 44A, hole transport between palladium source/drain electrodes separated by L=300 nm is optimized by chemically adjusting (reducing) the palladium barrier height for optimum transfer and flow of holes to the valence band of the semiconducting SWNT device such that the Schottky barrier height is reduced or eliminated, thereby achieving a relatively high hole injection efficiency in the pCNTFET valence band of single nanotube pCNTFET device 4400. Work functions and energy bands are illustrated in FIGS. 46A-C and 47A-B further below. Using the corresponding electrical characteristics 4450 illustrated in prior art FIG. 44B, $I_{DS}$ current as a function of gate to source voltage $V_{GS}$ for $V_{DS}$=100 mV is used further below to calculate the effective hole mobility $\mu_P$ for the pCNTFET device 4400. The hole mobility in the individual nanotubes forming the NT fabric channel region is typically substantially higher than the effective hole mobility calculated using the voltage drop applied across the contacts (electrodes, terminals) of the CNTFET device because the NT fabric channel element receives less voltage as a result of an electrode contact-to-NT channel element voltage drop. However, the effective hole mobility is the mobility of interest because circuits using pCNTFET devices are connected between the contacts (electrodes, terminals) of the CNTFET device.

Using electrical characteristics 4450 illustrated in FIG. 44B, for $V_{GS}$=8 V, $|V_{TP}|$=0.8 V, and $V_{DS}$=0.1 V, a current $I_{DS}$~$1\times10^{-5}$ A ($I_{DS}$~10 μA) flows through the single nanotube pCNTFET device. The capacitance per unit length for a single nanotube coupling to a gate may be calculated using equation 40.4. pCNTFET device 4400 is operating in the linear region, so the current $I_{DS}$ for a pCNTFET device with a single nanotube may be written using equation 40.10, where $C_{I-TOT}(N)$ is replaced by the single nanotube capacitance approximation illustrated in equation 40.4, as follows.

$$I_{DSP}=(\mu_P/L_P)\cdot[2\pi\cdot\epsilon_R\epsilon_0/\ln(2t_G/R_{NT})]\cdot[(V_{GS}-|V_{TP}|)V_{DS}-V^2_{DS}/2],\quad [EQ\ 40.12]$$

pCNTFET device 4400 is ON when the gate voltage $V_{GS}$ is zero, and turns OFF when $|V_{TP}|$=0.8 V. Therefore, the gate voltage relative to the threshold voltage $V_{GS}-V_{TP}$=8+0.8 V, results in a current of 10 μA. Substituting in equation 40.12, $1\times10^{-5}=(\mu_P/300\times10^{-7})\cdot[2\cdot3.14\cdot4\cdot8.85\times10^{-14}/\ln(2\cdot67/0.85)]\cdot[(8.8)0.1-0.01/2]$, $1\times10^{-5}=(\mu_P/3\times10^{-5})\cdot[43.94\times10^{-14}]\cdot[0.88]$, and $\mu_P$=775 cm$^2$/V·s    [EQ 40.13]

FIGS. 2A and 2B described further above, and FIGS. 48, 49A-B, 50A-B, 51A-B, 52A-B, 53 and 54 described further below, illustrate the integration of NT fabrics in an integrated circuit. For an integrated pCNTFET device, and assuming an effective hole mobility value of $\mu_P$=775 cm$^2$/V·s (equation 40.13) for each of the substantially parallel nanotubes forming a NT fabric of width W=400 nm, the electrical characteristics of pCNTFET devices may be calculated using capacitance values such as those illustrated in FIG. 42. Table 4250 illustrated in FIG. 42 shows the surprising result that capacitance per unit length varies by only approximately 4% when NT fabric density is varied by 4×. Accordingly, capacitance value 4220 was selected as representative of NT fabric densities corresponding to N=401 to N=101 individual nanotubes in an ordered NT fabric forming a CNTFET NT channel element approximately 400 nm wide. The pCNTFET devices illustrated further below generate a maximum saturation current for use in high speed logic circuits with simple structures, corresponding low process complexity, and compatible with integrating CNTFET devices at any level of assembly; that is, within and between wiring layers.

At this point in the specification, capacitance per unit length values are calculated using equations 40.6 and 40.8 and plotted in graphical form and displayed in tabular form in FIGS. 45A-E for CNTFET devices of width W as the number of nanotubes is varied from one nanotube to N nanotubes. The largest value of N used in these examples corresponds to the case where individual nanotubes in the ordered nanotube fabric are touching. Calculations include a range of semiconductor SWNT diameters from 0.75 nm to 2.0 nm. Corresponding CNTFET current values for applied voltages are shown in FIG. 45F.

Ordered Nanotube Fabric Capacitance Values for Various Nanotube Diameters and Fabric Densities and Corresponding CNTFET Device Currents For high performance digital circuits, current per unit width is typically used as a figure of merit in the semiconductor industry, usually expressed as micro-Amperes per micrometer, and is published for MOSFET devices in the International Technology Roadmap for Semiconductors (ITRS) updated every two years. Current per unit width is also a useful device figure of merit for CNTFET devices, as described further below with respect to FIG. 45F. Maximizing current per unit width values is dependent on maximizing the capacitance coupling between the gate of CNTFET devices to achieve a high number of available mobile carriers as explained further above, and minimizing variations in capacitance as a function of NT fabric density variations as explained further below with respect to FIGS. 45A-E.

FIG. 45A illustrates gate-to-NT fabric capacitance 4500, for a NT fabric formed with semiconducting SWNTs of diameter $d_{NT}$=0.75 nm, expressed as total capacitance per unit length $C_{I-TOT}(N)$ in units of Farads per centimeter (F/cm). Capacitance 4500 is plotted as a continuous curve for values of N=1 to N=533 nanotubes for a CNTFET device with a channel width of approximately 400 nm (W=400 nm).

The ordered NT fabric formed with $d_{NT}$=0.75 nm, corresponding to capacitance 4500, may be formed with a low fabric density, such as illustrated by capacitance 4500 low fabric density segment W-X in FIG. 45A. At low fabric density, the capacitance is proportional to the capacitance of a single nanotube multiplied by the number of nanotubes N (proportional to N), and corresponds, for example, to negligible electric field coupling between various individual nanotubes, as illustrated in FIG. 40A for example.

The ordered NT fabric formed with $d_{NT}$=0.75 nm, corresponding to capacitance 4500, may be formed with a high fabric density, such as illustrated by capacitance 4500 high fabric density segment Y-Z in FIG. 45A. High fabric density segment Y-Z is in a flat portion of the capacitance 4500 curve in which the capacitance variation is limited to less than or equal to 5%. So in this example, $C_{I-TOT}(N=115)\geq=0.95\cdot C_{I-TOT}(N=533)$. The corresponding ordered nanotube fabric density range for high density fabric Y-Z, when using $d_{NT}$=0.75 nm nanotubes, is from 287 NTs/um$^2$ to 1,332 NTs/um$^2$ as illustrated in FIGS. 45A and 45E. A surprising result is that the corresponding ordered nanotube fabric density range variation of 4.7× results in a capacitance variation of less than or equal to approximately 5%. As shown in FIG. 45F, the corresponding CNTFET device current variation due to capacitance is also approximately <=5% as calculated further below. This surprising low sensitivity of CNTFET device parameters to nanotube fabric density in the high fabric density segment Y-Z may be leveraged in CNTFET structures as described further below with respect to FIGS. 48, 49A-B, 50A-B, 51A-B, 52A-B, 53 and 54.

The ordered NT fabric formed with $d_{NT}$=0.75 nm, corresponding to capacitance 4500, may be formed with an intermediate fabric density, such as illustrated by capacitance 4500 intermediate fabric density segment X-Y in FIG. 45A. Intermediate fabric density segment X-Y is in a curved portion of the capacitance 4500 curve in which the capacitance increases from X to Y at a decreasing rate. Capacitance 4500 in intermediate fabric density segment X-Y is no longer proportional to the number of nanotubes N above the point X and is below the point Y at which the capacitance variation is limited to less than or equal to 5%.

CNTFET devices described further below are designed using high fabric densities to maximize current per unit width and minimize current variations as described with respect to FIG. 45A further above, and FIGS. 45B-F further below.

Figure 45B:
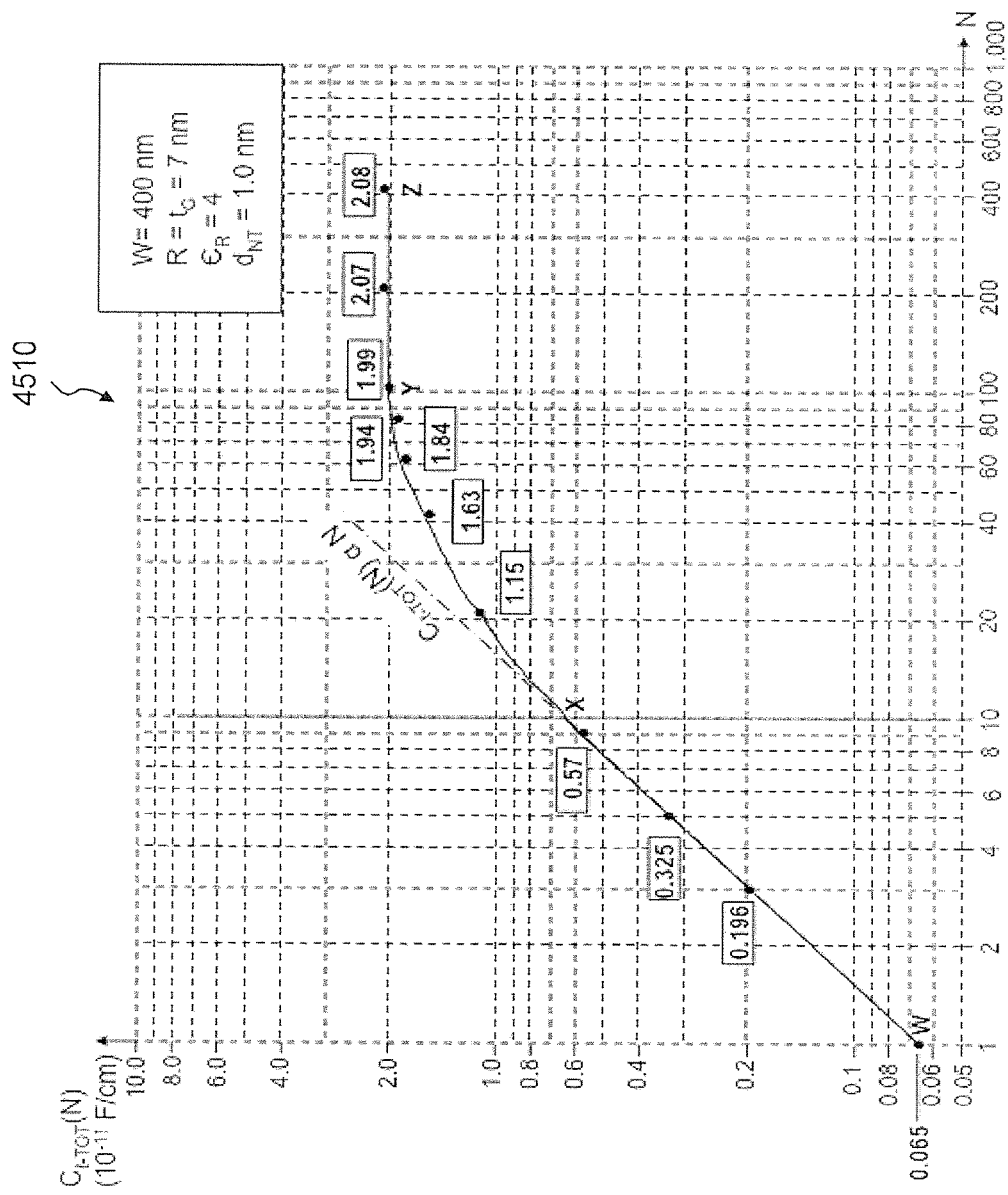
FIG. 45B illustrates a graphical representation of capacitance between gate and NT fabric as a function of nanotube density for a fabric composed of 1 nm diameter nanotubes.
Figure 45C:
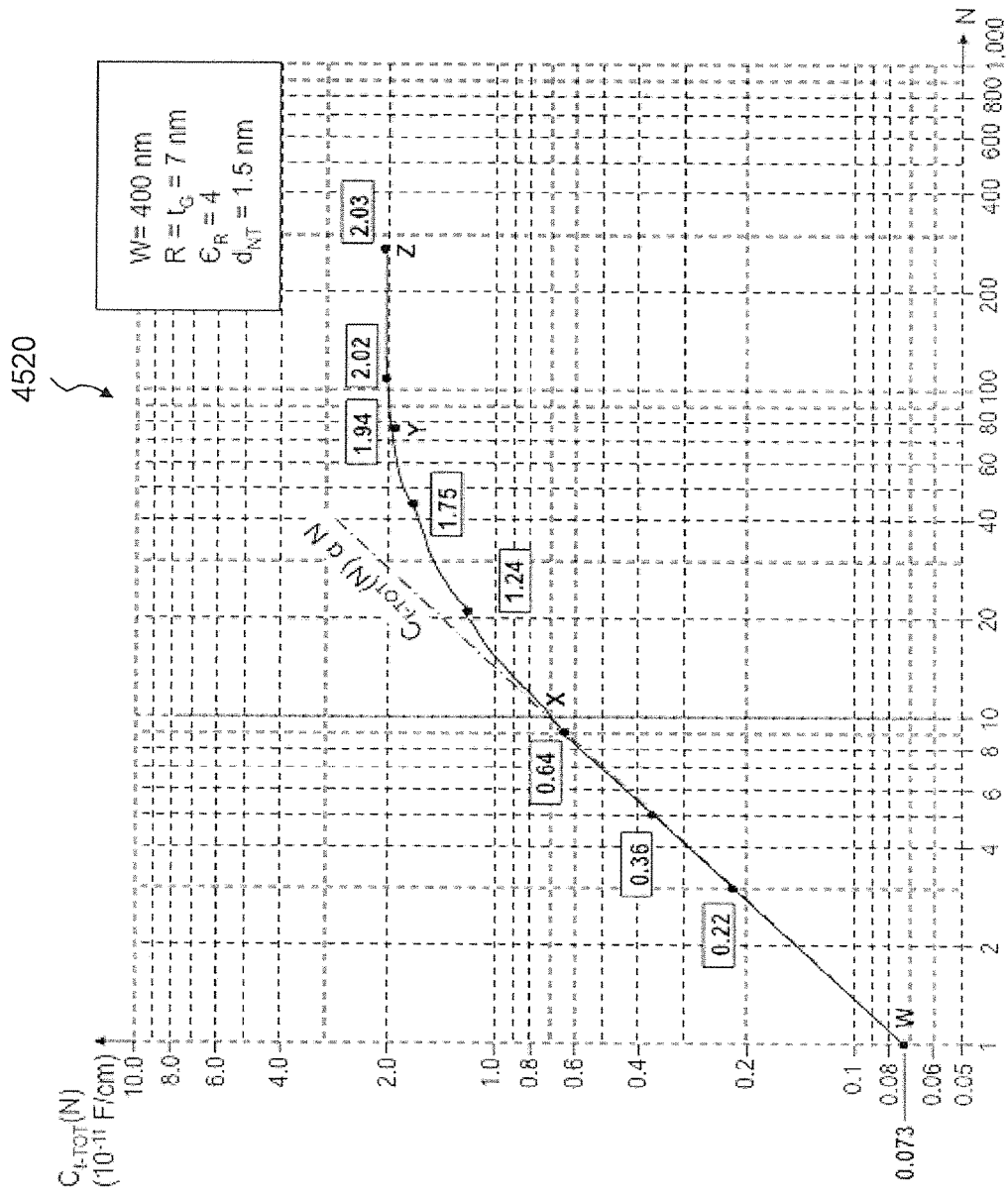
FIG. 45C illustrates a graphical representation of capacitance between gate and NT fabric as a function of nanotube density for a fabric composed of 1.5 nm diameter nanotubes.
Figure 45D:
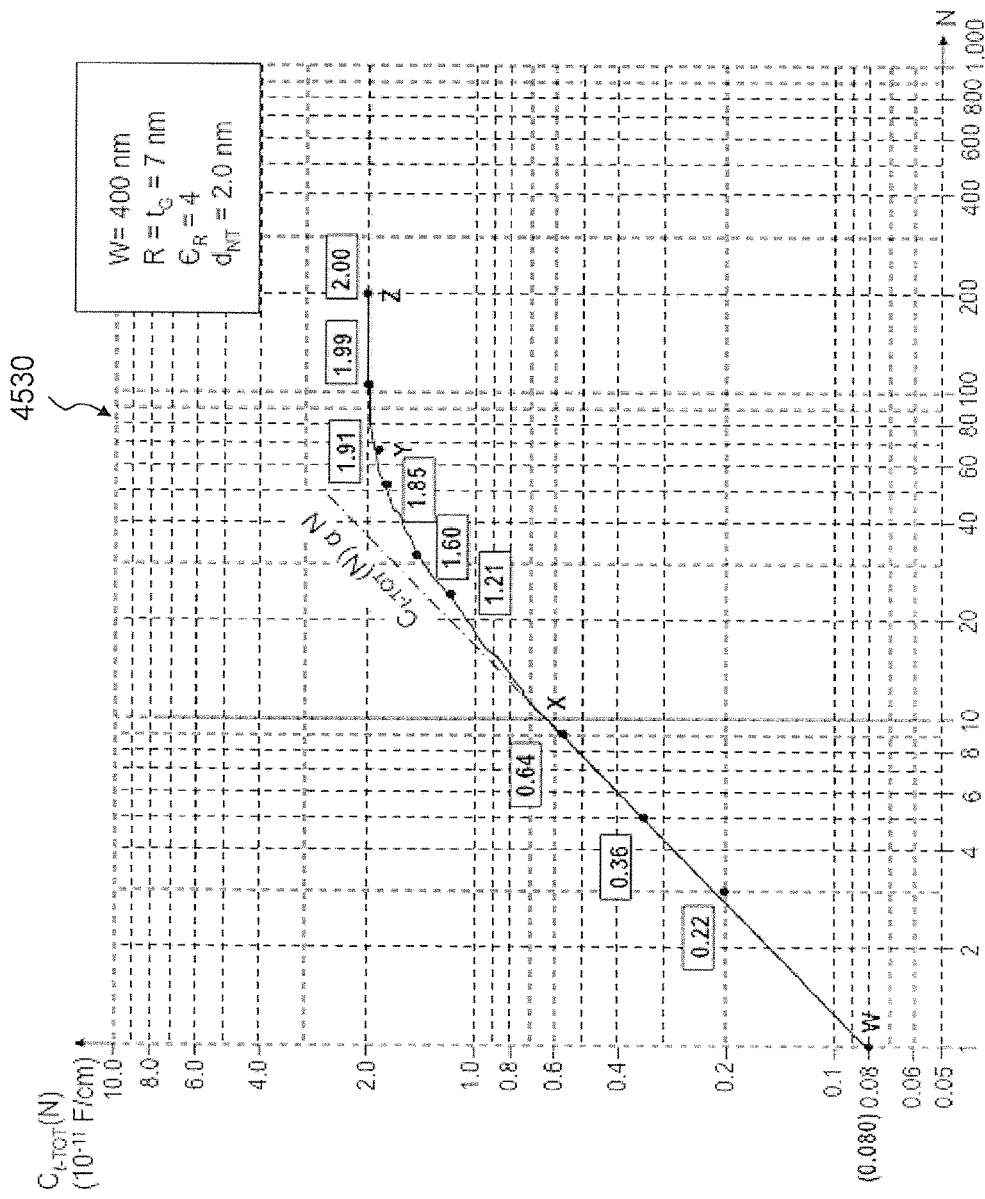
FIG. 45D illustrates a graphical representation of capacitance between gate and NT fabric as a function of nanotube density for a fabric composed of 2 nm diameter nanotubes.

FIGS. 45B, 45C, and 45D describe capacitance 4510 with $d_{NT}$=1.0 nm, capacitance 4520 with $d_{NT}$=1.5 nm, and capacitance 4530 with $d_{NT}$=2.0 nm, respectively. In each of these capacitance curves, $C_{l-TOT}(N)$ is plotted as a function of the number of nanotubes N. In each figure, low fabric density segment W-X, intermediate fabric density segment X-Y, and high fabric density segment Y-Z are shown. Capacitance 4500, 4510, 4520, and 4530 are continuous. Several representative values of capacitance are included because capacitance values are difficult to obtain from logarithmic plot axes. Capacitance and corresponding current values for high fabric density regions Y-Z are further illustrated and summarized in FIGS. 45E and 45F.

The ordered NT fabric formed with $d_{NT}$=1.0 nm nanotubes, corresponding to capacitance 4510, may be formed with a high fabric density, such as illustrated by capacitance 4510 high fabric density segment Y-Z in FIG. 45B. High fabric density segment Y-Z is in a flat portion of the capacitance 4510 curve in which the capacitance variation is limited to less than or equal to 5%. So in this example, $C_{l-TOT}(N=101)>=0.95 \cdot C_{l-TOT}(N=401)$. The corresponding ordered nanotube fabric density range for high fabric density Y-Z, when using $d_{NT}$=1.0 nm nanotubes, is from 252 NTs/um$^2$ to 1,002 NTs/um$^2$ as illustrated in FIGS. 45B and 45E. A surprising result is that the corresponding ordered nanotube fabric density range variation of 4.0× results in a capacitance variation of less than or equal to approximately 5%. As shown in FIG. 45F, the corresponding CNTFET device current variation due to capacitance is also approximately <=5% as calculated further below. This surprising low sensitivity of CNTFET device parameters to nanotube fabric density in the high fabric density segment Y-Z may be leveraged in CNTFET structures as described further below with respect to FIGS. 48, 49A-B, 50A-B, 51A-B, 52A-B, 53 and 54.

The ordered NT fabric formed with $d_{NT}$=1.5 nm nanotubes, corresponding to capacitance 4520, may be formed with a high fabric density, such as illustrated by capacitance 4520 high fabric density segment Y-Z in FIG. 45C. High fabric density segment Y-Z is in a flat portion of the capacitance 4520 curve in which the capacitance variation is limited to less than or equal to 5%. In this example, $C_{l-TOT}(N=75)>=0.95 \cdot C_{l-TOT}(N=267)$. The corresponding ordered nanotube fabric density range for high fabric density Y-Z, when using $d_{NT}$=1.5 nm nanotubes, is from 187 NTs/um$^2$ to 667 NTs/um$^2$ as illustrated in FIGS. 45C and 45E. A surprising result is that the corresponding ordered nanotube fabric density range variation of 3.5× results in a capacitance variation of less than or equal to approximately 5%. As shown in FIG. 45F, the corresponding CNTFET device current variation due to capacitance is also approximately <=5% as calculated further below. This surprising low sensitivity of CNTFET device parameters to nanotube fabric density in the high fabric density segment Y-Z may be leveraged in CNTFET structures as described further below with respect to FIGS. 48, 49A-B, 50A-B, 51A-B, 52A-B, 53 and 54.

The ordered NT fabric formed with $d_{NT}$=2.0 nm nanotubes, corresponding to capacitance 4530, may be formed with a high fabric density, such as illustrated by capacitance 4530 high fabric density segment Y-Z in FIG. 45D. High fabric density segment Y-Z is in a flat portion of the capacitance 4530 curve in which the capacitance variation is limited to less than or equal to 5%. So in this example, $C_{l-TOT}(N=67)>=0.95 \cdot C_{l-TOT}(N=201)$. The corresponding ordered nanotube fabric density range for high fabric density Y-Z, when using $d_{NT}$=2.0 nm nanotubes, is from 167 NTs/um$^2$ to 502 NTs/um$^2$ as illustrated in FIGS. 45D and 45E. A surprising result is that the corresponding ordered nanotube fabric density range variation of 3.0× results in a capacitance variation of less than or equal to approximately 5%. As shown in FIG. 45F, the corresponding CNTFET device current variation due to capacitance is also approximately <=5% as calculated further below. This surprising low sensitivity of CNTFET device parameters to nanotube fabric density in the high fabric density segment Y-Z may leveraged in CNTFET structures as described further below with respect to FIGS. 48, 49A-B, 50A-B, 51A-B, 52A-B, 53 and 54.

By way of example, pCNTFET device electrical characteristics are calculated for $d_{NT}$=1.0 for high fabric density segment Y-Z illustrated in FIG. 45B for maximum and minimum dense fabric characteristics as illustrated in FIG. 45F. The pCNTFET device is formed using an ordered NT fabric of approximately 400 nm width, and for maximum dense fabrics, with N=401 nanotubes, a channel length of 200 nm, with a $SiO_2$ dielectric of thickness $t_G$=7 nm, and relative dielectric constant $\epsilon_R$=4. In this example, the pCNTFET device operates in the saturated region with a voltage $V_{DD}$=1.5 V and threshold $|V_{TP}|$=0.4 V. The current $I_{DS}$ may be calculated as follows using equation 40.11 and the mobility pp in equation 40.13 for each individual nanotube.

$$I_{DSp} = (\mu_P/L_P) \cdot C_{l-TOT}(N) \cdot [(V_{GS}-|V_{TP}|)^2/2],$$

The total gate-to-NT fabric capacitance is shown in FIG. 45E as $C_{l-TOT}(N)=2.08\times10^{-11}$ F/cm. The corresponding current between source and drain for maximum dense fabrics may be calculated as follows.

$$I_{DSp} = (775/200\times10^{-7}) \cdot 2.08\times10^{-11} \cdot [(1.5-0.4)^2/2],$$

$$I_{DSp} = 488 \text{ μA in a device width } W=400 \text{ nm } (0.4 \text{ μm})$$

The saturation current per micrometer of width is therefore $$I_{DSp} = 1,220 \text{ μA/um}$$

and the average NT current per nanotube, for N nanotubes, is calculated with equation 40.14, $$I_{DS/NT} = I_{DS}/N \qquad [\text{EQ 40.14}].$$

Using equation 40.14 with $I_{DS}=I_{DSp}=488$ μA carried by N=401 nanotubes, the average current per nanotube $I_{DSp/NT}=1.2$ μA for this example, which is substantially less than the Javey et al. reference indicates for maximum allowed current flow in individual nanotubes. A $d_{NT}=1.0$ nm diameter nanotube has a circumference of 3.14 nm. Therefore, the average current per nm of circumference per nanotube is 0.4 uA/nm/NT. These electrical characteristics are illustrated in FIG. 45F.

In this example, a pCNTFET device is formed with minimum dense fabrics, with N=101 nanotubes, a channel length of 200 nm, with a $SiO_2$ dielectric of thickness $t_G=7$ nm, and relative dielectric constant $\epsilon_R=4$. The pCNTFET device operates in the saturated region with a voltage $V_{DD}=1.5$ V and threshold $|V_{TP}|=0.4$ V. The current $I_{DS}$ may be calculated as follows using equation 40.11 and the mobility $\mu_P$ in equation 40.13 for each individual nanotube.

$$I_{DSp}=(\mu_P/L_P)\cdot C_{l-TOT}(N)\cdot[(V_{GS}-|V_{TP}|)^2/2],$$

The total gate-to-NT fabric capacitance is shown in FIG. 45E as $C_{l-TOT}(N)=1.99\times10^{-11}$ F/cm. The corresponding current between source and drain for maximum dense fabrics may be calculated as follows.

$$I_{DSp}=(775/200\times10^{-7})\cdot1.99\times10^{-11}\cdot[(1.5-0.4)^2/2],$$

$I_{DSp}=466$ μA in a device width $W=400$ nm (0.4 μm)

The saturation current per micrometer of width is therefore $I_{DSp}=1,165$ μA/um and the average NT current per nanotube, for N nanotubes, is calculated with equation 40.14, $$I_{DS/NT}=I_{DS}/N \quad [EQ\ 40.14].$$

Using equation 40.14 with $I_{DS}=I_{DSp}=466$ μA carried by N=101 nanotubes, the average current per nanotube $I_{DSp/NT}=4.6$ μA for this example, which is substantially less than the Javey et al. reference indicates for maximum allowed current flow in individual nanotubes. A $d_{NT}=1.0$ nm diameter nanotube has a circumference of 3.14 nm. Therefore, the average current per nm of circumference per nanotube is 0.4 uA/nm/NT. These electrical characteristics are illustrated in FIG. 45F.

The specification has focused on maximizing current per unit width and minimizing current variations for digital circuits. However, these dense ordered nanotube fabrics may also be used for analog applications by improving the current-voltage characteristics in the linear region (equation 40.10). While calculations are with respect to pCNTFET devices, similar calculations may be performed for nCNTFET devices as described further below.

The pCNTFET device drain-source current $I_{DSp}$ and the drain-source current per unit width $I_{DSp/W}$ are within 5% for minimum and maximum dense fabrics with $d_{NT}=1.0$ nm as illustrated in FIG. 45F. These pCNTFET device currents are also within 5% for $d_{NT}=0.75$ nm, $d_{NT}=1.5$ nm, and $d_{NT}=2.0$ nm as illustrated in FIG. 45F. Comparing the maximum current $I_{DSp}=490$ μA for a maximum dense fabric formed with $d_{NT}=0.75$ nm diameter nanotubes, with the $I_{DSp}=448$ μm current for a minimum dense fabric formed with a $d_{NT}=2.0$ nm diameter nanotubes in FIG. 45F, shows a less than 10% variation in current. A still further surprising result is this relative insensitivity of pCNTFET device current to nanotube fabric density (above a minimum dense fabric value) variation combined with individual nanotube diameter variation which may be leveraged further below with respect to FIGS. 48, 49A-B, 50A-B, 51A-B, 52A-B, 53 and 54 so as to compensate for dense NT fabric process variations. By forming dense ordered NT fabrics of greater density than the minimum dense fabric shown in FIG. 45E to compensate for process variations, corresponding CNTFET devices are formed with ordered NT fabrics that always at least as dense as shown by the minimum dense fabric characteristics shown in FIG. 45E. This is enabled by the allowed NT fabric density variations illustrated in FIG. 45E.

The pCNTFET devices described with respect to FIGS. 45A-F may be fabricated as a stack of multiple CNTFET devices within and between wiring levels. nCNTFET devices may be formed as well. Such CNTFET devices may also be fabricated with shorter channel lengths than 200 nm, such as 100 nm and sub-100 nm channel lengths for example, for higher current per unit width and smaller size, for higher performance circuits. CNTFET circuits using CNTFET devices formed with ordered semiconducting NT channel elements, and integrated at various levels of assembly, may exceed MOSFET-based technology densities an order of magnitude or more at comparable and even higher performance levels. With the ordered NT fabric forming the device channel region, pCNTFET devices may operate over a broad range of voltages such as in the range of 1 to 3.5 V., and even up to $V_{DD}$ values of 5 V, since CNTFET devices do not require semiconductor junctions in single crystalline silicon with corresponding device limitations. Also, multiple CNTFET devices may operate at different $V_{DD}$ values in the same chip, and even in the same circuit.

Unordered and ordered NT fabrics are illustrated in FIGS. 35A and 35B, respectively, with contact regions forming corresponding source and drain regions. Various contacts, and methods of optimizing carrier injection, are described further below with respect to FIGS. 46A-C and 47A-B.

Figure 46A:
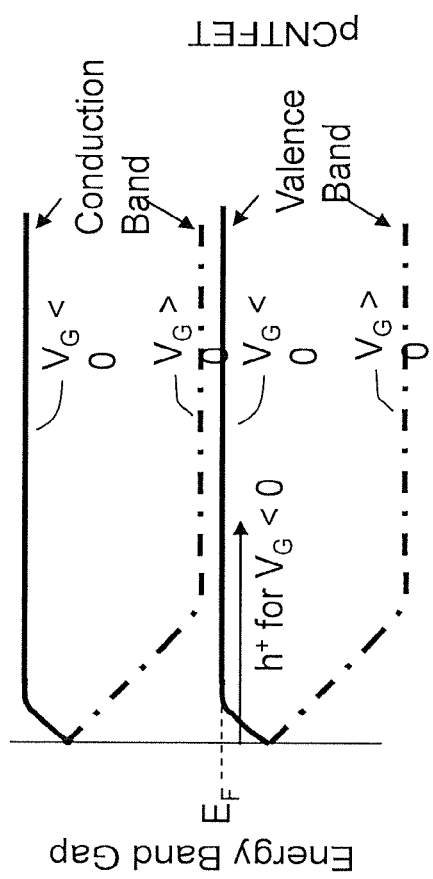
FIG. 46A illustrates band energy diagrams for pCNTFET devices operating with relatively high Schottky barriers in the source and drain conductor (also referred to as contact, electrode, and terminal) regions.
Figure 46B:
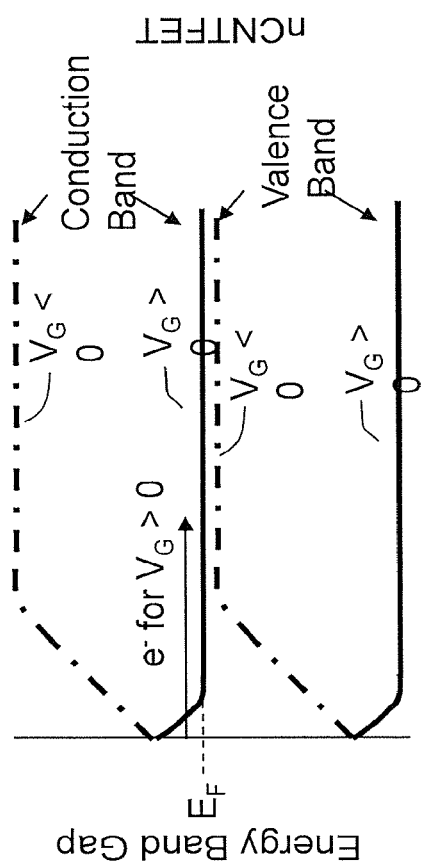
FIG. 46B illustrates band energy diagrams for nCNTFET devices operating with relatively high Schottky barriers in the source and drain conductor (also referred to as contact, electrode, and terminal) regions.
Figure 46C:
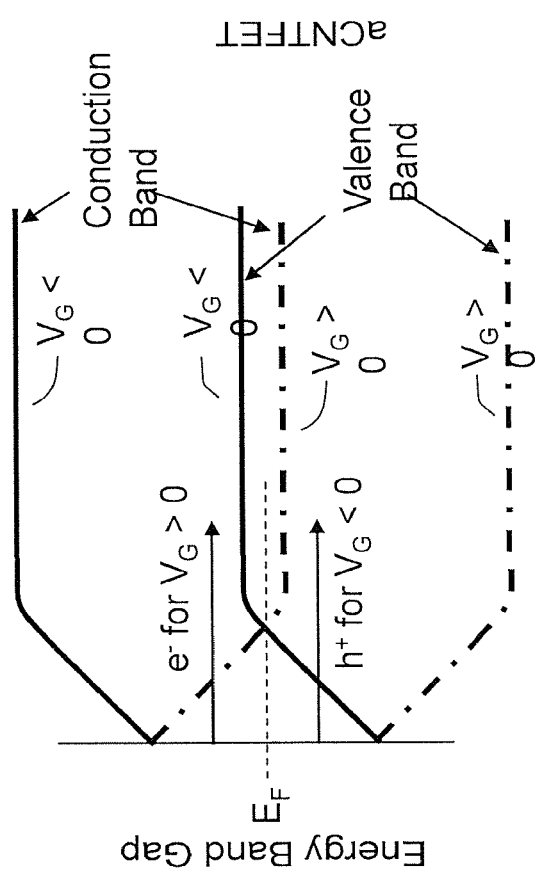
FIG. 46C illustrates band energy diagrams for ambipolar CNTFET (aCNTFET) devices operating with relatively high Schottky barriers in the source and drain conductor (also referred to as contact, electrode, and terminal) regions.

FIG. 46A illustrates an energy band gap diagram of a pCNTFET device with holes injected by the source into the valence band. Fermi level $E_F$ is close to the valence band enabling the injection. However, holes must overcome a relatively high Schottky barrier. FIG. 46C illustrates an energy band gap diagram of an ambipolar CNTFET (aCNTFET) device in which the Fermi level $E_F$ is positioned in close proximity to both valence and conduction bands facilitating injection of both holes and electrons. The FIG. 46A energy band gap diagram represents a pCNTFET device that corresponds to pCNTFET current-voltage characteristics 590 shown in FIG. 5F, and the FIG. 46C energy band gap diagram represents an aCNTFET that corresponds to aCNTFET electrical characteristics 1800 shown in FIG. 18. Electrical characteristic 1800 were obtained by heating a pCNTFET device with an energy band gap illustrated in FIG. 46A. An nCNTFET device corresponding to the energy band gap illustrated in FIG. 46B may be obtained by further heating an aCNTFET device with an energy band gap structure illustrated in FIG. 46C. CNTFET devices illustrated in FIG. 46A-C may be referred to as Schottky Barrier (SB) CNTFET (SB CNTFET) devices because of the relatively high Schottky barrier that carrier must overcome to be injected into the valence or conduction bands, and are representative of the device electrical characteristics illustrated further above in FIGS. 5F and 18 for example, as described in the reference R. Sahoo, et al., "Simulations of Carbon Nanotube Field Effect Transistors", International Journal of Electronic Engineering Research, ISSN 0975-6450, Volume 1, Number 2 (2009) pp. 117-125 incorporated herein by reference in its entirety. As described in the Sahoo reference, SB CNTFET device operation results from gate modulation of mobile carrier injection in the source and drain region, and not by induced mobile charge in the NT fabric region under the gate. pCNTFET, nCNTFET, and aCNTFET device saturation current increases in these devices if they are fabricated (formed) using ordered NT fabrics instead of unordered NT fabrics.

Figure 47A:
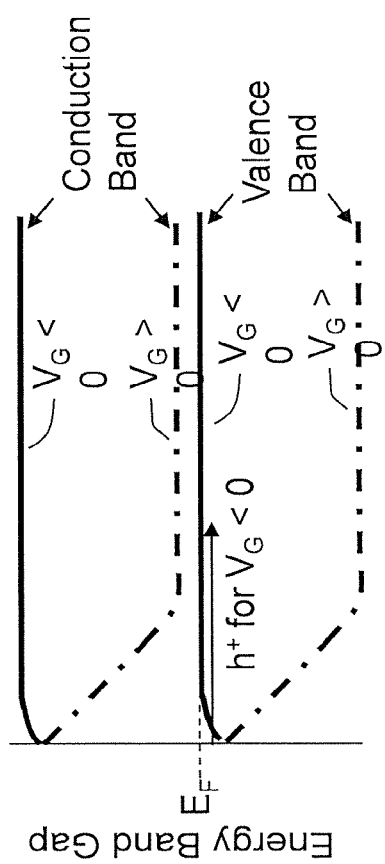
FIG. 47A illustrates band energy diagrams for pCNTFET devices operating with relatively low Schottky barriers in the source and drain conductor (also referred to as contact, electrode, and terminal) regions.
Figure 47B:
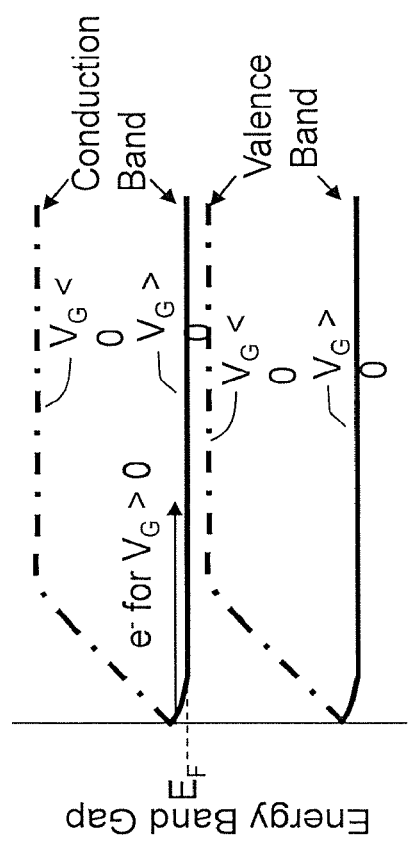
FIG. 47B illustrates band energy diagrams for nCNTFET devices operating with relatively low Schottky barriers in the source and drain conductor (also referred to as contact, electrode, and terminal) regions.

Additional device saturation current increases may be achieved by further changes in the contact-to-nanotube source and drain regions. FIG. 47A illustrates an energy band gap corresponding to a relatively low (or even non-existent) Schottky barrier for a pCNTFET device corresponding to device 4400 described in the Javey et al. reference cited further above, resulting in near-Ohmic or Ohmic source and drain contacts. Hole injection efficiency is substantially improved. Such a device may be referred to as a source drain (SD) CNTFET device, as described in the Sahoo reference cited further above. SD CNTFET devices, both p- and n-type, operate based on mobile carriers induced in the NT fabric region below the gate as described in the Sahoo reference. SD CNTFET-type device may enable greater saturation current per unit width because of more efficient hole injection into the valence band (FIG. 47A). FIG. 47B illustrates an energy band gap corresponding a relatively low (or even non-existent) Schottky barrier for an nCNTFET device and better electron injection in the conduction band. FIGS. 2A-B, 48, and 49A-B illustrate various structures and methods of fabricating SD pCNTFET and SD nCNTFET devices for use in semiconducting nanotube-fabric based complementary circuits. CNTFET devices may be optimized by enhanced contacts to CNTFET devices formed with dense nanotube fabrics described with respect to FIGS. 45A-F.

Fabrication Methods and Corresponding Structures

Figure 48:
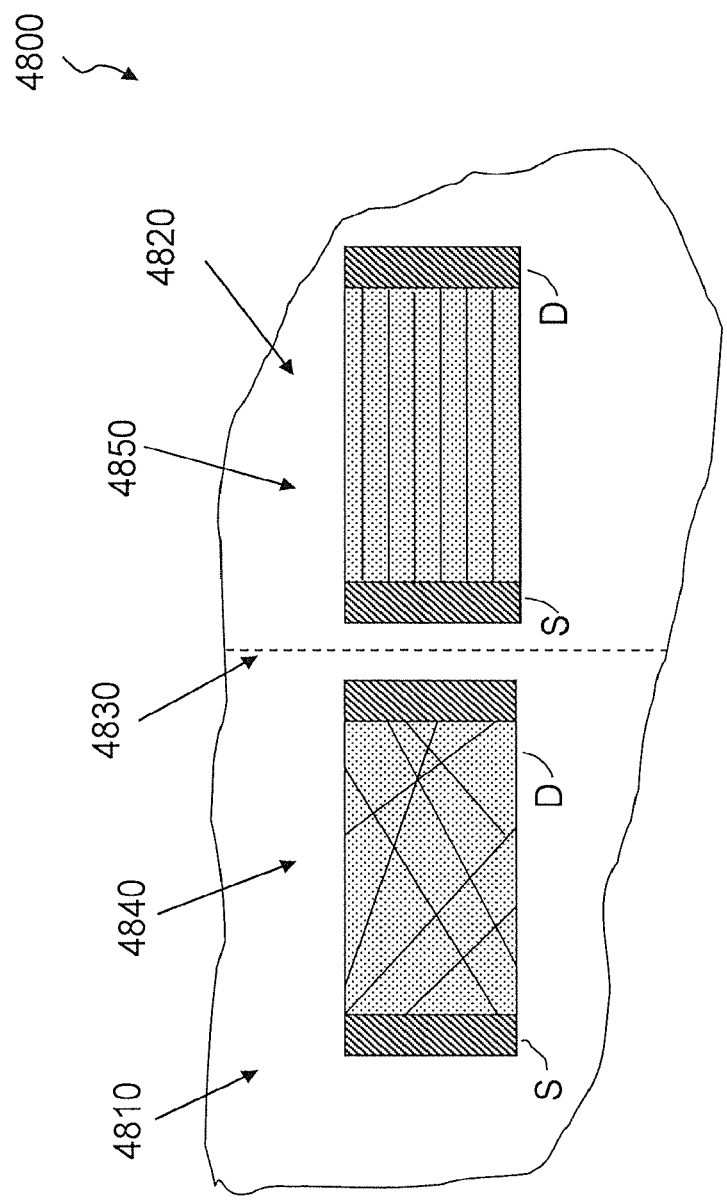
FIG. 48 illustrates a representation of a portion of a chip that includes an unordered nanotube fabric region and an ordered nanotube fabric region.

FIG. 48 illustrates a representation 4800 of a region 4820 within a chip that includes an unordered nanotube fabric 4810 and an ordered nanotube fabric 4820, defined in part by boundary line 4830. Unordered NT fabric 4810 corresponds to unordered NT fabric 3530, and CNTFET device 4840 corresponds to partial CNTFET device 3510 illustrated in FIG. 35A. Ordered NT fabric 4820 corresponds to ordered NT fabric 3570, and CNTFET device 4850 corresponds to partial CNTFET device 3555 illustrated in FIG. 35B. Ordered NT fabrics may be formed from unordered NT fabrics in selected regions, such as region 4820 illustrated in FIG. 48. CNTFET devices, as well as other components such as nanotube-based resistors and nanotube-based capacitors, and corresponding circuits may be formed in unordered NT fabric region 4810 and ordered NT fabric region 4820.

As described further below, CNTFET devices formed with ordered NT fabrics that may be substantially denser than unordered NT fabrics and may exhibit higher device area. Therefore circuits formed in ordered NT fabric regions may have superior performance than those formed in unordered NT fabric regions, resulting in substantially faster circuit operating speeds for CNTFET-based NOT (inverter) and NAND circuits of approximately the same physical dimensions, for example, as described further below.

For example, a ring oscillator formed using CNTFET-based NOT (inverter) circuits, such as inverter 1200 illustrated in FIGS. 12A-C, and using minimum CNTFET device structures with ordered NT fabrics as described further above with respect to FIGS. 45A-F, oscillates at a frequency approximately 278 times higher than the oscillating frequency of ring oscillators formed with NOT (inverter 1200) circuits of comparable size and structure and corresponding to CNTFET devices with unordered NT fabrics, as illustrated in CNT-based NOT circuit performance table 5500 in FIG. 55 and described further below. Also, a CNTFET-based NAND circuit, such as CCN-NAND circuit 1900 illustrated in FIG. 19, exhibits approximately 233 times less propagation delay when formed using CNTFET devices formed with ordered nanotube fabrics as described with respect to FIGS. 45A-F, than CCN-NAND circuit 1900 of comparable size (dimensions) and structure formed with CNTFET devices using unordered NT fabrics as described further below with respect to CCN-NAND circuit performance tables 5700 and 5750 illustrated in FIGS. 57A and 57B, respectively.

Exemplary CNTFET 200 device illustrated in FIGS. 2A and 2B are a representation of various CNTFET device structures described further above. For example, exemplary CNTFET 200 may include NT fabric 252 formed using a nonwoven nanotube fabric with randomly oriented individual nanotubes such as described in incorporated references, such as Ward et al. U.S. Pat. No. 7,335,395. An example of a nonwoven fabric is illustrated in FIG. 5B, and also further illustrated in FIG. 35A where the NT fabric is referred to as unordered nanotube fabric 3530, with randomly oriented individual nanotubes. However, NT fabric 252 may instead represent an ordered nanotube fabric, such that individual NT elements are substantially oriented in a single direction, as illustrated by ordered nanotube fabric 3570 illustrated in FIG. 35B, in which individual nanotubes possess a degree of positional regularity of the nanotubes, e.g., some degree of parallelism along their long axes, as described further above and illustrated in FIGS. 36A-B, 37A-B, 38A-D and 39A-D.

Exemplary CNTFET 200-type devices formed using unordered NT fabrics, such as NT fabrics described further above with respect to FIGS. 2A and 2B, FIGS. 5A-F, and FIG. 35A, result in the measured pCNTFET current voltage characteristics 590 shown in FIG. 5F as described further above. Applying transformational electrical post processing by heating the pCNTFET device resulted in an ambipolar CNTFET (aCNTFET) device as illustrated by aCNTFET electrical characteristic 1800 illustrated in FIG. 18 for the same device. This behavior is caused by the presence of Schottky barrier junctions at the source and drain regions of the CNTFET device as described further above with respect to FIGS. 46A and 46B, and explained in the reference Avouris, A., "Carbon nanotube electronics," Chemical Physics 281 (2002), pp. 429-445 incorporated herein by reference in its entirety. In the case of aCNTFET devices, Schottky barriers (SB) enable the same source region to supply electrons and holes to both conduction and valence bands, respectively. However, SB cause voltage drops between source and drain conductors, such as source conductor 256 and drain conductor 262, and nanotubes, such as the nanotubes forming NT fabric 252, in source region 264 and drain region 266, respectively, for pCNTFET, aCNTFET, and nCNTFET devices as illustrated by energy band gaps shown in FIGS. 46A-C. There is also a contact resistance between source and drain conductors 256 and 262, respectively, and nanotubes forming NT fabric 252, because of quantum resistance effects. As described in the Sahoo reference further above, CNTFET devices dominated by Schottky barrier behavior, may be referred to as SB CNTFET, for example, SB pCNTFET or SB nCNTFET devices.

The saturation current for CNTFET devices formed using unordered NT fabrics are typically several orders of magnitude than those shown in FIG. 45F, may be caused by a combination of factors. Mobile carriers flowing in individual nanotubes in NT fabric 252 typically flow through more than one nanotube while traveling between source and drain regions, such as source region 264 and drain region 266 illustrated in FIGS. 2A and 2B, because of the random orientation of individual nanotubes forming the unordered NT fabric. Mobile carrier scattering and additional contact resistance may lower carrier mobility. Also, the unordered nanotube fabric density is relatively low as illustrated by void regions between nanotubes in unordered NT fabric 3530 illustrated in FIG. 35A resulting in a relatively small number of parallel paths for mobile carrier flow between source and drain regions. In addition, voltage drops across Schottky barriers may result in less voltage across the NT channel region, such as channel region 272 illustrated in FIG. 2A, thereby reducing mobile carrier velocity and corresponding mobility. Quantum contact resistance between source and drain contacts and NT fabric in the source drain regions, such as source region 264 and drain region 266, are always present. However, quantum contact resistance may be minimized by the choice of conductor material and the optional doping of the NT fabric, such as NT fabric 252, in the source and drain regions. CNTFET devices with relatively high source-drain saturation currents in range of 1,120 to 1,225 µA/µm, such as illustrated in FIG. 45F, may be achieved with corresponding structures as described further below.

At this point in the specification, various approaches to forming NT fabric 252, illustrated in FIG. 2A, with ordered nanotube fabrics are described. The objective is to leverage the high CNTFET device current per unit width and surprising insensitivity of CNTFET device parameters to ordered NT fabric density variations of 3× or more, for ordered NT fabric densities greater than a minimum value. This minimum value of fabric density is shown at a point Y on capacitance 4500, 4510, 4520, and 4530 curves in FIGS. 45A, 45B, 45C, and 45D, respectively, and FIGS. 45E and 45F.

Figure 49A:
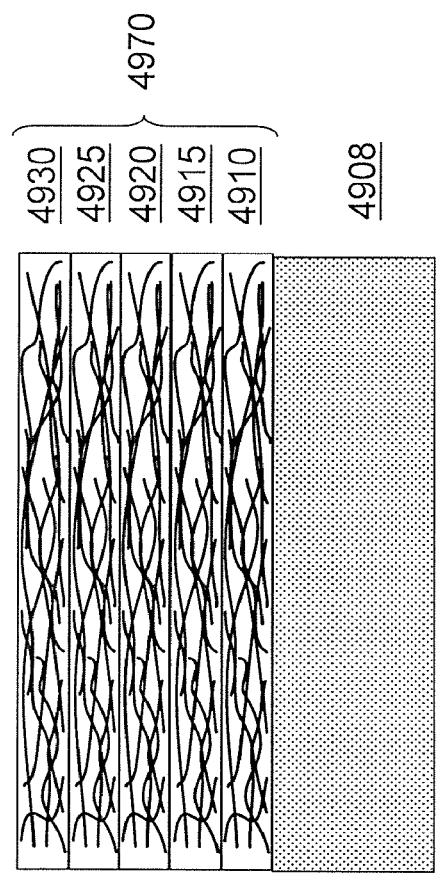
FIG. 49A illustrates a side view of a first ordered nanotube fabric structure.

FIG. 49A illustrates an unordered NT fabric 4970 on a substrate 4908. Unordered NT fabric 4970 is formed by depositing five unordered NT fabric layers 4910, 4920, 4930, 4940, and 4950. Each unordered NT fabric layer surface is in contact with adjacent unordered NT fabric layer surfaces. Unordered NT fabric layer 4910 is in contact with the top surface of substrate 5008.

The number of individual nanotubes in each unordered fabric layer may vary. Individual nanotubes are mostly semiconducting SWNTs. The diameter and length of nanotubes in the starting carbon nanotubes available from various vendors may be deposited on a surface and measured using an atomic force microscope (AFM). Typically, these nanotubes may have a diameter as small as approximately 0.7 nm and as large as 2.0 nm, although diameters outside this range are possible. Nanotube lengths in the 1 micrometer range are typical.

An indication of the NT fabric area density of deposited NT fabrics may be made using SEM images and counting individual nanotubes. However, sheet resistance measurements (Ohms per square) of deposited NT fabrics on monitor wafers using methods known in the Semiconductor Industry, and correlation with measured CNTFET device characteristics and/or CNT-based resistor values, is typically more useful. In this example, a NT fabric area density of approximately 50 NTs/um$^2$ is assumed for illustrative purposes.

Figure 49B:
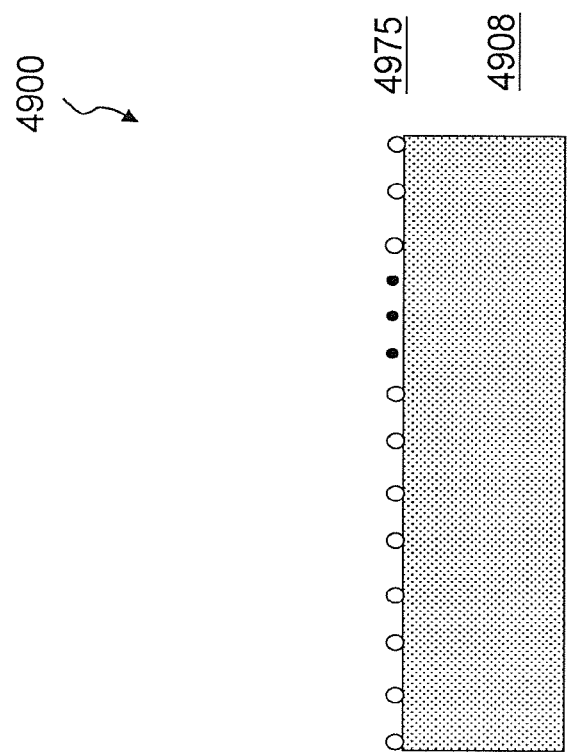
FIG. 49B illustrates a cross-sectional view of a first ordered nanotube fabric structure.

In a first example, individual NT diameter $d_{NT}$=1.0 nm, and the objective is to achieve an ordered NT fabric with a minimum dense fabric area density of approximately 250 Nts/um$^2$ (corresponding to the 252 NTs/um$^2$ illustrated in FIG. 45E). A directional mechanical force, such as mechanical force 3580 illustrated in FIG. 35B, may be applied to an unordered NT fabric to form an ordered NT fabric (as described within U.S. patent application Ser. No. 12/945,501). In this first example, the approximately 250 NTs/um$^2$ of NT fabric area density in unordered NT fabric 4970 (5× the 50 NTs/um$^2$ in each layer) are formed into a first ordered NT fabric structure 4900, with ordered NT fabric 4975 on substrate 4908 as illustrated in FIG. 49B. Ordered NT fabric 4975 corresponds to NT fabric 252 in FIG. 2A. Sheet resistance measurements on monitor wafers may be used to check for desired ordered NT fabric density prior to fabricating entire interconnected device structures. The density of ordered NT fabric 4975, in first ordered NT fabric structure 4900, needs to have a NT fabric area density of at least 250 NTs/um$^2$.

In the first example, no allowance was made for process variations. However, the surprising results illustrated in FIGS. 45E and 45F show that if the fabric density was increased by up to 4 times to approximately 1,000 NTs/um$^2$, the saturation current would increase by less than or equal to 5%. So in a second example, additional unordered NT layers are added to compensate for process variations in nanotube densities per layer and other factors. At an unordered NT fabric density per layer of 50 NTs/um$^2$, the number of layers in unordered NT fabric 4970 could be increased from 5 to up to 20, which results in a surprisingly large allowance for process variations.

Figure 50A:
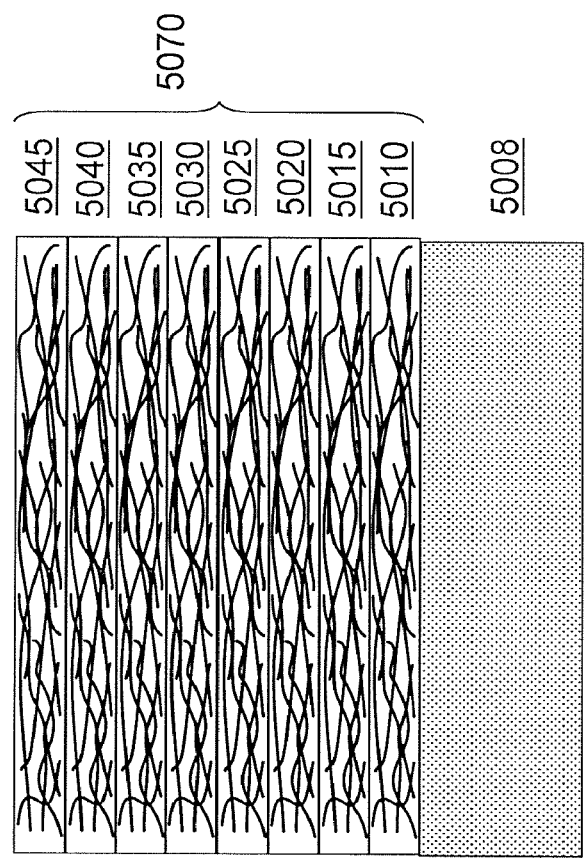
FIG. 50A illustrates a side view of a second ordered nanotube fabric structure.

In a second example, the number of unordered nanotube layers with unordered NT fabric area density of 50 NTs/um$^2$, are increased from 5 to 8, an increase in available unordered nanotube area density of 60%. FIG. 50A illustrates unordered NT fabric 5170 formed with unordered NT fabric layers 5010, 5015, 5020, 5025, 5030, 5035, 5040, and 5045, each unordered NT fabric layer surface is in contact with adjacent unordered NT fabric layer surfaces. Unordered NT fabric layer 5010 is in contact with the top surface of substrate 5008.

In the second example, individual NT diameter $d_{NT}$=1.0 nm, and the objective is to achieve an ordered NT fabric with a minimum dense fabric area density of approximately 400 NTs/um$^2$ (corresponding to a NT fabric area density approximately 60% greater than the 252 NTs/um$^2$ minimum ordered NT fabric density illustrated in FIG. 45E). A directional mechanical force, such as mechanical force 3580 illustrated in FIG. 35B, may be applied to an unordered NT fabric to form an ordered NT fabric (as described within U.S. patent application Ser. No. 12/945,501). In this second example, the approximately 400 NTs/um$^2$ of NT fabric area density in unordered NT fabric 5070 (8× the 50 NTs/um$^2$ in each layer) are formed into a second ordered NT fabric structure 5000, with ordered NT fabric 5075 on unordered NT fabric 5010-1 which is on substrate 5008 as illustrated in FIG. 50B. Ordered NT fabric 5080, a combination of ordered NT fabric 5075 and unordered fabric 5010-1, corresponds to NT fabric 252 in FIG. 2A. Unordered NT fabric 5010-1 corresponds to fabric 5010. Sheet resistance measurements on monitor wafers may be used to check for desired ordered NT fabric density prior to fabricating entire interconnected device structures. The density of ordered NT fabric 5080, in second ordered NT fabric structure 5000, needs to have a NT fabric area density of at least 250 NTs/um$^2$, and may be targeted for an ordered NT area fabric density of 350 NTs/um$^2$, to compensate for various process variables.

As described further above, unordered NT fabrics are substantially more resistive than ordered NT fabrics, typically orders of magnitude higher. In addition, source and drain contacts to CNTFET devices, such as illustrated in FIG. 2A, contact the top surface of the NT fabric 252, which corresponds to ordered NT fabric 5080 further reducing electrical conductive paths between source and drain regions potentially caused by unordered NT fabric 5010-1.

However, if CNTFET devices formed with ordered NT fabric 5080 exhibit relatively high leakage currents caused by the presence of unordered NT fabric 5010-1, then the resistance of NT fabric 5010-1 may be increased adjusting and/or limiting the conductivity range of the nanotube fabric layer itself.

For example, in certain applications the conductivity range of a nanotube fabric can be adjusted and/or limited by functionalizing—that is, chemically modifying—the nanotube elements comprising the nanotube fabric layer via wet chemistry techniques (e.g., by incorporating dielectric materials onto the surface of the nanotube elements). In other applications this conductivity range can be adjusted and/or limited by functionalizing the nanotube elements within the nanotube fabric layer via plasma treatment (e.g., exposing a nanotube fabric layer to an ionized plasma gas). In other applications this conductivity range can be adjusted and/or limited by functionalizing the nanotube elements within the nanotube fabric layer via CVD treatment (e.g., using a CVD process to coat the nanotube elements with dielectric material). In still other applications this conductivity range can be adjusted and/or limited by functionalizing the nanotube elements within the nanotube fabric layer via an ion implant (e.g., implanting ions into the nanotube elements so as to introduce defects).

Within certain applications a nanotube layer may be functionalized in situ. That is, a plurality of nanotube elements are deposited onto a substrate layer to form a nanotube fabric layer which is then subjected to functionalization via one or more of a plurality of the methods discussed above. Within such aspects no chemical modification of the nanotube elements is required prior to the formation of the nanotube fabric layer, which may be convenient within certain applications wherein modification and/or treatment of a nanotube application is undesirable.

Within other applications a nanotube fabric layer may be functionalized by chemically modifying nanotube elements in solution. That is, a nanotube application solution (comprising a plurality of nanotube elements suspended in a liquid medium) may be subjected to functionalization (via, for example, the introduction of dielectric filler material into the solution to coat surface of the nanotubes) prior to its deposition over a substrate. In this way, the formed nanotube fabric layer will be functionalized according to the methods of the present disclosure as it is formed, and require no additional chemical modification to realize a desired conductivity range. Such a process may be convenient within certain applications wherein modification and/or treatment of a formed nanotube fabric layer is undesirable.

Such methods for adjusting and/or limiting the conductivity range of a nanotube fabric layer are describe in more detail within U.S. patent application Ser. No. 12/356,447 and U.S. patent application Ser. No. 12/874,501, both incorporated herein by reference in their entirety.

Figure 51A:
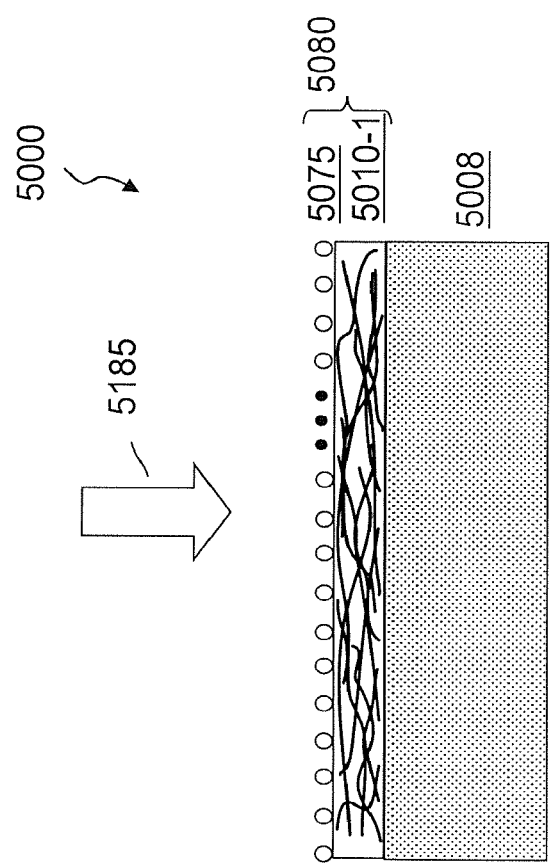
FIG. 51A illustrates a side view of a third ordered nanotube fabric structure.

FIG. 51A illustrates second ordered NT fabric structures 5000 and ion implantation source 5185. In this example, the ion implantation energy is relatively low, on the order of 10 keV for example, because of the relatively low density of NT fabrics. Ion implantation density may be approximately $10^{15}$ atoms per $cm^2$ for example.

In a first fabrication method, ion implantation of an inert gas such as argon, for example, may be used with sufficient energy to penetrate ordered NT 5075, but to damage nanotubes forming unordered NT fabric 5010-1 in order to increase resistance.

In a second fabrication method, ion implantation of nitrogen may be used, for example, to damage nanotubes forming unordered NT fabric 5010-1 in order increase resistance. In addition, ion implantation energy may be chosen so as to position the peak ion implantation density just inside the top surface of substrate 5008. Subsequent annealing may then be used to diffuse nitrogen into the unordered NT fabric 5010-1 region to further increase resistance.

In a third fabrication method, ion implantation of donor atoms may be used to convert p-type nanotubes into depleted nanotubes. Or alternatively, ion implantation of acceptor atoms may be used to convert n-type nanotubes into depleted nanotubes.

Figure 51B:
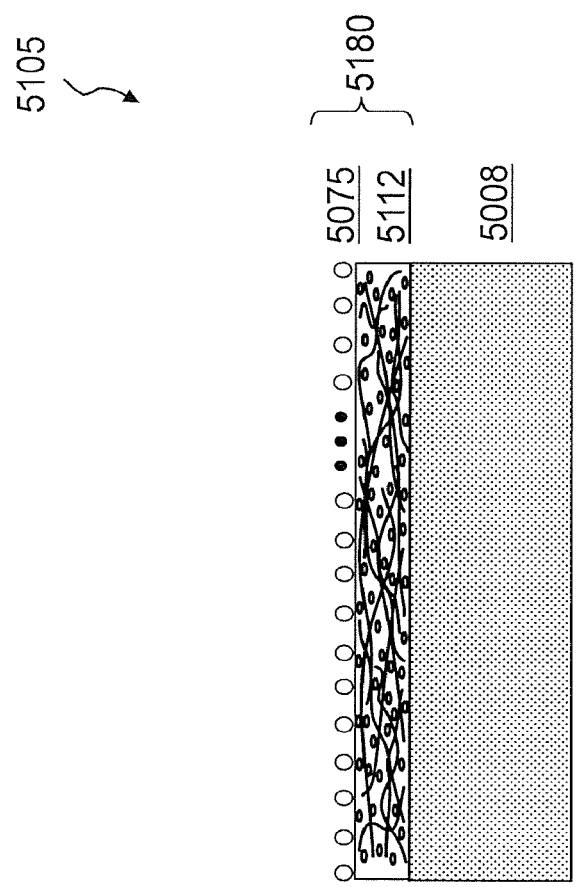
FIG. 51B illustrates a cross-sectional view of a third ordered nanotube fabric structure.

First, second, or third fabrication methods, or in combination, change the electrical characteristics of unordered NT fabric 5010-1; in this example by increasing resistance while forming unordered NT fabric 5212 illustrated in FIG. 51B. Fabrication methods and conditions are selected to leave ordered NT fabric 5075 unchanged. First, second, or third fabrication methods, or in combination, form ordered NT fabric 5180, which corresponds to NT fabric 252 illustrated in FIG. 2A, in third ordered NT fabric structure 5105 illustrated in FIG. 51B.

Figure 52A:
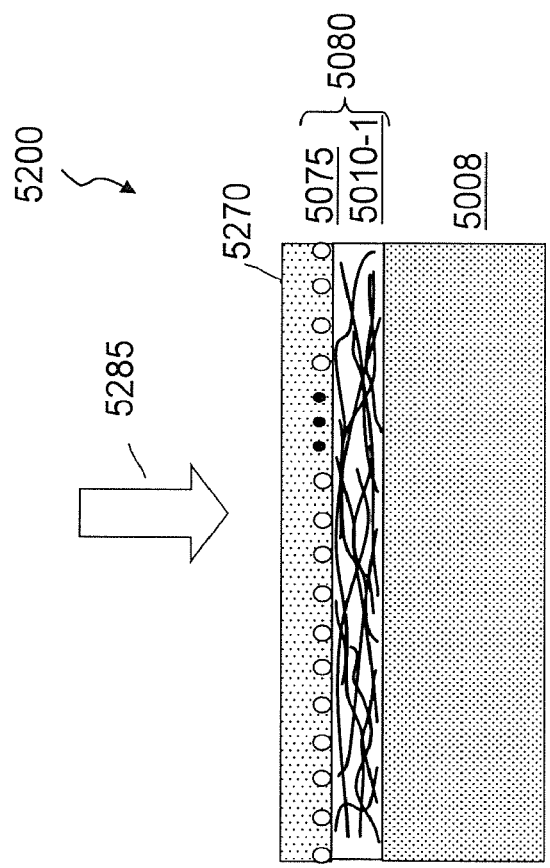
FIG. 52A illustrates a side view of a fourth ordered nanotube fabric structure.
Figure 52B:
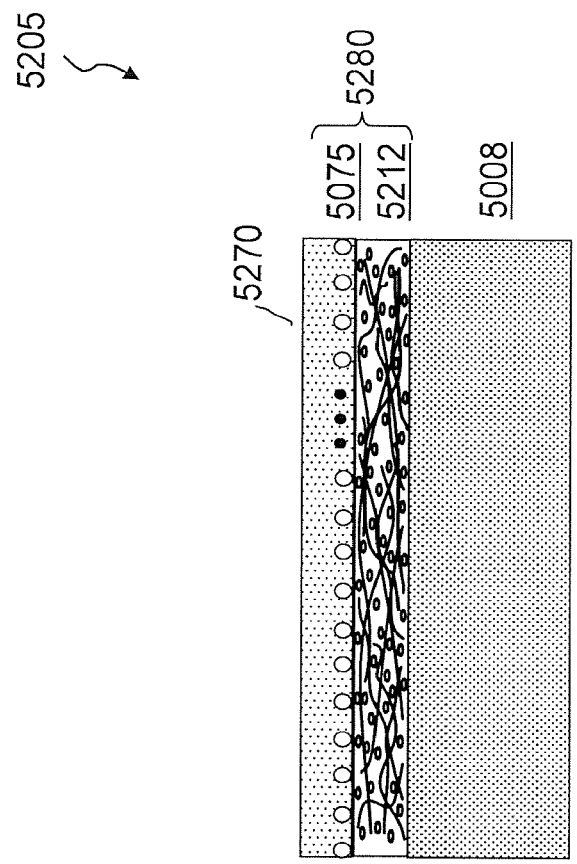
FIG. 52B illustrates a cross-sectional view of a fourth ordered nanotube fabric structure.

FIG. 52A gate insulator 5270, on second ordered NT fabric structures 5000, and ion implantations source 5285. In this example, the ion implantation energy is somewhat higher because the ion implanted species passes through the gate insulator, on the order of 20-30 keV for example. Ion implantation density may be $10^{15}$ atoms per $cm^2$ for example. First, second, and third fabrication methods may be adjusted for the presence of the gate insulator. However, the approach to increasing the resistance of unordered NT fabric 5010-1 is similar to the first, second, and third fabrication methods as described further above, and the resistance increase results in unordered NT fabric 5212 illustrated in FIG. 52B. Fabrication methods and conditions are selected to leave ordered NT fabric 5075 unchanged. Modified first, second, or third fabrication methods, or in combination, form ordered NT fabric 5280, which corresponds to NT fabric 252 illustrated in FIG. 2A, in fourth ordered NT fabric structure 5205 illustrated in FIG. 52B.

Ordered NT fabric methods of fabrication were described further above with respect to FIGS. 48, 49A-B, 50A-B, 51A-B and 52A-B using a nanotube diameter $d_{NT}=1.0$. These methods of fabrication may be used with any other nanotube diameter, for example $d_{NT}=0.75$ nm, $d_{NT}=1.5$ nm, and $d_{NT}$ 2.0 nm illustrated in FIGS. 45A-F.

In order to fabricate CNTFET-based devices suitable for large scale integration, CNTFET devices need to be fabricated without burn-off post-processing requirements using NT fabrics approaching 100% semiconductor SWNTs. Recently, within the last year-or-so, nanotube vendors have delivered quantities of semiconducting SWNTs, with a content of 95-99% semiconducting nanotubes. The following is a partial list of nanotube vendors: Carbon Solutions Riverside, Calif.; Nano-C Westwood, Mass.; NanoIntegris Evanston, Ill.; Nanotailor Austin, Tex.; and Southwest NanoTechnologies, Inc. Norman, Okla. The acquisition of semiconducting nanotubes from vendors such as these is discussed in greater detail within U.S. Patent Application Publication No. 20100134141.

Preferred methods of fabrication described further above include formation of solutions approaching 100% s-SWNTs starting with nanotube approaching 100% semiconducting SWNTs (s-SWNTs). However, for solutions formed with 95-99% nanotubes, chemical post-processing may be required to remove non-s-SWNTs from the nanotube fabric as described further below. Methods of further processing (post processing) NT fabrics that include a relatively small quantity of metallic CNTs (m-SWNTs or MWNTs) may be used to either convert the metallic CNTs to semiconducting CNTs, convert them to non-conducting CNTs, or remove them after NT fabric layer (or layers) formation. Such techniques may include, but are not limited to, 1) functionalizing the metallic CNTs so that they are converted to semiconducting CNTs or non-conducting CNTs (e.g., opens) or 2) functionalizing the metallic CNTs so that they can be selectively removed from the nanofabric layer. Process techniques to convert metallic CNTs to semiconducting CNTs may use a plasma treatment to convert metallic CNTs to semiconductor type (Chen, et al., Japanese Journal of Applied Physics, Vol. 45, No. 4B, pp. 3680-3685, 2006) or may use protein-coated nanoparticles in the device contact areas to convert metallic CNTs to semiconductor type (Na, et. al., Fullerenes, Nanotubes, and Carbon Nanostructures, vol. 14, pp. 141-149, 2006) as further described in these references incorporated herein by reference in their entirety. It has also been demonstrated that due to the higher conductivity and larger diameter of the metallic CNTs, it is possible to attack the metallic CNTs without attacking the higher resistance and smaller diameter semiconducting CNTs (An, et al., Science 301, pp. 344-347, 2003) which is incorporated herein by reference in its entirety. Thus, one or more of these process techniques may be used to either remove or convert the metallic CNTs to semiconductor CNTs (as described within U.S. Patent Application Publication No. 20100134141).

As described further above with respect to FIGS. 45A-F, achieving high saturation current per unit width CNTFET devices, such as described in FIG. 45F, requires contact (conductor) to nanotube optimization to maximize valence band hole injection or conduction band electron injection. pCNTFET devices described in the reference Bertin et al. U.S. Pat. No. 7,598,544 use TiPd contacts. pCNTFET device in various research papers, typically formed with a single s-SWNT, such as the Avouris and Javey papers referred to further above, typically use Pd, Ti, and Co contacts (conductors). So for example, source conductor 256 and drain conductor 262 illustrated in FIGS. 2A and 2B may use Pd, Ti, or Co, or combinations such as TiPd, TiC, $CoSi_x$, for example. The Javey paper referenced further above illustrates pCNTFET devices with Ohmic or near-Ohmic contacts and low Schottky barriers for source and drain contacts (conductors) forming a SD pCNTFET devices such as described in the Sahoo paper referenced further above. A more complete list of contact options is shown further below. Contacts, such as source conductor 256 and drain conductor 262 generally have a thickness in the range of 5 to 500 nm, for example.

High saturation current per unit width SD nCNTFET devices with near-Ohmic or Ohmic contacts may be formed with potassium (K) contacts, for example. More recently scandium (Sc) and Yttrium (Y) have been shown to form SD nCNTFET devices with near-Ohmic or Ohmic contacts as described in the reference Li Ding et al., "Y-Contacted High-Performance n-Type Single-Walled Carbon Nanotube Field-Effect Transistors: Scaling and Comparison with Sc-Contacted Devices," Nano Letters, 2009, 9 (12), pp. 4209-4214 incorporated herein by reference in its entirety. So, for example, source conductor 256 and drain conductor 262 illustrated in FIGS. 2A and 2B may use K, Sc, or Y conductors. A more complete list of contact options is shown further below.

An alternative to forming nCNTFET devices by selecting conductor material to form n-type electron injecting contacts with nanotubes in the source and drain regions, as described further above, is to use deposited donor atoms. CNTFET devices are typically pCNTFET-type devices as formed. However, n-type CNTFET devices may be formed by using substitutional or surface doping of p-type CNTFET device source and drain regions using electron donor atoms for example.

Figure 53:
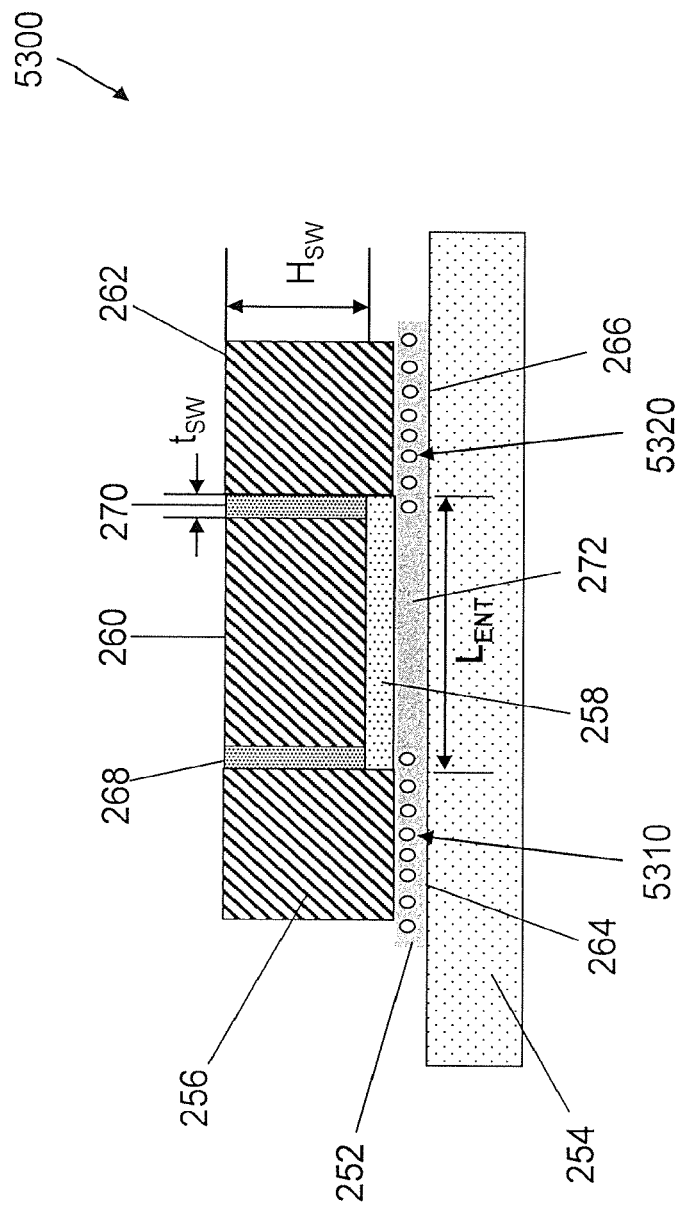
FIG. 53 illustrates FIGS. 2A and 2B with doped nanotube fabric regions in the source and drain regions.
Figure 54:
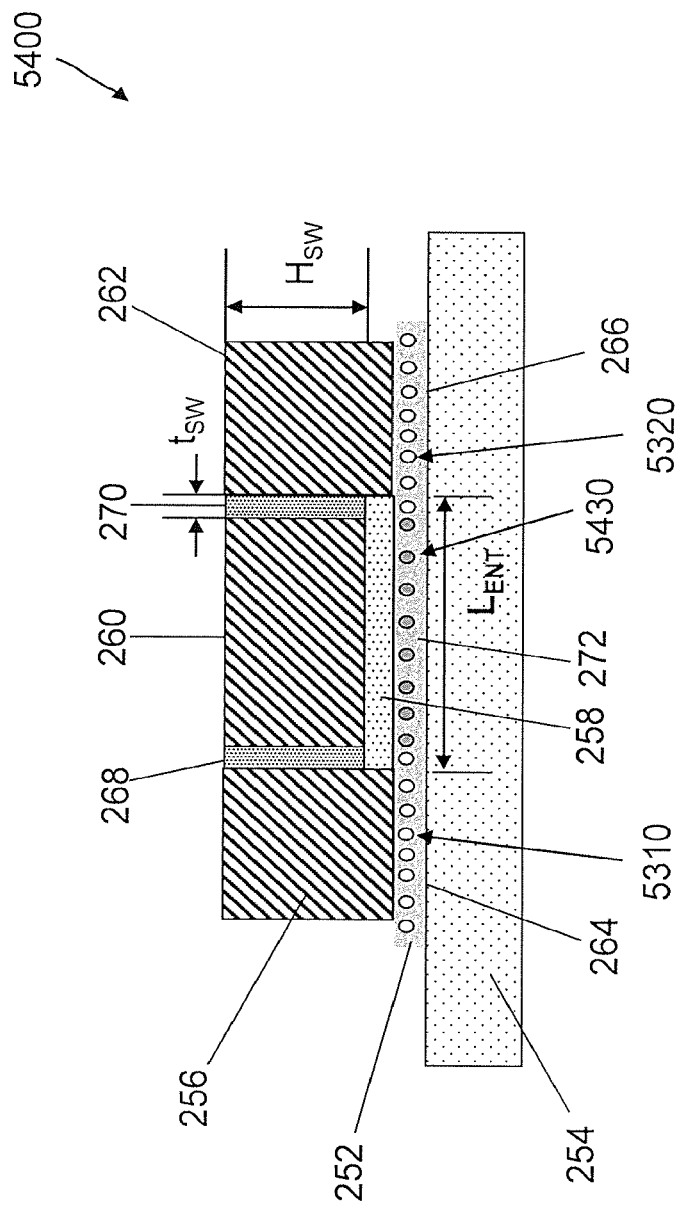
FIG. 54 illustrates FIGS. 2A and 2B with doped nanotube fabric regions in the source, drain, and gate regions.

Exemplary CNTFET 5300 illustrated in FIG. 53 corresponds to exemplary CNTFET 200 illustrated in FIGS. 2A and 2B in which the gate insulator exposed after forming gate conductor 260 and spacers 258 and 270, may be removed using a non-oxidizing etch such as C2F6 for example. Doping atoms 5310 and doping atoms 5320 have been ion implanted, or deposited using plasma deposition, or other deposition methods, in source region 264 and drain region 266, respectively. Such atoms are typically activated by annealing. Examples of donor atoms used to form nCNTFET device source and drain regions are potassium, phosphorous, arsenic, scandium, yttrium and other types of atoms. Hydrogen may also be used to enhance electron injection.

pCNTFET device hole injection may be enhanced by acceptor atom deposition. Exemplary CNTFET 5300 illustrated in FIG. 53 corresponds to exemplary CNTFET 200 illustrated in FIGS. 2A and 2B, except that doping atoms 5310 and doping atoms 5320 have been ion implanted, or deposited using plasma deposition, or other deposition methods, in source region 264 and drain region 266, respectively. Such atoms are typically activated by annealing. Examples of acceptor atoms that may be used to enhance pCNTFET device source and drain regions are oxygen, boron, and other types of atoms.

In the examples described further above, the gate insulator, such as insulator 258 is typically $SiO_2$, positioned between gate conductor 260 and NT fabric 252 in channel region 272 illustrated in FIGS. 2A and 53. However, gate insulator 252 may be also be formed of SiN, $Al_2O_3$, BeO, and also high relative dielectric constant materials such as tantalum oxide ($TaO_5$), hafnium oxide ($H_fO_2$), yttrium oxide ($Y_2O_2$) or other suitable insulating materials. In some cases, gate insulator 252 may be formed using a combination of insulators such ONO, $H_fO_2/SiO_2$, $Y_2O_2/SiO_2$ and other examples. Gate conductor 260 may be formed with semiconductors such as Si or Ge, silicides, or metals. For example, the gate structure (gate stack) of exemplary CNTFET device 4800 may be formed with $Al/H_fO_2/SiO_2$/NT fabric, or $Al/Y_2O_2/SiO_2$/NT fabric, in channel region 272. Other combinations may also be used. Gate insulator 258 may have a thickness in the range of less than 2 nm to greater than 10 nm, for example.

Gate conductor 260, combined with gate insulator 258 materials, may be selected so as to achieve desired threshold voltage characteristics for exemplary CNTFET 5300. Exemplary device 5400 illustrated in FIG. 54, corresponding to exemplary device 5300, shows that NT fabric 252 may be doped, by ion implantation or other methods, in channel region 272 so as to adjust threshold voltage $V_{TN}$ for nCNTFET devices, or $V_{TP}$ for pCNTFET devices, as illustrated by doping atoms 5430. Gates, such as gate conductor 260, generally have a thickness in the range of 5 to 500 nm, for example.

NT fabric 252 may be formed with an unordered NT fabric such as unordered NT fabric 3530 illustrated in FIG. 35A, or ordered NT fabric 3570 illustrated in FIG. 35B, formed primarily with semiconducting single wall nanotubes, for example. NT fabric 252 may be formed with one layer or with multiple layers, and the NT fabric 252 thickness may range from less than 1 nm to greater than 10 nm.

After exemplary CNTFETs 200, 5300, or 5400 illustrated in FIGS. 2A-B, 53, and 54, respectively, exposed NT fabric regions between CNTFET devices may be removed using an oxidizing etch. For example, at oxygen plasma formed using oxygen with an inert carrier gas such as helium or argon may be used.

A desirable integrated circuit process flow includes CNTFET devices formed within and between wiring layers, and wiring layers separated by insulating regions, compatible with integrated circuit technology and tools while ensuring CNTFET devices with high saturation currents and competitive with technologies such as CMOS that also have high saturation current devices Such devices may require including other conductor materials for source, drain, and gate conductors and wiring interconnections. Examples of conductor materials, some of which are not listed further above, include, but are not limited to, Al, Au, W, Cu, Mo, Pd, Ni, Ru, Ti, Cr, Ag, In, Ir, Pb, Sn, Sc, and Y, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$, and combinations thereof. Carbon may be used as a conductor or contact material. Carbon nanotube fabrics themselves (single walled, multiwalled, and/or double walled), metallic, semiconducting, or a combination of metallic and semiconducting nanotubes may be used in the form of patterned unordered or ordered nanotube fabrics.

Contacts may also be formed of mixed or nanoscopic material that include conductor and semiconductor nanoscopic particles such as, but not limited to, W, Ti, TiN, TiC, B, P, K, Pd, Si, and Ge and also include carbon and one or allotropes of carbon and other conductive materials, including others listed further above.

NT fabrics, such as NT fabric 252, may also include nanoscopic particles. A further description of various mixed or nanoscopic materials, doping atoms, and other methods and structures as described within U.S. patent application Ser. No. 12/356,447.

Inverter 1200 formed with CNTFET devices and illustrated in FIG. 12A, and CCN-NAND circuit 1900 formed with CNTFET devices and illustrated in FIG. 19, described further above may be formed in two-dimensional (2-D) or three-dimensional (3-D) logic configurations. Corresponding 2-D and 3-D layouts illustrated and described with respect to FIGS. 28-33 may be fabricated using fabrication methods and corresponding structures described further above with respect to FIGS. 2A and 2B and FIGS. 48, 49A-B, 50A-B, 51A-B, 52A-B, 53 and 54.

While CNTFET devices illustrated in FIGS. 2A and 2B and FIGS. 48, 49A-B, 50A-B, 51A-B, 52A-B, 53 and 54, for example, show source, drain, and gates above the NT fabric, other configurations may be used. For example, gates may remain above the NT fabric with source and drain conductors in contact with the underside of the NT fabric. The gate and gate insulator may also be formed below the NT fabric, with the gate insulator in contact with the underside of the NT fabric. It is also possible to have a source conductor in contact with the topside of the NT fabric and a drain conductor in contact with the bottom side of the fabric, with a gate conductor and insulator above or below the NT fabric region, as well as other variations.

NOT (Inverter) Circuit Performance with CNTFET Devices Fabricated Using Semiconducting Ordered Nanotube Fabrics FIG. 8 further above illustrates an $I_{DS}$ vs $V_{DS}$ characteristic 800 for a CNTFET device. An approximation of the switching characteristics based on a resistance R approximation may be used as part of a model for CNTFET devices. Calculated performance results, shown further above, for NOT (inverter) circuits using CNTFET devices formed with unordered nanotube fabrics illustrated in FIGS. 2A-B and 5B are summarized in table 1 illustrated in FIG. 15.

In this example, exemplary resistance values for CNTFET devices formed with the ordered nanotube fabrics described further above with respect to FIGS. 35B, 36A-B, 37A-B, 38A-D, 39A-D, 40-43, 44A-B, 45A-F, 46A-C and 47A-B, and corresponding equations 40.1-40.14, may be used. Both pCNTFET and nCNTFET devices are assumed to have approximately the same effective mobility $\mu_P$ and $\mu_N$, where the effective mobility includes contact-to-nanotube resistance as well as NT channel element resistance as described further above. The NOT (inverter) circuit in this example is selected as a minimum size device. The terms NOT and inverter circuit are used interchangeably in this specification. Minimum size inverters may be used as a measure of the inherent speed of a technology and is useful when comparing technologies. In this example, the inherent speed of nanotube circuits using CNTFET devices formed with unordered nanotube fabrics as described further above with respect to FIGS. 12A-C and 13-15, is compared with the inherent speed of nanotube circuits calculated further below using CNTFET devices formed with ordered nanotube fabrics.

Exemplary CNTFET device characteristics for CNTFET devices corresponding to pCNTFET device 1202 and nCNTFET device 1204 used to form inverter 1200 illustrated in FIG. 12A and formed with ordered nanotube fabrics may be given by:

Ln=Lp=0.2 um, Wn=Wp=0.2 um, $t_G$=7 nm, $d_{NT}$=1 nm, $\varepsilon_R$=4, $\varepsilon_0$=8.85×10$^{-14}$ F/cm, $\mu_P$=775 cm$^2$/V·s, $\mu_N$=775 cm$^2$/V·s where $\mu_P$ is given by equation 40.13, and $\mu_N$ is set equal to pp as described further above with respect to FIGS. 47A and 47B.

Exemplary parameters for a CNTFET inverter, such as inverter 1200, formed with CNTFET devices using ordered NT fabrics may be calculated as follows.

Resistance and Capacitance Calculations:

Equation 40.11 gives the relationship between current and applied voltage, and includes device dimensions (geometry or structure) and materials. Resistance value R shown in FIG. 8 may be calculated using equation 40.15:

$R=V_{DD}/I_{DS}$ [EQ 40.15]

Substituting equation 40.11 for $I_{DS}$, results in resistance value R expressed as:

$R=V_{DD}/\{(\mu/L)\cdot C_{I\text{-}TOT}(N)\cdot[(V_{GS}-V_T)^2/2]\}$

At $V_{GS}=V_{DD}$ illustrated in FIG. 8 further above:

$R=V_{DD}/\{(\mu/L)\cdot C_{I\text{-}TOT}(N)\cdot[(V_{DD}-V_T)^2/2]\}$ [EQ 40.16]

Referring to FIG. 12A, the pCNTFET resistance may be calculated using equation 40.16.

$R_P=V_{DD}/\{(\mu_P/L_P)\cdot C_{I\text{-}TOTp}(N)\cdot[(V_{DD}-V_T)^2/2]\}$ [EQ 40.17]

Referring to FIG. 12B, the nCNTFET resistance may be calculated using equation 40.17.

$R_N=V_{DD}/\{(\mu_P/L_N)\cdot C_{I\text{-}TOTn}(N)\cdot[(V_{DD}-V_T)^2/2]\}$ [EQ 40.18]

In order to calculate resistance values, gate capacitance values between gate and NT fabric need to be calculated. The gate capacitance between the gate electrode and the NT fabric forming the NT channel element may be calculated using equation 40.8, where the capacitance values of individual nanotubes may be calculated using equation 40.6. Equation 40.8 gives the total gate capacitance per unit length by summing each nanotube capacitance as calculated using equation 40.6. In this example, $C_{l\text{-}TOTp}(N)$ is calculated for an ordered nanotube fabric density of 500 NTs/μm² corresponding to FIG. 40D and capacitance values 4220 illustrated in FIG. 42, except that the pCNTFET device channel width is $W_P=200$ nm instead of 400 nm used to calculate capacitance and current values illustrated in FIGS. 45E and 45F. Using the following dimensional and material parameters:

$d_{NT}/2=0.5$ nm; $r=t_G=7$ nm, $S=2$ nm, $\epsilon_R=4$ and $N=101$ for $W_P=200$ nm the pCNTFET total gate capacitance per unit length, $C_{l\text{-}TOTp}(N)$, may be calculated using equations 40.6 and 40.8, as:

$$C_{l\text{-}TOTp}(N=101)=1.09\times10^{-11} \text{ F/cm} \quad [\text{EQ 40.19}]$$

Since the dimensions and material characteristic are the same for both the pCNTFET and the nCNTFET, then the nCNTFET capacitance per unit length $C_{l\text{-}TOTn}(N)$ is given by equation 40.19 as;

$$C_{l\text{-}TOTn}(N=101)=1.09\times10^{-11} \text{ F/cm} \quad [\text{EQ 40.20}]$$

Inverter Performance Calculations:

Exemplary parameters for a CNTFET inverter, such as inverter 1200, formed with CNTFET devices using ordered NT fabrics may be calculated as shown further below.

Inverter 1200 illustrated in FIG. 12A, formed with CNTFET devices using ordered nanotube fabrics has pCNTFET pull-up device 1202 with width/length ratio=1 and an nCNTFET pull-down device 1204 with width/length ratio=1. FIG. 12B shows the transfer characteristics 1220 of the inverter 1200. The circuit design point for inverter 1200 is chosen such that switching point voltage $V_{SP}$ is equal to half the value of the power supply voltage $V_{DD}$, in this example, $V_{DD}=3.5$ V so $V_{SP}=1.75$V. The switching point $V_{SP}$ is defined such that when inverter 1200 input voltage $V_{IN}=V_{SP}=V_{DD}/2$, which turns both pCNTFET pull-up device 1202 and nCNTFET pull-down device 1204 to an ON state, the output voltage $V_{OUT}=V_{SP}=V_{DD}/2$. $W_P/L_P=W_N/L_N$ meets the transfer characteristic 1220 design requirements for CNTFET in which hole mobility is approximately the same as electron mobility as described further above. FIG. 12C shows the corresponding simplified digital model 1260 of inverter 1200 based on CNTFET device characteristics shown in FIG. 12B. Model 1260 resistance values Rp and Rn are calculated further below. Gate capacitance parameters $C_{GFp}$ and $C_{GFn}$ are calculated further below, and then used to calculate input and output capacitances $C_{IN}$ and $C_{OUT}$, respectively. These values are for a minimum size inverter to calculate inherent technology speed. Logic circuits, including inverters for example, typically use larger width to length ratios to achieve performance objectives as illustrated further below with respect to CCN-NAND circuit 1900 illustrated in FIG. 19.

For $V_{DD}=3.5$ volts and pCNTFET device threshold voltage $|V_{TP}|=0.5$ V and nCNTFET device threshold voltage $V_{TN}=0.5$ V, $R_P$ may be calculated using equations 40.17 and 40.19 and $R_N$ may be calculated using equations 40.18 and 40.20 as shown further below.

$$R_P=3.5/\{(775/200\times10^{-7})\cdot1.09\times10^{-11}\cdot[(3.5-0.5)^2/2]\}$$

$$R_P=3.5/\{(3.875\times10^7)\cdot1.09\times10^{-11}\cdot4.5\}$$

$$R_P=1,840\Omega \quad [\text{EQ 40.21}]$$

and $$R_N=3.5/\{(775/200\times10^{-7})\cdot1.09\times10^{-11}\cdot[(3.5-0.5)^2/2]\}$$

$$R_N=3.5/\{(3.875\times10^7)\cdot1.09\times10^{-11}\cdot4.5\}$$

$$R_N=1,840\Omega \quad [\text{EQ 40.22}]$$

The total gate capacitance between the gate and NT fabric, $C_{GF}$, may be calculated by multiplying the total capacitance per unit length $C_{l\text{-}TOT}$ by the channel length L as shown by equation 40.23.

$$C_{GF}=L\cdot C_{l\text{-}TOT}(N) \quad [\text{EQ 40.23}]$$

where $C_{l\text{-}TOT}(N)$ is the gate capacitance per unit length and may be calculated using equations 40.8 and 40.6 as described further above.

The gate-to-fabric capacitance for a CNTFET device formed using a correlated NT fabric, and having dimensions of L and width W may be calculated as follows.

For pCNTFET devices using equation 40.19, $$C_{GFp}=L\cdot C_{l\text{-}TOTp}(N=101)=200\times10^{-7}\cdot1.09\times10^{-11}$$

$$C_{GFp}=218\times10^{-18} \text{ F}$$

$$C_{GFp}=218 \text{ aF} \quad [\text{EQ 40.24}]$$

For nCNTFET devices using equation 40.20, $$C_{GFn}=L\cdot C_{l\text{-}TOTn}(N=101)=200\times10^{-7}\cdot1.09\times10^{-11}$$

$$C_{GFn}=218\times10^{-18} \text{ F}$$

$$C_{GFn}=218 \text{ aF} \quad [\text{EQ 40.25}]$$

Input capacitance $C_{IN}$ and output capacitance $C_{OUT}$ shown in digital model 1260 illustrated in FIG. 12C may be calculated as follows.

$$C_{IN}=(3/2)\cdot(C_{GFp}+C_{GFn}) \quad [\text{EQ 40.26}]$$

$$C_{OUT}=C_{GFp}+C_{GFn} \quad [\text{EQ 40.27}]$$

Using equations 40.24 and 40.25, $$C_{IN}=654 \text{ aF} \quad [\text{EQ 40.28}]$$

$$C_{OUT}=436 \text{ aF} \quad [\text{EQ 40.29}]$$

Exemplary parameters for FIG. 12C shows the corresponding simplified digital model 1260 of inverter 1200 for FIG. 12A based on CNTFET device characteristics for devices formed using ordered nanotube fabrics as described further above:

$R_P=R_N=1,840\Omega$ (equations 40.21 and 40.22, respectively); and $C_{IN}=654$ aF, $C_{OUT}=436$ aF (equations 40.28 and 40.29, respectively)

FIG. 13 shows an exemplary inverter delay chain 1300 of m NOT gates (inverter circuits) in series, where m can be an even or odd number, with an input voltage $V_{IN}$ and an output voltage $V_{OUT}$. Inverter chains can be used as delay elements to control the timing of signals between digital circuits, they can also be used to change logic polarity, and to act as buffers between logic circuits. Delay times associated with rise and fall times may be estimated using inverter digital model 1260, with the input capacitance of the next stage as a load ($C_L=C_{IN}$). For an inverter, such as inverter 1200 formed using a minimum size pCNTFET device and a minimum size nCNTFET device, both formed using ordered semiconducting NT fabrics, the performance may be calculated using resistance values for $R_P$ and $R_N$ in equation 40.21 and 40.22, respectively, input capacitance value in equation 40.28, and output capacitance value in equation 40.29. Based on equations 10.1 and 10.2, the delay estimates $t_{DHL}$=Rn ($C_{OUT}$+$C_L$) may be calculated. $t_{DHL}$=1.84×10$^3$·(436+654)×10$^{-18}$=$t_{DHL}$=2 ps. Since Rp=Rn, and the capacitance values are the same, then $t_{DLH}$=2 ps. The time delay T for a down transition followed by an up transition is $t_{DHL}$+$t_{DLH}$=4 ps. Assuming that inverter chain 1300 is to provide a non-inverting buffer (or delay) of m=4 stages, then the delay through the four-inverter chain is m($t_{DHL}$+$t_{DLH}$)=4(4)=16 ps.

An exemplary inverter chain with a feedback loop such as ring oscillator 1400 illustrated in FIG. 14, with an odd number of stages m, will oscillate after fabrication and the output voltage $V_{OUT}$ may be used as a measure of a technology's performance (speed) and power dissipation. This may be expressed as a power-delay product (PDP) value for example. The oscillating frequency may be calculated as $f_{OSC}$=1/[m ($t_{DHL}$=$t_{DLH}$)]. CNTFET-based NOT circuit performance table 5500 in FIG. 55 shows exemplary oscillating frequencies for ring oscillators with inverter stages (NOT circuit stages) constructed from CNTFETs with unordered nanotube fabrics and ordered nanotube fabrics. The CNTFET specifications common to all inverter stages when using pCNTFETs and nCNTFETs formed using unordered fabrics are $R_P$=$R_N$, $W_N$=0.2 um; $W_P$=2 $W_N$; $L_P$=$L_N$=0.2 um; NTFC$_P$=4×10$^5$; NTFCN=8×10$^5$ cm/V-s; $t_G$=7 nm; $d_{NT}$=1 nm; $\varepsilon_R$=4; |$V_{TP}$|=$V_{TN}$=0.5 V; and $V_{DD}$=3.5V. In this example, the CNTFET specifications common to all inverter stages when using pCNTFETs and nCNTFETs formed using ordered fabrics are $R_P$=$R_N$; $W_P$=$W_N$=0.2 um; $L_P$=$L_N$=0.2 um; $\mu_P$=775 cm$^2$/V·s; $\mu_N$=775 cm$^2$/V·s; $t_G$=7 nm; $d_{NT}$=1 nm; $\varepsilon_R$=4; |$V_{TP}$|=$V_{TN}$=0.5 V; and $V_{DD}$=3.5V. A nanotube-to-nanotube periodicity of S=2 nm was selected, and for $W_P$ and $W_N$ channel widths of 0.2 um (200 nm), N=101 semiconducting individual nanotubes form the NT channel region as described further above.

Ring oscillators using inverters with CNTFET devices formed using unordered nanotube fabrics are described further above and illustrated in FIG. 15, and summarized in FIG. 55 for comparison purposes. For inverters with CNTFET devices formed using unordered nanotube fabrics, the ring oscillator for m=15 stages has an oscillating frequency of $f_{OSC1}$=60 MHz. For inverters with CNTFET devices formed using unordered nanotube fabrics, the ring oscillator for m=5 stages has an oscillating frequency of $f_{OSC2}$=180 MHz as illustrated in table CNTFET-based NOT circuit performance table 5500 of FIG. 55.

The oscillating frequencies of ring oscillators with inverters formed using CNTFET devices with ordered nanotube fabrics are calculated as follows. Using $t_{DHL}$ and $t_{DLH}$ values calculated further above for inverters formed with CNTFET devices using ordered fabrics, $f_{OSC}$=1/[m($t_{DHL}$+$t_{DLH}$)]. For ring oscillators with 15 stages, the oscillating frequency of $f_{OSC3}$=1/[15(4×10$^{-12}$) since $t_{DHL}$+$t_{DLH}$=4 ps as calculated further above, and $f_{OSC3}$=16.7 GHz. For ring oscillators with 5 stages, the oscillating frequency of $f_{OSC3}$=1/[5(4×10$^{-12}$) since $t_{DHL}$+$t_{DLH}$=4 ps as calculated further above, and $f_{OSC3}$=50 GHz.

CNTFET-based NOT circuit performance table 5500 illustrated in FIG. 55 shows that inverters designed with minimum dimensions reduce four-stage delay by 275 times and increase operating speed by 278 times (higher frequency of oscillation) if the inverter is formed with CNTFET devices fabricated with ordered NT fabric relative to those using CNTFET devices fabricated with unordered NT fabric. Device cross sections in FIGS. 2A-B and FIGS. 48, 49A-B, 50A-B, 51A-B, 52A-B, 53 and 54 and layouts in FIGS. 31-33 correspond to CNTFET-based inverter 1200 performance comparisons in FIG. 55.

Two-Input Complementary Carbon Nanotube NAND Circuit Performance with CNTFET Devices Fabricated Using Semiconducting Ordered Nanotube Fabrics FIG. 19 is a schematic representation of an exemplary two input complementary carbon nanotube NAND (CCN-NAND) circuit 1900, which is a two-input CNFET device-based NAND circuit, whose elements, interconnections, logic function, and operation are described further above with respect to FIG. 19. CCN-NAND 1900 switching waveforms, described further above for a CCN-NAND 1900 circuit using CNTFET devices formed with unordered nanotube fabrics illustrated in FIGS. 2A-B and 5B, are illustrated in FIGS. 26A and B at a 0.2 nm technology node, and FIGS. 27A and B at a 0.1 nm technology node.

Figure 56A:
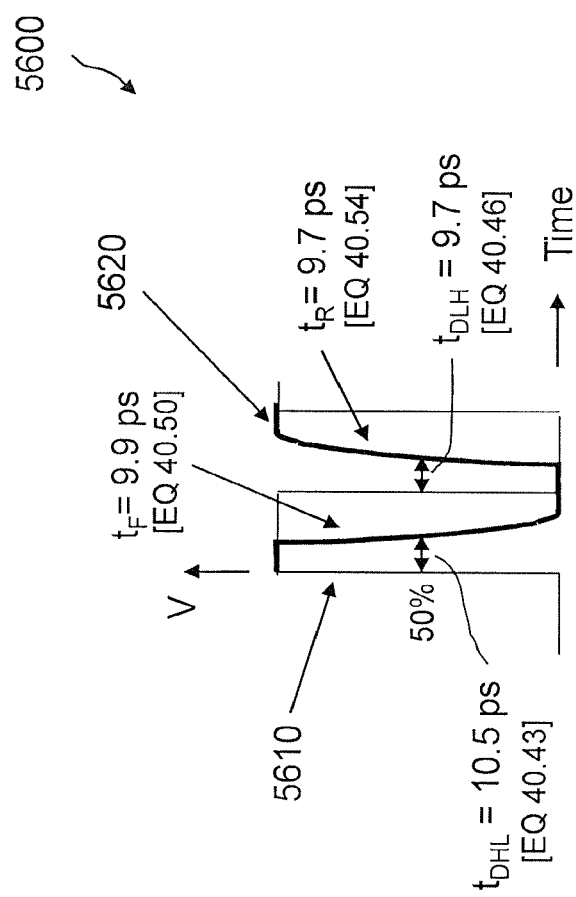
FIG. 56A illustrates the input/output voltage response of a two input CNTFET-based NAND circuit formed using p- and n-type CNTFETs with ordered nanotube fabrics in a two-dimensional layout configuration.
Figure 56B:
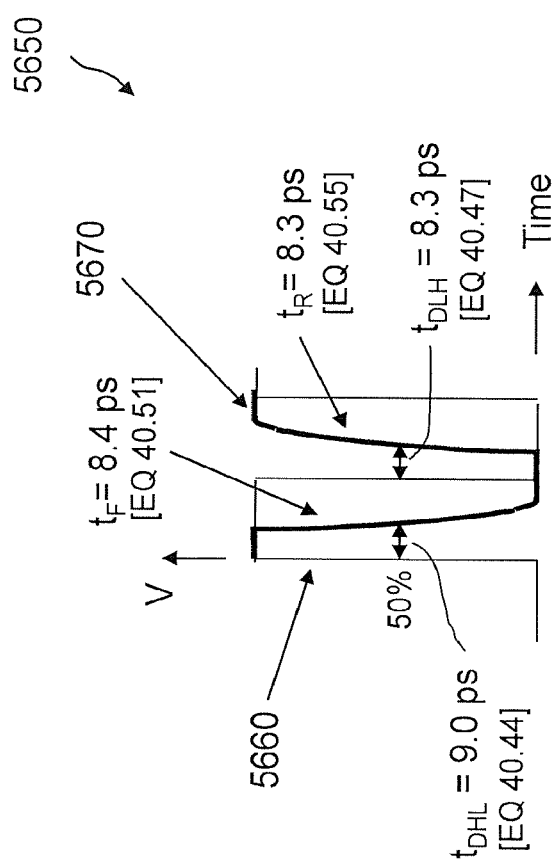
FIG. 56B illustrates the input/output voltage response of a two input CNTFET-based NAND circuit formed using p- and n-type CNTFETs with ordered nanotube fabrics in a three-dimensional layout configuration.

In this example, CCN-NAND circuit 1900 may be formed using CNTFET devices formed with ordered (semiconducting) nanotube fabrics. The electrical, geometrical, and fabric properties of these CNTFET devices are described further above with respect to FIGS. 35B, 36A-B, 37A-B, 38A-B, 39A-B, 40-43, 44A-B, 45A-F, 46A-C and 47A-B, and equations 40.1-40.29. Corresponding input/output voltage response 5600 and 5650 waveforms are shown in FIGS. 56A and 56B, respectively. Input waveform 5610 and output waveform 5620 are illustrated in input/output voltage response 5600 shown in FIG. 56A. Input waveform 5660 and output waveform 5670 are illustrated in input/output voltage response 5650 shown in FIG. 56B. Performance comparison of CCN-NAND 1900 circuit using CNTFET devices formed with ordered NT fabrics may be compared with performance of CCN-NAND 1900 circuit using CNTFET devices formed with unordered NT fabrics as shown further below in CCN-NAND circuit 1900 performance table 5700 and CCN-NAND circuit 1900 performance table 5750 illustrated in FIGS. 57A and 57B, respectively.

In this example, the CNTFET devices forming 2-input CCN-NAND circuit 1900 and interconnect wiring may be laid out in two dimensions on a single NT fabric layer (level) as illustrated further below in FIGS. 28 and 29. Alternatively, the CNTFET devices forming 2-input devices forming 2-input CCN-NAND circuit 1900 and interconnect wiring may be laid out in three dimensions on two NT fabric layers (levels) resulting in a smaller footprint with less wiring capacitance as illustrated further below in FIGS. 30 and 31. For a 2-input CCN-NAND circuit 1900 layout in two dimensions, a fanout (FO) of FO=6 is used; that is FO=4 for logic circuit input loading and FO=2 for wiring interconnect capacitance loading. However, for a 2-input CCN-NAND circuit 1900 layout in three dimensions, a FO=5 is used; that is FO=4 for logic circuit input loading and FO=1 for interconnect capacitance loading. Also, in the case of three-dimensional layouts, one layer (or level) may be optimized for pCNTFETs and another layer (or level) may be optimized for nCNTFETs, thereby further optimizing the CNTFET-based 2-input NAND circuit design.

As was described further above with respect to transfer characteristic 1220 of inverter 1200 illustrated in FIGS. 12A-C, the circuit design point is selected such that when pCNTFET and nCNTFET devices are in an ON state, with $V_{IN}$ is set to switching point voltage $V_{SP}(V_{IN}=V_{SP})$, $V_{OUT}=V_{SP}$, where $V_{SP}=V_{DD}/2$. A similar design approach is used in the case of 2-input CCN-NAND circuit 1900 illustrated in FIG. 19, such that when $V_{IN1}=V_{IN2}=V_{SP}=V_{DD}/2$, pCNTFET device 1902 (T1), pCNTFET device 1904 (T2), nCNTFET device 1906 (T3), and nCNTFET device 1908 (T4) are all in an ON state. The dimensions, width and length, of these pCNTFET and nCNTFET devices are selected such that $V_{OUT}=V_{SP}=V_{DD}/2$ when $V_{IN1}=V_{IN2}=V_{SP}=V_{DD}/2$. In order for $V_{OUT}=V_{DD}/2$ when $V_{IN1}=V_{IN2}=V_{DD}/2$, the resistance between $V_{DD}$ and output A, and between output A and ground, are made equal by choosing the geometries (dimensions) of the pCNTFET and nCNTFET devices. However, since pCNTFET devices T1 and T2 are in parallel and nCNTFET devices T3 and T4 are in series, then the resistance of pCNTFET devices T1 and T2 is set to be 4 times larger than the resistance of nCNTFET devices T3 and T4. In this example, CNTFET device dimensions for devices formed with ordered (semiconducting) nanotube fabrics having a pCNTFET device mobility $\mu_P=775$ cm$^2$/V·s (equation 40.13) and nCNTFET device mobility $\mu_N=\mu_P$ as described further above with respect to FIGS. 47A and 47B, are chosen such that pCNTFET and nCNTFET device channel lengths $L_P$ and $L_N$, respectively, are equal ($L_P=L_N$), and the nCNTFET device channel width $W_N$ is chosen as 4 times the pCNTFET channel width $W_P$ ($W_N=4\ W_P$). Other geometries are possible. For example, $L_P=4L_N$ with $W_P=W_N$; $L_P=2L_N$ and $W_N=2W_P$; and other variations.

In order to calculate the circuit response (output) to an input excitation for CCN-NAND circuit 1900 formed using CNTFET devices formed with ordered (semiconducting) nanotube fabrics, pCNTFET device model 2000 values of resistance $R_P$, input capacitance $C_{INP}$, and output capacitance $C_{OUTP}$ are calculated as described further below. Also, nCNTFET device model 2050 values of resistance $R_N$, input capacitance $C_{INN}$, and output capacitance $C_{OUTN}$ are calculated as described further below.

At this point in the specification, the resistance and capacitance values are calculated for pCNTFET device model 2000 illustrated in FIG. 20A. The resistance $R_P$ may be calculated using equation 40.17. However, first the gate-to-fabric capacitance needs to be calculated using equations 40.6 and 40.8 as described further above. In this example, the pCNTFET device characteristics selected when using pCNTFETs devices formed using ordered NT fabrics are $L_P=0.2$ um; $\mu_P=775$ cm$^2$/V·s; $t_G=7$ nm; $d_{NT}=1$ nm; $\varepsilon_R=4$; $|V_{TP}|=0.5$ V; and $V_{DD}=3.5$V. A NT channel element geometry with nanotube-to-nanotube periodicity of S=2 nm was selected, and for a $W_P$ width of 2 um (2,000 nm), N=1,001 semiconducting individual nanotubes form the NT channel region as described further above. Using equations 40.6 and 40.8, the total gate-to-NT fabric capacitance per unit length is calculated as:

$$C_{l\text{-}TOTp}(N=1,001)=9.8\times10^{-11}\text{ F/cm} \quad [\text{EQ 40.30}]$$

Resistance $R_P$ may now be calculated using equations 40.17 and 40:30 as follows:

$$R_P=V_{DD}/\{(\mu_P/L_P)\cdot C_{l\text{-}TOTp}(N)\cdot[(V_{DD}-V_T)^2/2]\},$$

$$R_P=3.5/\{(775/200\times10^{-7})\cdot9.8\times10^{-11}\cdot[(3.5-0.5)^2/2]\},$$
and $$R_P=205\Omega \quad [\text{EQ 40.31}]$$

The total gate-to-NT fabric capacitance of pCNTFET devices formed using ordered NT fabrics may be calculate using equation 40.23, where the channel length L=$L_P$ and the total gate capacitance per unit length $C_{l\text{-}TOT}(N)$ is equal to $C_{l\text{-}TOTp}(N)$ as follows:

$$C_{GFp}=L_P\cdot C_{l\text{-}TOTp}(N),$$

$$C_{GFp}=200\times10^{-7}\cdot9.8\times10^{-11}=1.96\times10^{-15}$$

$$C_{GFp}=1.96\text{ fF} \quad [\text{EQ 40.32}]$$

Input capacitance $C_{INP}$ may be calculated using equation 11.12 and equation 40.32 as follows:

$$C_{INP}=(3/2)C_{GFp},$$

$$C_{INP}=1.5\cdot 1.96\text{ fF}$$

$$C_{INP}=2.94\text{ fF} \quad [\text{EQ 40.33}]$$

Output capacitance $C_{OUTP}$ may be calculated using equation 11.13 and equation 40.32 as follows:

$$C_{OUTP}=C_{GFp},$$

$$C_{OUTP}=1.96\text{ fF} \quad [\text{EQ 40.34}]$$

Next, the resistance and capacitance values are calculated for nCNTFET device model 2050 illustrated in FIG. 20B. The resistance $R_N$ may be calculated using equation 40.18. However, first the gate-to-fabric capacitance needs to be calculated using equations 40.6 and 40.8 as described further above. In this example, the nCNTFET device characteristics selected when using nCNTFETs devices formed using ordered NT fabrics are $L_N=0.2$ um; $\mu_N=775$ cm$^2$/V·s; $t_G=7$ nm; $d_{NT}=1$ nm; $\varepsilon_R=4$; $|V_{TP}|=0.5$ V; and $V_{DD}=3.5$V. A NT channel element geometry with nanotube-to-nanotube periodicity of S=2 nm was selected, and for $W_N=4\ W_P$, the $W_N$ width is 8 um (8,000 nm), and N=4,001 semiconducting individual nanotubes form the NT channel region as described further above. Using equations 40.6 and 40.8, the total gate-to-NT fabric capacitance per unit length is calculated as:

$$C_{l\text{-}TOTn}(N=4,001)=3.87\times10^{-10}\text{ F/cm} \quad [\text{EQ 40.35}]$$

Resistance $R_N$ may now be calculated using equations 40.18 and 40.35 as follows:

$$R_N=V_{DD}/\{(\mu_P/L_P)\cdot C_{l\text{-}TOTp}(N)\cdot[(V_{DD}-V_T)^2/2]\},$$

$$R_N=3.5/\{(775/200\times10^{-7})\cdot3.87\times10^{-10}\cdot[(3.5-0.5)^2/2]\},$$
and $$R_N=52\Omega \quad [\text{EQ 40.36}]$$

The total gate-to-NT fabric capacitance of nCNTFET devices formed using ordered NT fabrics may be calculate using equation 40.23, where the channel length L=$L_N$ and the total gate capacitance per unit length $C_{l\text{-}TOT}(N)$ is equal to $C_{l\text{-}TOTn}(N)$ as follows.

$$C_{GFn}=L_N\cdot C_{l\text{-}TOT}(N),$$

$$C_{GFn}\ 200\times10^{-7}\cdot3.87\times10^{-10}=7.74\times10^{-15}$$

$$C_{GFn}=7.74\text{ fF} \quad [\text{EQ 40.37}]$$

Input capacitance $C_{INN}$ may be calculated using equation 11.12 and equation 40.37 as follows:

$$C_{INN}=(3/2)C_{GFn},$$

$$C_{INN}=1.5\cdot7.74\text{ fF}$$

$$C_{INN}=11.6\text{ fF} \quad [\text{EQ 40.38}]$$

Output capacitance $C_{OUTN}$ may be calculated using equation 11.13 and equation 40.37 as follows:

$$C_{OUTN}=C_{GFn},$$

$$C_{OUTN}=7.74\text{ fF} \quad [\text{EQ 40.39}]$$

At this point, CNT-based design methods as described further above with respect to equations 40.30 to 40.34 have been used to calculate $R_P$, $C_{INp}$, $C_{OUTP}$ for pCNTFET device model 2000 for pCNTFET devices formed with ordered NT fabrics. Also, CNT-based design methods as described further above with respect to equations 40.35 to 40.39 have been used to calculate and $R_N$, $C_{INN}$, and $C_{OUTN}$ for nCNTFET device model 2050 for nCNTFET devices formed with ordered NT fabrics for CNTFET technology with minimum dimensions F=0.2 um.

The performance of two-input CCN-NAND circuit 1900 illustrated in FIG. 19 using CNTFET devices formed with ordered (semiconducting) nanotube fabrics can be calculated using CCN-NAND circuit model 2100, with resistance and capacitance values calculated using pCNTFET device model 2000 and nCNTFET device model 2050 and corresponding resistance and capacitance values given further above with respect to equations 40.30 to 40.39. Delay times for high-to-low and low-to-high output voltage transitions, as well as corresponding fall times and rise times, can be calculated using CCN-NAND circuit model 2100 illustrated in FIG. 21 as described further below. In this example, values of $R_1$, $R_2$, $C_{IN1}$, $C_{IN2}$, $C_{OUT1}$, and $C_{OUT2}$ correspond to the values of $R_P$, $C_{INP}$, and $C_{OUTP}$, respectively, calculated further above with respect to equations 40.30-40.34 for pCNTFET device model 2000. Also, values of $R_3$, $R_4$, $C_{IN3}$, $C_{IN4}$, $C_{OUT3}$, and $C_{OUT4}$ correspond to the values of $R_N$, $C_{INN}$, and $C_{OUTN}$ calculated further above with respect to equations 40.35-40.39 for nCNTFET device model 2050. Capacitive load $C_L$ between output node 2160 and ground 2170 is a combination of other NAND circuit input capacitances and estimated wire interconnect capacitance.

The CCN-NAND circuit 1900 layout is approximately the same for circuits with CNTFETs devices formed with ordered and unordered NT fabrics. The estimated load capacitance for $C_{L-2D}$ and $C_{L-3D}$ may be calculated using FO=6 for the two-dimensional layouts and FO=5 for the three-dimensional layouts, respectively, as describer further above. Therefore, the load capacitance values $C_{L-2D}$ and $C_{L-3D}$ may be calculated as follows:

$$C_{L-2D}=6(C_{INP}+C_{INN})$$

$$C_{L-2D}=6(2.94+11.6)$$

$$C_{L-2D}=87.2 \text{ pF} \quad [\text{EQ } 40.40]$$

where $C_{INP}$ is given by equation 40.33 and $C_{INN}$ is given by equation 30.38 shown further above. And $$C_{L-3D}=5(C_{INP}+C_{INN})$$

$$C_{L-3D}=5(2.94+11.6)$$

$$C_{L-3D}=72.7 \text{ pF} \quad [\text{EQ } 40.41]$$

CCN-NAND circuit 1900 operation may be calculated using CNT-based circuit response calculation methods and used to calculate the output voltage $V_{OUT}$ based on input voltages $V_{IN1}$ and $V_{IN2}$ for two-terminal CCN-NAND circuit 1900 illustrated schematically in FIG. 19 by using corresponding CCN-NAND circuit model 2100 illustrated in FIG. 21. CNT-based circuit response calculation methods calculate R and C values corresponding to RC network 1000 illustrated in FIGS. 10A-C. A square wave corresponding to $V_{IN}$ in RC network 1000 is applied to input voltages $V_{IN1}$ and $V_{IN2}$, and the output voltage $V_{OUT}$ response is calculated. CCN-NAND circuit model 2100 is simplified for each calculation. For example, high-to-low delay time model 2200 illustrated in FIG. 22 can be used to calculate high-to-low delay time $t_{DHL}$; low-to-high delay time model 2300 illustrated in FIG. 23 can be used to calculate low-to-high delay time $t_{DLH}$; fall time model 2400 illustrated in FIG. 24 can be used to calculate fall time $t_F$, and rise time model 2500 illustrated in FIG. 25 can be used to calculate rise time $t_R$; $t_{DHL}$, $t_{DLH}$, $t_F$, and $t_R$ correspond to the definitions in FIGS. 10A-C. Output voltage $V_{OUT}$ response delays and waveform fall times and rise times have been calculated for circuit loads $C_L$ corresponding to 2-D and 3-D layouts described further below with respect to FIGS. 56A and 56B, respectively. The two-input CCN-NAND circuit 1900 response is calculated for a CNTFET technology with minimum dimensions F=0.2 um as described further below.

FIG. 22 illustrates an exemplary high-to-low delay time ($t_{DHL}$) response model device 2200, which is a subset of CCN-NAND circuit model 2100, when $V_{IN1}$ and $V_{IN2}$ have been at zero volts with $V_{OUT}$ charged to $V_{DD}$ and $V_{IN1}$ and $V_{IN2}$ transition to $V_{DD}$ thereby discharging output node 2160. When $V_{IN1}=V_{IN2}=V_{DD}$, switches in series with R1 and R2 open and switches in series with R3 and R4 close resulting in $t_{DHL}$ response model 2200. Model 2205 corresponds to the combination of pCNTFET device models 2110 and 2120 with switches in series with R1 and R2 in an open position, model 2230 corresponds to nCNTFET device model 2130 with the switch corresponding to R3 in a closed position, and model 2240 corresponds to nCNTFET device model 2140 with the switch corresponding to R4 in a closed position. Source, drain, gate nodes and capacitors and resistors correspond those described further above with respect to CCN-NAND circuit model 2100 illustrated in FIG. 21.

CNT-based circuit response calculation methods can be used to calculate $t_{DHL}$ as follows:

$$t_{DHL}=(R3+R4)\cdot[(C_{OUT3}\cdot C_{OUT4})/(C_{OUT3}+C_{OUT4})+C_{OUT1}+C_{OUT2}C_L]+R4\cdot C_{IN3},$$

and, $$t_{DHL}=2R_N\cdot[(C_{OUTN}/2+2C_{OUTP}+C_L]+R_N\cdot C_{INN}, \quad [\text{EQ } 40.42]$$

where $C_{IN3}=C_{INN}$, and the load $C_L$ may be $C_{L-2D}$ or $C_{L-3D}$ for 2-D and 3-D layouts, respectively, of two-input CCN-NAND circuit 1900.

For a 2-input CCN-NAND circuit 1900 illustrated in FIG. 19 and using CNTFET devices formed with ordered (semiconducting) nanotube fabrics using 2-D layouts with minimum dimension F=0.2 um and $C_L=C_{L-2D}$:
$R_N$=52Ω (equation 40.36), $C_{OUTN}$=7.74 fF (equation 40.39), $C_{OUTP}$=1.96 fF (equation 40.34), $C_{INN}$=11.6 fF (equation 40.38), and $C_{L-2D}$=87.2 fF (equation 40.40).

Substituting in equation 22.1 results in:

$$t_{DHL}=2\cdot52\cdot[(7.74/2+2\cdot1.96+87.2]+52\cdot11.6\times10^{-15}$$

$$t_{DHL}=10.5 \text{ ps}. \quad [\text{EQ } 40.43]$$

For a 2-input CCN-NAND circuit 1900 3-D layouts using minimum dimension F=0.2 um, only the load capacitance changes from $C_{L-2D}$=87.2 fF to $C_L=C_{L-3D}$=72.7 fF (equation 40.41):

Substituting in equation 40.42 results in:

$$t_{DHL}=9.0 \text{ ps}. \quad [\text{EQ } 40.44]$$

FIG. 23 illustrates an exemplary low-to-high delay time ($t_{DLH}$) response model device 2300, which is a subset of CCN-NAND circuit model 2100, when $V_{IN1}$ and $V_{IN2}$ have been at $V_{DD}$ with $V_{OUT}$ discharged to ground (zero volts in this example) and $V_{IN1}$ and $V_{IN2}$ transition to zero volts thereby charging output node 2160. When $V_{IN1}=V_{IN2}=0$, switches in series with R1 and R2 close and switches in series with R3 and R4 open resulting in $t_{DLH}$ response model 2300. Model 2310 corresponds to pCNTFET device model 2110 with the switch in series with R1 in a closed position, and model 2320 corresponds to pCNTFET device model 2120 with the switch in series R2 in a closed position. Model 2330 corresponds to the combination of nCNTFET device models 2130 and 2140 with switches in series with R3 and R4 in an open position. Source, drain, gate nodes and capacitors and resistors correspond those described further above with respect to CCN-NAND circuit model 2100 illustrated in FIG. 21.

CNT-based circuit response calculation methods can be used to calculate $t_{DLH}$ as follows:

$$t_{DLH}=(R1 \cdot R2)/(R1+R2) \cdot [(C_{OUT3} \cdot C_{OUT4})/(C_{OUT3}+C_{OUT4})+C_{OUT1}+C_{OUT2}+C_L], \text{ and}$$

$$t_{DLH}=(R_P/2) \cdot [2C_{OUTP}+C_{OUTN}/2+C_L], \quad \text{[EQ 40.45]}$$

where the load $C_L$ may be $C_{L-2D}$ or $C_{L-3D}$ for 2-D and 3-D layouts, respectively, of two-input CCN-NAND circuit 1900.

For a 2-input CCN-NAND circuit 1900 2-D layouts using minimum dimension F=0.2 um and $C_L=C_{L-2D}$:
$R_P$=205Ω (equation 40.31), $C_{OUTP}$=1.96 fF (equation 40.34), $C_{OUTN}$=7.74 Ff (equation 40.39); $C_{L-2D}$=87.2 fF (equation 40.40).

Substituting in equation 40.45 results in:

$$t_{DLH}=9.7 \text{ ps.} \quad \text{[EQ 40.46]}$$

For a 2-input CCN-NAND circuit 1900 3-D layouts using minimum dimension F=0.2 um, only the load capacitance changes from $C_{L-2D}$=87.2 fF to $C_L=C_{L-3D}$=72.7 fF:
Substituting in equation 40.45 results in:

$$t_{DLH}=8.3 \text{ ps.} \quad \text{[EQ 40.47]}$$

FIG. 24 illustrates an exemplary fall time ($t_F$) response model 2400, which is a subset of CCN-NAND circuit model 2100, when $V_{IN1}$ and $V_{IN12}$ have been at zero volts with $V_{OUT}$ charged to $V_{DD}$ and $V_{IN1}$ and $V_{IN2}$ transition to $V_{DD}$ thereby discharging output node 2160. When $V_{IN1}=V_{IN2}=V_{DD}$, switches in series with R1 and R2 open and switches in series with R3 and R4 close resulting in $t_F$ response model 2400. Model 2405 corresponds to the combination of pCNTFET device models 2110 and 2120 with switches in series with R1 and R2 in an open position, model 2430 corresponds to nCNTFET device model 2130 with the switch corresponding to R3 in a closed position, and model 2440 corresponds to nCNTFET device model 2140 with the switch corresponding to R4 in a closed position. Source, drain, gate nodes and capacitors and resistors correspond those described further above with respect to CCN-NAND circuit model 2100 illustrated in FIG. 21.

CNT-based circuit response calculation methods can be used to calculate $t_F$. In particular, capacitors discharge, and output voltage $V_{OUT}$ on node 2160 with respect to ground 2170 decays from $V_{DD}$ to ground (zero) with a time constant $t_F$. The time constant $t_F$ can be calculated as follows (as illustrated in FIGS. 10A-C):

$$t_F=2 \text{ RC.} \quad \text{[EQ 24.1]}$$

For a 2-input CCN-NAND circuit 1900 2-D layouts using minimum dimension F=0.2 um and $C_L=C_{L-2D}$:

$$R=R3+R4=2 \cdot R_N, \quad \text{[EQ 40.48]}$$

$$R=2 \cdot 52=104Ω,$$

$$C=(C_{OUT3} \cdot C_{OUT4})/(C_{OUT3}+C_{OUT4})+C_{OUT1}+C_{OUT2}+C_L \quad \text{[EQ 40.49]}$$

$C=C_{OUTN}/2+2C_{OUTP}$, since $C_{OUT3}=C_{OUT4}=C_{OUTN}$ and $C_{OUT1}=C_{OUT2}=C_{OUTP}$ $C=7.74/2+2 \times 1.96+87.2=95.0$ fF.

Substituting in equation 24.1 results in:

$$t_F=9.9 \text{ ps.} \quad \text{[EQ 40.50]}$$

For a 2-input CCN-NAND circuit 1900 3-D layouts using minimum dimension F=0.2 um and $C_L=C_{L-3D}$, substituting in equation 40.49:

$C=7.74/2+2 \times 1.96+72.7=80.5$ fF.

Substituting in equation 24.1 results in:

$$t_F=8.4 \text{ ps.} \quad \text{[EQ 40.51]}$$

FIG. 25 illustrates an exemplary rise time ($t_R$) response model device 2500, which is a subset of CCN-NAND circuit model 2100, when $V_{IN1}$ and $V_{IN2}$ have been at $V_{DD}$ with $V_{OUT}$ discharged to ground (zero volts in this example) and $V_{IN1}$ and $V_{IN2}$ transition to zero volts thereby charging output node 2160. When $V_{IN1}=V_{IN2}=0$, switches in series with R1 and R2 close and switches in series with R3 and R4 open resulting in $t_R$ response model 2500. Model 2510 corresponds to pCNTFET device model 2110 with the switch in series with R1 in a closed position, and model 2520 corresponds to pCNTFET device model 2120 with the switch in series R2 in a closed position. Model 2505 corresponds to the combination of nCNTFET device models 2130 and 2140 with switches in series with R3 and R4 in an open position. Source, drain, gate nodes and capacitors and resistors correspond those described further above with respect to CCN-NAND circuit model 2100 illustrated in FIG. 21.

CNT-based circuit response calculation methods can be used to calculate $t_R$. In particular, capacitors discharge, and output voltage $V_{OUT}$ on node 2160 with respect to ground 2170 changes from ground (zero) to $V_{DD}$ with a time constant $t_R$. Time constant $t_R$ can be calculated as follows (as illustrated in FIGS. 10A-C):

$$t_R=2RC. \quad \text{[EQ 25.1]}$$

For a 2-input CCN-NAND circuit 1900 2-D layouts using minimum dimension F=0.2 um and $C_L=C_{L-2D}$:

$$R=R1 \cdot R2/(R1+R2)=R_P/2 \quad \text{[EQ 40.52]}$$

since $R1=R2=R_P$, $R=205/2; R=102.5Ω,$ $$C=C_{OUT1}+C_{OUT2}+(C_{OUT3} \cdot C_{OUT4})/(C_{OUT3}+C_{OUT4})+C_L \quad \text{[EQ 40.53]}$$

$C=2C_{OUTP}+C_{OUTN}/2+C_L$, since $C_{OUT1}=C_{OUT2}=C_{OUTP}$ and $C_{OUT3}=C_{OUT4}=C_{OUTN}$ $C=2 \times 1.96+7.74/2+87.2=95.0$ fF.

Substituting in equation 25.1 results in:

$$t_R=9.7 \text{ ps.} \quad \text{[EQ 40.54]}$$

For a 2-input CCN-NAND circuit 1900 3-D layouts using minimum dimension F=0.2 um and $C_L=C_{L-3D}$, substituting in equation 40.53:

$C=2 \times 1.96+7.74/2+72.7=80.5$ fF.

Substituting in equation 25.1 results in:

$$t_R=8.3 \text{ ps.} \quad \text{[EQ 40.55]}$$

The output voltage ($V_{OUT}$) signal (response) of 2-input CCN-NAND circuit 1900 to input signal voltages $V_{IN1}$ and $V_{IN2}$, using calculations of $t_{DHL}$, $t_{DLH}$, $t_F$, and $t_R$ shown further above and based on the circuit response corresponding CCN-NAND circuit 2100 model, is illustrated by combined input/output voltage response 2600 shown in FIG. 26A. $t_{DHL}$, $t_{DLH}$, $t_F$, and $t_R$ are given by equations 40.43, 40.46, 40.50, and 40.54, respectively, shown further above. Output voltage ($V_{OUT}$) signal 2620 at node 1924 corresponds to input signal 2610 applied to input nodes 1920 and 1922 of 2-input CCN-NAND circuit 1900 for 2-D layouts using minimum dimension F=0.2 um and a load capacitance $C_{L-2D}$=87.2 fF as described further above.

CNT-based circuit response calculation methods can be used to calculate the propagation delay using equations 40.43 and 40.46 as follows:

propagation delay=$t_{DHL}$+$t_{DLH}$=10.5+9.7=20.2 ps. [EQ 40.56]

The output voltage ($V_{OUT}$) signal (response) of 2-input CCN-NAND circuit 1900 to input signal voltages $V_{IN1}$ and $V_{IN2}$, using calculations of $t_{DHL}$, $t_{DLH}$, $t_F$, and $t_R$ shown further above and based on the circuit response corresponding CCN-NAND circuit 2100 model, is illustrated by combined input/output voltage response 2650 shown in FIG. 26B. $t_{DHL}$, $t_{DLH}$, $t_F$, and $t_R$ are given by equations 40.44, 40.47, 40.51, and 40.55, respectively, shown further above. Output voltage ($V_{OUT}$) signal 2670 at node 1924 corresponds to input signal 2660 applied to input nodes 1920 and 1922 of 2-input CCN-NAND circuit 1900 for 3-D layouts using minimum dimension F=0.2 um and a load capacitance $C_{L-3D}$=72.7 fF as described further above.

CNT-based circuit response calculation methods can be used to calculate the propagation delay using equations 40.44 and 40.47 as follows:

propagation delay=$t_{DHL}$+$t_{DLH}$=9.0+8.3=17.3 ps. [EQ 40.57]

Referring to CCN-NAND circuit performance table 5700 in FIG. 57A, CCN-NAND circuit 1900 with 2-D layout, fan-out FO=6. and using CNTFET devices formed with ordered NT fabrics has a propagation delay of 20.2 ps (equation 40.56) compared with a propagation delay of 4.71 ns (equation 26.1) for CCN-NAND circuit 1900 2-D layout, FO=6, and using CNTFET devices formed with unordered NT fabrics. Using an ordered NT fabric reduces propagation delay for 2-D layouts by approximately 233 times.

Referring to CCN-NAND circuit performance table 5750 in FIG. 57B, CCN-NAND circuit 1900 with 3-D layout, fan-out FO=5. and using CNTFET devices formed with ordered NT fabrics has a propagation delay of 17.3 ps (equation 40.57) compared with a propagation delay of 4.03 ns (equation 26.2) for CCN-NAND circuit 1900 3-D layout, FO=5, and using CNTFET devices formed with unordered NT fabrics. Using an ordered NT fabric reduces propagation delay for 3-D layouts by approximately 233 times.

Other circuits, such as a CNTFET device-based NOR circuit (not shown) for example, may be used with, or instead of, CCN-NAND circuit 1900. Also, analog circuits such as linear amplifiers, comparators, and other circuits may be formed as well using the CNTFET devices described further above.

While the present invention has been described in relation to particular embodiments thereof, many other variations and modifications and other uses will become apparent to those skilled in the art. Therefore the present invention not be limited by the specific disclosure herein.

What is claimed is:

1. A nanotube based transistor device, comprising:
 a multi-layer nanotube fabric comprising multiple nanotube fabric layers, each of said nanotube fabric layers comprising a plurality of nanotube elements;
 a first conductive element formed over a first region of said multi-layer nanotube fabric;
 a second conductive element formed over a second region of said multi-layer nanotube fabric;
 an insulating element formed over a third region of said multi-layer nanotube fabric, said third region disposed between said first region and said second region;
 a third conductive element formed over said insulating element;
 wherein said first conductive element, second conductive element, and third conductive element are separated from one another; and
 wherein said nanotube fabric layers of said multi-layer nanotube fabric include an ordered nanotube fabric layer.

2. The nanotube based transistor device of claim 1, wherein said multi-layer nanotube fabric comprises said ordered nanotube fabric layer formed on a surface of an unordered nanotube fabric layer.

3. The nanotube based transistor device of claim 1, wherein said ordered nanotube layer is formed by applying a directional force to an unordered layer of nanotubes.

4. The nanotube based transistor device of claim 1, wherein a first nanotube fabric layer of said multi-layer nanotube fabric and a second nanotube fabric layer of said multi-layer nanotube fabric are ordered nanotube fabric layers.

5. The nanotube based transistor device of claim 1, wherein a nanotube density of said multi-layer nanotube fabric is at least 80 nanotubes per micrometer.

6. The nanotube based transistor device of claim 1, wherein at least some of said nanotubes within said multi-layer nanotube fabric are coated with a dielectric material.

7. The nanotube based transistor device of claim 1, wherein said nanotube elements of said multi-layer nanotube fabric have diameters ranging from 0.7 nm to 2.0 nm.

8. The nanotube based transistor device of claim 1, wherein said first region of said multi-layer nanotube fabric defines a source region and said first conductive element defines a source conductor.

9. The nanotube based transistor device of claim 1, wherein said second region of said multi-layer nanotube fabric defines a drain region and said second conductive element defines a drain conductor.

10. The nanotube based transistor device of claim 1, wherein said third conductive element defines a gate conductor, said third region of said multi-layer nanotube fabric defines a channel region, and said insulating element defines a gate insulator element between said gate conductor and said channel region.

11. The nanotube based transistor device of claim 1, wherein said insulating element has a thickness ranging from 1 nm to 25 nm.

12. The nanotube based transistor device of claim 1, wherein said insulating element is formed from at least one material selected from the list consisting of SiO2, $TaO_5$, SiN, $Al_2O_3$, BeO, $Y_2O_2$, ONO, $H_fO_2/SiO_2$, and $Y_2O_2/SiO_2$.

13. The nanotube based transistor device of claim 1, wherein said first conductive element, said second conductive element, and said third conductive element are formed from at least one material selected from the list consisting of Al, Au, W, Cu, Co, Mo, Pd, Ni, Ru, Ti, Cr, Ag, In, Ir, Pb, Sn, Sc, Y, C, B, P, K, Si, Ge, TiAu, TiCu, TiPd, PbIn, TiW, RuN, RuO, TiN, TiC, TaN, $CoSi_x$, and $TiSi_x$.

14. The nanotube based transistor device of claim 1, wherein said third region of said multi-layer nanotube fabric forms a conductive pathway between said first region and said second region responsive to an electrical bias applied to said third conductive element.

15. The nanotube based transistor device of claim 1, wherein said nanotube elements are substantially all semiconducting carbon nanotubes.

16. The nanotube based transistor device of claim 1, wherein said nanotube based transistor device is formed within wiring layers of an integrated circuit, and wherein said wiring layers are separated by insulating regions.

17. The nanotube based transistor device of claim 16, wherein said multiple wiring layers comprise at least one material selected from the list consisting of Al, Au, W, Cu, Mo, Pd, Ni, Ru, Ti, Cr, Ag, In, Ir, Pb, Sn, Sc, Y, C, TiAu, TiCu, TiPd, PbIn, TiW, RuN, RuO, TiN, TaN, $CoSi_x$, and $TiSi_x$.

18. The nanotube based transistor device of claim 16, wherein said multiple wiring layers comprise nanotube fabric layers.

19. The nanotube based transistor device of claim 1, wherein said multi-layer nanotube fabric comprises donor atoms provided by ion implantation.

20. The nanotube based transistor device of claim 19, wherein said donor atoms are selected from the list consisting of potassium, phosphorous, arsenic, scandium, yttrium, and hydrogen.

21. The nanotube based transistor device of claim 1, wherein said multi-layer nanotube fabric comprises acceptor atoms provided by ion implantation.

22. The nanotube based transistor device of claim 21, where said acceptor atoms are selected from the list consisting of oxygen and boron.

23. The nanotube based transistor device of claim 1, wherein said nanotube based transistor device is formed between wiring layers of an integrated circuit, and wherein said wiring layers are separated by insulating regions.

24. The nanotube based transistor device of claim 1, comprising an insulating layer, wherein said multi-layer nanotube fabric is disposed on said insulating layer.

25. The nanotube based transistor device of claim 1, comprising a substrate, wherein said multi-layer nanotube fabric is positioned separated from said substrate.

26. The nanotube based transistor device of claim 25, wherein said substrate is an insulating substrate.

27. The nanotube based transistor device of claim 1, comprising a layer of organic semiconducting material, wherein said multi-layer nanotube fabric is disposed on said layer of organic semiconducting material.

28. The nanotube based transistor device of claim 27, wherein said layer of organic semiconducting material is formed from a material selected from the list consisting of polyfluorene, polythiophenes, polyacetylene, polypyrrole, polyaniline, p-phenylene sulfide, and p-phenylene vinylene.

29. The nanotube based transistor device of claim 1, comprising a plastic film, wherein said multi-layer nanotube fabric is disposed on said plastic film.

30. The nanotube based transistor device of claim 29, wherein said plastic film is formed from a material selected from the list consisting of polyethylene terephthalate, polymethylmethacrylate, polyamides, polysulfones, and polycyclic olefins.

31. The nanotube based transistor device of claim 1, comprising a substrate, wherein said multi-layer nanotube fabric is in contact with a top surface of said substrate.

32. A method of making a nanotube based transistor device, comprising:
depositing multiple nanotube fabric layers to form a multi-layer nanotube fabric, each of said nanotube fabric layers comprising a plurality of nanotube elements;
applying a directional force over at least one nanotube fabric layer to form an ordered nanotube fabric layer;
forming a first conductive element over a first region of said multi-layer nanotube fabric;
forming a second conductive element over a second region of said multi-layer nanotube fabric;
forming an insulating element over a third region of said multi-layer nanotube fabric, said third region disposed between said first region and said second region;
forming a third conductive element over said insulating element;
wherein said first conductive element, second conductive element, and third conductive element are separated from one another.

* * * * *